United States Patent
Lee et al.

(10) Patent No.: US 12,446,459 B2
(45) Date of Patent: Oct. 14, 2025

(54) ORGANIC ELECTROLUMINESCENT DEVICE

(71) Applicant: ROHM AND HAAS ELECTRONIC MATERIALS KOREA LTD., Chungcheongnam-do (KR)

(72) Inventors: Dong-Hyung Lee, Gyeonggi-do (KR); Chi-Sik Kim, Gyeonggi-do (KR); Soo-Yong Lee, Gyeonggi-do (KR); Seung-Hoon Yoo, Gyeonggi-do (KR); Yoo-Jin Doh, Gyeonggi-do (KR)

(73) Assignee: DuPont Specialty Materials Korea Ltd. (KR)

( * ) Notice: Subject to any disclaimer, the term of this patent is extended or adjusted under 35 U.S.C. 154(b) by 828 days.

(21) Appl. No.: 17/237,988

(22) Filed: Apr. 22, 2021

(65) Prior Publication Data
US 2021/0351358 A1   Nov. 11, 2021

(30) Foreign Application Priority Data

Apr. 24, 2020 (KR) ......... 10-2020-0049806
Feb. 19, 2021 (KR) ......... 10-2021-0022375

(51) Int. Cl.
| | | |
|---|---|---|
| *H01L 51/50* | (2006.01) | |
| *H10K 85/60* | (2023.01) | |
| *H10K 50/11* | (2023.01) | |
| *H10K 50/15* | (2023.01) | |

(52) U.S. Cl.
CPC ......... *H10K 85/636* (2023.02); *H10K 85/622* (2023.02); *H10K 85/626* (2023.02); *H10K 85/633* (2023.02); *H10K 85/6572* (2023.02); *H10K 85/6574* (2023.02); *H10K 85/6576* (2023.02); *H10K 50/11* (2023.02); *H10K 50/15* (2023.02)

(58) Field of Classification Search
None
See application file for complete search history.

(56) References Cited

U.S. PATENT DOCUMENTS

| | | |
|---|---|---|
| 2007/0247063 A1 | 10/2007 | Murase et al. |
| 2010/0187977 A1 | 7/2010 | Kai et al. |
| 2010/0187983 A1* | 7/2010 | Herron et al. ........ C07C 211/61 313/504 |
| 2011/0057173 A1 | 3/2011 | LeCloux et al. |
| 2014/0326987 A1 | 11/2014 | Park et al. |
| 2014/0332793 A1 | 11/2014 | Park et al. |
| 2015/0008394 A1 | 1/2015 | Oh et al. |
| 2017/0025609 A1 | 1/2017 | Herron et al. |
| 2017/0213985 A1 | 7/2017 | Lee et al. |
| 2018/0301629 A1 | 10/2018 | Hatakeyama et al. |
| 2018/0339967 A1 | 11/2018 | Kim et al. |
| 2020/0411771 A1 | 12/2020 | Kim et al. |
| 2021/0395215 A1* | 12/2021 | Kim .................. C07D 413/10 |

FOREIGN PATENT DOCUMENTS

| | | |
|---|---|---|
| JP | 3139321 B2 | 2/2001 |
| KR | 20100079458 A | 7/2010 |
| KR | 101108519 B1 | 1/2012 |
| KR | 101144358 B1 | 5/2012 |
| KR | 101146929 B1 | 5/2012 |
| KR | 101146930 B1 | 5/2012 |
| KR | 20150138000 A | 12/2015 |
| KR | 20160012846 A | 2/2016 |
| WO | 2010075421 A | 7/2010 |
| WO | 2011053334 A1 | 5/2011 |

OTHER PUBLICATIONS

Cited Reference issued from Japan Patent Office, Patent Application No. 2021-064562, Filing Date: Apr. 6, 2021.

* cited by examiner

*Primary Examiner* — Gregory D Clark
(74) *Attorney, Agent, or Firm* — G. Creston Campbell

(57) ABSTRACT

The present disclosure relates to an organic electroluminescent device comprising a first electrode, a second electrode, and at least one organic layer interposed between the first electrode and the second electrode, wherein the organic layer comprises a light-emitting layer and a hole transport zone. By comprising a deuterated compound in at least one of the light-emitting layer and the hole transport zone, it is possible to provide an organic electroluminescent device having improved driving voltage, luminous efficiency, power efficiency, and/or lifetime properties.

10 Claims, No Drawings

ORGANIC ELECTROLUMINESCENT DEVICE

TECHNICAL FIELD

The present disclosure relates to an organic electroluminescent device comprising a deuterated compound.

BACKGROUND ART

In 1987, Tang, Van Slyke, et al. at Eastman Kodak first developed a small molecule green organic electroluminescent device (OLED) of TPD/Alq3 bilayer consisting of a light-emitting layer and a charge transport layer. Since then, the research on an OLED has been rapidly carried out, and it has been commercialized.

In recent years, OLEDs have been intensively developed owing to their potential in the fields of flat panel displays and general lighting systems. In order to improve the performance of OLEDs, a great deal of effort and technological progress have been made, but developing high-performance materials and more suitable device structures is emerging as an important task.

Meanwhile, in order to drive the display, it is very important to maintain the white balance of red, green, and blue. Red and green OLED materials are easy to implement long lifetime and low driving voltage. However, the blue OLED dopant material does not meet the strong demand for a blue OLED having a low driving voltage and a long lifetime due to several issues such as a short operational lifetime and a high driving voltage. Therefore, there is a need to develop a blue OLED material having a driving voltage and a lifetime suitable for red- and green-OLED materials.

DISCLOSURE OF INVENTION

Technical Problem

The objective of the present disclosure is to provide an organic electroluminescent device having improved driving voltage, luminous efficiency, power efficiency and/or lifetime properties compared to a conventional organic electroluminescent device.

Solution to Problem

The present inventors found that the above objective can be achieved by using a compound in which hydrogen is replaced with deuterium as a host material and/or a hole transport zone material.

According to the first aspect of the present disclosure, the present disclosure provides an organic electroluminescent device comprising a first electrode, a second electrode, and at least one organic layer interposed between the first electrode and the second electrode, wherein the organic layer comprises a light-emitting layer and a hole transport zone, and at least one of the light-emitting layer and the hole transport zone comprises a deuterated compound.

According to the second aspect of the present disclosure, in the first aspect, the hole transport zone comprises a deuterated compound.

According to the third aspect of the present disclosure, in the first or second aspect, the light-emitting layer comprises a deuterated compound.

According to the fourth aspect of the present disclosure, in any one of the first to third aspects, the hole transport zone comprise at least one of a hole auxiliary layer and a light-emitting auxiliary layer.

According to the fifth aspect of the present disclosure, in any one of the first to fourth aspects, the deuterated compound is one in which at least 10%, preferably at least 30%, more preferably at least 60% of the hydrogen atoms in the non-deuterated compound are replaced with deuterium.

According to the sixth aspect of the present disclosure, in any one of the first to fifth aspects, the hole transport zone comprises a compound represented by the following formula 1.

According to the seventh aspect of the present disclosure, in any one of the first to sixth aspects, the hole transport zone comprises a compound represented by the following formula 2.

According to the eighth aspect of the present disclosure, in any one of the first to seventh aspects, the hole transport zone comprises a compound represented by the following formula 3.

According to the ninth aspect of the present disclosure, in any one of the first to eighth aspects, the light-emitting layer comprises at least one compound represented by the following formula 4.

According to the tenth aspect of the present disclosure, in any one of the first to ninth aspects, the light-emitting layer comprises a first host material and a second host material, and the compound represented by the following formula 4 is included in each of the first host material and the second host material, with a proviso that the compounds represented by formula 4, which are included in the first host material and the second host material, respectively, are different from each other.

According to the eleventh aspect of the present disclosure, in any one of the first to tenth aspects, the light-emitting layer comprises a first host material comprising a compound represented by the following formula 4, and a second host material comprising a compound represented by the following formula 5, and at least one of the first host material and the second host material comprises one or more deuterium.

According to the twelfth aspect of the present disclosure, in any one of the first to eleventh aspects, at least one compound represented by the following formula 1, a compound represented by the following formula 2 and a compound represented by the following formula 3 is comprised in the hole transport zone; and at least one compound represented by the following formula 4 and a compound represented by the following formula 5 is comprised in the light-emitting layer.

According to the thirteenth aspect of the present disclosure, in any one of the first to twelfth aspects, the light-emitting layer comprises a dopant, the dopant comprises at least one selected from the group consisting of a boron derivative, a pyrene derivative, a chrysene derivative, and a benzofluorene derivative.

According to the fourteenth aspect of the present disclosure, in any one of the first to thirteenth aspects, the light-emitting layer is a blue light-emitting layer.

Advantageous Effects of Invention

The present disclosure can provide an organic electroluminescent device having improved driving voltage, luminous efficiency, power efficiency and/or lifetime properties compared to a conventional organic electroluminescent device, by comprising the deuterated compound in the light-emitting layer and/or the hole transport zone. According to one embodiment, a blue fluorescent organic electroluminescent device comprising a hole transport zone of the present disclosure, a light-emitting layer of the present disclosure, a combination of a hole transport zone and a light-emitting layer of the present disclosure, or a combination of a plurality of hosts of the present disclosure can implement a long lifetime and/or a low driving voltage.

MODE FOR THE INVENTION

Hereinafter, the present disclosure will be described in detail. However, the following description is intended to explain the present disclosure, and is not meant in any way to restrict the scope of the present disclosure.

Herein, the term "deuterated" means that one or more hydrogen atoms in a compound or functional group is replaced with deuterium, and it includes that some or all of the hydrogen atoms are replaced with deuterium.

Herein, the "hole transport zone" may be composed of one or more layers selected from the group consisting of a hole transport layer, a hole injection layer, an electron blocking layer, a light-emitting auxiliary layer, and a hole auxiliary layer, and each of the layers may be composed of one or more layers. The hole transport zone of the present disclosure may be a second hole transport layer, and may comprise at least one of a hole auxiliary layer and a light-emitting auxiliary layer. Herein, the hole auxiliary layer or the light-emitting auxiliary layer is placed between the hole transport layer and the light-emitting layer, and controls a hole transport rate. The hole auxiliary layer or the light-emitting auxiliary layer provides an effect of improving the efficiency and lifetime of the organic electroluminescent device.

Herein, the "hole transport zone material" may be at least one selected from the group consisting of a hole transport material, a hole injection material, an electron blocking material, a hole auxiliary material, and a light-emitting auxiliary material.

According to another embodiment of the present disclosure, the hole transport zone comprises a hole transport layer, and the hole transport layer may consist of multi-layers of two or more layers, wherein at least one layer of the multi-layers may comprise at least one of a compound represented by formula 1, a compound represented by formula 2, and a compound represented by formula 3. The layer comprising the compound of formula 1, formula 2 or formula 3, or the other layers may comprise any compounds used as conventional hole transport zone materials.

Herein, the term "(C1-C30)alkyl" is meant to be a linear or branched alkyl having 1 to 30 carbon atoms constituting the chain, in which the number of carbon atoms is preferably 1 to 20, and more preferably 1 to 10. The above alkyl may include methyl, ethyl, n-propyl, isopropyl, n-butyl, isobutyl, tert-butyl, sec-butyl, etc. The term "(C2-C30)alkenyl" is meant to be a linear or branched alkenyl having 2 to 30 carbon atoms constituting the chain, in which the number of carbon atoms is preferably 2 to 20, and more preferably 2 to 10. The above alkenyl may include vinyl, 1-propenyl, 2-propenyl, 1-butenyl, 2-butenyl, 3-butenyl, 2-methylbut-2-enyl, etc. The term "(C2-C30)alkynyl" is meant to be a linear or branched alkynyl having 2 to 30 carbon atoms constituting the chain, in which the number of carbon atoms is preferably 2 to 20, and more preferably 2 to 10. The above alkynyl may include ethynyl, 1-propynyl, 2-propynyl, 1-butynyl, 2-butynyl, 3-butynyl, 1-methylpent-2-ynyl, etc. The term "(C3-C30)cycloalkyl" is meant to be a mono- or polycyclic hydrocarbon having 3 to 30 ring backbone carbon atoms, in which the number of carbon atoms is preferably 3 to 20, and more preferably 3 to 7. The above cycloalkyl may include cyclopropyl, cyclobutyl, cyclopentyl, cyclohexyl, cyclopentylmethyl, cyclohexylmethyl, etc. The term "(3- to 7-membered)heterocycloalkyl" is meant to be a cycloalkyl having 3 to 7, preferably 5 to 7, ring backbone atoms, and including at least one heteroatom selected from the group consisting of B, N, O, S, Si, and P, and preferably the group consisting of O, S, and N. The above heterocycloalkyl may include tetrahydrofuran, pyrrolidine, thiolan, tetrahydropyran, etc. The term "(C6-C30)aryl(ene)" is meant to be a monocyclic or fused ring radical derived from an aromatic hydrocarbon having 6 to 30 ring backbone carbon atoms. The above aryl(ene) may be partially saturated, and may comprise a spiro structure. The number of ring backbone carbon atoms is preferably 6 to 25, and more preferably 6 to 18. The above aryl may include phenyl, biphenyl, terphenyl, naphthyl, binaphthyl, phenylnaphthyl, naphthylphenyl, fluorenyl, phenylfluorenyl, diphenylfluorenyl, benzofluorenyl, dibenzofluorenyl, phenanthrenyl, phenylphenanthrenyl, anthracenyl, indenyl, triphenylenyl, pyrenyl, tetracenyl, perylenyl, chrysenyl, naphthacenyl, fluoranthenyl, spirobifluorenyl, spiro[fluorene-benzofluoren]yl, azulenyl, tetramethyldihydrophenanthrenyl, etc. More specifically, the aryl may include phenyl, 1-naphthyl, 2-naphthyl, 1-anthryl, 2-anthryl, 9-anthryl, benzanthryl, 1-phenanthryl, 2-phenanthryl, 3-phenanthryl, 4-phenanthryl, 9-phenanthryl, naphthacenyl, pyrenyl, 1-chrysenyl, 2-chrysenyl, 3-chrysenyl, 4-chrysenyl, 5-chrysenyl, 6-chrysenyl, benzo[c]phenanthryl, benzo[g]chrysenyl, 1-triphenylenyl, 2-triphenylenyl, 3-triphenylenyl, 4-triphenylenyl, 1-fluorenyl, 2-fluorenyl, 3-fluorenyl, 4-fluorenyl, 9-fluorenyl, benzo[a]fluorenyl, benzo[b]fluorenyl, benzo[c]fluorenyl, dibenzofluorenyl, 2-biphenylyl, 3-biphenylyl, 4-biphenylyl, o-terphenyl, m-terphenyl-4-yl, m-terphenyl-3-yl, m-terphenyl-2-yl, p-terphenyl-4-yl, p-terphenyl-3-yl, p-terphenyl-2-yl, m-quaterphenyl, 3-fluoranthenyl, 4-fluoranthenyl, 8-fluoranthenyl, 9-fluoranthenyl, benzofluoranthenyl, o-tolyl, m-tolyl, p-tolyl, 2,3-xylyl, 3,4-xylyl, 2,5-xylyl, mesityl, o-cumenyl, m-cumenyl, p-cumenyl, p-tert-butylphenyl, p-(2-phenylpropyl)phenyl, 4'-methylbiphenylyl, 4''-tert-butyl-p-terphenyl-4-yl, 9,9-dimethyl-1-fluorenyl, 9,9-dimethyl-2-fluorenyl, 9,9-dimethyl-3-fluorenyl, 9,9-dimethyl-4-fluorenyl, 9,9-diphenyl-1-fluorenyl, 9,9-diphenyl-2-fluorenyl, 9,9-diphenyl-3-fluorenyl, 9,9-diphenyl-4-fluorenyl, 11,11-dimethyl-1-benzo[a]fluorenyl, 11,11-dimethyl-2-benzo[a]fluorenyl, 11,11-dimethyl-3-benzo[a]fluorenyl, 11,11-dimethyl-4-benzo[a]fluorenyl, 11,11-dimethyl-5-benzo[a]fluorenyl, 11,11-dimethyl-6-benzo[a]fluorenyl, 11,11-dimethyl-7-benzo[a]fluorenyl, 11,11-dimethyl-8-benzo[a]fluorenyl, 11,11-dimethyl-9-benzo[a]fluorenyl, 11,11-dimethyl-10-benzo[a]fluorenyl, 11,11-dimethyl-1-benzo[b]fluorenyl, 11,11-dimethyl-2-benzo[b]fluorenyl, 11,11-dimethyl-3-benzo[b]fluorenyl, 11,11-dimethyl-4-benzo[b]fluorenyl, 11,11-dimethyl-5-benzo[b]fluorenyl, 11,11-dimethyl-6-benzo[b]fluorenyl, 11,11-dimethyl-7-benzo[b]fluorenyl, 11,11-dimethyl-8-benzo[b]fluorenyl, 11,11-dimethyl-9-benzo[b]fluorenyl, 11,11-dimethyl-10-benzo[b]fluorenyl, 11,11-dimethyl-1-benzo[c]fluorenyl, 11,11-dimethyl-2-benzo[c]fluorenyl, 11,11-dimethyl-3-benzo[c]fluorenyl, 11,11-dimethyl-4-benzo[c]fluorenyl, 11,11-dimethyl-5-benzo[c]fluorenyl, 11,11-dimethyl-6-benzo[c]fluorenyl, 11,11-dimethyl-7-benzo[c]fluorenyl, 11,11-dimethyl-8-benzo[c]fluorenyl, 11,11-dimethyl-9-benzo[c]fluorenyl, 11,11-dimethyl-10-benzo[c]fluorenyl, 11,11-diphenyl-1-benzo[a]fluorenyl, 11,11-diphenyl-2-benzo[a]fluorenyl, 11,11- diphenyl-3-benzo[a]fluorenyl, 11,11-diphenyl-4-benzo[a]fluorenyl, 11,11-diphenyl-5-benzo[a]fluorenyl, 11,11-diphenyl-6-benzo[a]fluorenyl, 11,11-diphenyl-7-benzo[a]fluorenyl, 11,11-diphenyl-8-benzo[a]fluorenyl, 11,11-diphenyl-9-benzo[a]fluorenyl, 11,11-diphenyl-10-benzo[a]fluorenyl, 11,11-diphenyl-1-benzo[b]fluorenyl, 11,11-diphenyl-2-benzo[b]fluorenyl, 11,11-diphenyl-3-benzo[b]fluorenyl, 11,11-diphenyl-4-benzo[b]fluorenyl, 11,11-diphenyl-5-benzo[b]fluorenyl, 11,11-diphenyl-6-benzo[b]fluorenyl, 11,11-diphenyl-7-benzo[b]fluorenyl, 11,11-diphenyl-8-benzo[b]fluorenyl, 11,11-diphenyl-9-benzo[b]fluorenyl, 11,11-diphenyl-10-benzo[b]fluorenyl, 11,11-diphenyl-1-benzo[c]fluorenyl, 11,11-diphenyl-2-benzo[c]fluorenyl, 11,11-diphenyl-3-benzo[c]fluorenyl, 11,11-diphenyl-4-benzo[c]fluorenyl, 11,11-diphenyl-5-benzo[c]fluorenyl, 11,11-diphenyl-6-benzo[c]fluorenyl, 11,11-diphenyl-7-benzo[c]fluorenyl, 11,11-diphenyl-8-benzo[c]fluorenyl, 11,11-diphenyl-9-benzo[c]fluorenyl, 11,11-diphenyl-10-benzo[c]fluorenyl, 9,9,10,10-tetramethyl-9,10-dihydro-1-phenanthrenyl, 9,9,10,10-tetramethyl-9,10-dihydro-2-phenanthrenyl, 9,9,10,10-tetramethyl-9,10-dihydro-3-phenanthrenyl, 9,9,10,10-tetramethyl-9,10-dihydro-4-phenanthrenyl, etc.

Herein, the term "(3- to 30-membered)heteroaryl(ene)" is an aryl(ene) having 3 to 30 ring backbone atoms, preferably 5 to 30 ring backbone atoms, more preferably 5 to 25 ring backbone atoms, and including at least one, preferably 1 to 4 heteroatoms selected from the group consisting of B, N, O, S, Si, and P. The above heteroaryl(ene) may be a monocyclic ring, or a fused ring condensed with at least one benzene ring; may be partially saturated; may be one formed by linking at least one heteroaryl or aryl group to a heteroaryl group via a single bond(s); and may comprise a spiro structure. The above heteroaryl may include a monocyclic ring-type heteroaryl such as furyl, thiophenyl, pyrrolyl, imidazolyl, pyrazolyl, thiazolyl, thiadiazolyl, isothiazolyl, isoxazolyl, oxazolyl, oxadiazolyl, triazinyl, tetrazinyl, triazolyl, tetrazolyl, furazanyl, pyridyl, pyrazinyl, pyrimidinyl, pyridazinyl, etc., and a fused ring-type heteroaryl such as benzofuranyl, benzothiophenyl, isobenzofuranyl, dibenzofuranyl, benzonaphthofuranyl, dibenzothiophenyl, benzonaphthothiophenyl, dibenzoselenophenyl, benzofuroquinolinyl, benzofuroquinazolinyl, benzofuronaphthyridinyl, benzofuropyrimidinyl, naphthofuropyrimidinyl, benzothienoquinolinyl, benzothienoquinazolinyl, benzothienonaphthyridinyl, benzothienopyrimidinyl, naphthothienopyrimidinyl, pyrimidoindolyl, benzopyrmidoindolyl, benzofuropyrazinyl, naphthofuropyrazinyl, benzothienopyrazinyl, naphthothienopyrazinyl, pyrazinoindolyl, benzopyrazinoindolyl, benzimidazolyl, benzothiazolyl, benzoisothiazolyl, benzoisoxazolyl, benzoxazolyl, isoindolyl, indolyl, indazolyl, benzothiadiazolyl, quinolyl, isoquinolyl, cinnolinyl, quinazolinyl, benzoquinazolinyl, quinoxalinyl, benzoquinoxalinyl, naphthyridinyl, pyridopyrazinyl, carbazolyl, benzocarbazolyl, phenoxazinyl, phenanthridinyl, phenanthro oxazolyl, benzodioxolyl, dihydroacridinyl, benzotriazolphenazinyl, imidazopyridyl, chromenoquinazolinyl, thiochromenoquinazolinyl, dimethylbenzoperimidinyl, indolocarbazolyl, indenocarbazolyl, etc. More specifically, the heteroaryl may include 1-pyrrolyl, 2-pyrrolyl, 3-pyrrolyl, pyrazinyl, 2-pyridyl, 2-pyrimidinyl, 4-pyrimidinyl, 5-pyrimidinyl, 6-pyrimidinyl, 1,2,3-triazin-4-yl, 1,2,4-triazin-3-yl, 1,3,5-triazin-2-yl, 1-imidazolyl, 2-imidazolyl, 1-pyrazolyl, 1-indolidinyl, 2-indolidinyl, 3-indolidinyl, 5-indolidinyl, 6-indolidinyl, 7-indolidinyl, 8-indolidinyl, 2-imidazopyridyl, 3-imidazopyridyl, 5-imidazopyridyl, 6-imidazopyridyl, 7-imidazopyridyl, 8-imidazopyridyl, 3-pyridyl, 4-pyridyl, 1-indolyl, 2-indolyl, 3-indolyl, 4-indolyl, 5-indolyl, 6-indolyl, 7-indolyl, 1-isoindolyl, 2-isoindolyl, 3-isoindolyl, 4-isoindolyl, 5-isoindolyl, 6-isoindolyl, 7-isoindolyl, 2-furyl, 3-furyl, 2-benzofuranyl, 3-benzofuranyl, 4-benzofuranyl, 5-benzofuranyl, 6-benzofuranyl, 7-benzofuranyl, 1-isobenzofuranyl, 3-isobenzofuranyl, 4-isobenzofuranyl, 5-isobenzofuranyl, 6-isobenzofuranyl, 7-isobenzofuranyl, 2-quinolyl, 3-quinolyl, 4-quinolyl, 5-quinolyl, 6-quinolyl, 7-quinolyl, 8-quinolyl, 1-isoquinolyl, 3-isoquinolyl, 4-isoquinolyl, 5-isoquinolyl, 6-isoquinolyl, 7-isoquinolyl, 8-isoquinolyl, 2-quinoxalinyl, 5-quinoxalinyl, 6-quinoxalinyl, 1-carbazolyl, 2-carbazolyl, 3-carbazolyl, 4-carbazolyl, 9-carbazolyl, azacarbazolyl-1-yl, azacarbazolyl-2-yl, azacarbazolyl-3-yl, azacarbazolyl-4-yl, azacarbazolyl-5-yl, azacarbazolyl-6-yl, azacarbazolyl-7-yl, azacarbazolyl-8-yl, azacarbazolyl-9-yl, 1-phenanthridinyl, 2-phenanthridinyl, 3-phenanthridinyl, 4-phenanthridinyl, 6-phenanthridinyl, 7-phenanthridinyl, 8-phenanthridinyl, 9-phenanthridinyl, 10-phenanthridinyl, 1-acridinyl, 2-acridinyl, 3-acridinyl, 4-acridinyl, 9-acridinyl, 2-oxazolyl, 4-oxazolyl, 5-oxazolyl, 2-oxadiazolyl, 5-oxadiazolyl, 3-furazanyl, 2-thienyl, 3-thienyl, 2-methylpyrrol-1-yl, 2-methylpyrrol-3-yl, 2-methylpyrrol-4-yl, 2-methylpyrrol-5-yl, 3-methylpyrrol-1-yl, 3-methylpyrrol-2-yl, 3-methylpyrrol-4-yl, 3-methylpyrrol-5-yl, 2-tert-butylpyrrol-4-yl, 3-(2-phenylpropyl)pyrrol-1-yl, 2-methyl-1-indolyl, 4-methyl-1-indolyl, 2-methyl-3-indolyl, 4-methyl-3-indolyl, 2-tert-butyl-1-indolyl, 4-tert-butyl-1-indolyl, 2-tert-butyl-3-indolyl, 4-tert-butyl-3-indolyl, 1-dibenzofuranyl, 2-dibenzofuranyl, 3-dibenzofuranyl, 4-dibenzofuranyl, 1-dibenzothiophenyl, 2-dibenzothiophenyl, 3-dibenzothiophenyl, 4-dibenzothiophenyl, 1-naphtho-[1,2-b]-benzofuranyl, 2-naphtho-[1,2-b]-benzofuranyl, 3-naphtho-[1,2-b]-benzofuranyl, 4-naphtho-[1,2-b]-benzofuranyl, 5-naphtho-[1,2-b]-benzofuranyl, 6-naphtho-[1,2-b]-benzofuranyl, 7-naphtho-[1,2-b]-benzofuranyl, 8-naphtho-[1,2-b]-benzofuranyl, 9-naphtho-[1,2-b]-benzofuranyl, 10-naphtho-[1,2-b]-benzofuranyl, 1-naphtho-[2,3-b]-benzofuranyl, 2-naphtho-[2,3-b]-benzofuranyl, 3-naphtho-[2,3-b]-benzofuranyl, 4-naphtho-[2,3-b]-benzofuranyl, 5-naphtho-[2,3-b]-benzofuranyl, 6-naphtho-[2,3-b]-benzofuranyl, 7-naphtho-[2,3-b]-benzofuranyl, 8-naphtho-[2,3-b]-benzofuranyl, 9-naphtho-[2,3-b]-benzofuranyl, 10-naphtho-[2,3-b]-benzofuranyl, 1-naphtho-[2,1-b]-benzofuranyl, 2-naphtho-[2,1-b]-benzofuranyl, 3-naphtho-[2,1-b]-benzofuranyl, 4-naphtho-[2,1-b]-benzofuranyl, 5-naphtho-[2,1-b]-benzofuranyl, 6-naphtho-[2,1-b]-benzofuranyl, 7-naphtho-[2,1-b]-benzofuranyl, 8-naphtho-[2,1-b]-benzofuranyl, 9-naphtho-[2,1-b]-benzofuranyl, 10-naphtho-[2,1-b]-benzofuranyl, 1-naphtho-[1,2-b]-benzothiophenyl, 2-naphtho-[1,2-b]-benzothiophenyl, 3-naphtho-[1,2-b]-benzothiophenyl, 4-naphtho-[1,2-b]-benzothiophenyl, 5-naphtho-[1,2-b]-benzothiophenyl, 6-naphtho-[1,2-b]-benzothiophenyl, 7-naphtho-[1,2-b]-benzothiophenyl, 8-naphtho-[1,2-b]-benzothiophenyl, 9-naphtho-[1,2-b]-benzothiophenyl, 10-naphtho-[1,2-b]-benzothiophenyl, 1-naphtho-[2,3-b]-benzothiophenyl, 2-naphtho-[2,3-b]-benzothiophenyl, 3-naphtho-[2,3-b]-benzothiophenyl, 4-naphtho-[2,3-b]-benzothiophenyl, 5-naphtho-[2,3-b]-benzothiophenyl, 1-naphtho-[2,1-b]-benzothiophenyl, 2-naphtho-[2,1-b]-benzothiophenyl, 3-naphtho-[2,1-b]-benzothiophenyl, 4-naphtho-[2,1-b]-benzothiophenyl, 5-naphtho-[2,1-b]-benzothiophenyl, 6-naphtho-[2,1-b]-benzothiophenyl, 7-naphtho-[2,1-b]-benzothiophenyl, 8-naphtho-[2,1-b]-benzothiophenyl, 9-naphtho-[2,1-b]-benzothiophenyl, 10-naphtho-[2,1-b]-benzothiophenyl, 2-benzofuro[3,2-d]pyrmidinyl, 6-benzofuro[3,2-d]pyrmidinyl, 7-benzofuro[3,2-d]pyrmidinyl, 8-benzofuro[3,2-d]pynmidinyl, 9-benzofuro[3,2-d]pyrmidinyl, 2-benzothio[3,2-d]pyrmidinyl, 6-benzothio[3,2-d]pyrimidinyl, 7-benzothio[3,2-d]pyrimidinyl, 8-benzothio[3,2-d]pyrimidinyl, 9-benzothio[3,2-d]pyrmidinyl, 2-benzofuro[3,2-d]pyrazinyl, 6-benzofuro[3,2-d]pyrazinyl, 7-benzofuro[3,2-d]pyrazinyl, 8-benzofuro[3,2-d]pyrazinyl, 9-benzofuro[3,2-d]pyrazinyl, 2-benzothio[3,2-d]pyrazinyl, 6-benzothio[3,2-d]pyrazinyl, 7-benzothio[3,2-d]pyrazinyl, 8-benzothio[3,2-d]pyrazinyl, 9-benzothio[3,2-d]pyrazinyl, 1-silafluorenyl, 2-silafluorenyl, 3-silafluorenyl, 4-silafluorenyl, 1-germafluorenyl, 2-germafluorenyl, 3-germafluorenyl, 4-germafluorenyl, 1-dibenzoselenophenyl, 2-dibenzoselenophenyl, 3-dibenzoselenophenyl, 4-dibenzoselenophenyl, etc. "Halogen" includes F, Cl, Br, and I.

In addition, "ortho (o-)," "meta (m-)," and "para (p-)" are prefixes, which represent the relative positions of substituents, respectively. Ortho indicates that two substituents are adjacent to each other, and for example, when two substituents in a benzene derivative occupy positions 1 and 2, it is called an ortho position. Meta indicates that two substituents are at positions 1 and 3, and for example, when two substituents in a benzene derivative occupy positions 1 and 3, it is called a meta position. Para indicates that two substituents are at positions 1 and 4, and for example, when two substituents in a benzene derivative occupy positions 1 and 4, it is called a para position.

In the formulas of the present disclosure, a ring formed by a linkage of adjacent substituents means that at least two adjacent substituents are linked to or fused with each other to form a substituted or unsubstituted mono- or polycyclic (3- to 30-membered) alicyclic or aromatic ring, or the combination thereof. The ring may be preferably, a substituted or unsubstituted mono- or polycyclic (5- to 25-membered) alicyclic or aromatic ring, or the combination thereof; and more preferably, an unsubstituted mono- or polycyclic (5- to 20-membered) aromatic ring. In addition, the ring may contain at least one heteroatom selected from B, N, O, S, Si, and P, preferably at least one heteroatom selected from N, O, and S. For example, the ring may be a substituted or unsubstituted, benzene ring, naphthalene ring, phenanthrene ring, fluorene ring, indene ring, indole ring, benzoindole ring, benzofuran ring, benzothiophene ring, dibenzothiophene ring, dibenzofuran ring, or carbazole ring, etc.

Herein, "substituted" in the expression "substituted or unsubstituted" means that a hydrogen atom in a certain functional group is replaced with another atom or another functional group, i.e., a substituent. The substituent also includes those in which two or more substituents are linked. For example, the substituent formed by linking two or more substituents may be pyridine-triazine. That is, when being substituted with pyridine-triazine, the substituent(s) may be interpreted as one heteroaryl, or two heteroaryls. In the present disclosure, the substituent(s) of the substituted alkyl, the substituted cycloalkyl, the substituted silyl, the substituted aryl, the substituted arylene, the substituted heteroaryl, the substituted heteroarylene, the substituted alkoxy, the substituted trialkylsilyl, the substituted dialkylarylsilyl, the substituted alkyldiarylsilyl, the substituted triarylsilyl, the substituted mono- or di-alkylamino, the substituted mono- or di-alkenylamino, the substituted mono- or di-arylamino, the substituted mono- or di-heteroarylamino, the substituted alkylalkenylamino, the substituted alkylarylamino, the substituted alkylheteroarylamino, the substituted alkenylarylamino, the substituted alkenylheteroarylamino, the substituted arylheteroarylamino, the substituted phenanthrenyl, the substituted carbazolyl, the substituted fluorenyl, the substituted benzofluorenyl, the substituted triphenylenyl, the substituted dibenzofuranyl, the substituted dibenzothiophenyl, the substituted benzene ring, the substituted naphthalene ring, and the substituted phenanthrene ring, each independently, are at least one selected from the group consisting of deuterium; a halogen; a cyano; a carboxyl; a nitro; a hydroxyl; a phosphine oxide; a (C1-C30)alkyl; a halo(C1-C30)alkyl; a (C2-C30)alkenyl; a (C2-C30)alkynyl; a (C1-C30)alkoxy; a (C1-C30)alkylthio; a (C3-C30)cycloalkyl; a (C3-C30)cycloalkenyl; a (3- to 7-membered)heterocycloalkyl; a (C6-C30)aryloxy; a (C6-C30)arylthio; a (3- to 30-membered)heteroaryl unsubstituted or substituted with at least one of a (C1-C30)alkyl(s) and a (C6-C30)aryl(s); a (C6-C30)aryl unsubstituted or substituted with at least one of deuterium, a (C1-C30)alkyl(s), a (3- to 30-membered) heteroaryl(s) and a mono- or di-(C6-C30)arylamino(s); a tri(C1-C30)alkylsilyl; a tri(C6-C30)arylsilyl; a di(C1-C30) alkyl(C6-C30)arylsilyl; a (C1-C30)alkyldi(C6-C30)arylsilyl; a fused ring group of a (C3-C30) aliphatic ring(s) and a (C6-C30) aromatic ring(s); an amino; a mono- or di-(C1-C30)alkylamino; a mono- or di-(C2-C30)alkenylamino; a mono- or di-(C6-C30)arylamino; a mono- or di-(3- to 30-membered)heteroarylamino; a (C1-C30)alkyl(C2-C30) alkenylamino; a (C1-C30)alkyl(C6-C30)arylamino; a (C1-C30)alkyl(3- to 30-membered)heteroarylamino; a (C2-C30) alkenyl(C6-C30)arylamino; a (C2-C30)alkenyl(3- to 30-membered)heteroarylamino; a (C6-C30)aryl(3- to 30-membered)heteroarylamino; a (C1-C30)alkylcarbonyl; a (C1-C30)alkoxycarbonyl; a (C6-C30)arylcarbonyl; a (C6-C30)arylphosphine; a di(C6-C30)arylboronyl; a di(C1-C30) alkylboronyl; a (C1-C30)alkyl(C6-C30)arylboronyl; a (C6-C30)aryl(C1-C30)alkyl; and a (C1-C30)alkyl(C6-C30)aryl, or a combination thereof. According to one embodiment of the present disclosure, the substituent(s), each independently, are at least one selected from the group consisting of deuterium, an unsubstituted (C1-C20)alkyl, an unsubstituted (5- to 25-membered)heteroaryl, and an unsubstituted (C6-C18)aryl, or a combination thereof. According to another embodiment of the present disclosure, the substituent(s), each independently, are at least one selected from the group consisting of deuterium, an unsubstituted (C1-C10)alkyl, and an unsubstituted (C6-C18)aryl. For example, the substituent(s), each independently, may be at least one selected from the group consisting of deuterium, a methyl, tert-butyl, a phenyl, a naphthyl, and a biphenyl.

In the formulas of the present disclosure, the heteroaryl, the heteroarylene, and the heterocycloalkyl, each independently, may contain at least one heteroatom selected from B, N, O, S, Si, and P. Also, the heteroatom may be bonded to at least one selected from the group consisting of hydrogen, deuterium, a halogen, a cyano, a substituted or unsubstituted (C1-C30)alkyl, a substituted or unsubstituted (C6-C30)aryl, a substituted or unsubstituted (3- to 30-membered)heteroaryl, a substituted or unsubstituted (C3-C30)cycloalkyl, a substituted or unsubstituted (C1-C30)alkoxy, a substituted or unsubstituted tri(C1-C30)alkylsilyl, a substituted or unsubstituted di(C1-C30)alkyl(C6-C30)arylsilyl, a substituted or unsubstituted (C1-C30)alkyldi(C6-C30)arylsilyl, a substituted or unsubstituted tri(C6-C30)arylsilyl, a substituted or unsubstituted mono- or di-(C1-C30)alkylamino, a substituted or unsubstituted mono- or di-(C2-C30)alkenylamino, a substituted or unsubstituted mono- or di-(C6-C30)arylamino, a substituted or unsubstituted mono- or di-(3- to 30-membered)heteroarylamino, a substituted or unsubstituted (C1-C30)alkyl(C2-C30)alkenylamino, a substituted or unsubstituted (C1-C30)alkyl(C6-C30)arylamino, a substituted or unsubstituted (C1-C30)alkyl(3- to 30-membered)heteroarylamino, a substituted or unsubstituted (C2-C30)alkenyl(C6-C30)arylamino, a substituted or unsubstituted (C2-C30)alkenyl(3- to 30-membered)heteroarylamino, or a substituted or unsubstituted (C6-C30)aryl(3- to 30-membered)heteroarylamino.

According to one embodiment of the present disclosure, at least one of the light-emitting layer and the hole transport zone of the organic electroluminescent device may comprise a compound deuterated by at least 10%, preferably a compound deuterated by at least 30%, and more preferably a compound deuterated by at least 60%. The compound deuterated by at least 10% means that at least 10% of the hydrogen atoms in the non-deuterated compound are replaced with deuterium. That is, the deuterated compound of the present disclosure may be one in which at least 10%, preferably at least 30%, and more preferably at least 60% of the hydrogen atoms in the non-deuterated compound are replaced with deuterium. The higher the deuterated ratio, the greater the likelihood that the device lifetime can be improved.

According to one embodiment of the present disclosure, the hole transport zone may comprise a compound represented by the following formula 1.

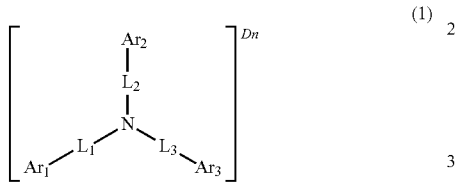

(1)

In formula 1, $Ar_1$ to $Ar_3$, each independently, represent hydrogen, deuterium, a halogen, a cyano, a substituted or unsubstituted (C1-C30)alkyl, a substituted or unsubstituted (C3-C30)cycloalkyl, a substituted or unsubstituted silyl, a substituted or unsubstituted (C6-C30)aryl, or a substituted or unsubstituted (3- to 30-membered)heteroaryl. According to one embodiment of the present disclosure, at least one of $Ar_1$ to $Ar_3$ represents a substituted or unsubstituted (C6-C30) aryl, or a substituted or unsubstituted (3- to 30-membered) heteroaryl. Preferably, at least one of $Ar_1$ to $Ar_3$ represents a substituted or unsubstituted phenanthrenyl, a substituted or unsubstituted carbazolyl, a substituted or unsubstituted fluorenyl, a substituted or unsubstituted benzofluorenyl, a substituted or unsubstituted triphenylenyl, a substituted or unsubstituted dibenzofuranyl, or a substituted or unsubstituted dibenzothiophenyl. According to another embodiment of the present disclosure, $Ar_1$ to $Ar_3$, each independently, represent a substituted or unsubstituted (C6-C25)aryl, or a substituted or unsubstituted (5- to 25-membered)heteroaryl. According to another embodiment of the present disclosure, $Ar_1$ to $Ar_3$, each independently, represent a (C6-C25)aryl unsubstituted or substituted with a (C1-C6)alkyl(s), or a (5- to 20-membered)heteroaryl unsubstituted or substituted with a (C6-C18)aryl(s). For example, $Ar_1$ to $Ar_3$, each independently, may be a phenyl, a naphthyl, a biphenyl, a dimethylfluorenyl, a diphenylfluorenyl, a dimethylbenzofluorenyl, a phenanthrenyl, a terphenyl, a dibenzofuranyl, a dibenzothiophenyl, or a carbazolyl unsubstituted or substituted with a phenyl(s), etc.

In formula 1, $L_1$ to $L_3$, each independently, represent a single bond, a substituted or unsubstituted (C6-C30)arylene, or a substituted or unsubstituted (3- to 30-membered)heteroarylene. According to one embodiment of the present disclosure, $L_1$ to $L_3$, each independently, represent a single bond, or a substituted or unsubstituted (C6-C25)arylene.

According to another embodiment of the present disclosure, $L_1$ to $L_3$, each independently, represent a single bond, or an unsubstituted (C6-C18)arylene. For example, $L_1$ to $L_3$, each independently, may be a single bond, a phenylene, or a biphenylene, etc.

According to one embodiment of the present disclosure, the hole transport zone comprises a compound represented by the following formula 2.

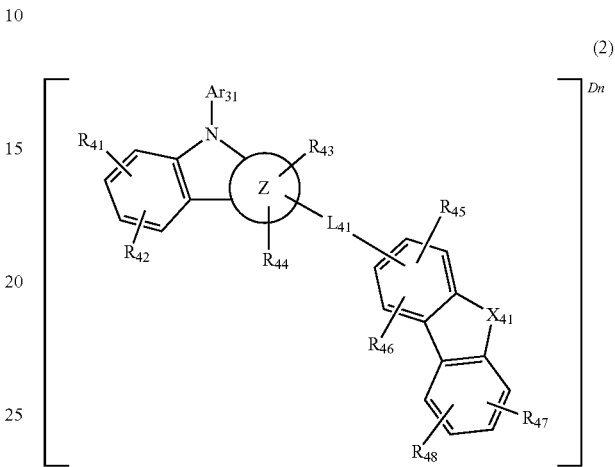

(2)

In formula 2, ring Z represents a benzene ring or a naphthalene ring.

In formula 2, $X_{41}$ represents —O—, —S—, —C($R_{51}$)($R_{52}$)—, or —N($R_{53}$)—. $R_{51}$ and $R_{52}$, each independently, represent hydrogen, deuterium, a halogen, a cyano, a substituted or unsubstituted (C1-C30)alkyl, a substituted or unsubstituted (C6-C30)aryl, a substituted or unsubstituted (3- to 30-membered)heteroaryl, a substituted or unsubstituted (C3-C30)cycloalkyl, a substituted or unsubstituted (C1-C30)alkoxy, a substituted or unsubstituted tri(C1-C30)alkylsilyl, a substituted or unsubstituted di(C1-C30)alkyl(C6-C30)arylsilyl, a substituted or unsubstituted (C1-C30)alkyldi(C6-C30)arylsilyl, a substituted or unsubstituted tri(C6-C30)arylsilyl, a substituted or unsubstituted mono- or di-(C1-C30)alkylamino, a substituted or unsubstituted mono- or di-(C2-C30)alkenylamino, a substituted or unsubstituted mono- or di-(C6-C30)arylamino, a substituted or unsubstituted mono- or di-(3- to 30-membered)heteroarylamino, a substituted or unsubstituted (C1-C30)alkyl(C2-C30)alkenylamino, a substituted or unsubstituted (C1-C30)alkyl(C6-C30)arylamino, a substituted or unsubstituted (C1-C30)alkyl(3- to 30-membered)heteroarylamino, a substituted or unsubstituted (C2-C30)alkenyl(C6-C30)arylamino, a substituted or unsubstituted (C2-C30)alkenyl(3- to 30-membered)heteroarylamino, or a substituted or unsubstituted (C6-C30)aryl(3- to 30-membered)heteroarylamino; or $R_{51}$ and $R_{52}$ may be linked to each other to form a ring(s). $R_{51}$ and $R_{52}$ may be the same as or different from each other. According to one embodiment of the present disclosure, $R_{51}$ and $R_{52}$, each independently, represent a substituted or unsubstituted (C1-C20)alkyl, or a substituted or unsubstituted (C6-C25)aryl; or $R_{51}$ and $R_{52}$ may be linked to each other to form a ring(s). According to another embodiment of the present disclosure, $R_{51}$ and $R_{52}$, each independently, represent an unsubstituted (C1-C10)alkyl, or an unsubstituted (C6-C18)aryl; or $R_{51}$ and $R_{52}$ may be linked to each other to form a substituted or unsubstituted fluorene ring. For example, $R_{51}$ and $R_{52}$, each independently, may be a methyl; or $R_{51}$ and $R_{52}$ may be linked to each other to form a spirobifluorene ring together with the backbone.

$R_{53}$ represents hydrogen, deuterium, a halogen, a cyano, a substituted or unsubstituted (C1-C30)alkyl, a substituted or unsubstituted (C6-C30)aryl, a substituted or unsubstituted (3- to 30-membered)heteroaryl, a substituted or unsubstituted (C3-C30)cycloalkyl, a substituted or unsubstituted (C1-C30)alkoxy, a substituted or unsubstituted tri(C1-C30)alkylsilyl, a substituted or unsubstituted di(C1-C30)alkyl(C6-C30)arylsilyl, a substituted or unsubstituted (C1-C30)alkyldi(C6-C30)arylsilyl, a substituted or unsubstituted tri(C6-C30)arylsilyl, a substituted or unsubstituted mono- or di-(C1-C30)alkylamino, a substituted or unsubstituted mono- or di-(C2-C30)alkenylamino, a substituted or unsubstituted mono- or di-(C6-C30)arylamino, a substituted or unsubstituted mono- or di-(3- to 30-membered)heteroarylamino, a substituted or unsubstituted (C1-C30)alkyl(C2-C30)alkenylamino, a substituted or unsubstituted (C1-C30)alkyl(C6-C30)arylamino, a substituted or unsubstituted (C1-C30)alkyl(3- to 30-membered)heteroarylamino, a substituted or unsubstituted (C2-C30)alkenyl(C6-C30)arylamino, a substituted or unsubstituted (C2-C30)alkenyl(3- to 30-membered)heteroarylamino, or a substituted or unsubstituted (C6-C30)aryl(3- to 30-membered)heteroarylamino. According to one embodiment of the present disclosure, $R_{53}$ represents a substituted or unsubstituted (C6-C30)aryl, or a substituted or unsubstituted (3- to 30-membered)heteroaryl. According to another embodiment of the present disclosure, $R_{53}$ represents a (C6-C25)aryl unsubstituted or substituted with a di(C6-C18)arylamino(s). For example, $R_{53}$ may be a phenyl unsubstituted or substituted with a diphenylamino, a naphthyl, a biphenyl, a phenylnaphthyl, or a naphthylphenyl, etc.

In formula 2, $L_{41}$ represents a single bond, a substituted or unsubstituted (C6-C30)arylene, or a substituted or unsubstituted (3- to 30-membered)heteroarylene. According to one embodiment of the present disclosure, $L_{41}$ represents a single bond, or a substituted or unsubstituted (C6-C25)arylene. According to another embodiment of the present disclosure, $L_{41}$ represents a single bond, or an unsubstituted (C6-C18)arylene. For example, $L_{41}$ may be a single bond, a phenylene, or a naphthylene, etc.

In formula 2, $Ar_{31}$ represents a substituted or unsubstituted (C6-C30)aryl. According to one embodiment of the present disclosure, $Ar_{31}$ represents a substituted or unsubstituted (C6-C25)aryl. According to another embodiment of the present disclosure, $Ar_{31}$ represents an unsubstituted (C6-C18)aryl. For example, $Ar_{31}$ may be a phenyl, a naphthyl, a biphenyl, a phenylnaphthyl, or a naphthylphenyl, etc.

In formula 2, $R_{41}$ to $R_{48}$, each independently, represent hydrogen, deuterium, a substituted or unsubstituted (C1-C30)alkyl, a substituted or unsubstituted (C6-C30)aryl, a substituted or unsubstituted (3- to 30-membered)heteroaryl, a substituted or unsubstituted (C3-C30)cycloalkyl, a substituted or unsubstituted tri(C1-C30)alkylsilyl, a substituted or unsubstituted di(C1-C30)alkyl(C6-C30)arylsilyl, a substituted or unsubstituted (C1-C30)alkyldi(C6-C30)arylsilyl, a substituted or unsubstituted tri(C6-C30)arylsilyl, a substituted or unsubstituted mono- or di-(C1-C30)alkylamino, a substituted or unsubstituted mono- or di-(C2-C30)alkenylamino, a substituted or unsubstituted mono- or di-(C6-C30)arylamino, a substituted or unsubstituted mono- or di-(3- to 30-membered)heteroarylamino, a substituted or unsubstituted (C1-C30)alkyl(C2-C30)alkenylamino, a substituted or unsubstituted (C1-C30)alkyl(C6-C30)arylamino, a substituted or unsubstituted (C1-C30)alkyl(3- to 30-membered)heteroarylamino, a substituted or unsubstituted (C2-C30)alkenyl(C6-C30)arylamino, a substituted or unsubstituted (C2-C30)alkenyl(3- to 30-membered)heteroarylamino, or a substituted or unsubstituted (C6-C30)aryl(3- to 30-membered)heteroarylamino; or two or more adjacent ones of $R_{41}$ to $R_{48}$ may be linked to each other to form a ring(s). According to one embodiment of the present disclosure, $R_{41}$ to $R_{48}$, each independently, represent hydrogen, deuterium, a substituted or unsubstituted (C6-C25)aryl, or a substituted or unsubstituted (5- to 25-membered)heteroaryl; or two or more adjacent ones of $R_{41}$ to $R_{48}$ may be linked to each other to form a ring(s). According to another embodiment of the present disclosure, $R_{41}$ to $R_{48}$, each independently, represent hydrogen, or a (5- to 20-membered)heteroaryl unsubstituted or substituted with a (C6-C18)aryl(s); or two or more adjacent ones of $R_{41}$ to $R_{48}$ may be linked to each other to form a benzene ring. For example, $R_{41}$ to $R_{48}$, each independently, may be hydrogen, or a carbazolyl substituted with a phenyl(s); $R_{41}$ and $R_{42}$ are linked to each other to form a benzene ring; $R_{43}$ and $R_{44}$ are linked to each other to form a benzene ring; $R_{46}$ and $R_{48}$ are linked to each other to form a benzene ring; or $R_{47}$ and $R_{48}$ are linked to each other to form a benzene ring.

According to one embodiment of the present disclosure, the hole transport zone comprises a compound represented by the following formula 3.

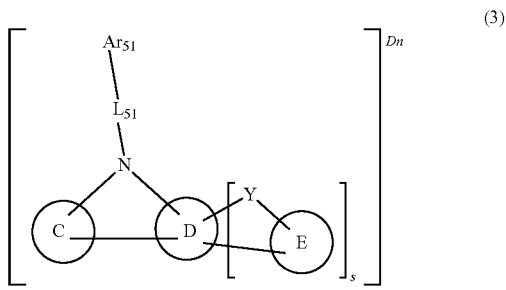

In formula 3, ring C, ring D, and ring E, each independently, represent a substituted or unsubstituted benzene ring, or a substituted or unsubstituted naphthalene ring. According to one embodiment of the present disclosure, ring C, ring D, and ring E, each independently, represent an unsubstituted benzene ring, or an unsubstituted naphthalene ring.

In formula 3, Y represents —O—, —S—, or —N(Ra)—; and Ra represents -$L_{52}$-$Ar_{52}$. According to one embodiment of the present disclosure, Y represents —N(Ra)—.

$Ar_{31}$ and $Ar_{32}$, each independently, represent a substituted or unsubstituted (C6-C30)aryl, a substituted or unsubstituted (3- to 30-membered)heteroaryl containing at least one of nitrogen, oxygen and sulfur, a substituted or unsubstituted di(C6-C30)arylamino, a substituted or unsubstituted mono- or di-(3- to 30-membered)heteroarylamino, or a substituted or unsubstituted (C6-C30)aryl(3- to 30-membered)heteroarylamino. According to one embodiment of the present disclosure, $Ar_{31}$ and $Ar_{32}$, each independently, represent a substituted or unsubstituted (C6-C25)aryl. According to another embodiment of the present disclosure, $Ar_{51}$ and $Ar_{52}$, each independently, represent an unsubstituted (C6-C18)aryl. For example, $Ar_{51}$ and $Ar_{52}$, each independently, may be a phenyl, or a naphthyl, etc.

$L_{51}$ and $L_{52}$, each independently, represent a single bond, a substituted or unsubstituted (C6-C30)arylene, or a substituted or unsubstituted (3- to 30-membered)heteroarylene. According to one embodiment of the present disclosure, $L_{51}$ and $L_{52}$, each independently, represent a single bond, or a substituted or unsubstituted (C6-C25)arylene. According to another embodiment of the present disclosure, $L_{51}$ and $L_{52}$, each independently, represent a single bond, or an unsubstituted (C6-C18)arylene. For example, $L_{51}$ and $L_{52}$, each independently, may be a single bond, or a phenylene, etc.

In formula 3, s represents an integer of 0 or 1. According to one embodiment of the present disclosure, s represents an integer of 1.

According to one embodiment of the present disclosure, the light-emitting layer of the present disclosure comprises a compound represented by the following formula 4.

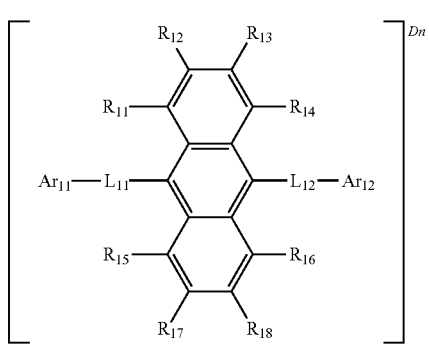

(4)

In formula 4, 11 and $L_{12}$, each independently, represent a single bond, a substituted or unsubstituted (C6-C30)arylene, or a substituted or unsubstituted (3- to 30-membered)heteroarylene. According to one embodiment of the present disclosure, $L_{11}$ and $L_{12}$, each independently, represent a single bond, a substituted or unsubstituted (C6-C25)arylene, or a substituted or unsubstituted (5- to 25-membered)heteroarylene. According to another embodiment of the present disclosure, $L_{11}$ and $L_{12}$, each independently, represent a single bond, an unsubstituted (C6-C18)arylene, or a (5- to 20-membered)heteroarylene unsubstituted or substituted with a (C1-C6)alkyl(s). For example, $L_{11}$ and $L_{12}$, each independently, may be a single bond, a phenylene, a naphthylene, a biphenylene, a phenanthrenylene, a dibenzofuranylene, a dimethylbenzofluorenylene, a carbazolylene, a benzocarbazolylene, or a phenanthrooxazolylene, etc.

In formula 4, $Ar_{11}$ and $Ar_{12}$, each independently, represent a substituted or unsubstituted (C6-C30)aryl, or a substituted or unsubstituted (3- to 30-membered)heteroaryl. According to one embodiment of the present disclosure, $Ar_{11}$ and $Ar_{12}$, each independently, represent a substituted or unsubstituted (C6-C25)aryl, or a substituted or unsubstituted (5- to 25-membered)heteroaryl. According to another embodiment of the present disclosure, $Ar_{11}$ and $Ar_{12}$, each independently, represent a (C6-C18)aryl unsubstituted or substituted with at least one of a (C1-C10)alkyl(s) and a (C6-C18)aryl(s), or a (5- to 25-membered)heteroaryl unsubstituted or substituted with a (C6-C18)aryl(s). For example, $Ar_{11}$ and $Ar_{12}$, each independently, may be a phenyl unsubstituted or substituted with a tert-butyl(s); a naphthyl; a naphthylphenyl; a phenylnaphthyl; a biphenyl; a phenanthrenyl; a dimethylbenzofluorenyl unsubstituted or substituted with a phenyl(s); a diphenylbenzofluorenyl; a terphenyl; a furanyl substituted with a phenyl(s); a pyridyl substituted with a phenyl(s); a benzofuranyl; a dibenzofuranyl unsubstituted or substituted with a phenyl(s), a naphthyl(s) and/or a biphenyl(s); a dibenzothiophenyl; a carbazolyl unsubstituted or substituted with a phenyl(s) and/or a naphthyl(s); a benzocarbazolyl substituted with a phenyl(s) and/or a naphthyl(s); a benzonaphthofuranyl unsubstituted or substituted with a phenyl(s); a phenanthrooxazolyl substituted with a phenyl(s); a triphenylenofuranyl; a benzothienocarbazolyl unsubstituted or substituted with a phenyl(s); a benzofurodibenzothiophenyl; a benzofurocarbazolyl unsubstituted or substituted with a phenyl(s); a benzobisbenzothiophenyl; a dinaphthofuranyl; a benzophenanthrofuranyl; a dibenzocarbazolyl unsubstituted or substituted with a phenyl(s); or a benzofurobenzocarbazolyl substituted with a phenyl(s), etc.

In formula 4, $R_{11}$ to $R_{18}$, each independently, represent hydrogen, deuterium, a halogen, a cyano, a substituted or unsubstituted (C1-C30)alkyl, a substituted or unsubstituted (C6-C30)aryl, a substituted or unsubstituted (3- to 30-membered)heteroaryl, a substituted or unsubstituted (C3-C30)cycloalkyl, a substituted or unsubstituted (C1-C30)alkoxy, a substituted or unsubstituted tri(C1-C30)alkylsilyl, a substituted or unsubstituted di(C1-C30)alkyl(C6-C30)arylsilyl, a substituted or unsubstituted (C1-C30)alkyldi(C6-C30)arylsilyl, a substituted or unsubstituted tri(C6-C30)arylsilyl, a substituted or unsubstituted mono- or di-(C1-C30)alkylamino, a substituted or unsubstituted mono- or di-(C6-C30)arylamino, a substituted or unsubstituted mono- or di-(C2-C30)alkenylamino, a substituted or unsubstituted mono- or di-(3- to 30-membered)heteroarylamino, a substituted or unsubstituted (C1-C30)alkyl(C2-C30)alkenylamino, a substituted or unsubstituted (C1-C30)alkyl(C6-C30)arylamino, a substituted or unsubstituted (C1-C30)alkyl(3- to 30-membered)heteroarylamino, a substituted or unsubstituted (C2-C30)alkenyl(C6-C30)arylamino, a substituted or unsubstituted (C2-C30)alkenyl(3- to 30-membered)heteroarylamino, or a substituted or unsubstituted (C6-C30)aryl(3- to 30-membered)heteroarylamino. For example, $R_{11}$ to $R_{18}$ may be hydrogen.

According to one embodiment of the present disclosure, the organic electroluminescent device of the present disclosure comprises a light-emitting layer comprising a first host material and a second host material, wherein the first host material comprises at least one compound represented by formula 4, and both the first host material and the second host material may comprise one or more deuterium. According to another embodiment of the present disclosure, the organic electroluminescent device of the present disclosure comprises a light-emitting layer comprising a first host material and a second host material, wherein the compound represented by formula 4 may be included in each of the first host material and the second host material, with a proviso that the compounds represented by formula 4, respectively, included in the first host material and the second host material are different from each other.

According to one embodiment of the present disclosure, the organic electroluminescent device of the present disclosure comprises a light-emitting layer comprising a first host material and a second host material, wherein the first host material comprises a compound represented by formula 4, the second host material comprises a compound represented by the following formula 5, and at least one of the first host material and the second host material comprises one or more deuterium.

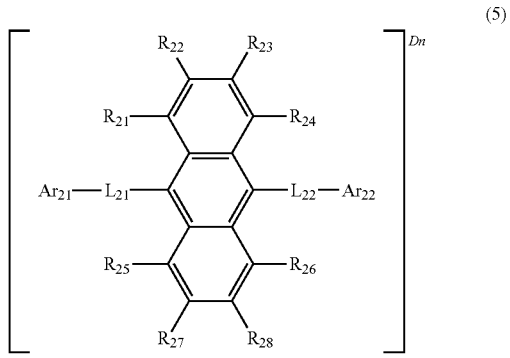

(5)

In formula 5, $L_{21}$ and $L_{22}$, each independently, represent a single bond, a substituted or unsubstituted (C6-C30)arylene, or a substituted or unsubstituted (3- to 30-membered)heteroarylene. According to one embodiment of the present disclosure, $L_{21}$ and $L_{22}$, each independently, represent a single bond, or a substituted or unsubstituted (C6-C25)arylene. According to another embodiment of the present disclosure, $L_{21}$ and $L_{22}$, each independently, represent a single bond, or an unsubstituted (C6-C18)arylene. For example, $L_{21}$ and $L_{22}$, each independently, may be a single bond, a phenylene, or a naphthylene, etc.

In formula 5, $Ar_{21}$ represents a substituted or unsubstituted (C6-C30)aryl, or a substituted or unsubstituted (3- to 30-membered)heteroaryl. According to one embodiment of the present disclosure, $Ar_{21}$ represents a substituted or unsubstituted (C6-C25)aryl. According to another embodiment of the present disclosure, $Ar_{21}$ represents a (C6-C18) aryl unsubstituted or substituted with a (C1-C6)alkyl(s). For example, $Ar_{21}$ may be a phenyl unsubstituted or substituted with a tert-butyl(s), a naphthyl, a biphenyl, a dimethylbenzofluorenyl, or a terphenyl, etc.

In formula 5, $Ar_{22}$ represents any one of the following formulas, and * represents a binding site with $L_{22}$.

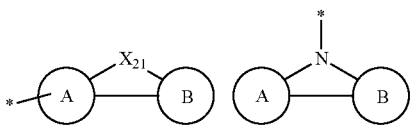

Ring A and ring B, each independently, represent a substituted or unsubstituted benzene ring, a substituted or unsubstituted naphthalene ring, or a substituted or unsubstituted phenanthrene ring. The substituent(s) of the substituted benzene ring, the substituted naphthalene ring, and the substituted phenanthrene ring, each independently, may be a (C6-C18)aryl, e.g., a phenyl, a naphthyl, or a biphenyl, etc. According to one embodiment of the present disclosure, at least one of ring A and ring B represents a substituted or unsubstituted naphthalene ring. For example, ring A and ring B, each independently, may be a benzene ring unsubstituted or substituted with a phenyl(s), a naphthyl(s), or a biphenyl(s); a naphthalene ring unsubstituted or substituted with a phenyl(s); or an unsubstituted phenanthrene ring.

$X_{21}$ represents —O—, —S—, —C($R_{31}$)($R_{32}$)—, or —N($R_{33}$)—. $R_{31}$ and $R_{32}$, each independently, represent hydrogen, deuterium, a halogen, a cyano, a substituted or unsubstituted (C1-C30)alkyl, a substituted or unsubstituted (C6-C30)aryl, a substituted or unsubstituted (3- to 30-membered)heteroaryl, a substituted or unsubstituted (C3-C30)cycloalkyl, a substituted or unsubstituted (C1-C30)alkoxy, a substituted or unsubstituted tri(C1-C30)alkylsilyl, a substituted or unsubstituted di(C1-C30)alkyl(C6-C30)arylsilyl, a substituted or unsubstituted (C1-C30)alkyldi(C6-C30)arylsilyl, a substituted or unsubstituted tri(C6-C30)arylsilyl, a substituted or unsubstituted mono- or di-(C1-C30)alkylamino, a substituted or unsubstituted mono- or di-(C2-C30)alkenylamino, a substituted or unsubstituted mono- or di-(C6-C30)arylamino, a substituted or unsubstituted mono- or di-(3- to 30-membered)heteroarylamino, a substituted or unsubstituted (C1-C30)alkyl(C2-C30)alkenylamino, a substituted or unsubstituted (C1-C30)alkyl(C6-C30)arylamino, a substituted or unsubstituted (C1-C30)alkyl(3- to 30-membered)heteroarylamino, a substituted or unsubstituted (C2-C30)alkenyl(C6-C30)arylamino, a substituted or unsubstituted (C2-C30)alkenyl(3- to 30-membered)heteroarylamino, or a substituted or unsubstituted (C6-C30)aryl(3- to 30-membered)heteroarylamino; or $R_{31}$ and $R_{32}$ may be linked to each other to form a ring(s). $R_{31}$ and $R_{32}$ may be the same as or different from each other. According to one embodiment of the present disclosure, $R_{31}$ and $R_{32}$, each independently, represent a substituted or unsubstituted (C1-C20)alkyl, or a substituted or unsubstituted (C6-C25) aryl. According to another embodiment of the present disclosure, $R_{31}$ and $R_{32}$, each independently, represent an unsubstituted (C1-C10)alkyl, or an unsubstituted (C6-C18) aryl. For example, $R_{31}$ and $R_{32}$, each independently, may be a methyl or a phenyl, etc., and $R_{51}$ and $R_{32}$ may be the same as each other.

$R_{33}$ represents hydrogen, deuterium, a halogen, a cyano, a substituted or unsubstituted (C1-C30)alkyl, a substituted or unsubstituted (C6-C30)aryl, a substituted or unsubstituted (3- to 30-membered)heteroaryl, a substituted or unsubstituted (C3-C30)cycloalkyl, a substituted or unsubstituted (C1-C30)alkoxy, a substituted or unsubstituted tri(C1-C30)alkylsilyl, a substituted or unsubstituted di(C1-C30)alkyl(C6-C30)arylsilyl, a substituted or unsubstituted (C1-C30)alkyldi(C6-C30)arylsilyl, a substituted or unsubstituted tri(C6-C30)arylsilyl, a substituted or unsubstituted mono- or di-(C1-C30)alkylamino, a substituted or unsubstituted mono- or di-(C2-C30)alkenylamino, a substituted or unsubstituted mono- or di-(C6-C30)arylamino, a substituted or unsubstituted mono- or di-(3- to 30-membered)heteroarylamino, a substituted or unsubstituted (C1-C30)alkyl(C2-C30)alkenylamino, a substituted or unsubstituted (C1-C30)alkyl(C6-C30)arylamino, a substituted or unsubstituted (C1-C30)alkyl(3- to 30-membered)heteroarylamino, a substituted or unsubstituted (C2-C30)alkenyl(C6-C30)arylamino, a substituted or unsubstituted (C2-C30)alkenyl(3- to 30-membered)heteroarylamino, or a substituted or unsubstituted (C6-C30)aryl(3- to 30-membered)heteroarylamino. According to one embodiment of the present disclosure, $R_{33}$ represents a substituted or unsubstituted (C6-C25)aryl, or a substituted or unsubstituted (5- to 25-membered)heteroaryl. According to another embodiment of the present disclosure, $R_{33}$ represents an unsubstituted (C6-C18)aryl. For example, $R_{33}$ may be a phenyl, or a naphthyl, etc.

In formula 5, $R_{21}$ to $R_{28}$, each independently, represent hydrogen, deuterium, a halogen, a cyano, a substituted or unsubstituted (C1-C30)alkyl, a substituted or unsubstituted (C6-C30)aryl, a substituted or unsubstituted (3- to 30-membered)heteroaryl, a substituted or unsubstituted (C3-C30) cydoalkyl, a substituted or unsubstituted (C1-C30)alkoxy, a substituted or unsubstituted tri(C1-C30)alkylsilyl, a substituted or unsubstituted di(C1-C30)alkyl(C6-C30)arylsilyl, a substituted or unsubstituted (C1-C30)alkyldi(C6-C30)arylsilyl, a substituted or unsubstituted tri(C6-C30)arylsilyl, a substituted or unsubstituted mono- or di-(C1-C30)alkylamino, a substituted or unsubstituted mono- or di-(C2-C30)alkenylamino, a substituted or unsubstituted mono- or di-(C6-C30)arylamino, a substituted or unsubstituted mono- or di-(3- to 30-membered)heteroarylamino, a substituted or unsubstituted (C1-C30)alkyl(C2-C30)alkenylamino, a substituted or unsubstituted (C1-C30)alkyl(C6-C30)arylamino, a substituted or unsubstituted (C1-C30)alkyl(3- to 30-membered)heteroarylamino, a substituted or unsubstituted (C2-C30)alkenyl(C6-C30)arylamino, a substituted or unsubstituted (C2-C30)alkenyl(3- to 30-membered)heteroarylamino, or a substituted or unsubstituted (C6-C30)aryl(3- to 30-membered)heteroarylamino. For example, $R_{21}$ to $R_{28}$ may be hydrogen.

In formulas 1 to 5, Dn represents that n hydrogens are replaced with deuterium. In formulas 1 to 5, n, each independently, represents an integer of 0 to 50. According to one embodiment of the present disclosure, in formulas 1 to 5, n, each independently, represents an integer of 1 to 50. In formulas 1 to 5, n represents preferably an integer of 4 to 50, and more preferably an integer of 8 to 50. When being deuterated with a number equal to or greater than the lower limit, the bond dissociation energy related to deuteration is sufficiently increased, and the effect of lifetime properties is remarkable. The upper limit is determined according to the number of hydrogens that can be substituted in each compound.

The compound represented by formula 1 may be at least one selected from the group consisting of the following compounds, but is not limited thereto.

C-1

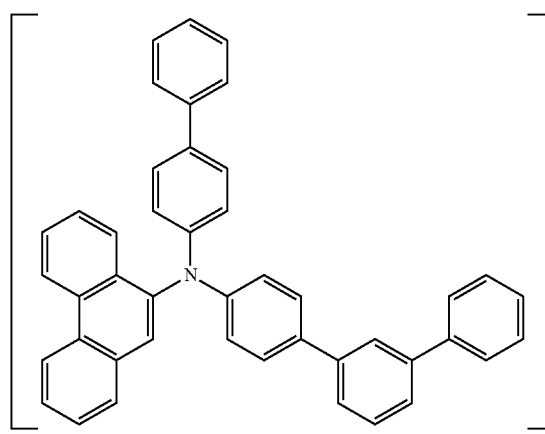

C-2

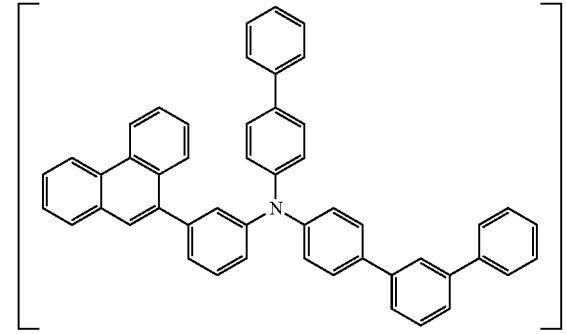

C-3

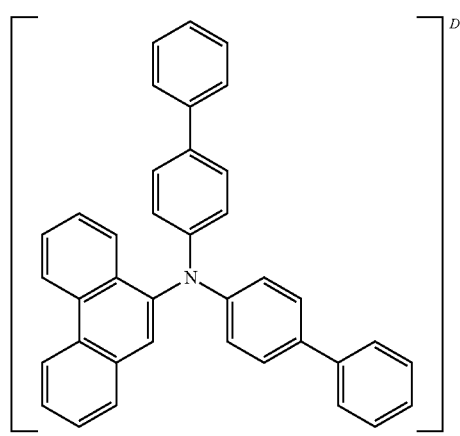

C-4

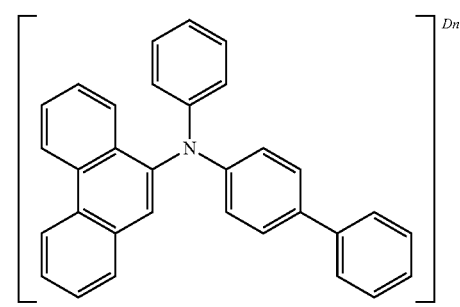

-continued
C-5
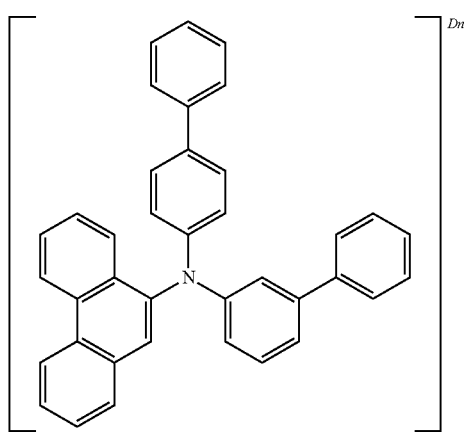
C-6
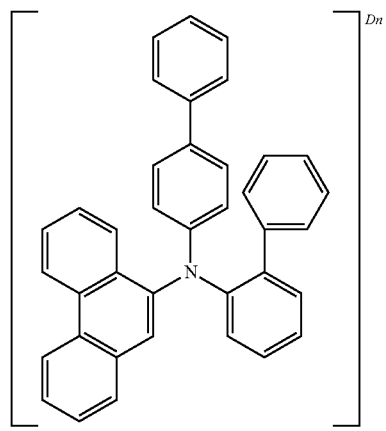
C-7
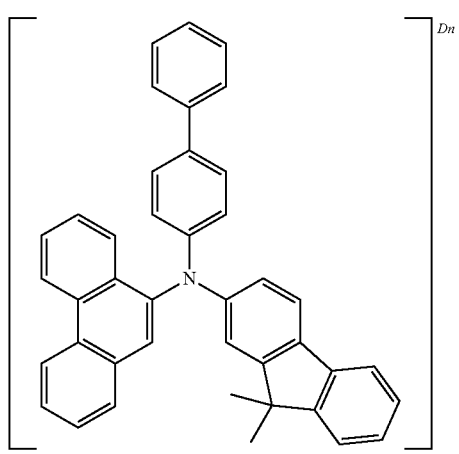
C-8
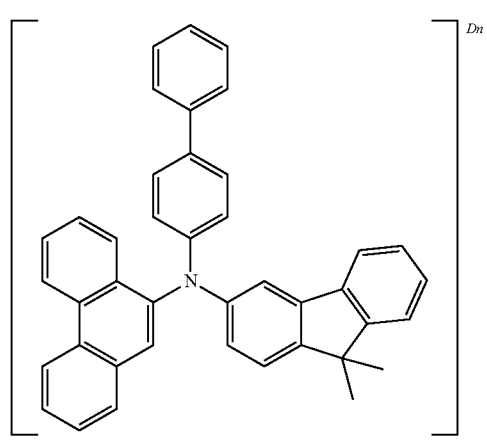
C-9
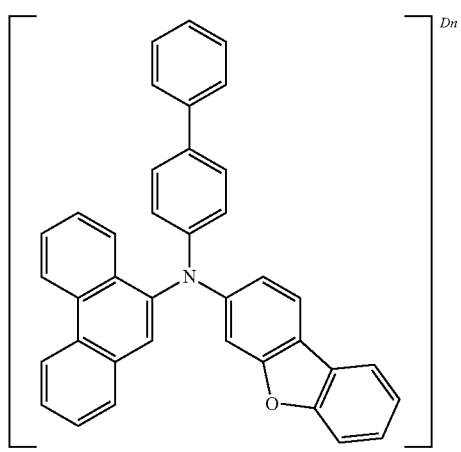
C-10
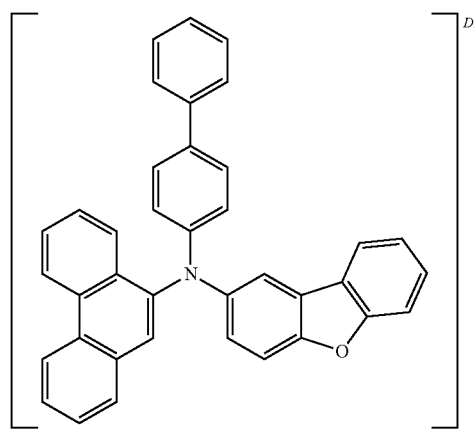

-continued
C-11
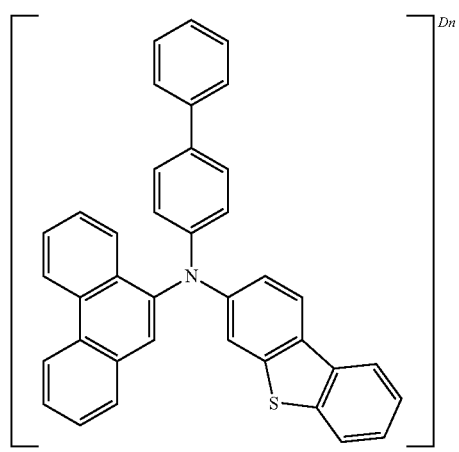
C-12
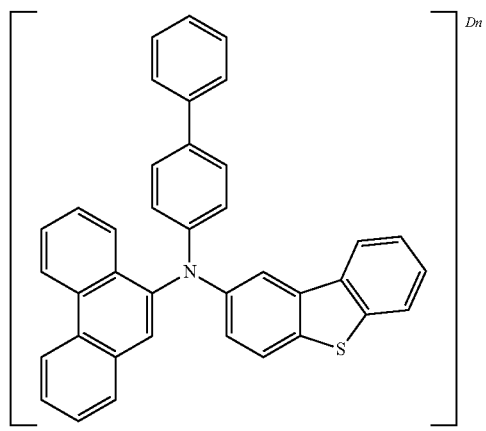
C-13
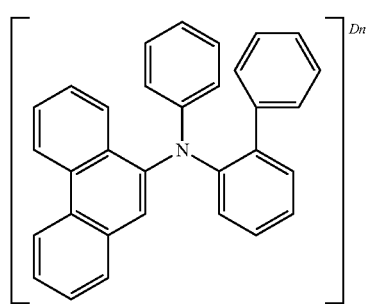
C-14
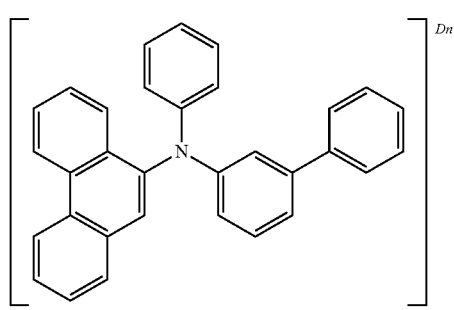
C-15
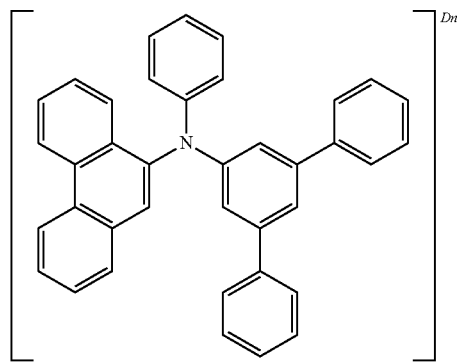
C-16
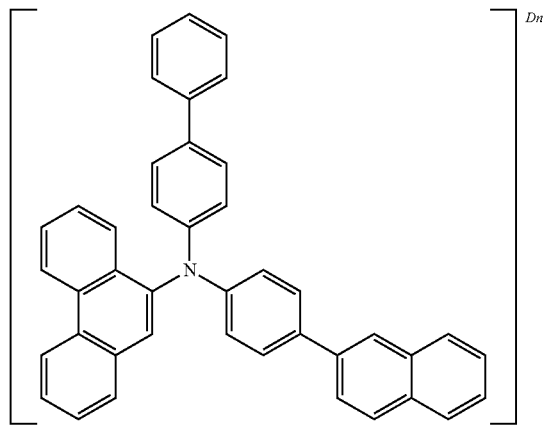
C-17
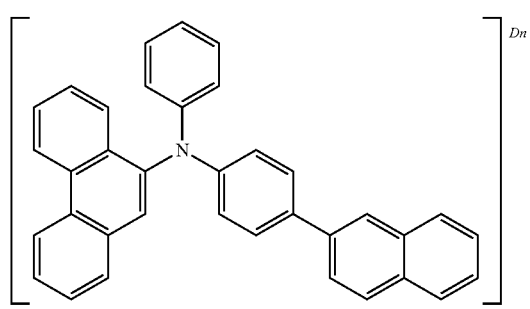
C-18
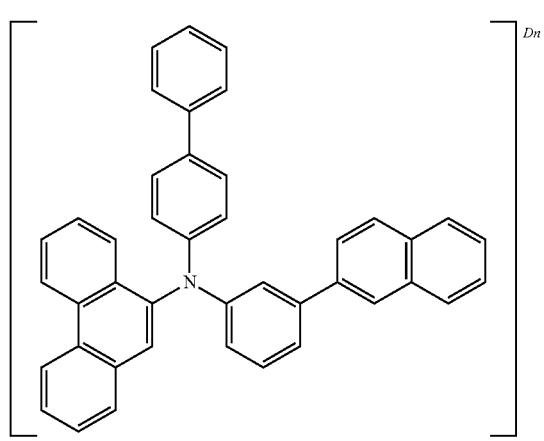

-continued
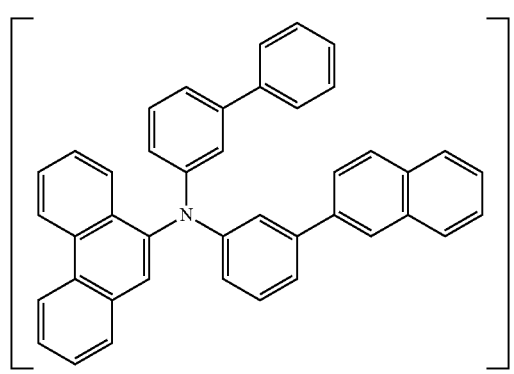
C-19
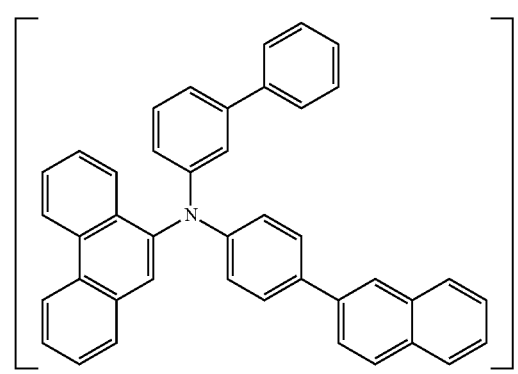
C-20
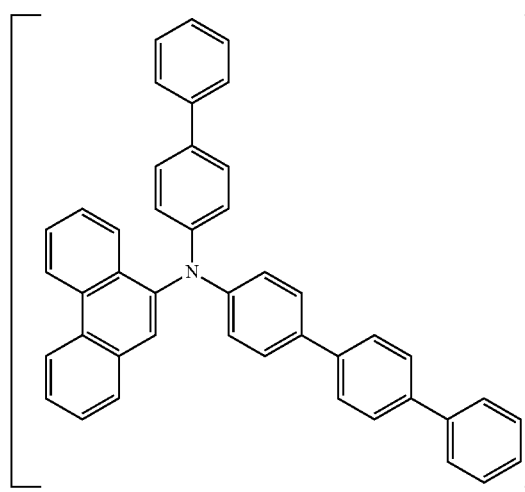
C-21
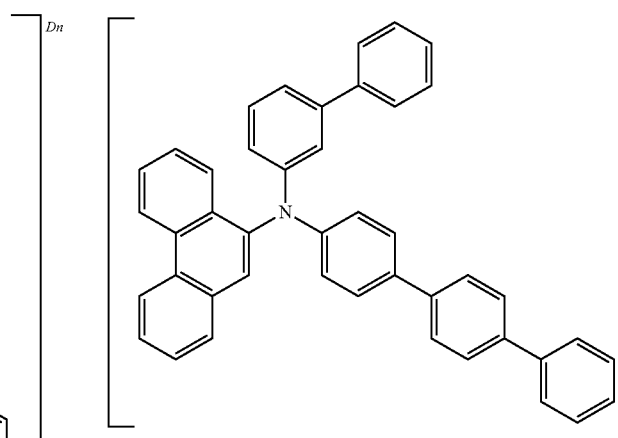
C-22
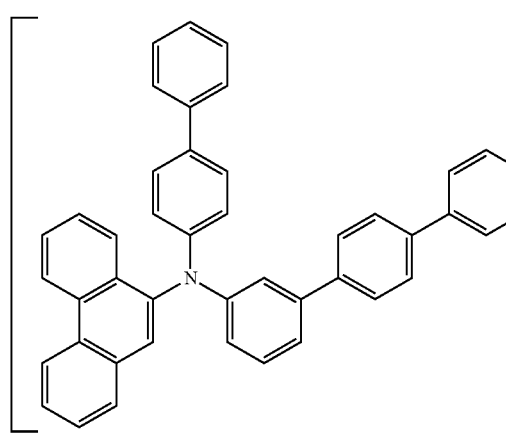
C-23
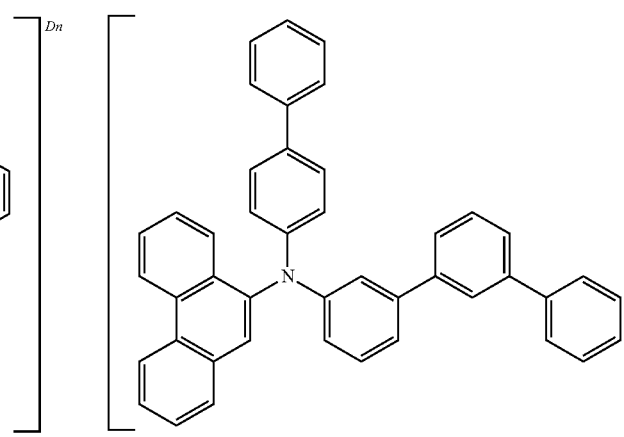
C-24

-continued
C-25
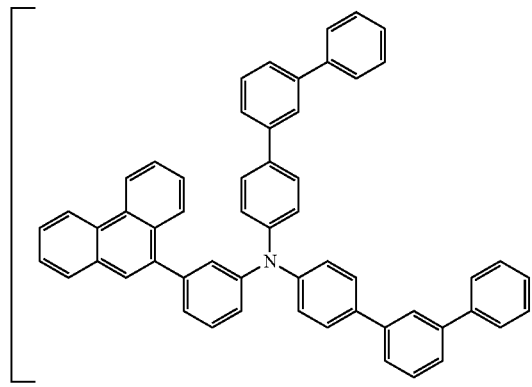
C-26
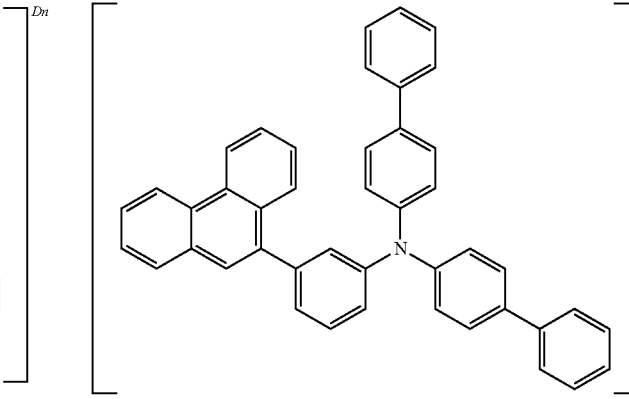
C-27
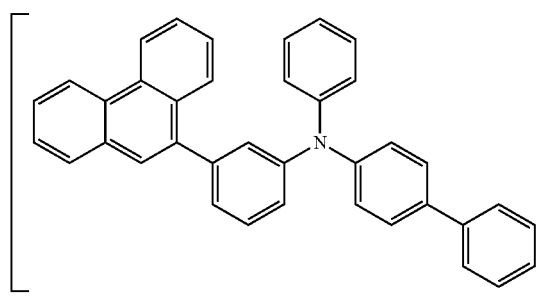
C-28
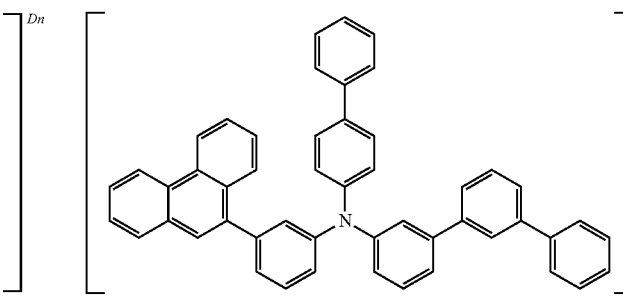
C-29
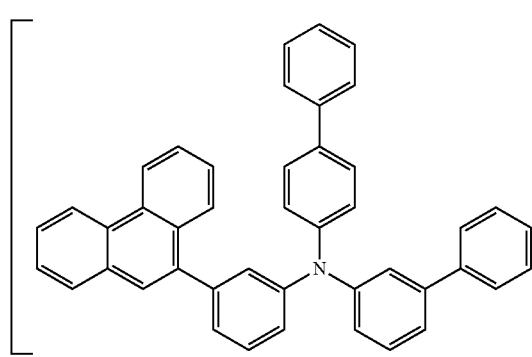
C-30
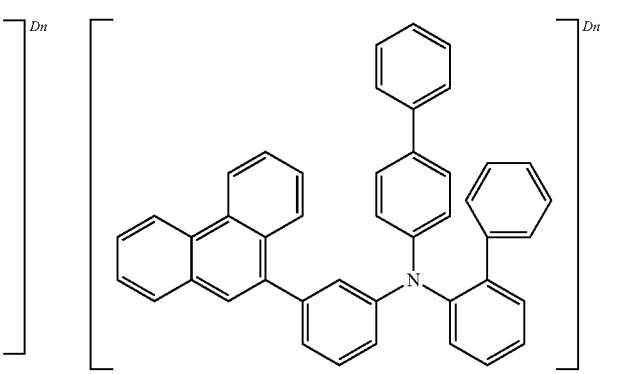
C-31
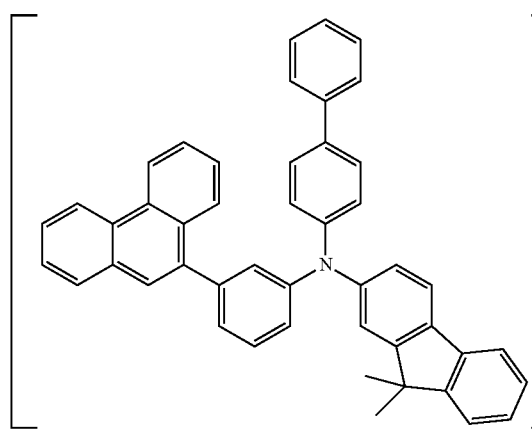
C-32

-continued
C-33
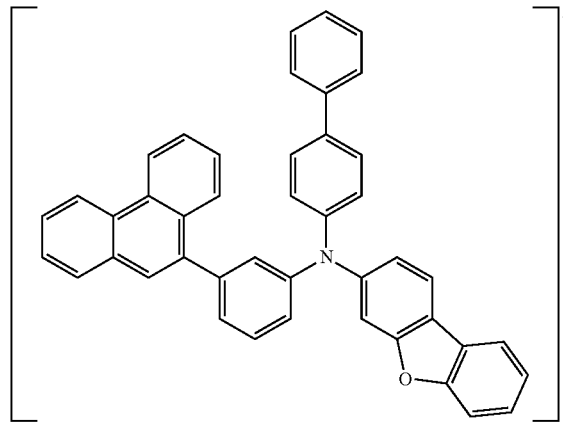
C-34
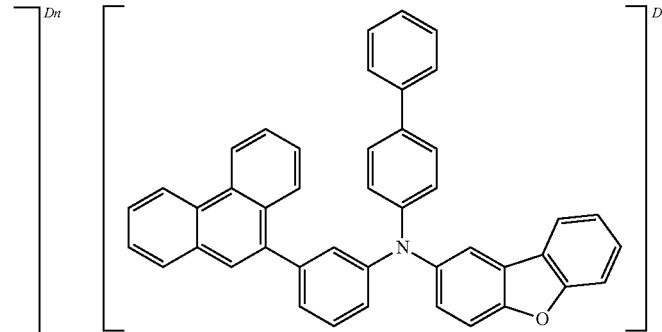
C-35
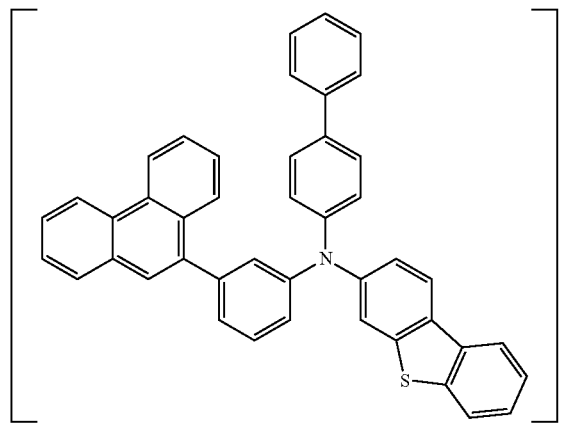
C-36
C-37
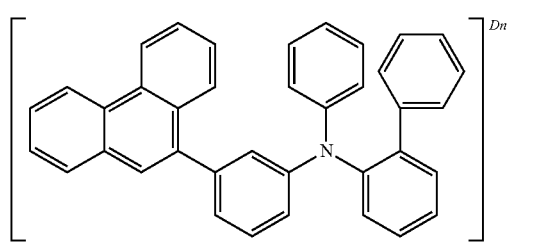
C-38
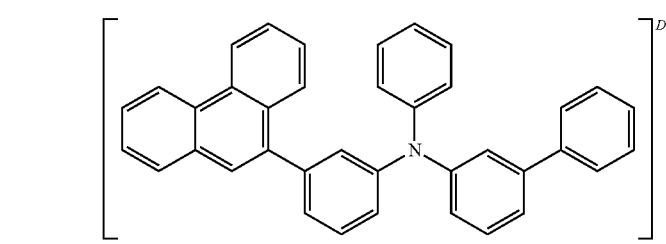
C-39
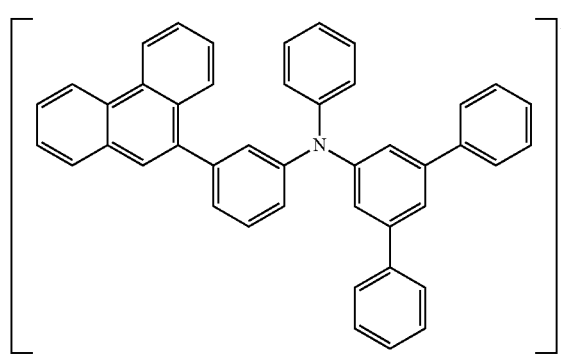
C-40
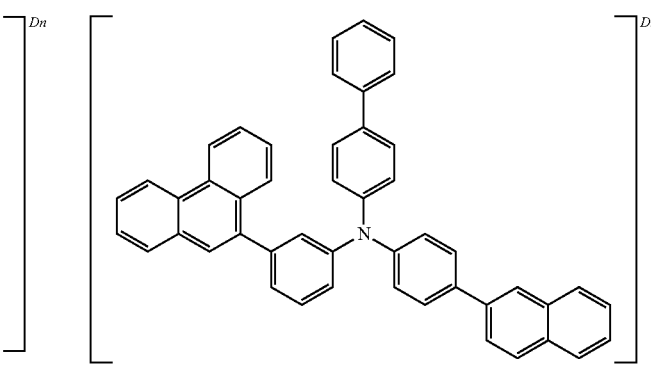

-continued
C-41
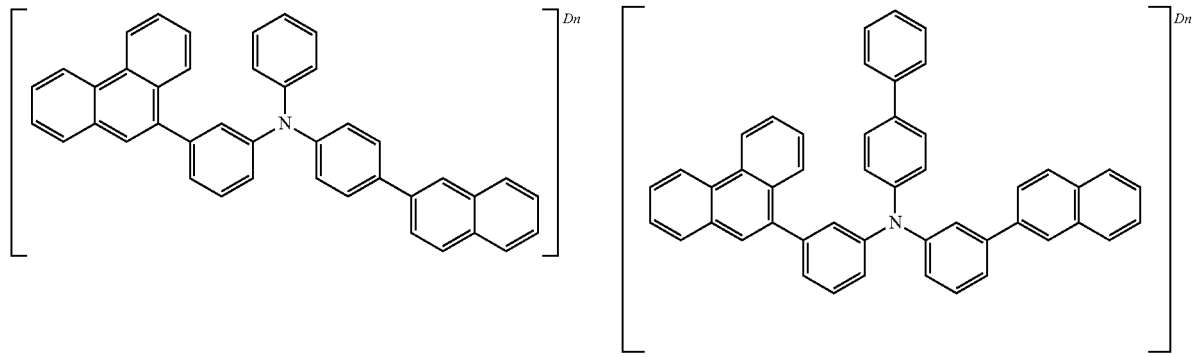
C-42
C-43
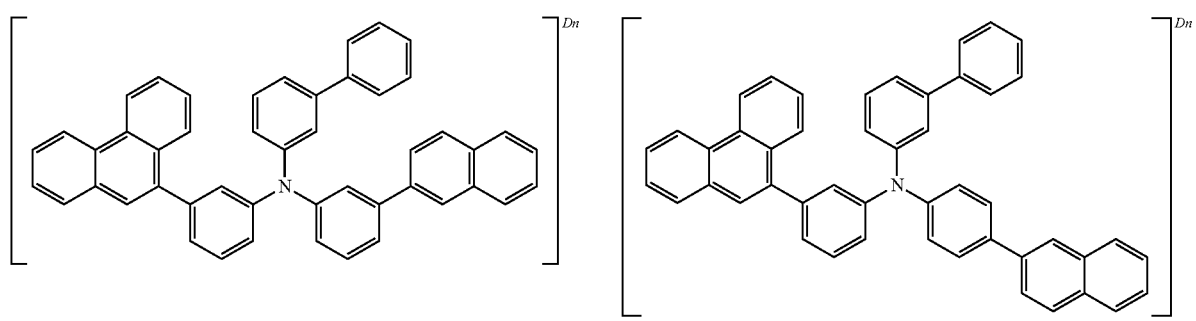
C-44
C-45
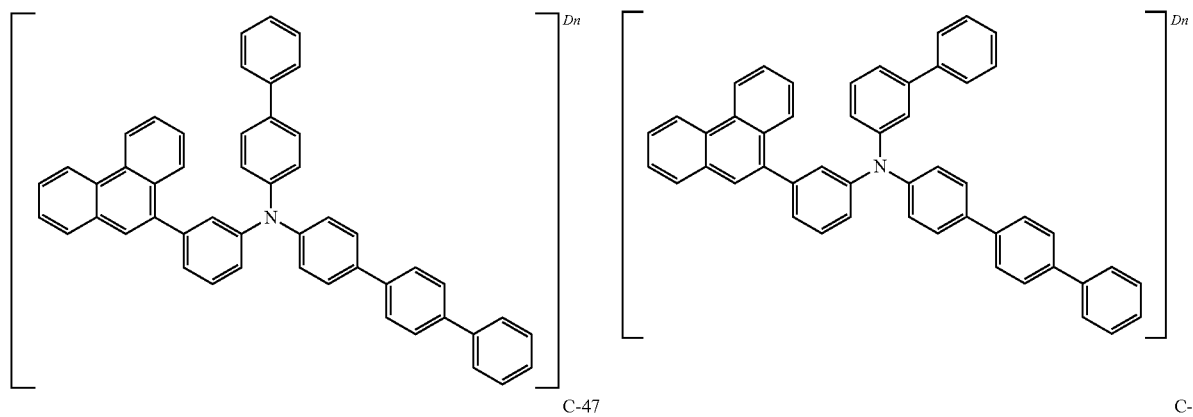
C-46
C-47
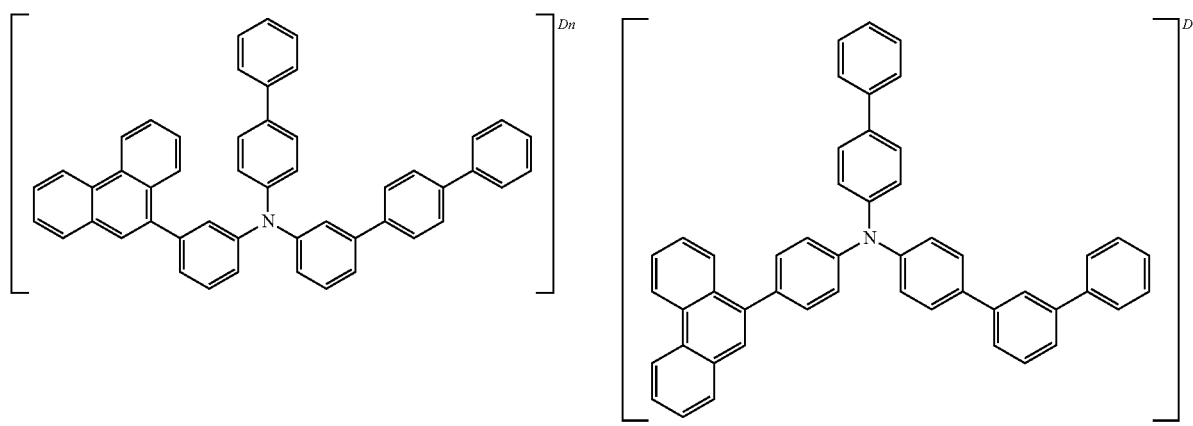
C-48

-continued
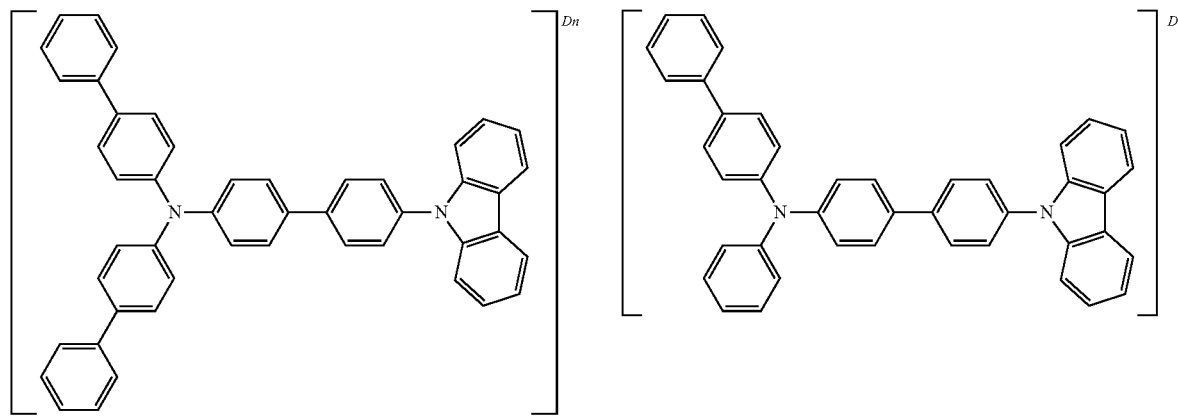
C-49  C-50
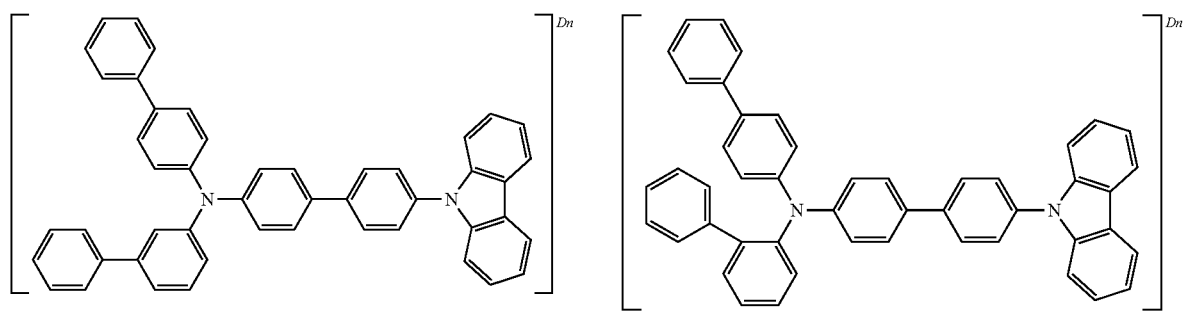
C-51  C-52
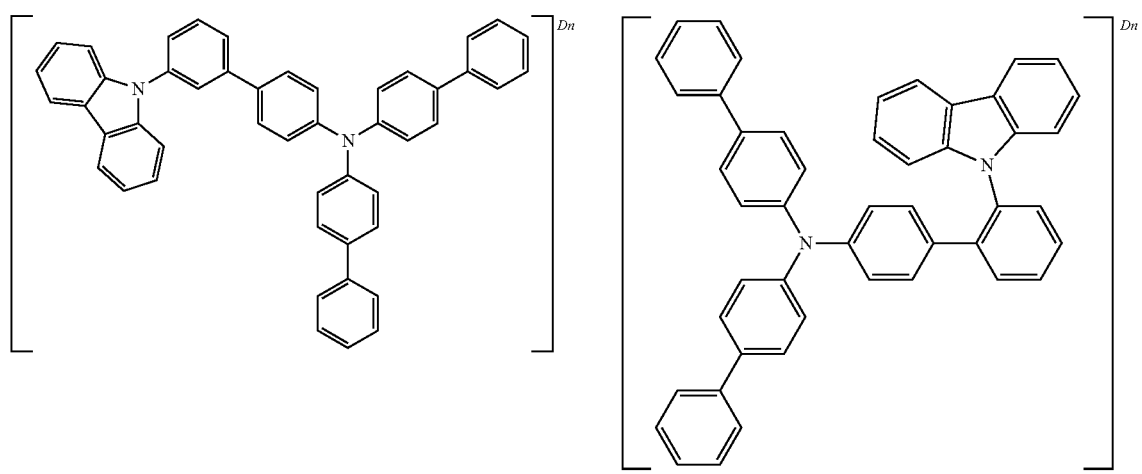
C-53  C-54

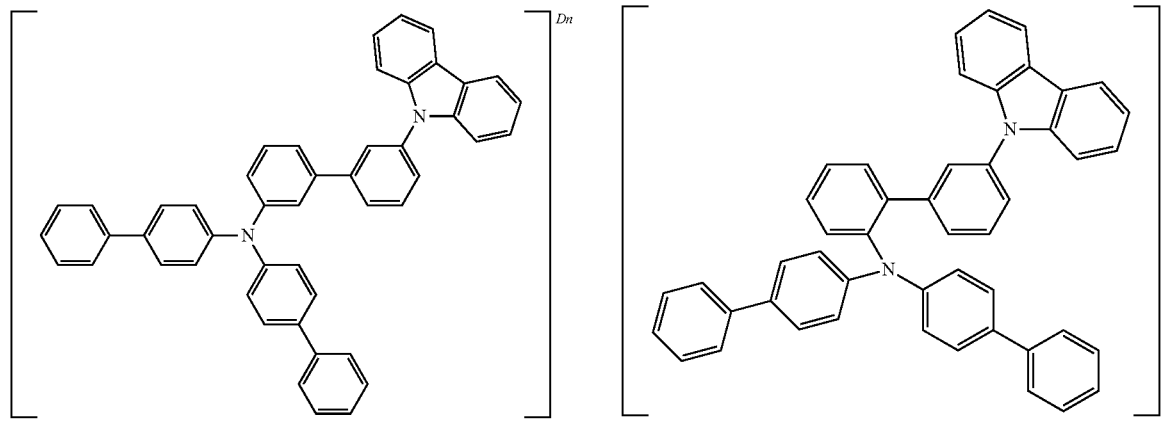
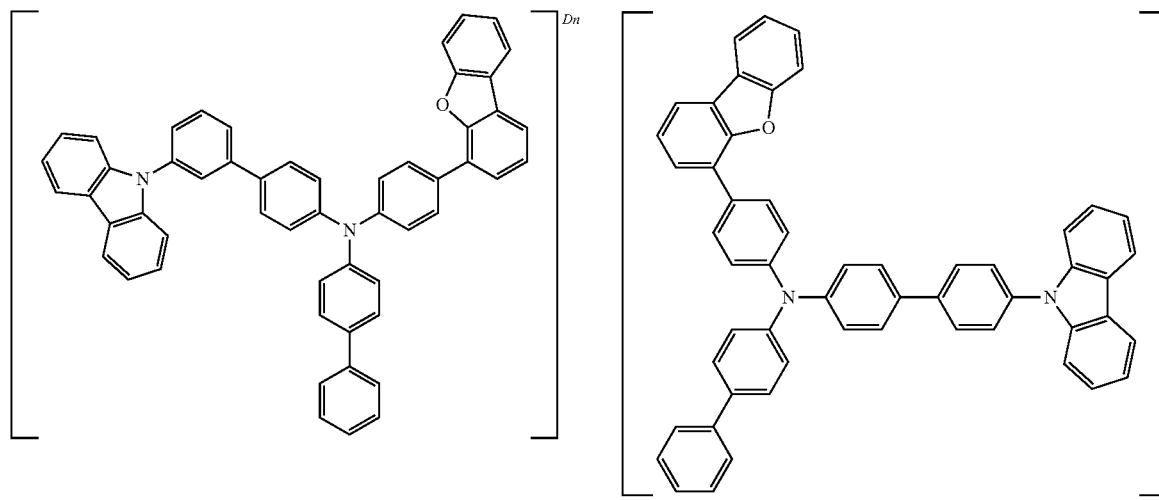
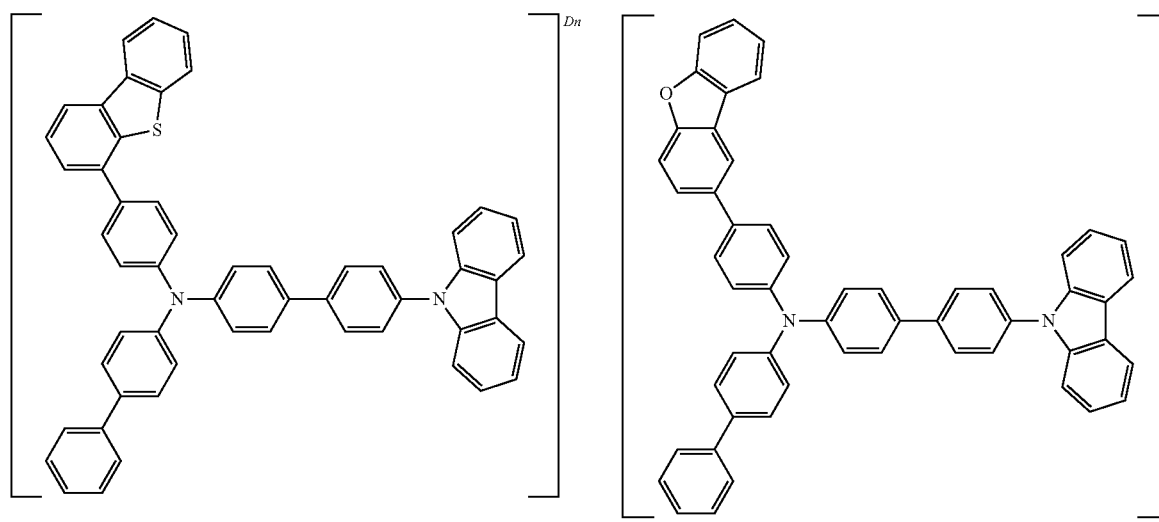

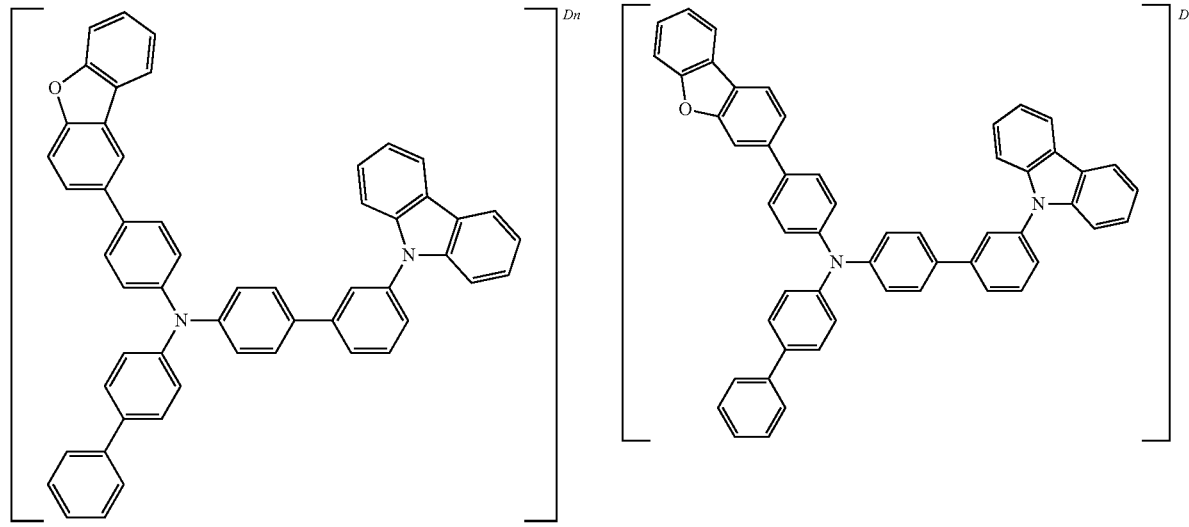
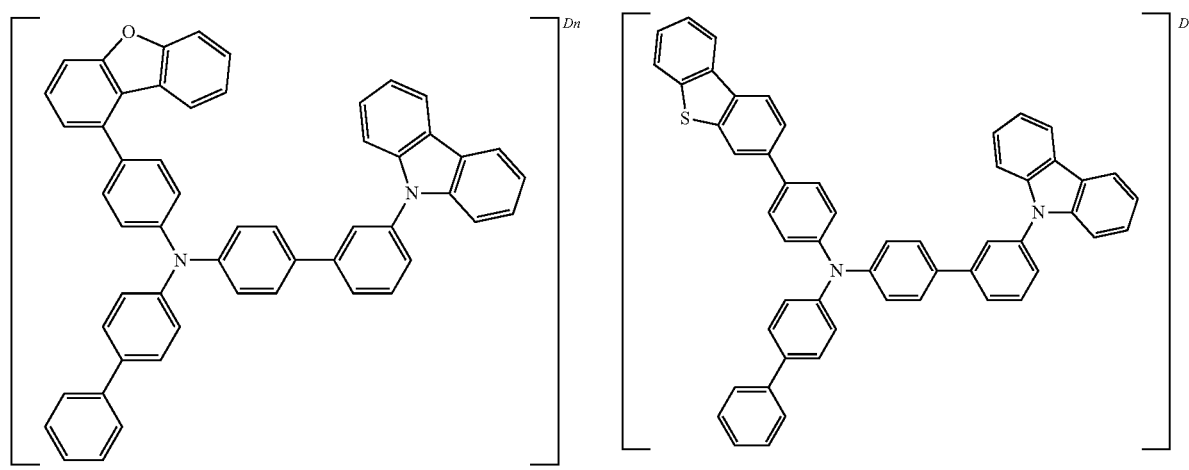
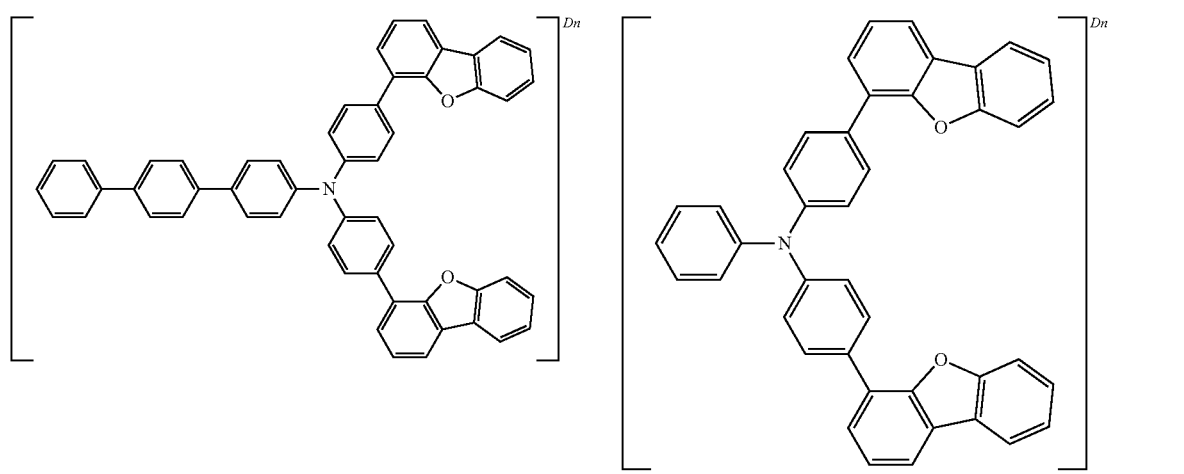

-continued
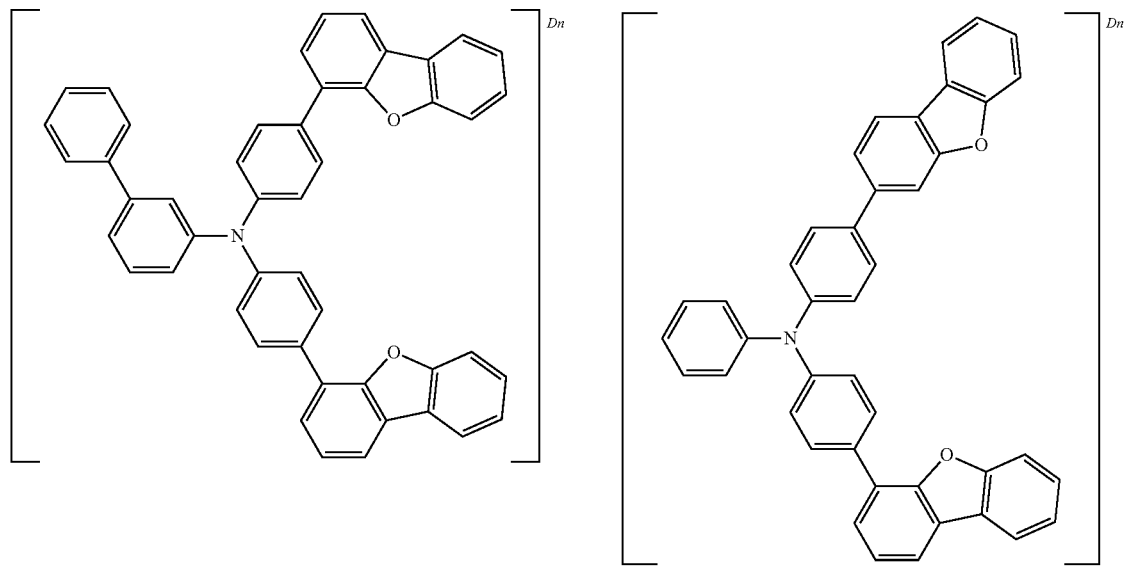
C-67
C-68
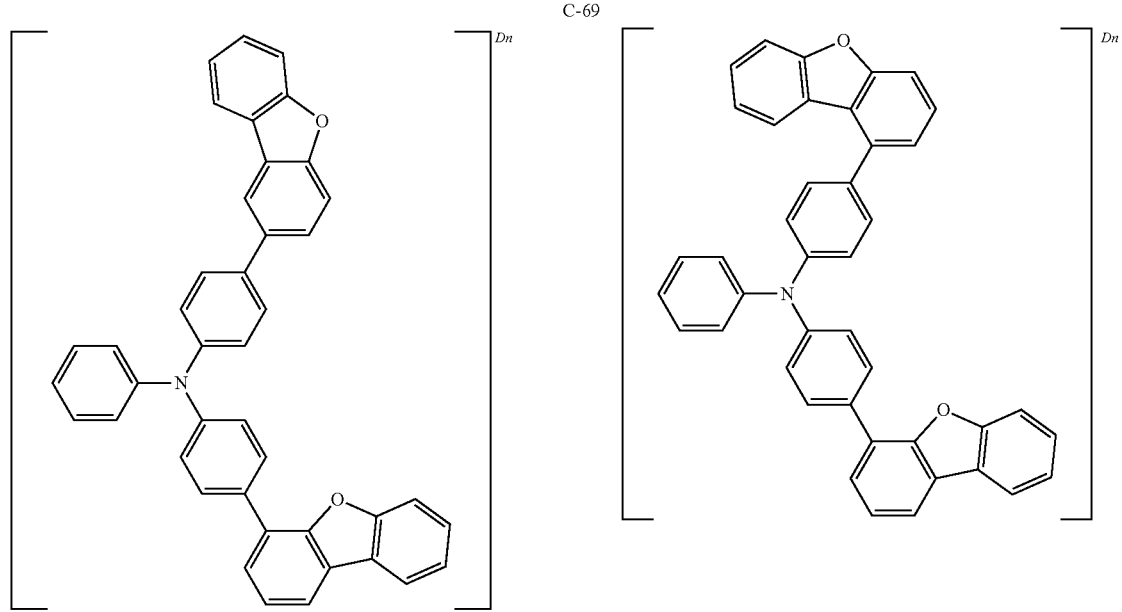
C-69
C-70

-continued
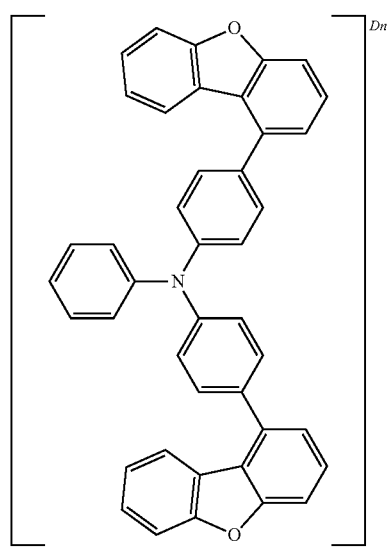
C-71
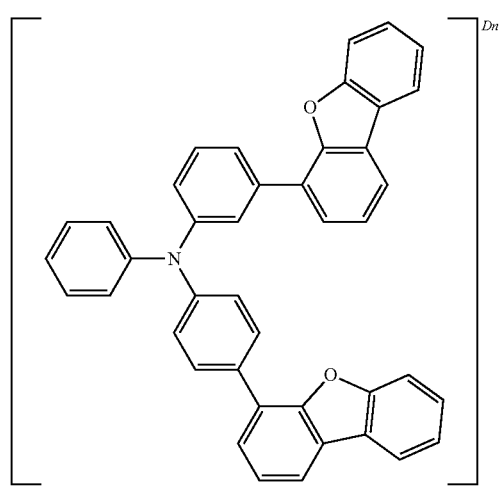
C-72
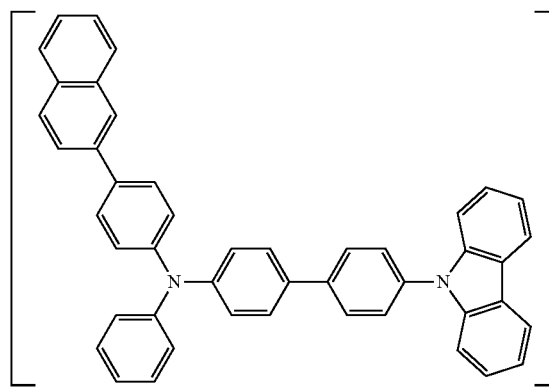
C-73
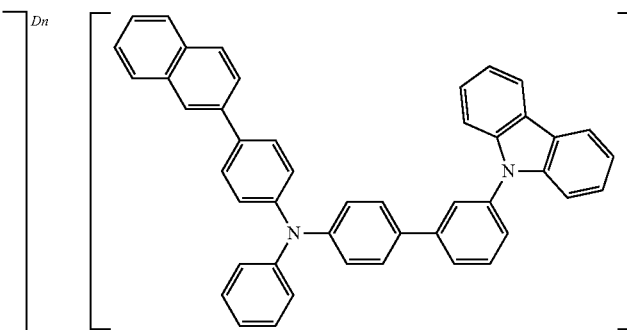
C-74
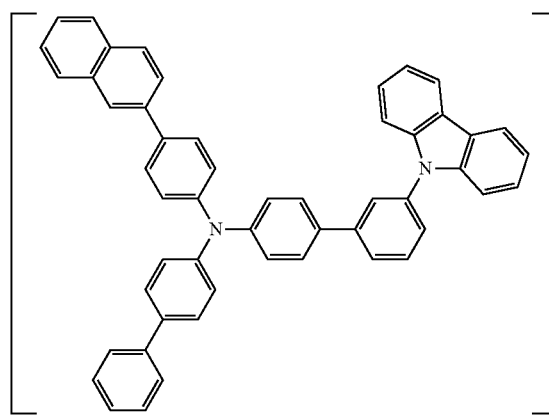
C-75
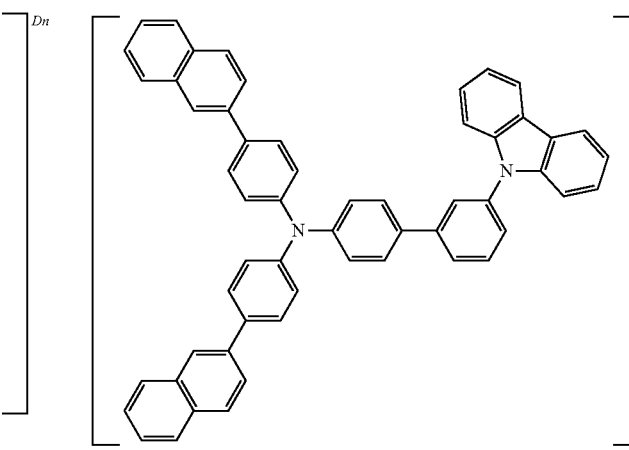
C-76

C-77
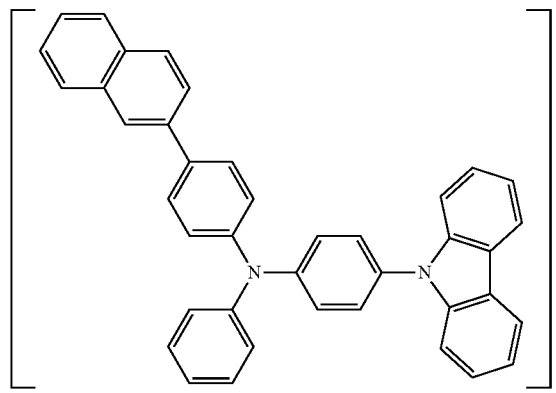
C-78
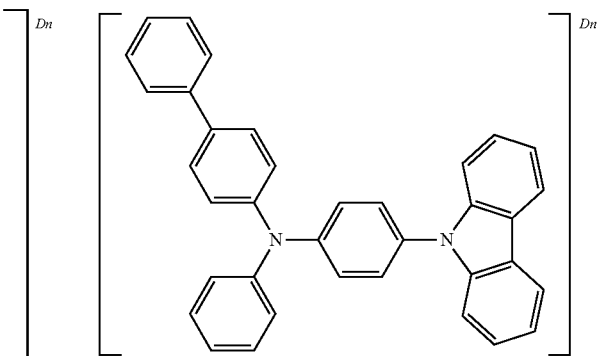
C-79
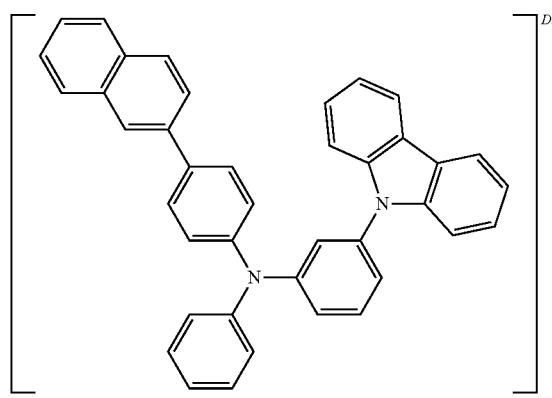
C-80
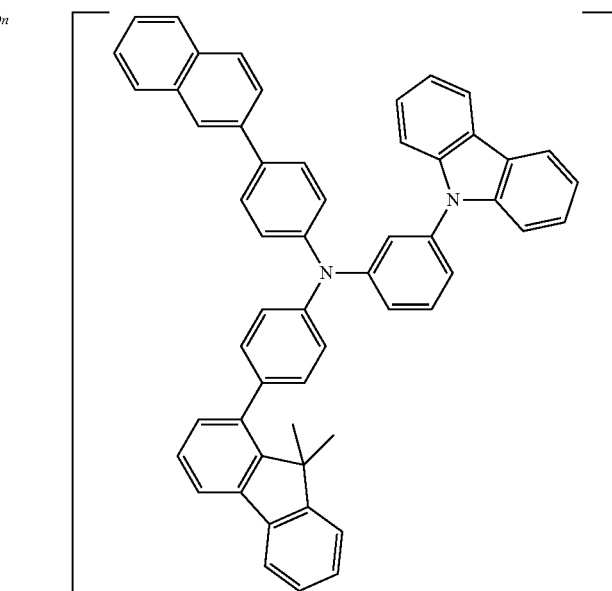
C-81
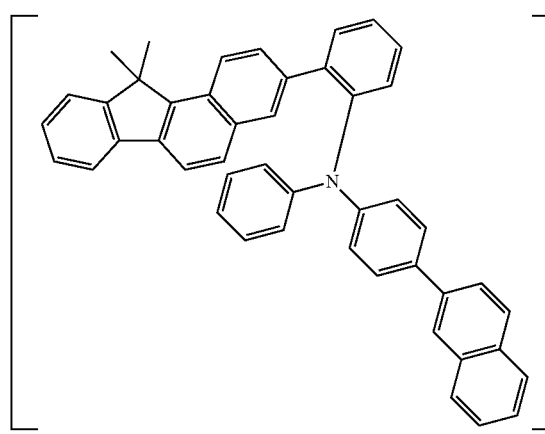
C-82
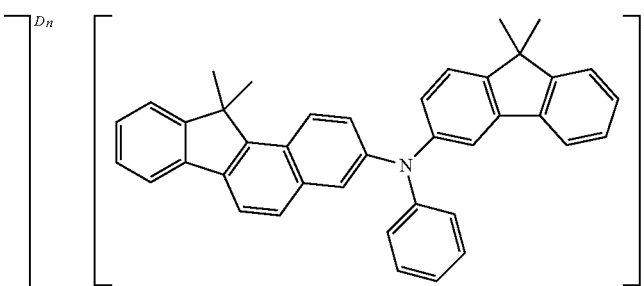

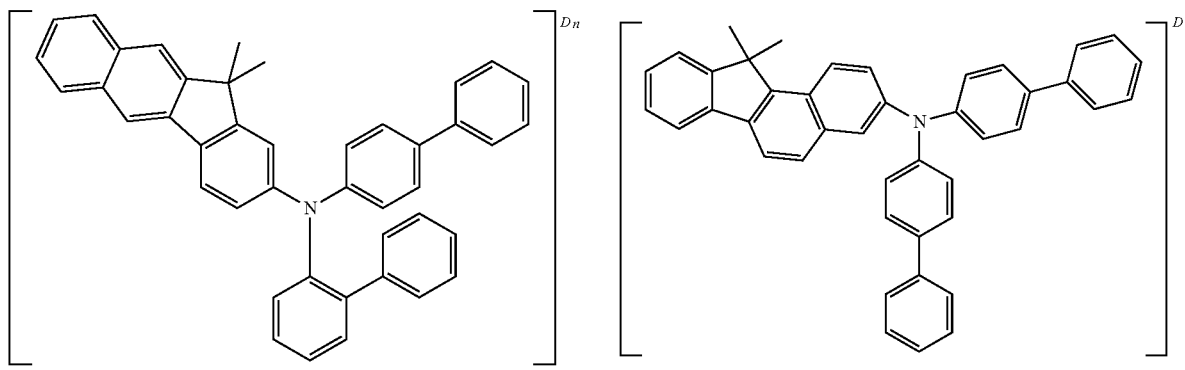
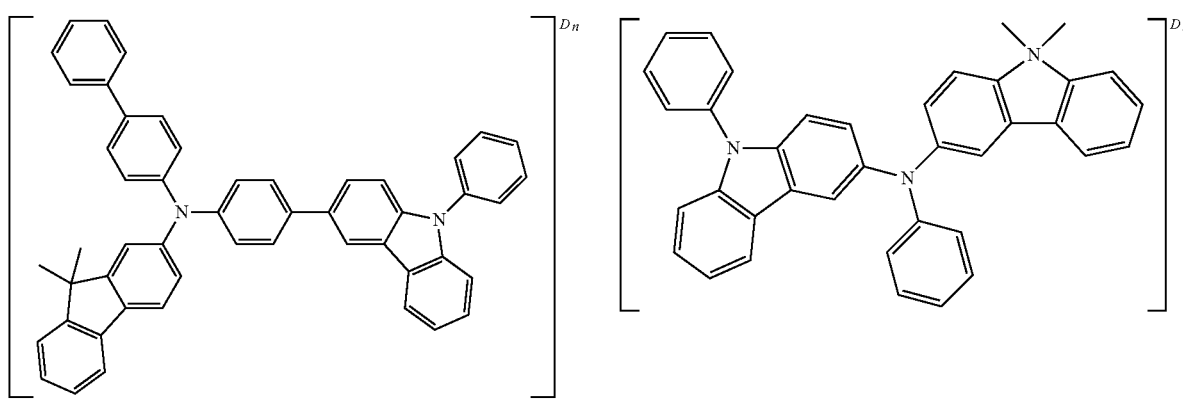
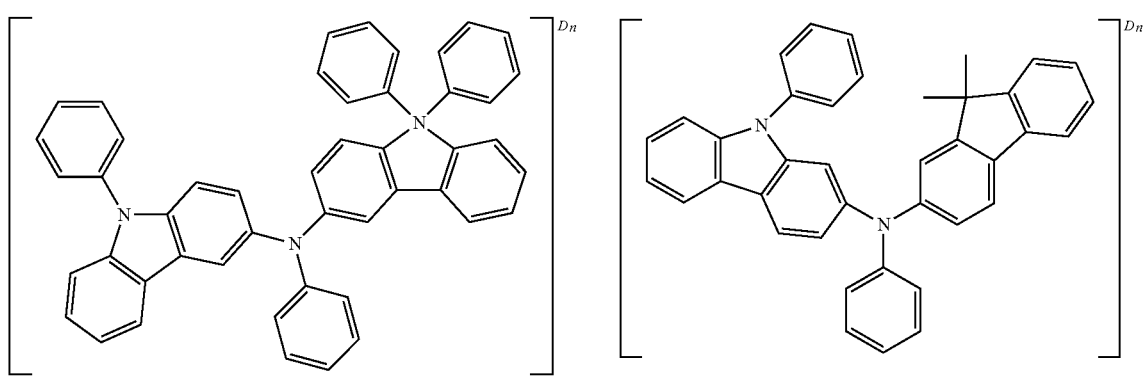
The compound represented by formula 2 may be at least one selected from the group consisting of the following compounds, but is not limited thereto.

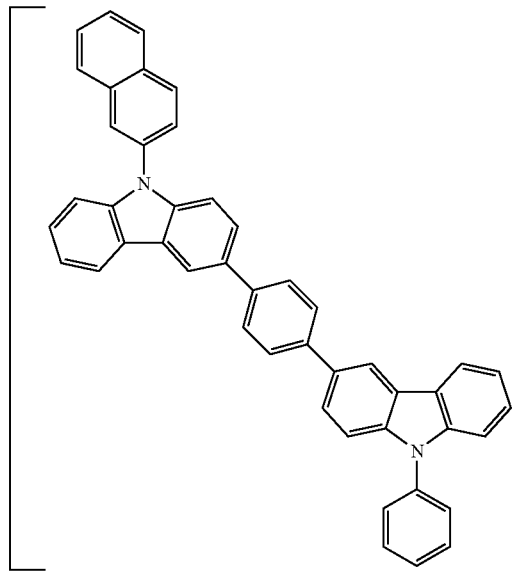
B-1
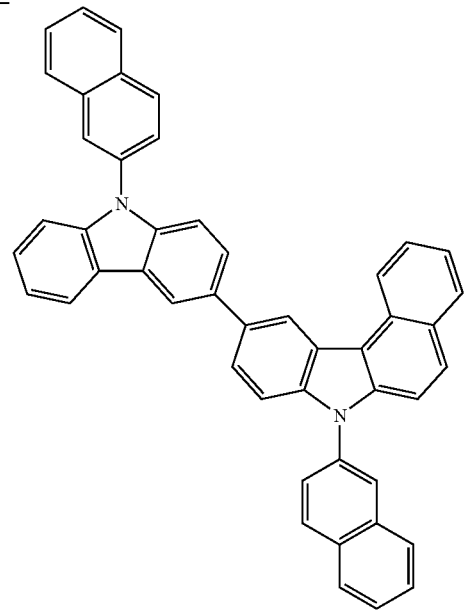
B-3
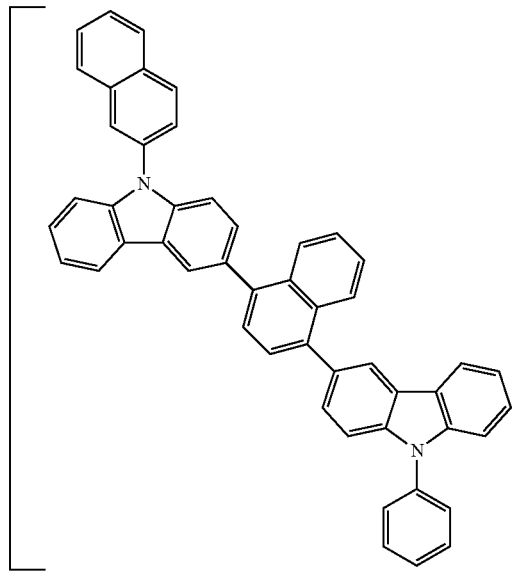
B-2
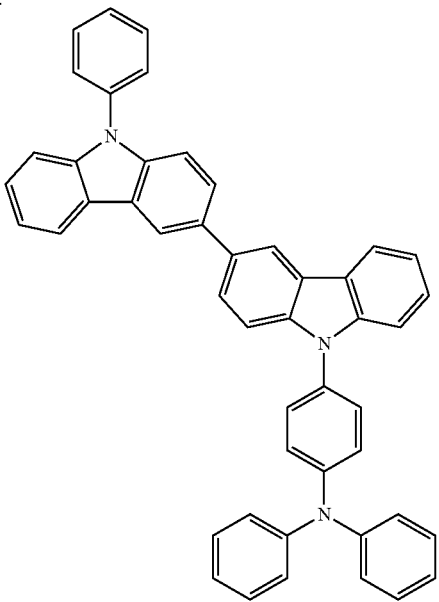
B-4

B-5
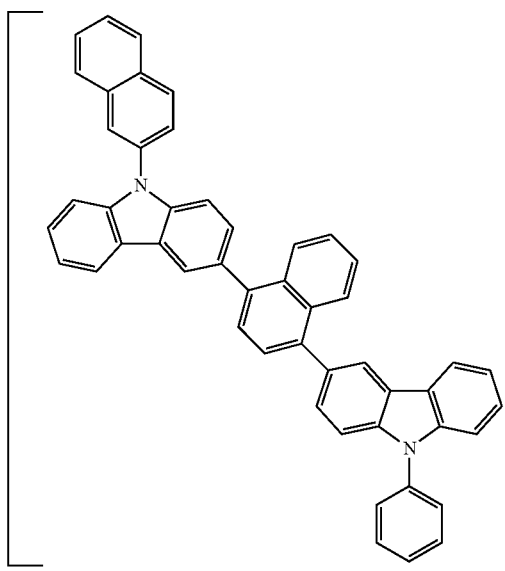
B-8
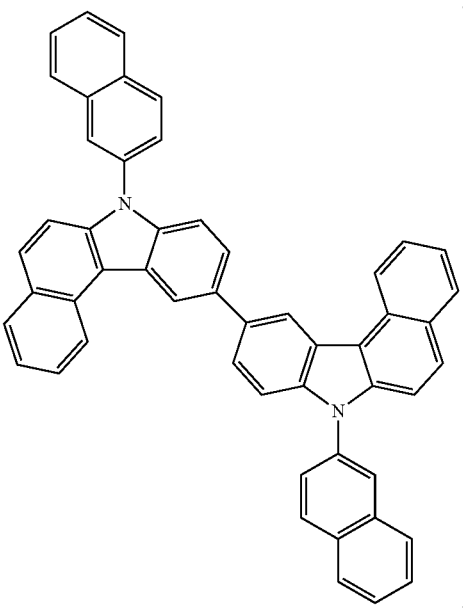
B-6
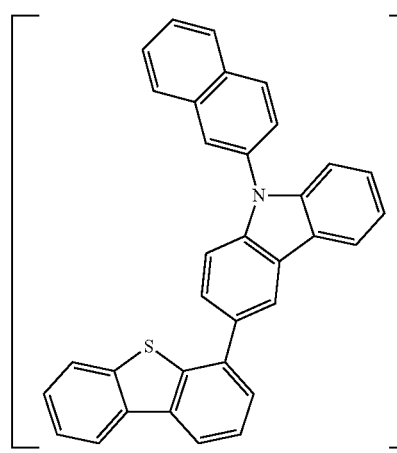
B-9
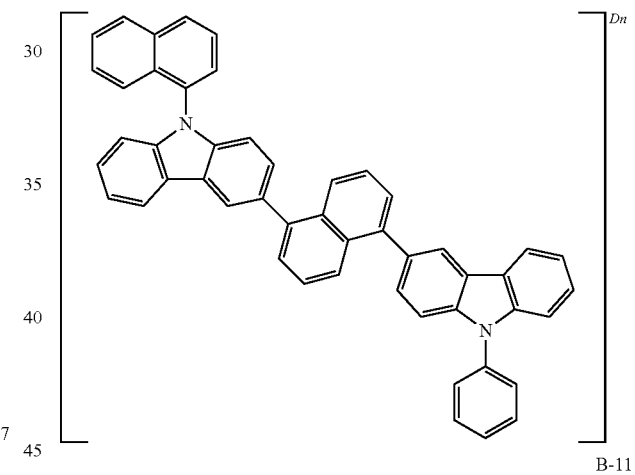
B-7
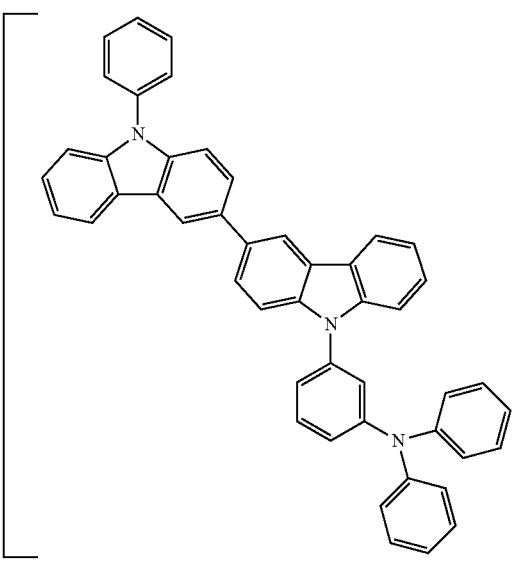
B-11
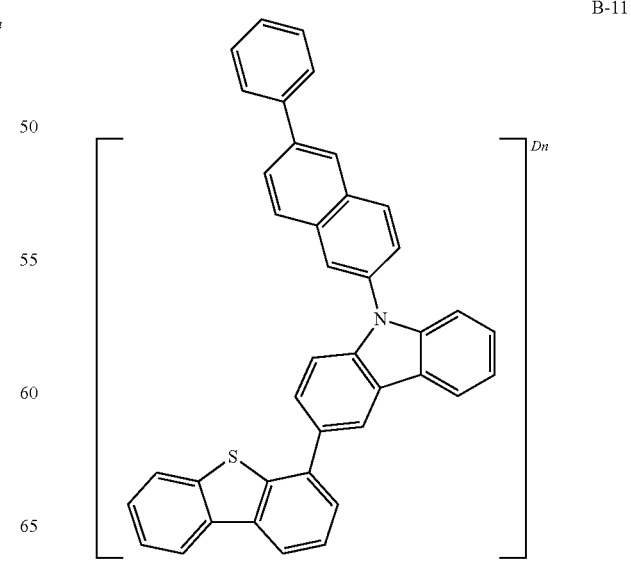

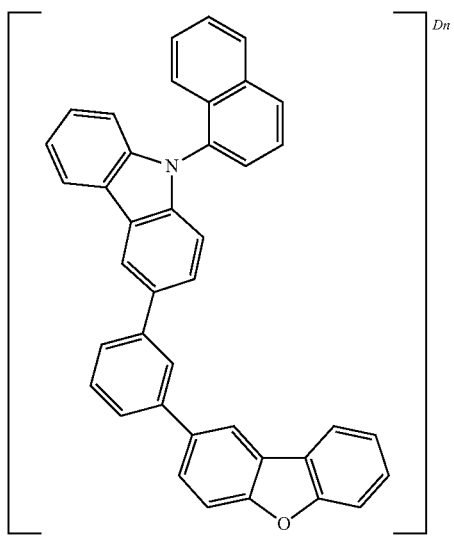
B-12
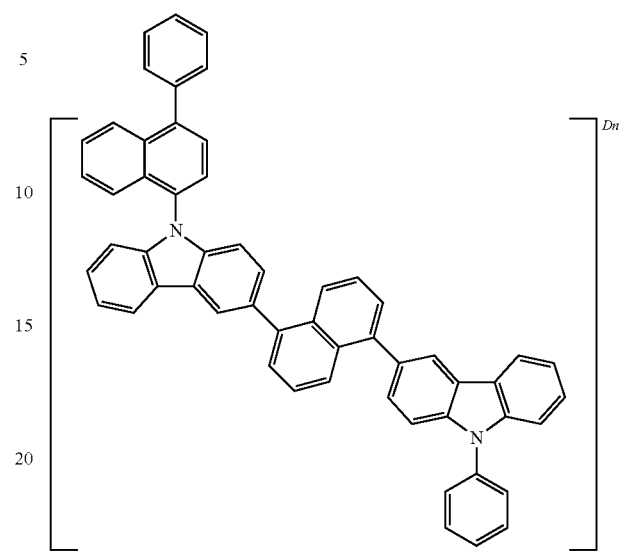
B-14
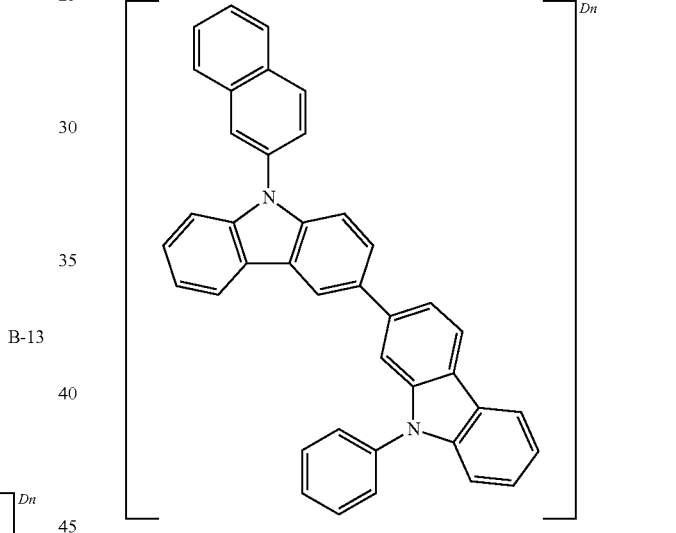
B-15
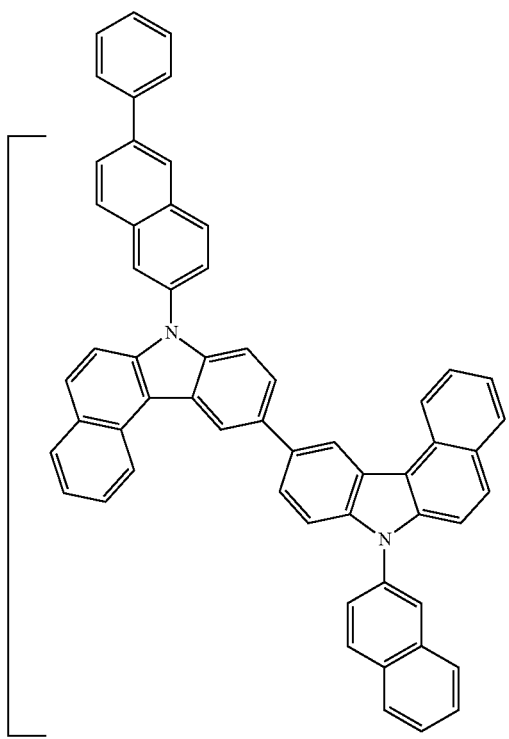
B-13
B-16

B-17
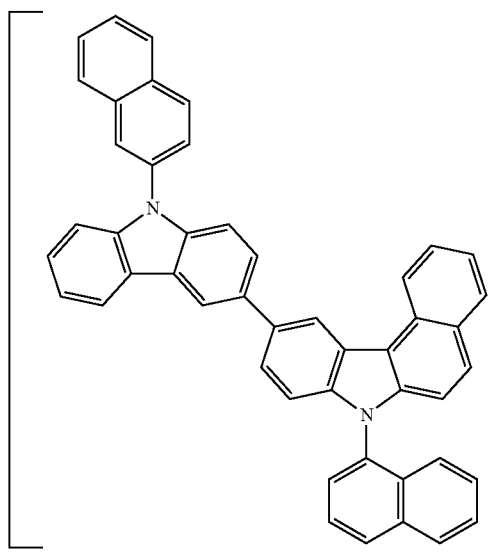
B-20
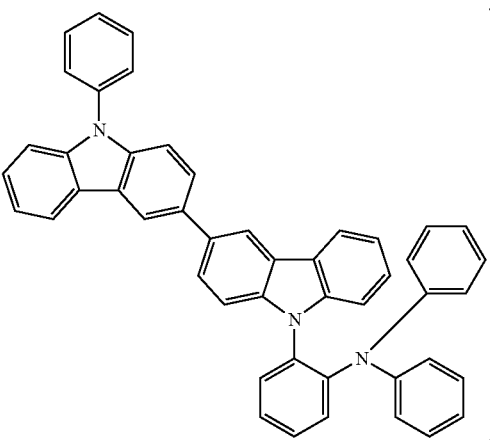
B-18
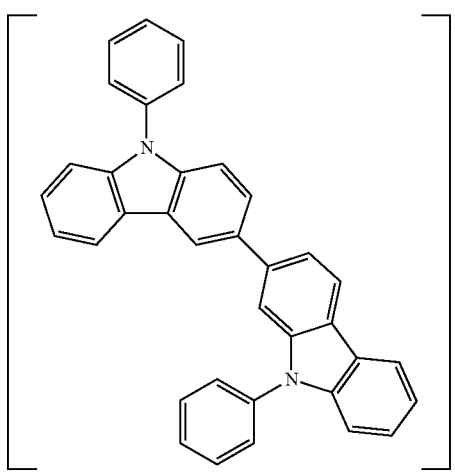
B-21
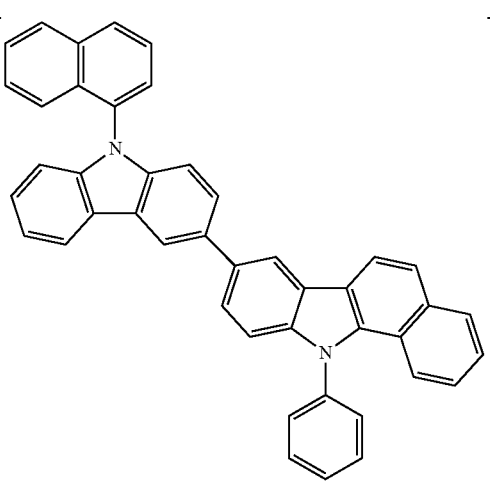
B-19
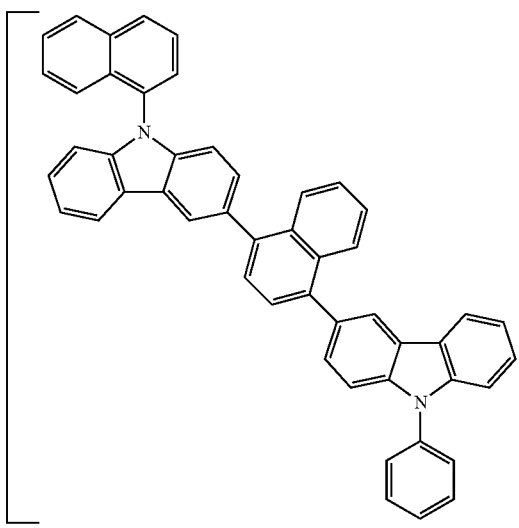
B-22
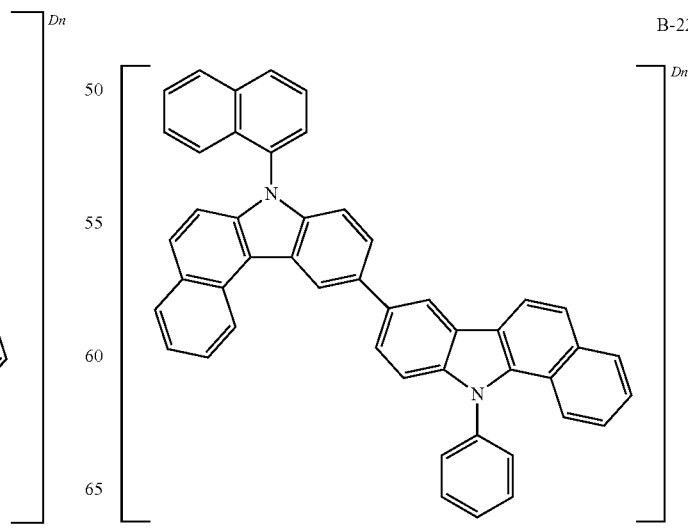

B-23
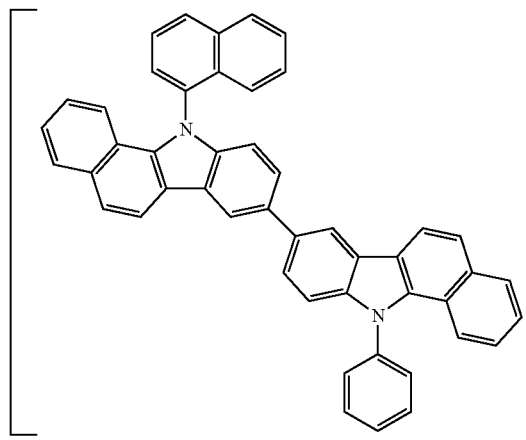
B-26
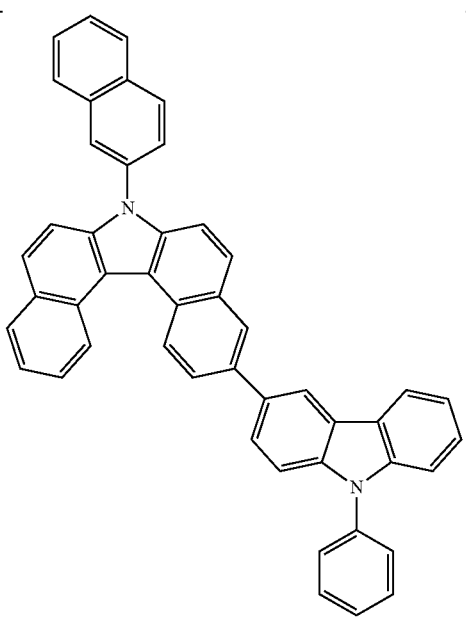
B-24
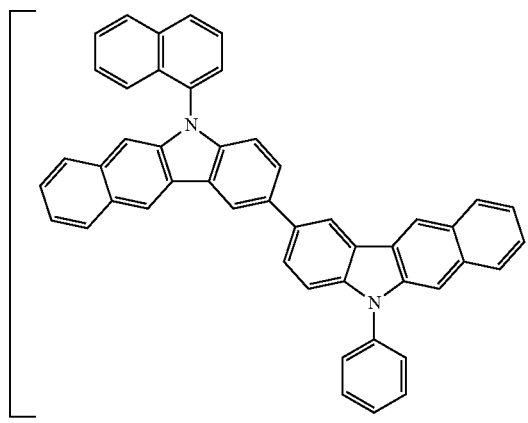
B-25
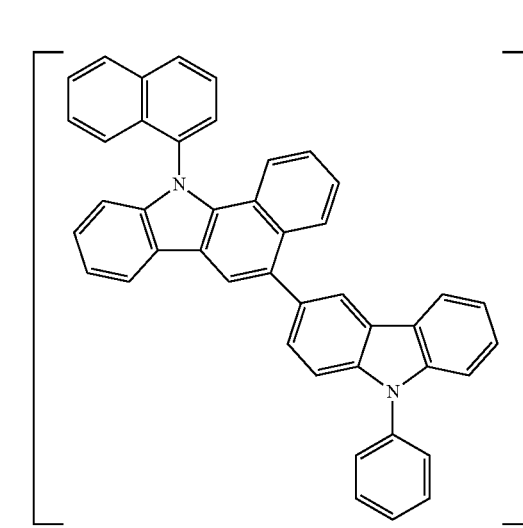
B-27
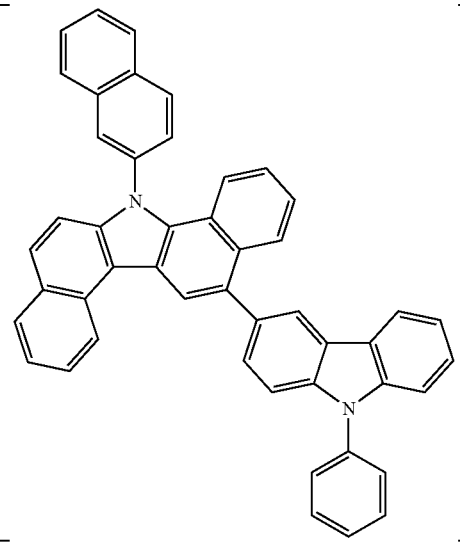

B-28
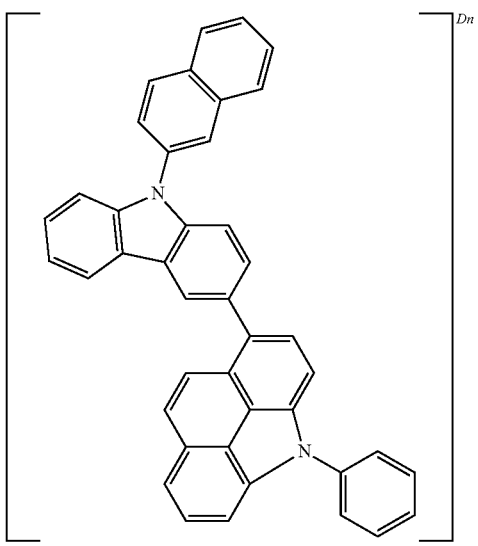
B-31
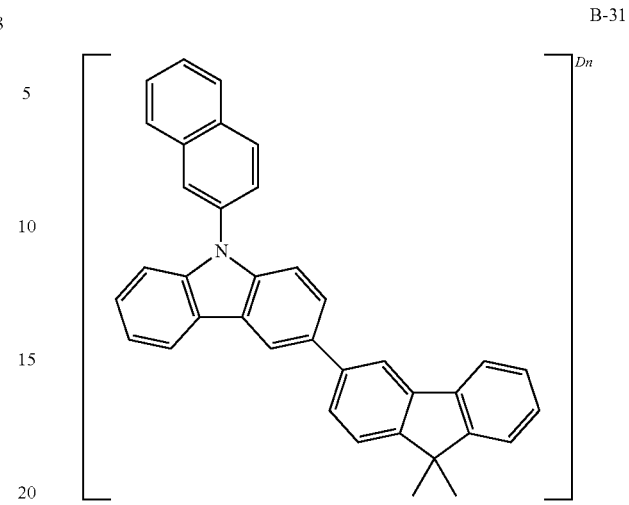
B-29
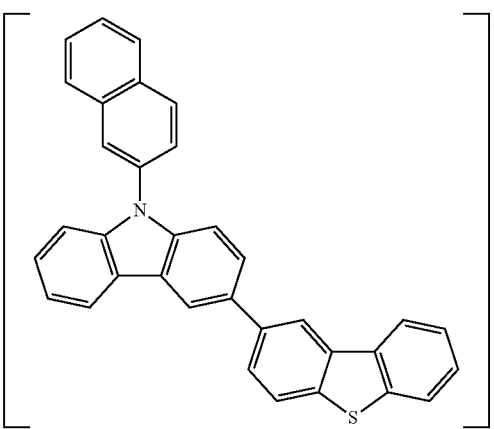
B-32
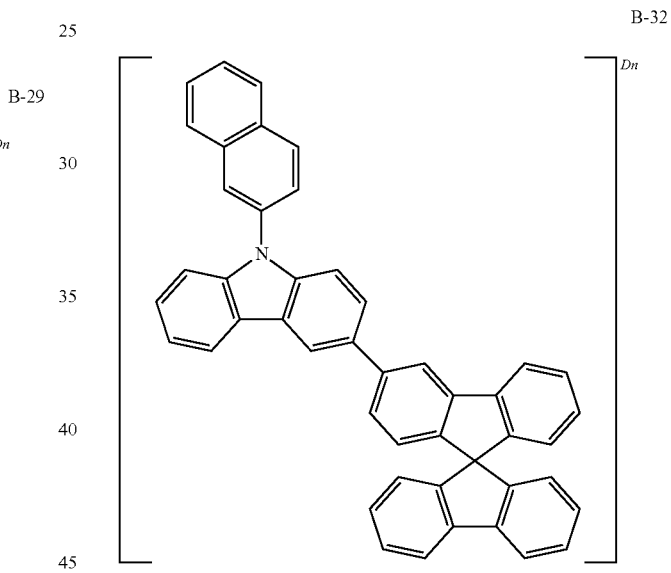
B-30
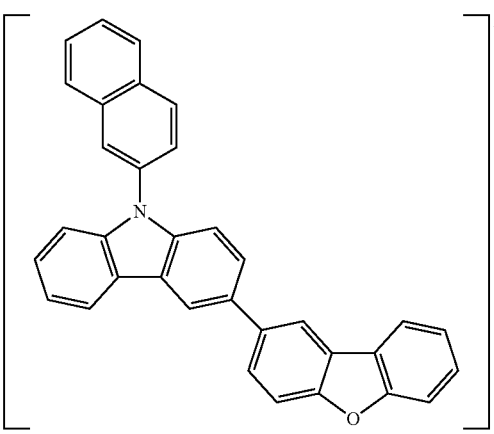
B-33
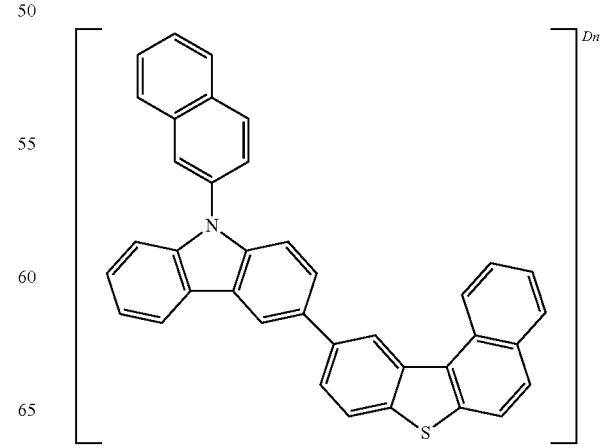

-continued
B-34
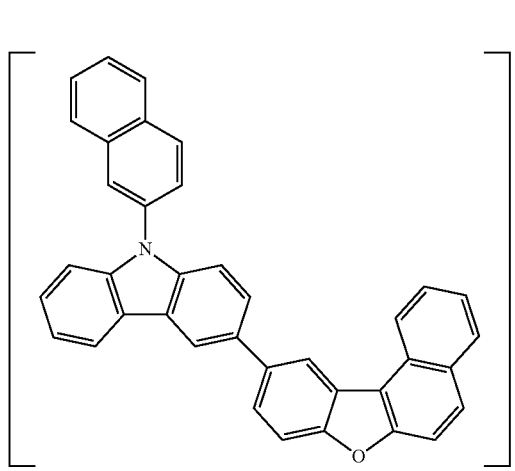
B-35
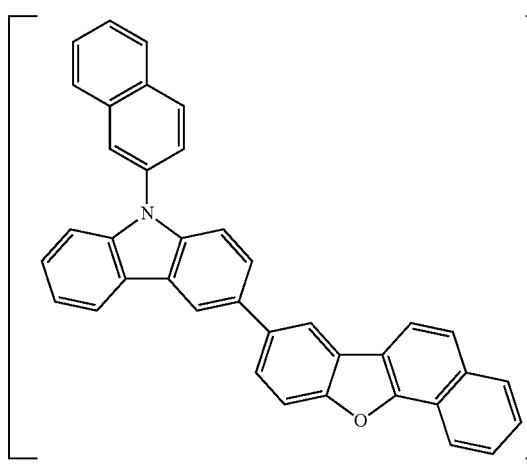
B-36
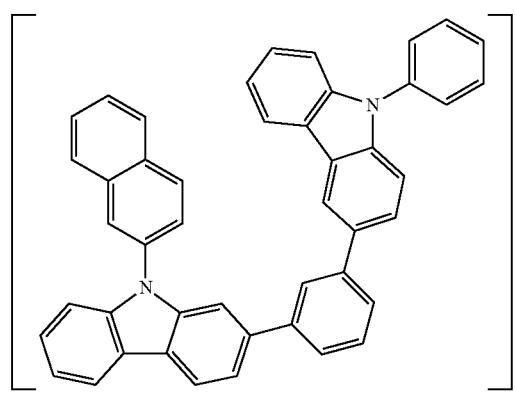
B-37
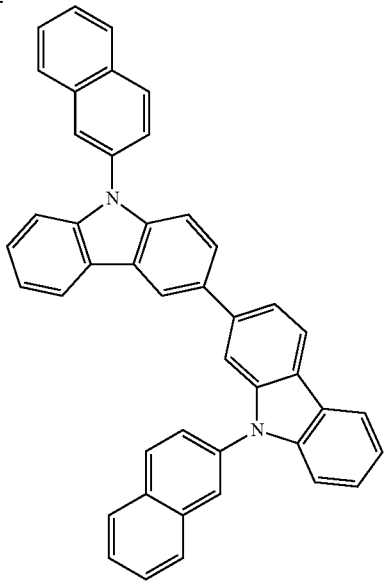
B-38
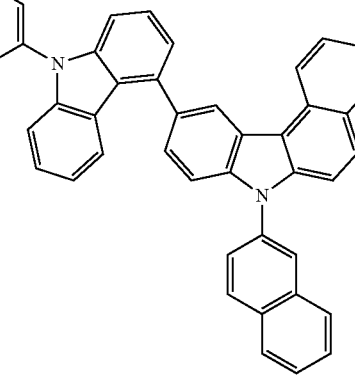
B-39
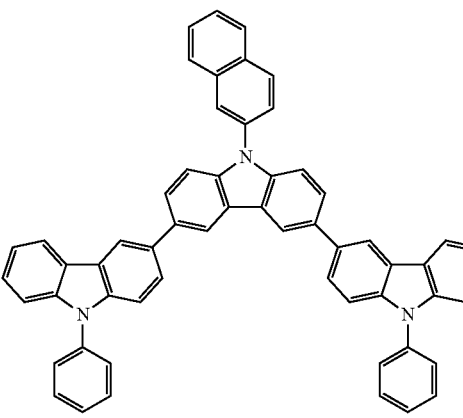

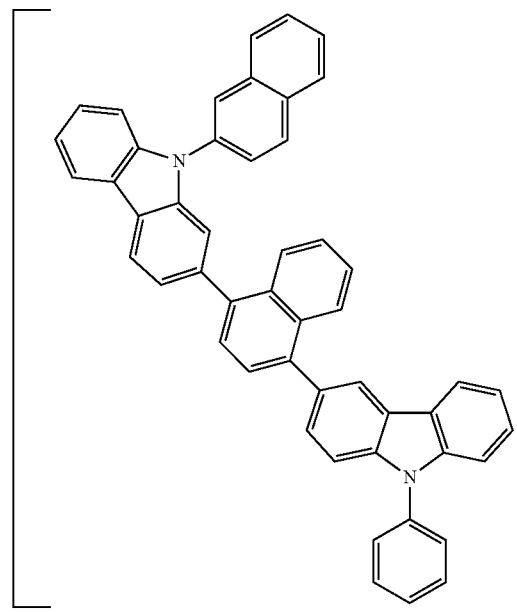
B-40
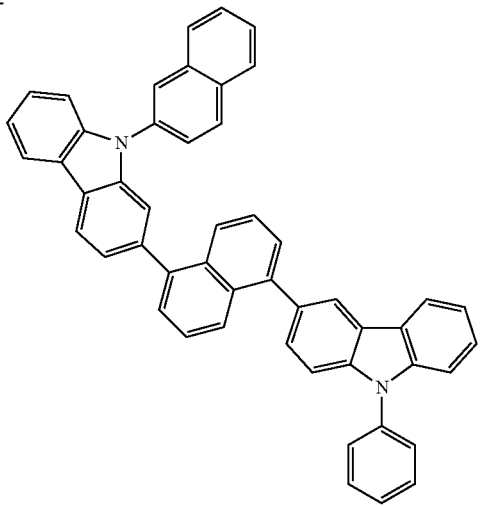
B-42
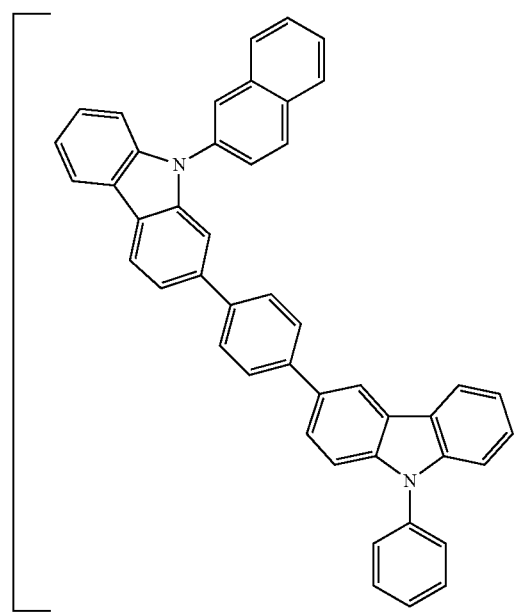
B-41
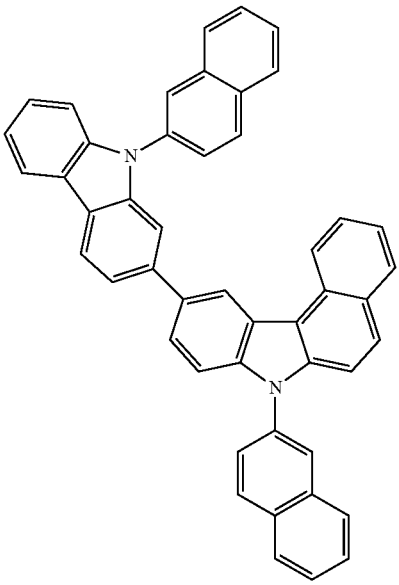
B-43

B-44
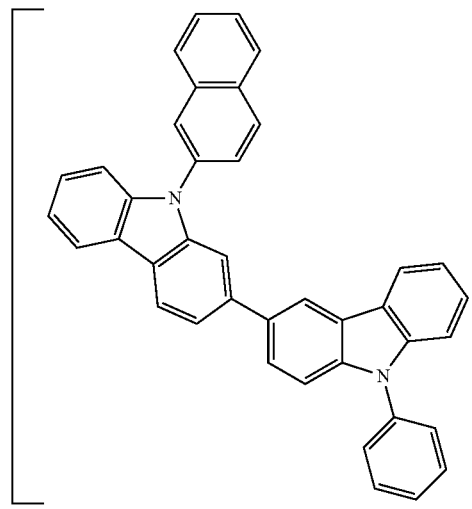
B-47
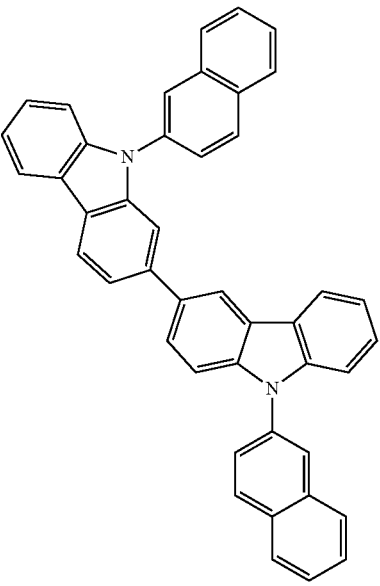
B-45
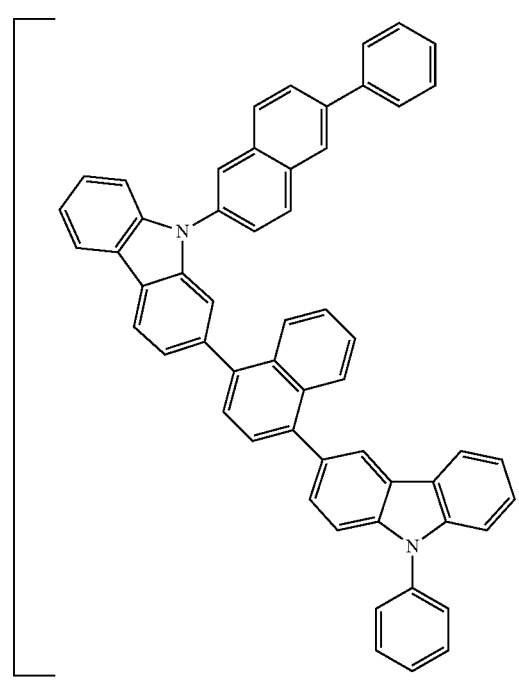
B-46
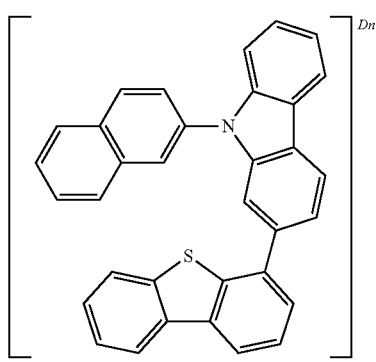
B-48
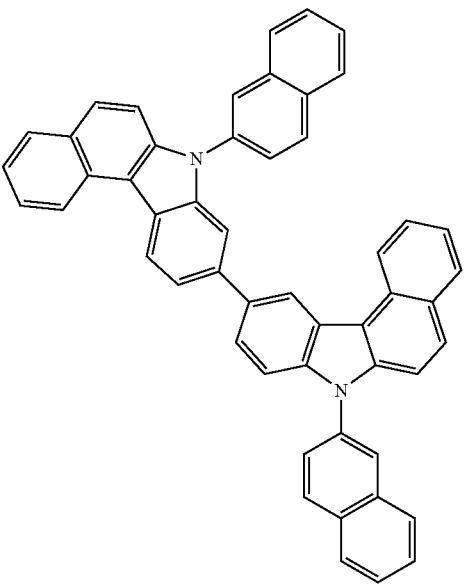

B-49
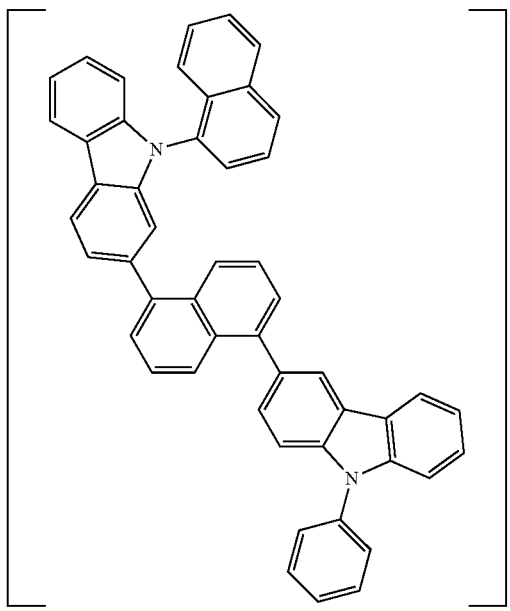
B-50
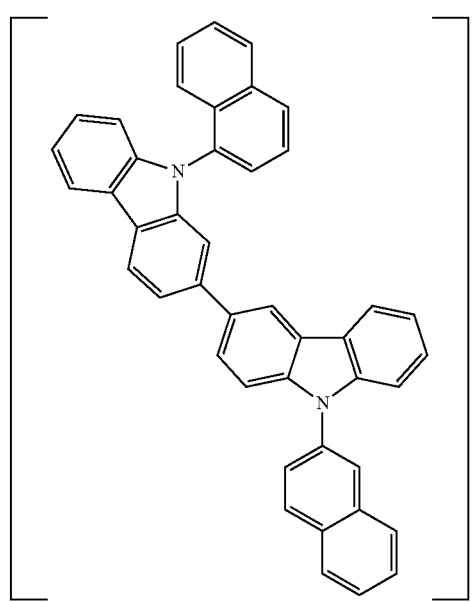
B-51
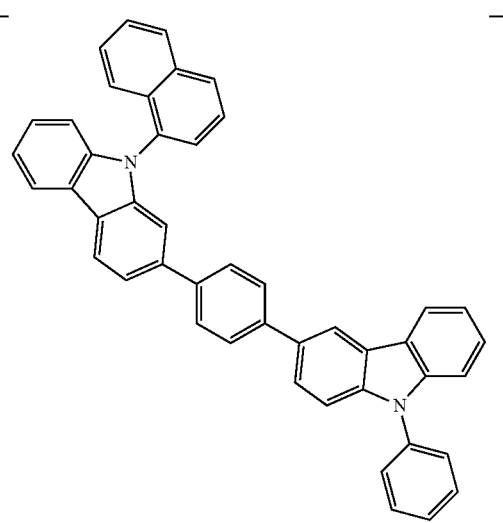
B-52
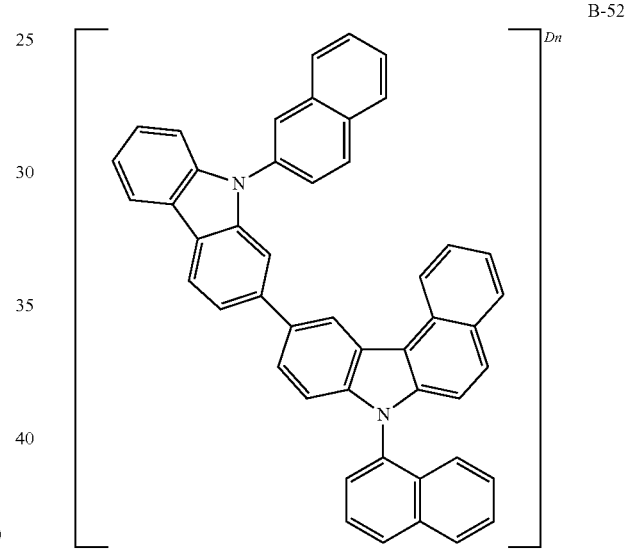
B-53
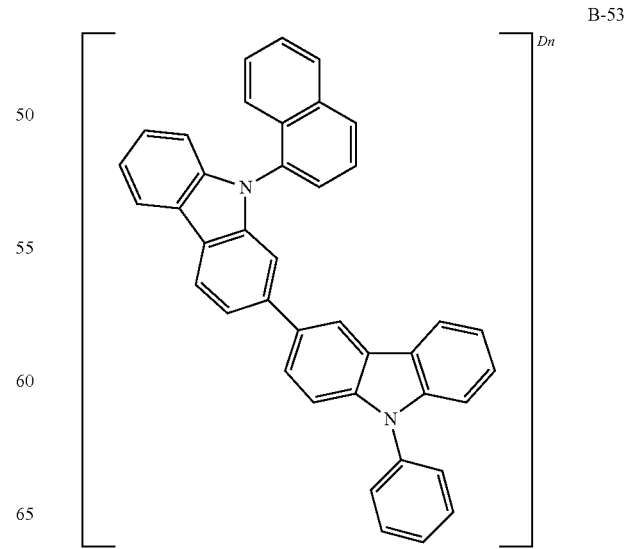

B-54
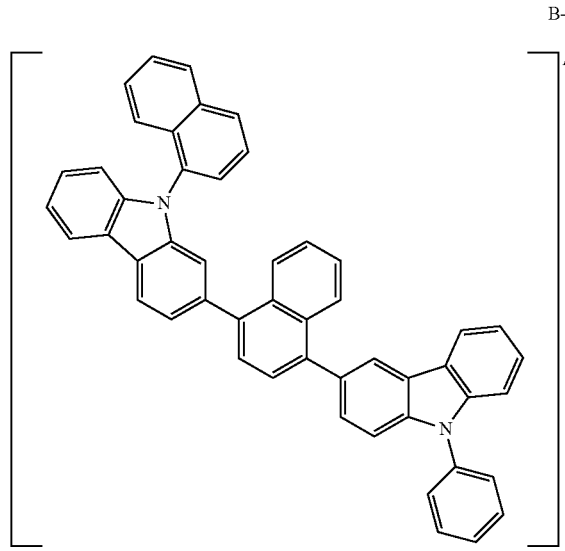
B-57
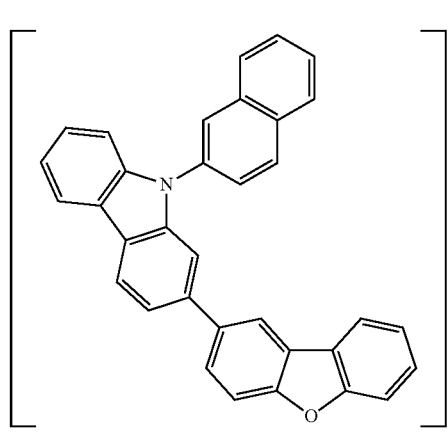
B-55
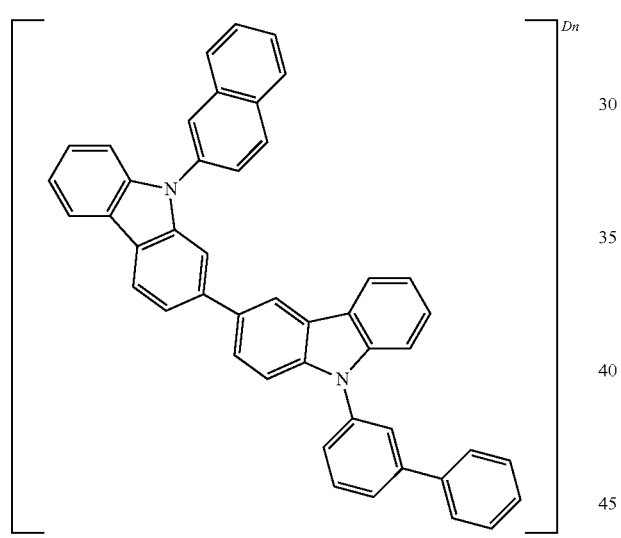
B-58
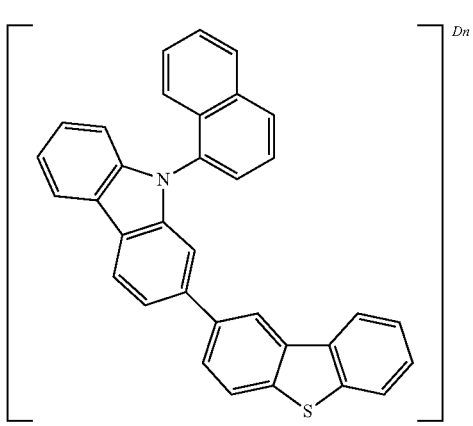
B-56
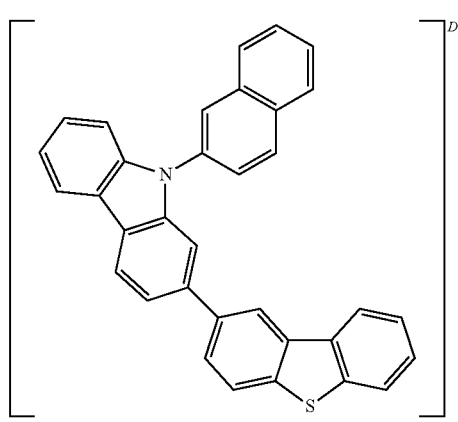
B-59
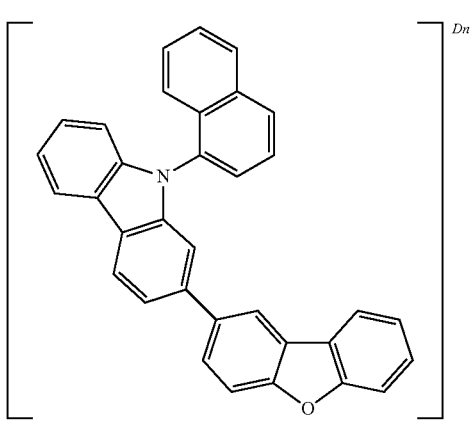

B-60
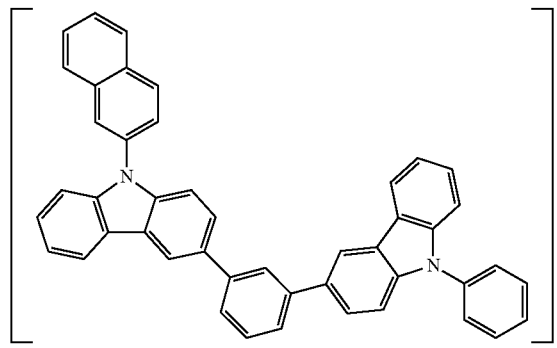
B-61
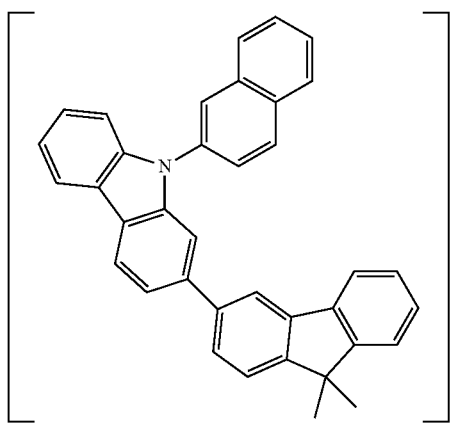
B-62
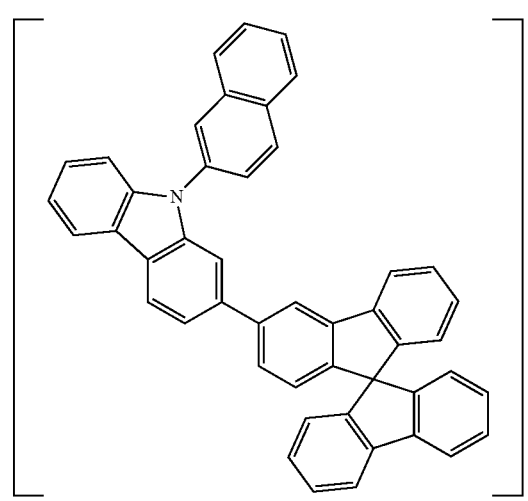
B-63
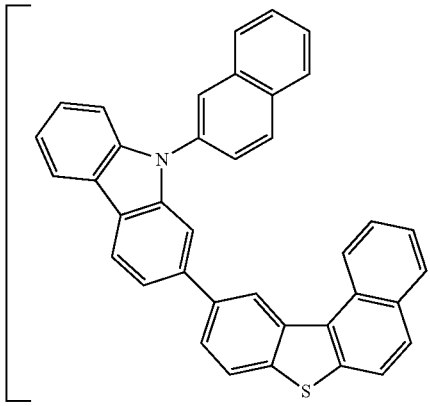
B-64
B-65
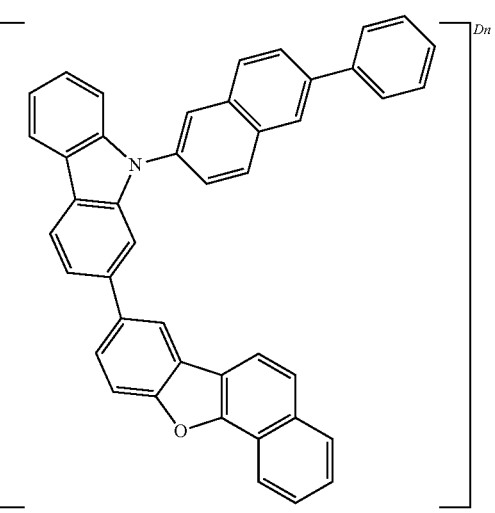

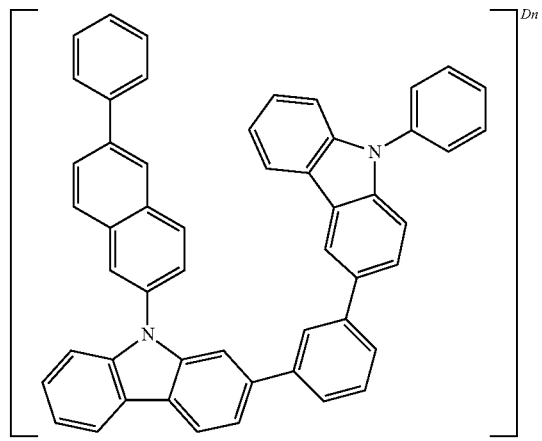
B-66
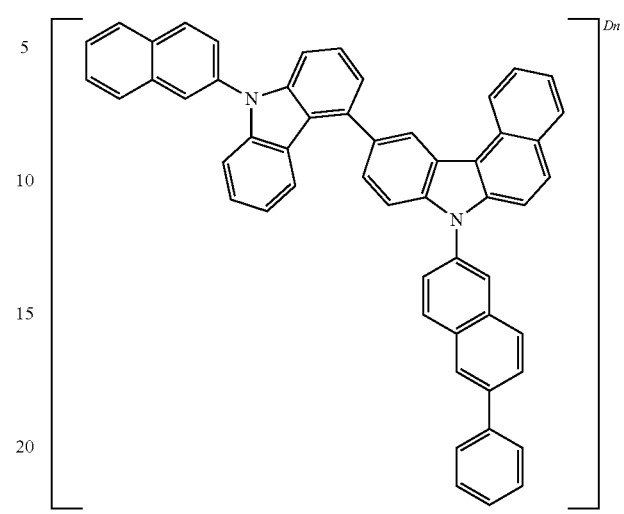
B-68
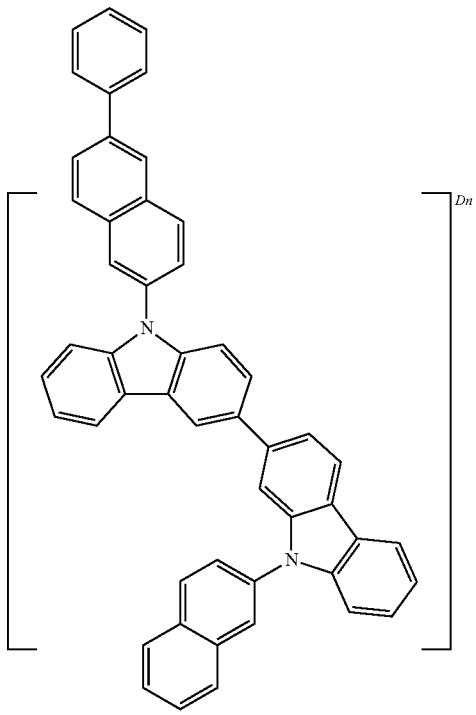
B-67
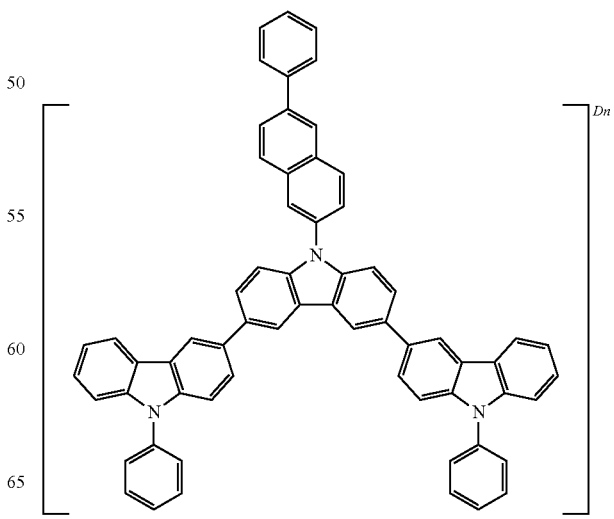
B-69

-continued
B-70
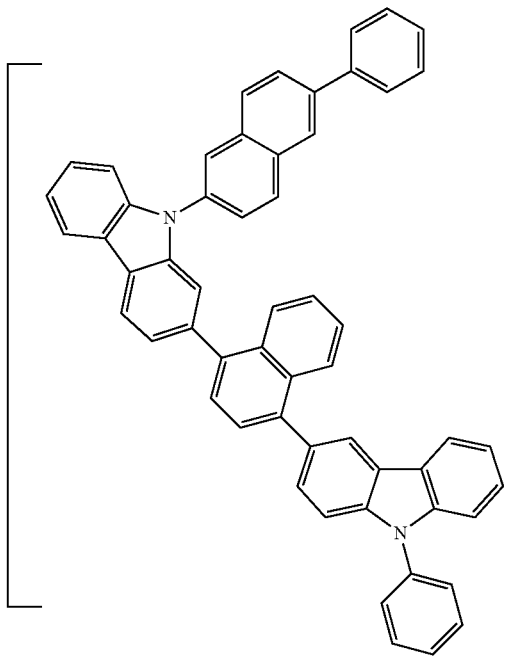
B-71
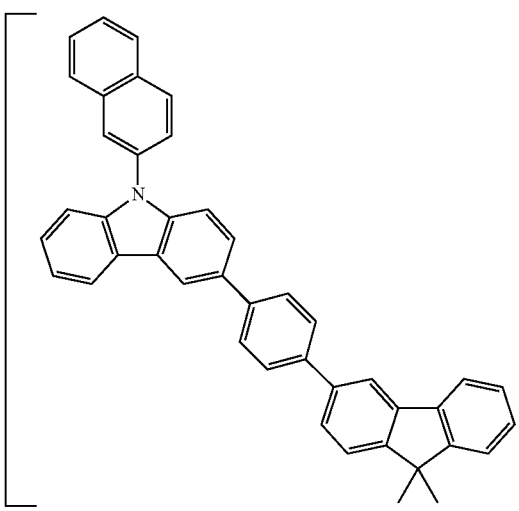
B-72
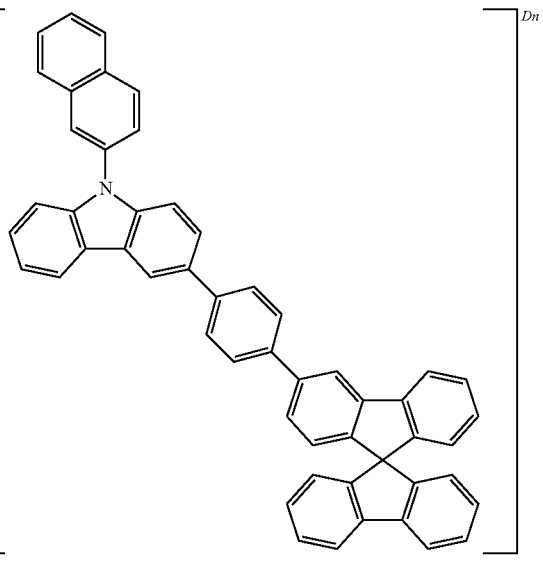
B-73
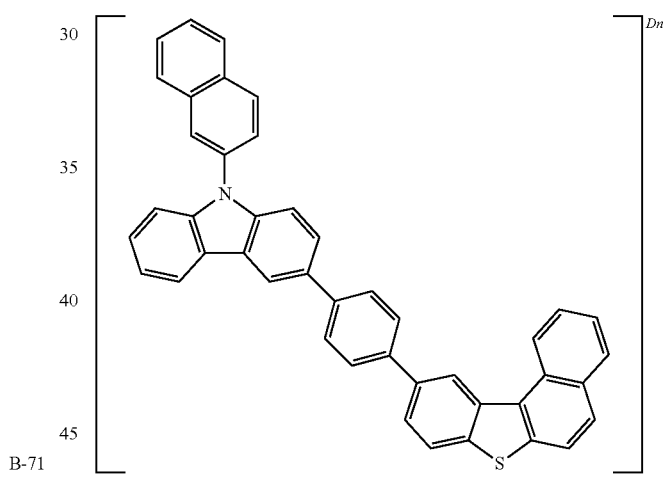
B-74
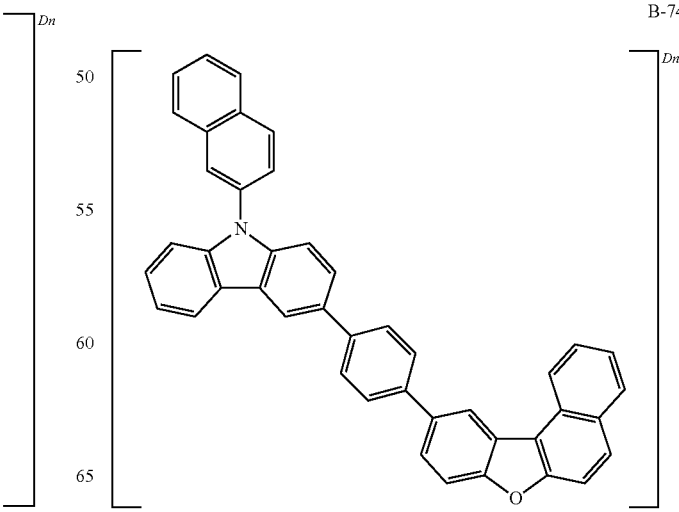

B-75
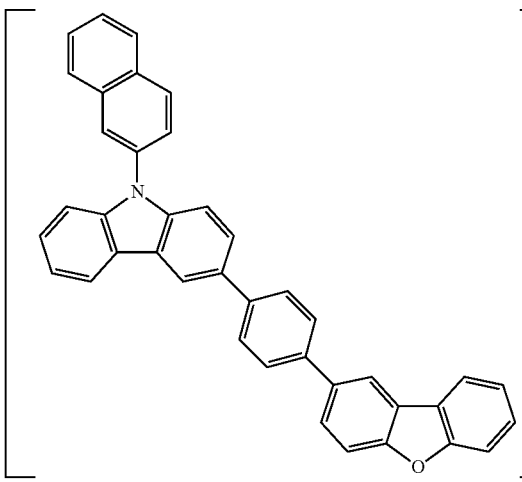
B-76
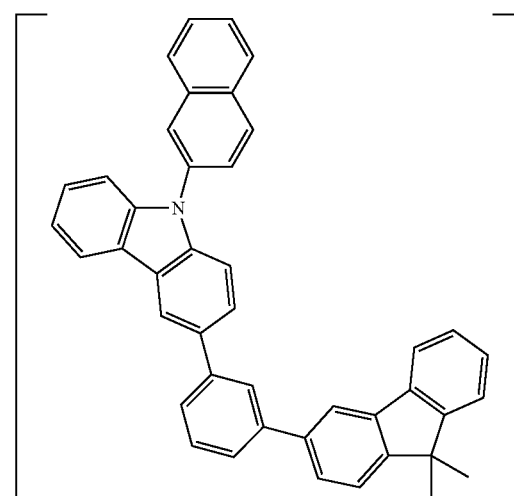
B-77
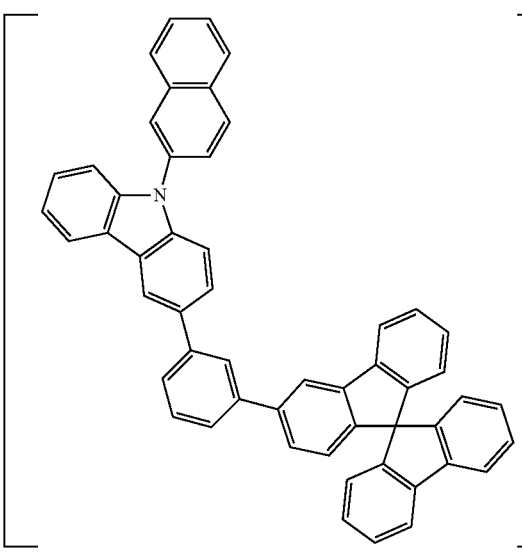
B-78
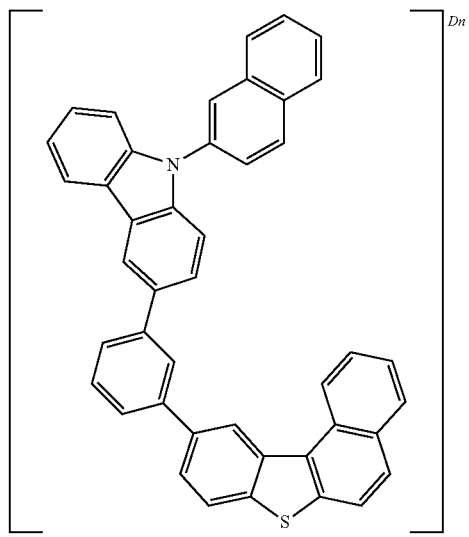
B-79
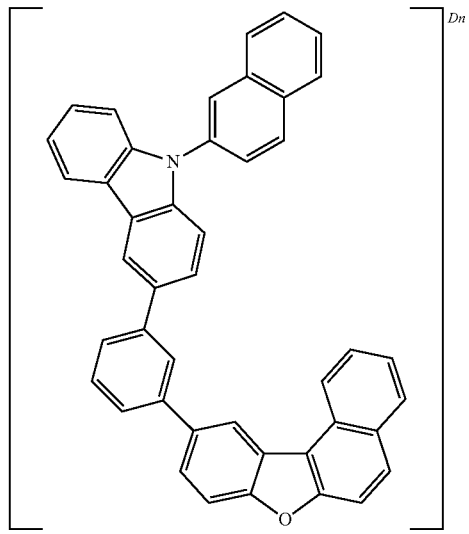
B-80
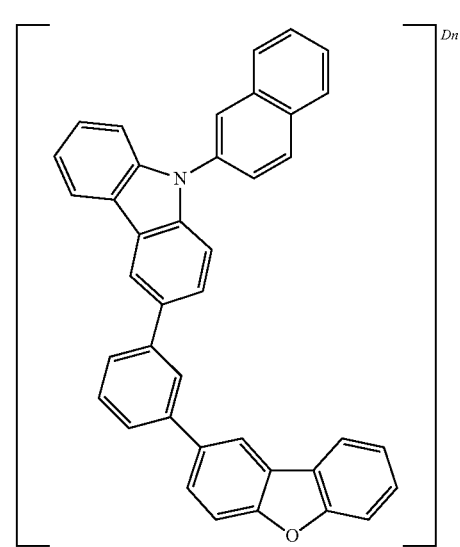

B-81
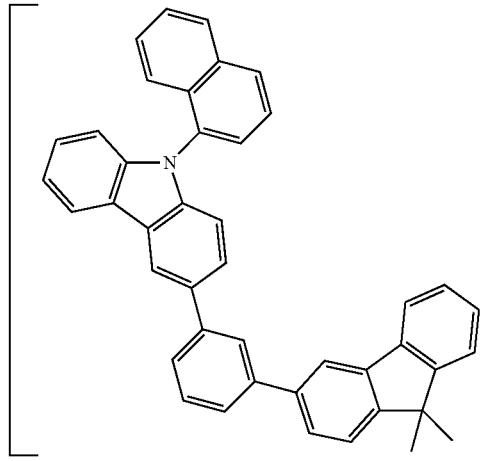
B-84
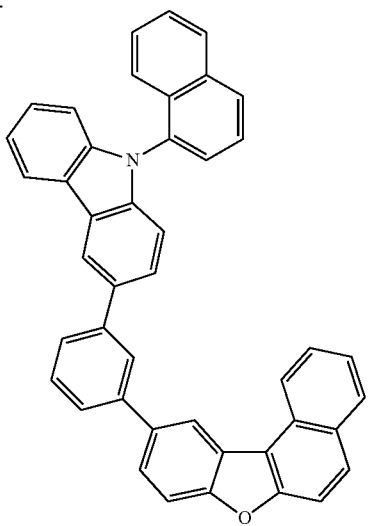
B-82
The compound represented by formula 3 may be at least one selected from the group consisting of the following compounds, but is not limited thereto.
A-1
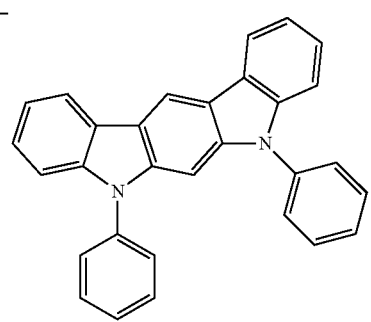
B-83
A-2
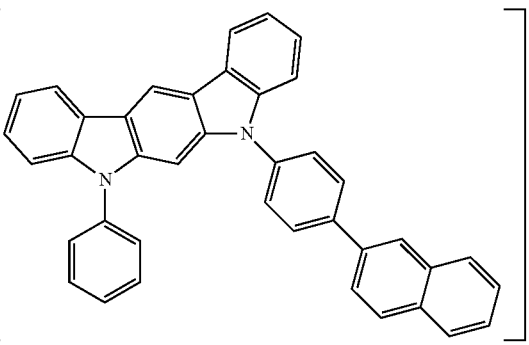

A-3
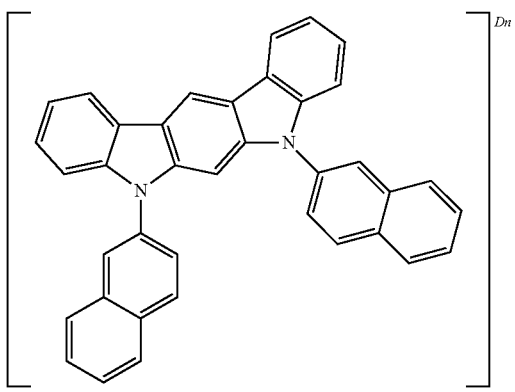
A-4
A-5
A-6
A-7
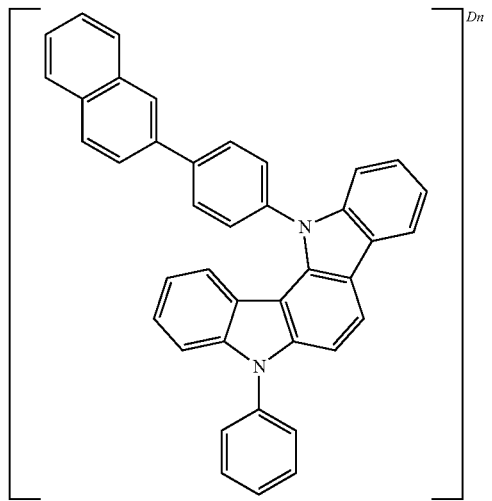
A-8
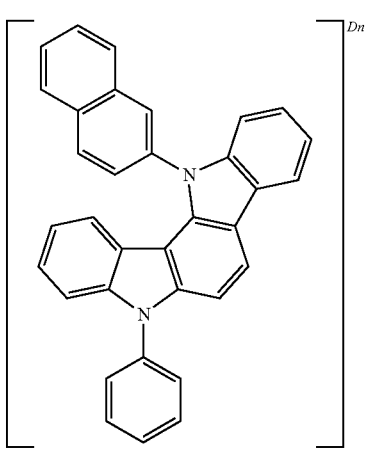
A-9
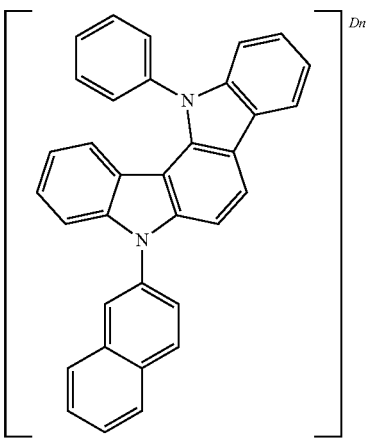

A-10
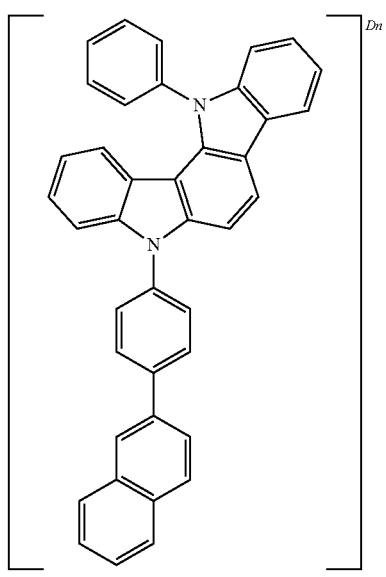
H-4
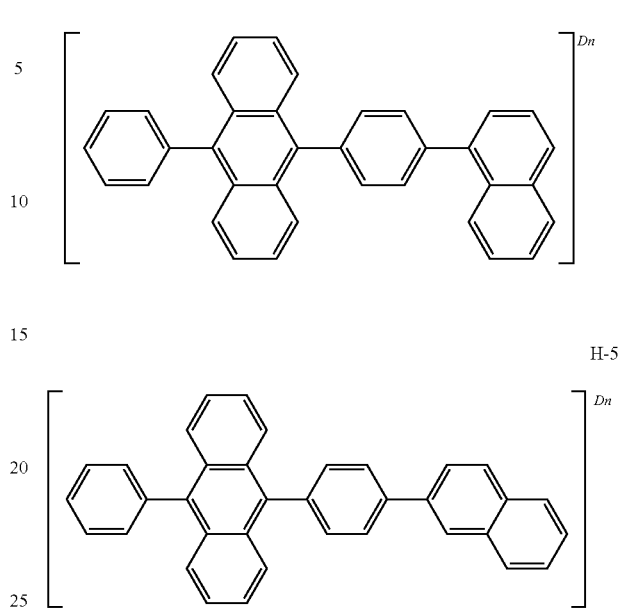
H-5
The compound represented by formula 4 may be at least one selected from the group consisting of the following compounds, but is not limited thereto.
H-1
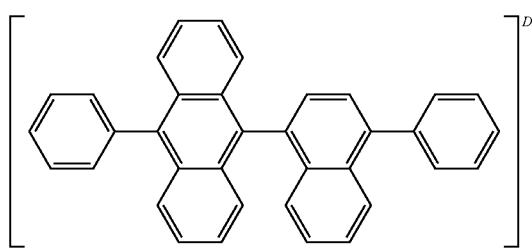
H-6
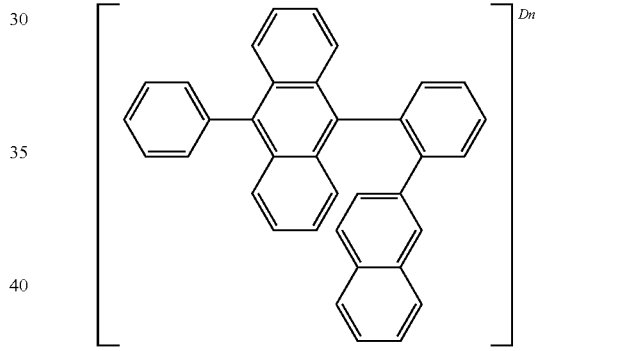
H-2
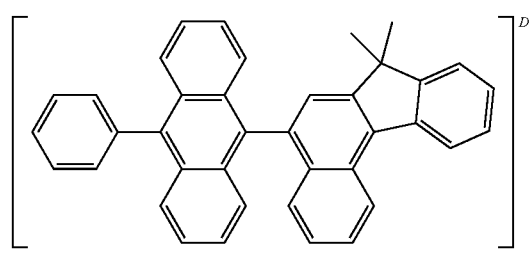
H-7
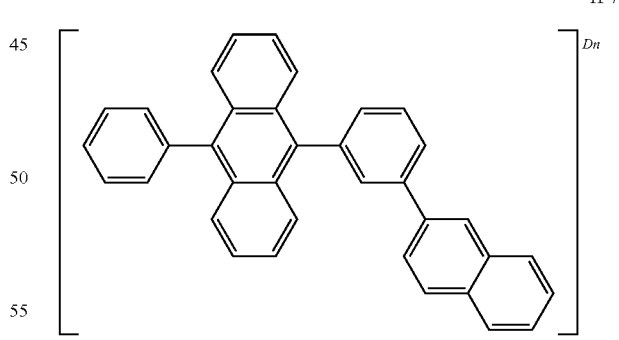
H-3
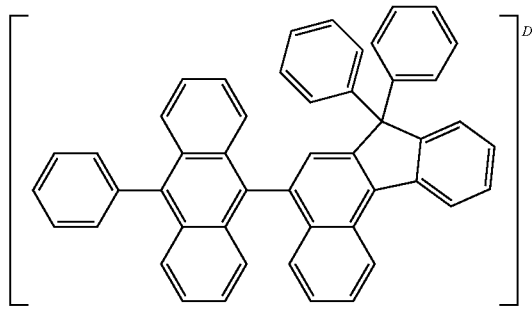
H-8
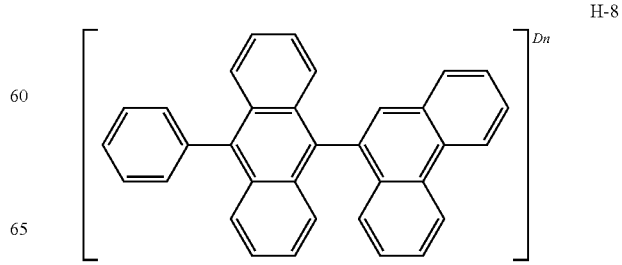

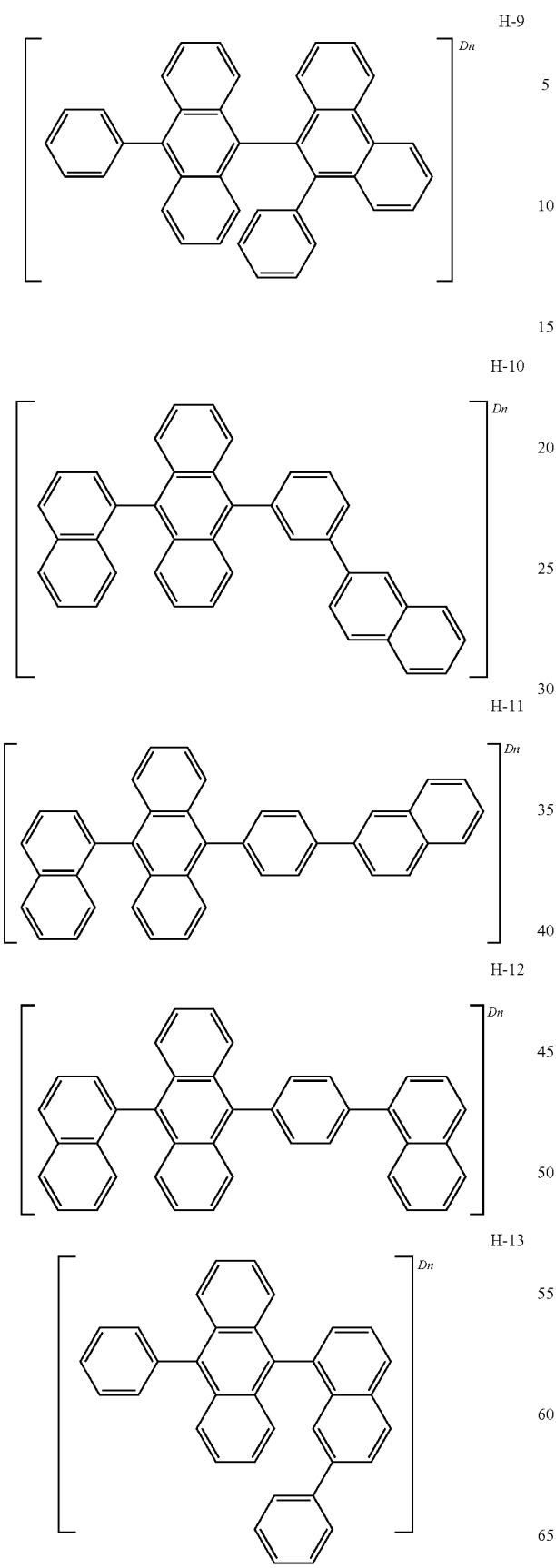
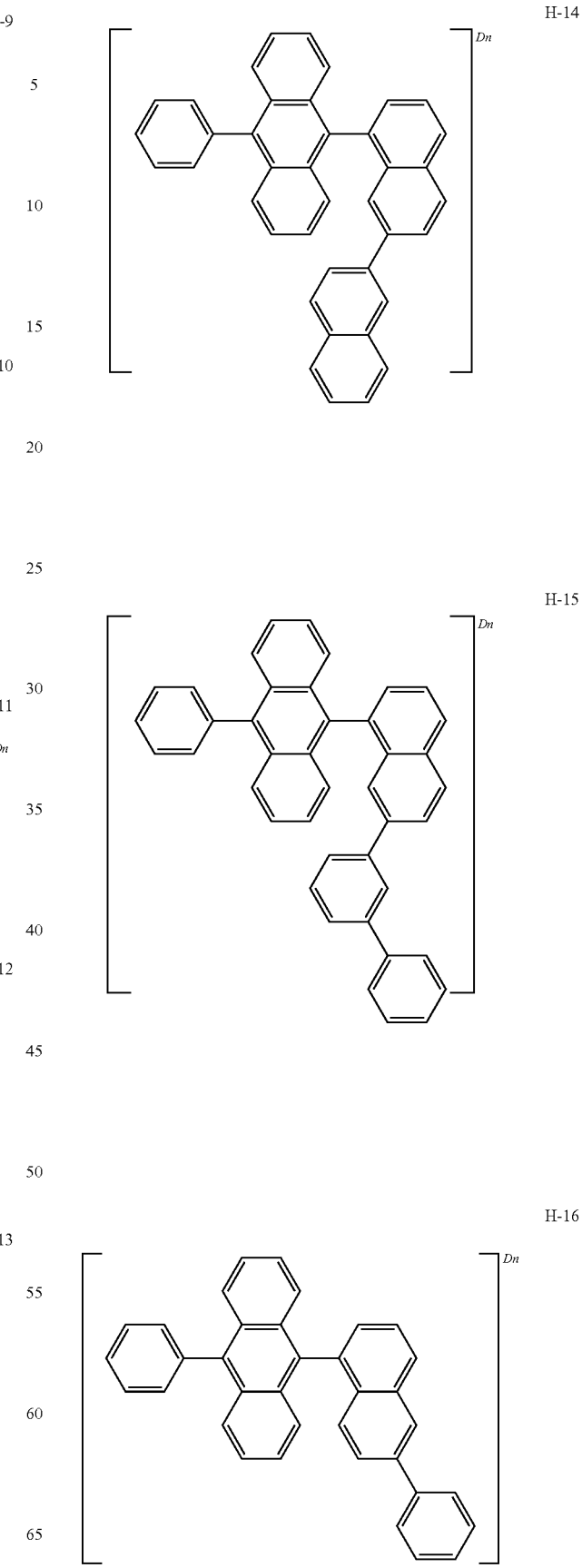

H-17
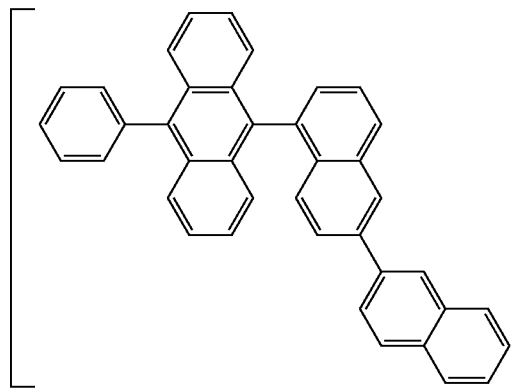
H-18
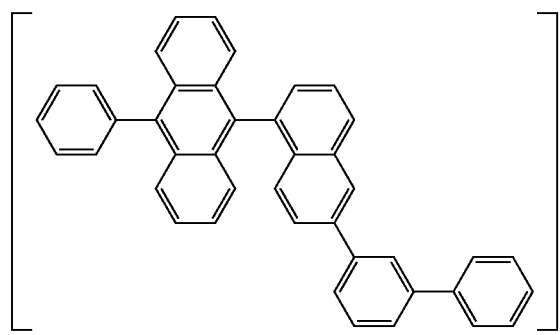
H-19
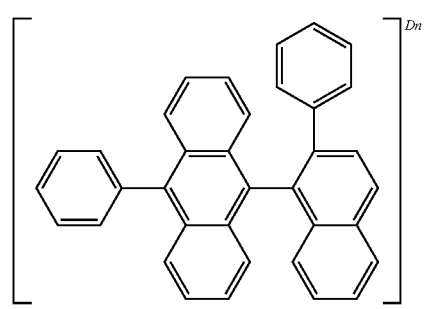
H-20
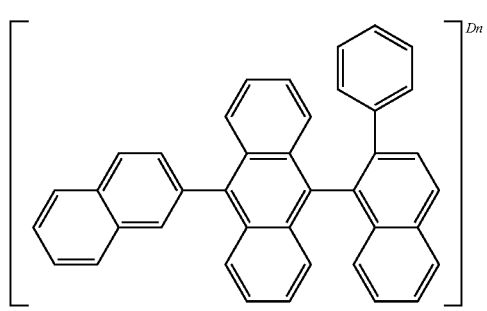
H-21
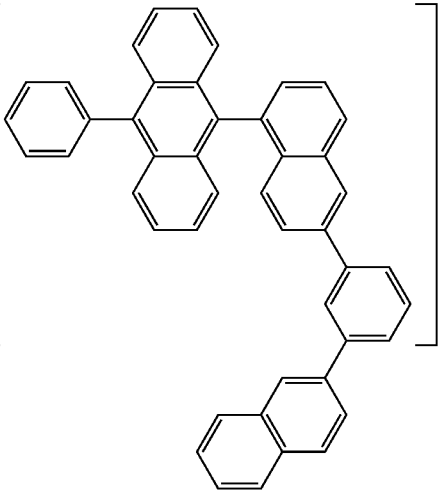
H-22
H-23

-continued
H-24
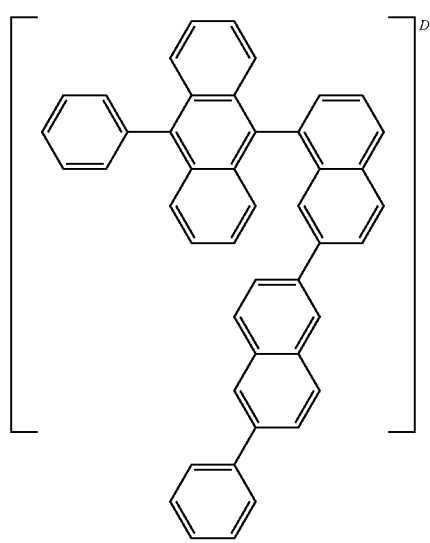
H-25
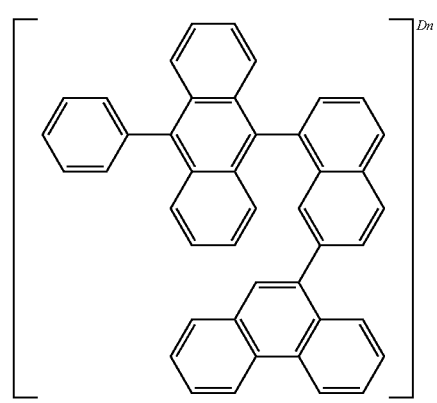
H-26
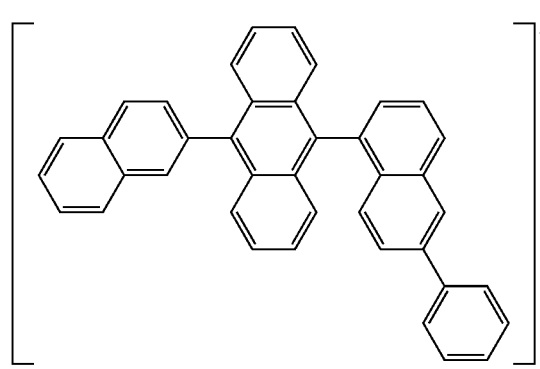
-continued
H-27
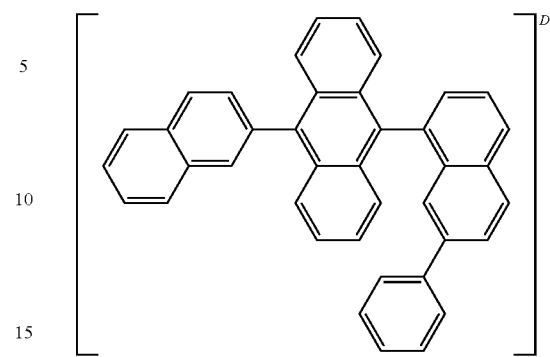
H-28
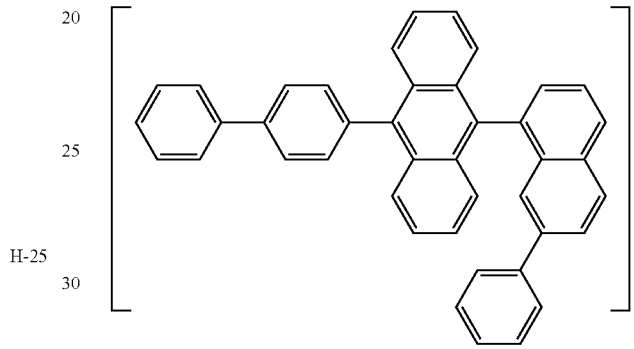
H-29
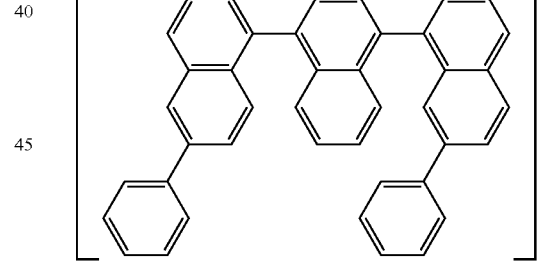
H-30
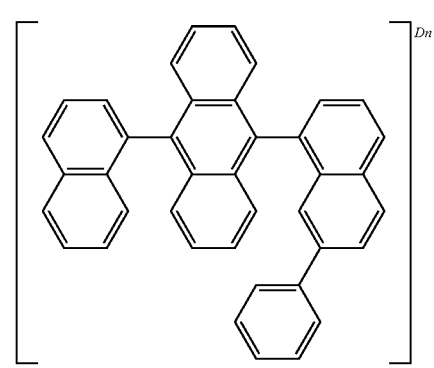

H-31
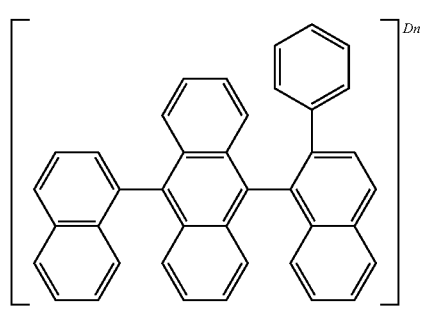
H-32
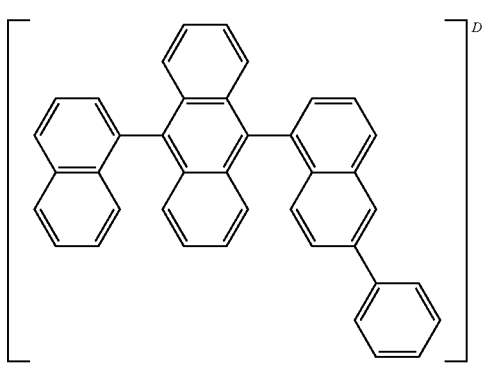
H-33
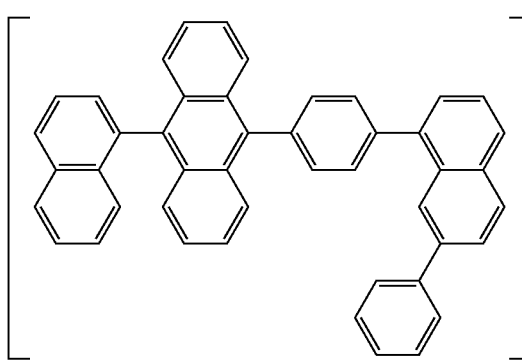
H-34
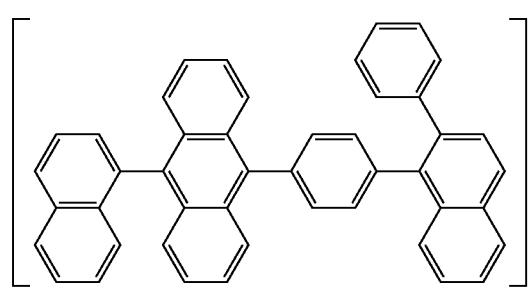
H-35
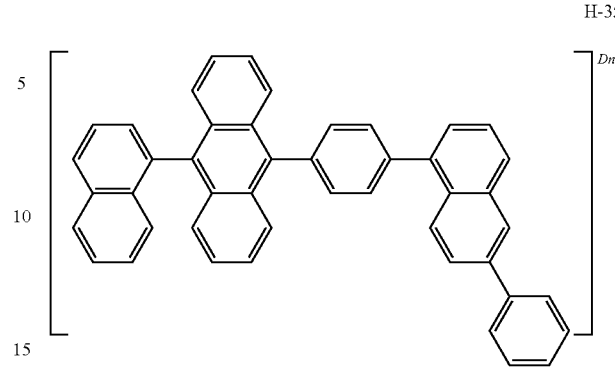
H-36
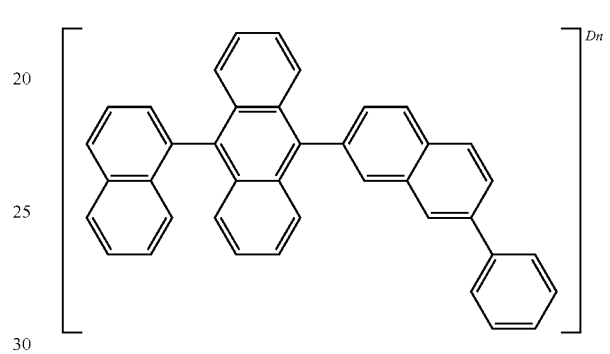
H-37
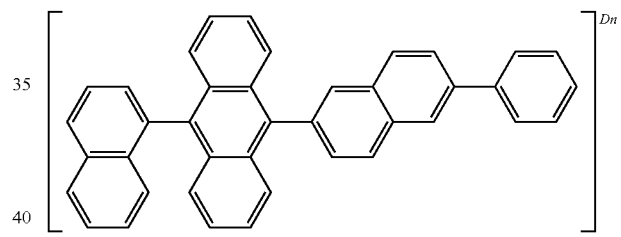
H-38
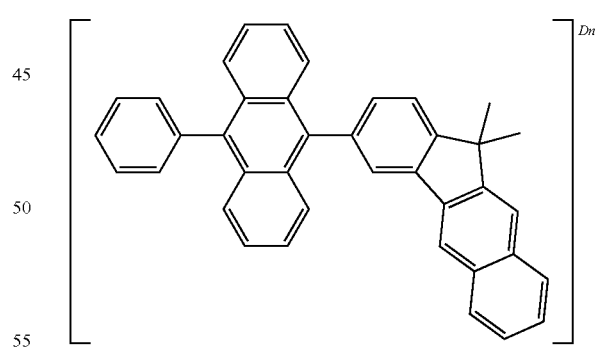
H-39
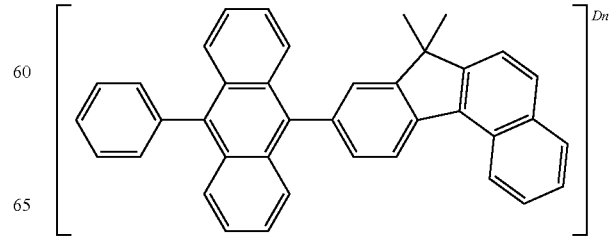

H-40
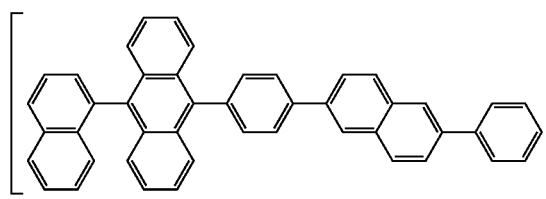
H-45
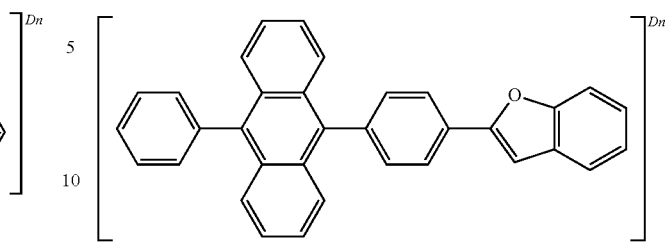
H-41
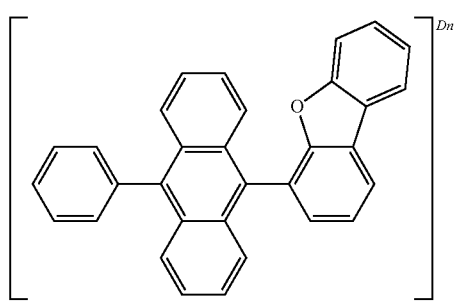
H-46
H-42
H-47
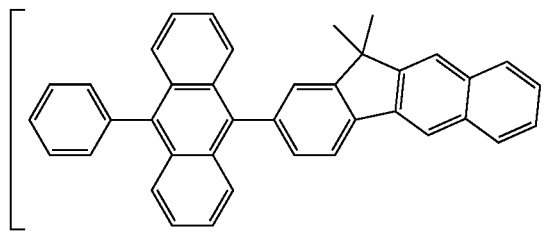
H-48
H-43
H-49
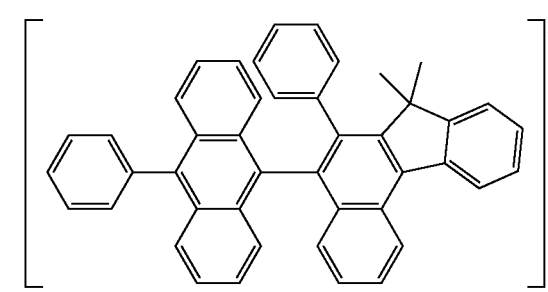
H-44
H-50
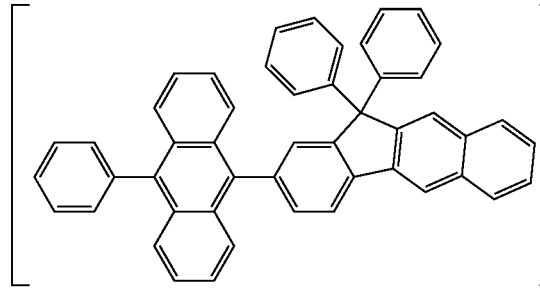
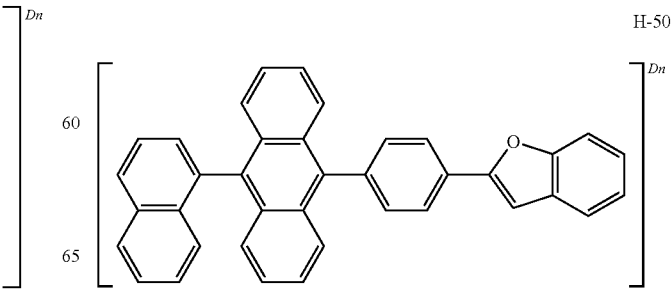

-continued
H-51
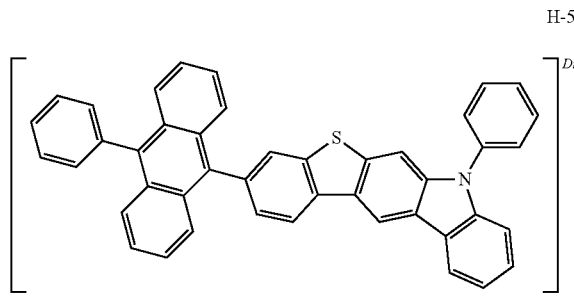
H-52
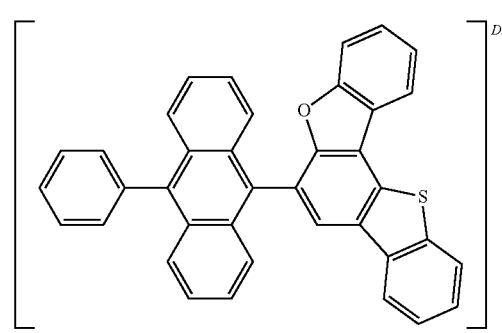
H-53
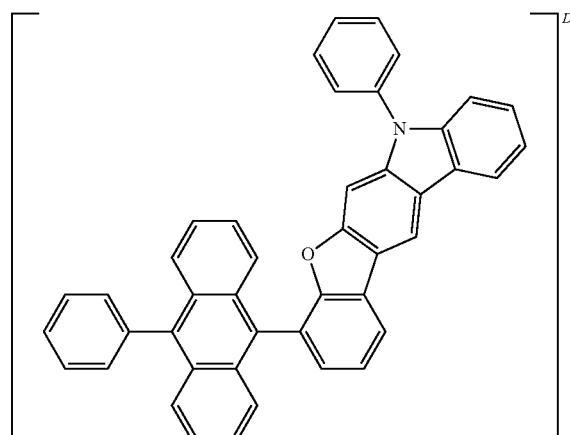
H-54
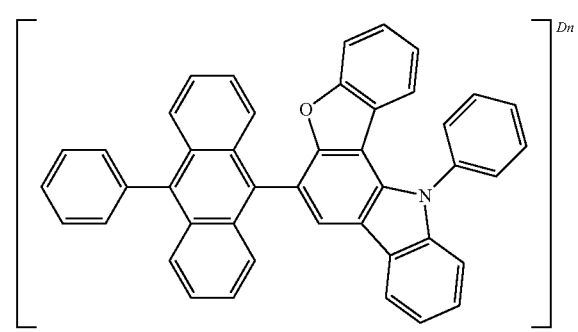
-continued
H-55
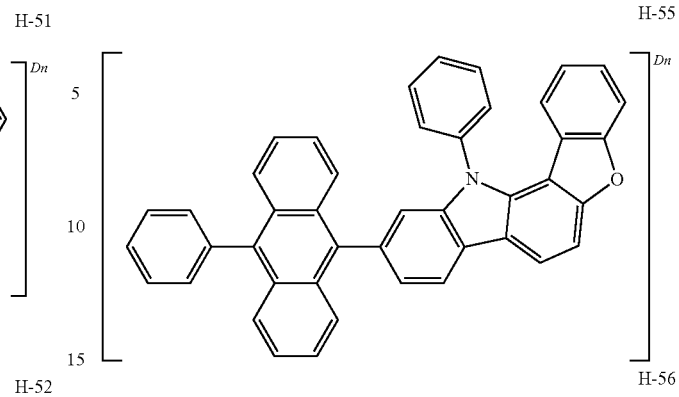
H-56
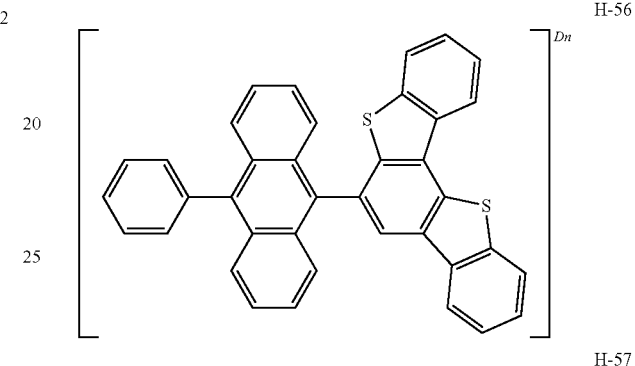
H-57
H-58
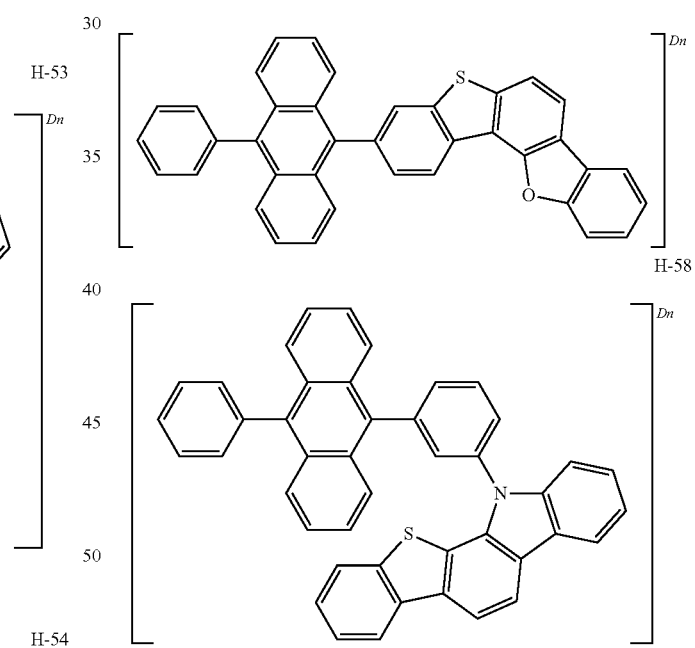
H-59
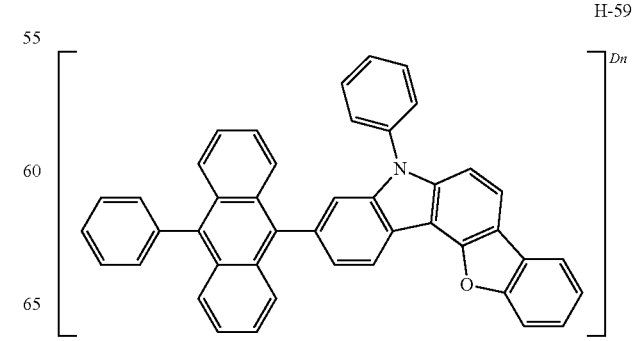

H-60
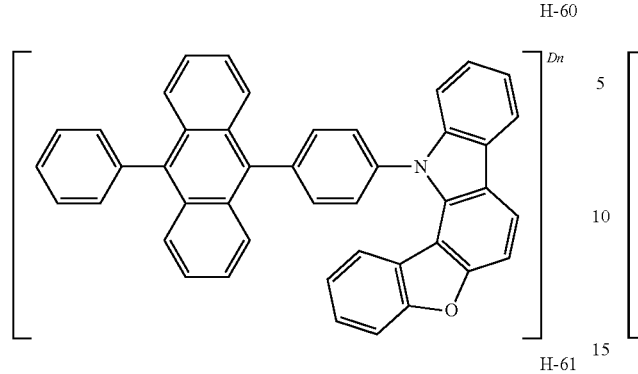
H-61
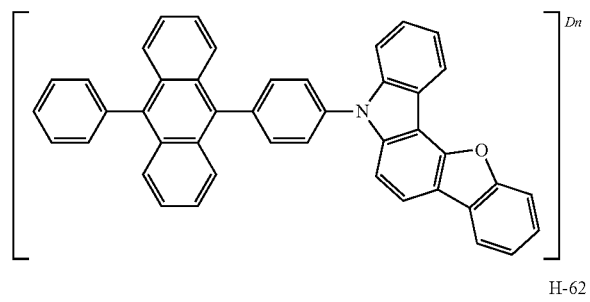
H-62
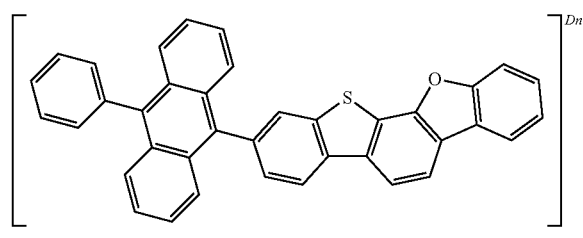
H-63
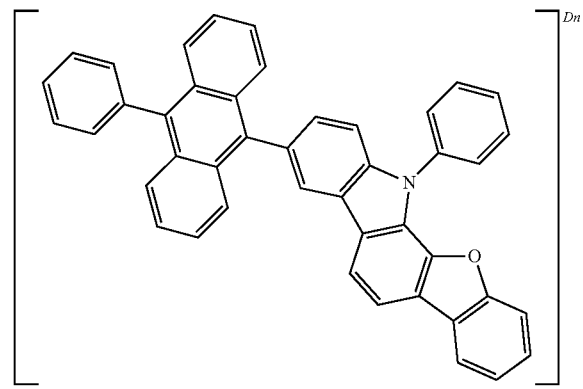
H-64
H-65
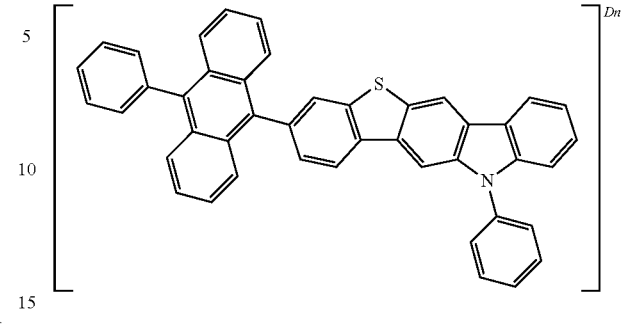
H-66
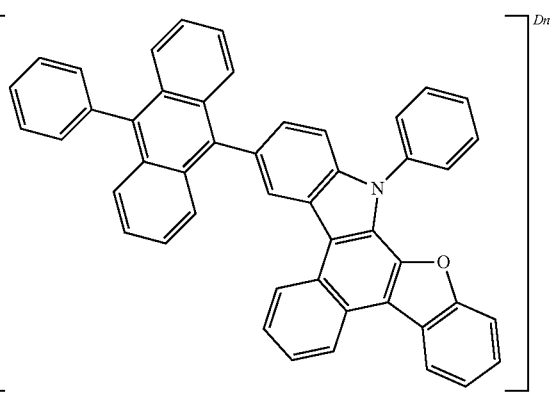
H-67
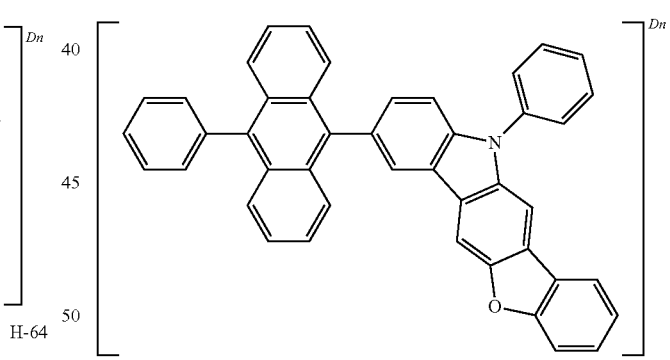
H-68
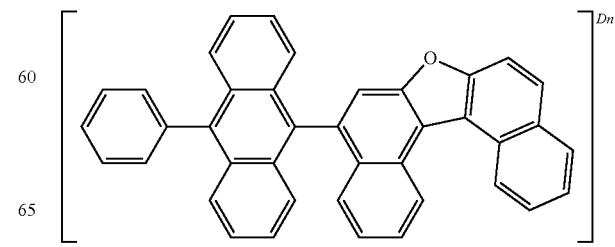

H-69
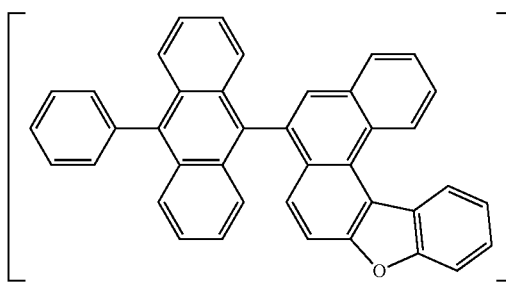
H-70
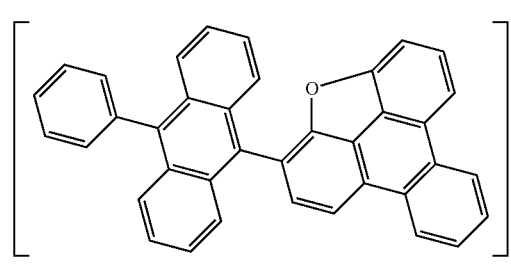
H-71
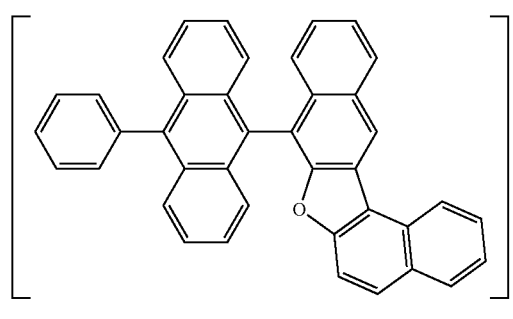
H-72
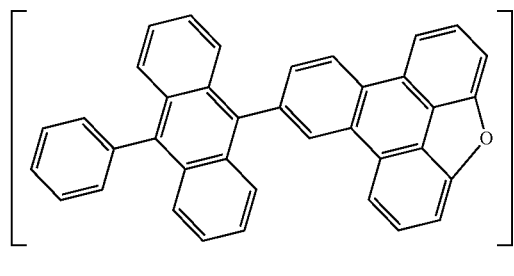
H-73
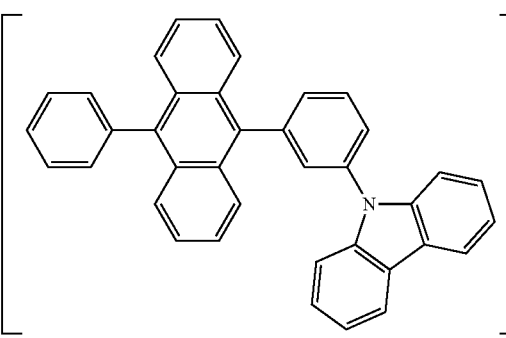
H-74
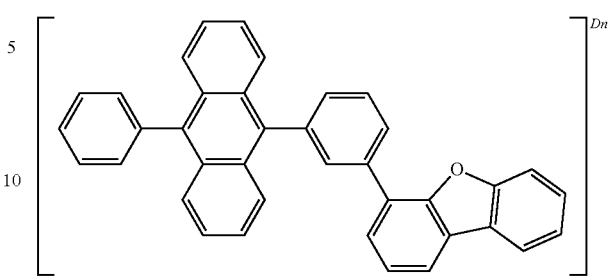
H-75
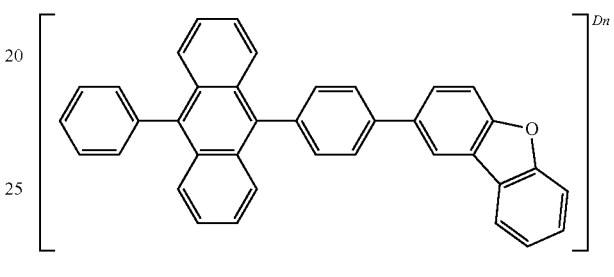
H-76
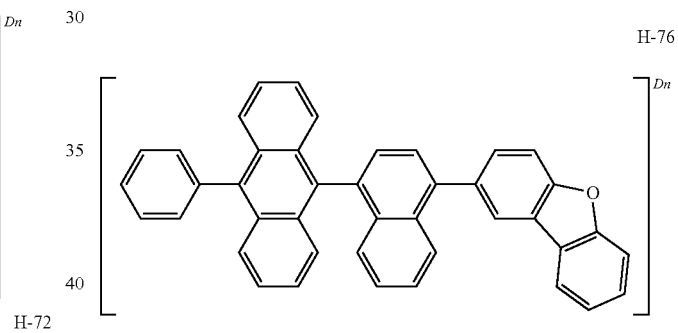
H-77
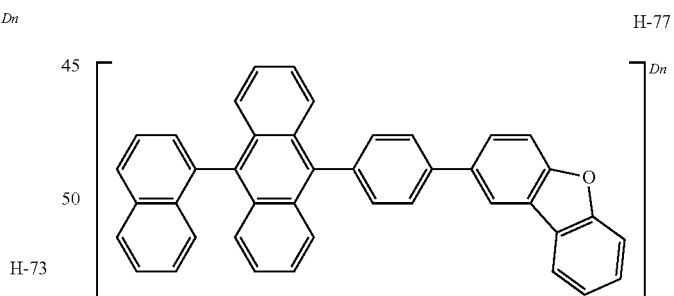
H-78
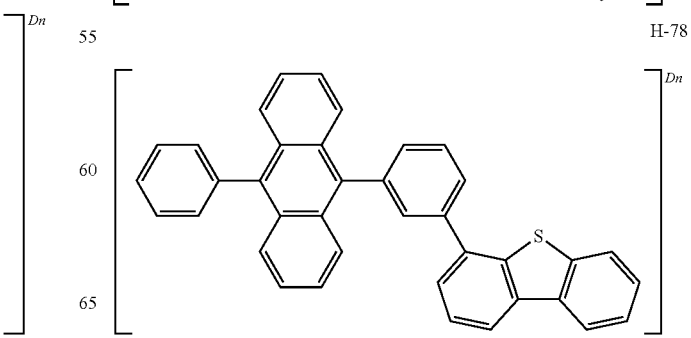

H-79
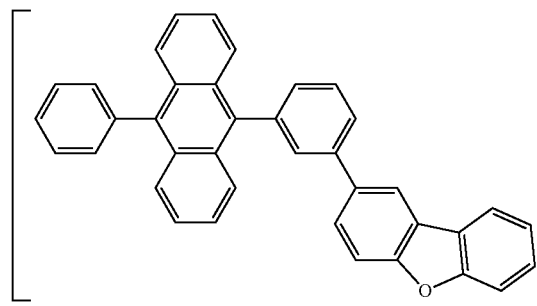
H-84
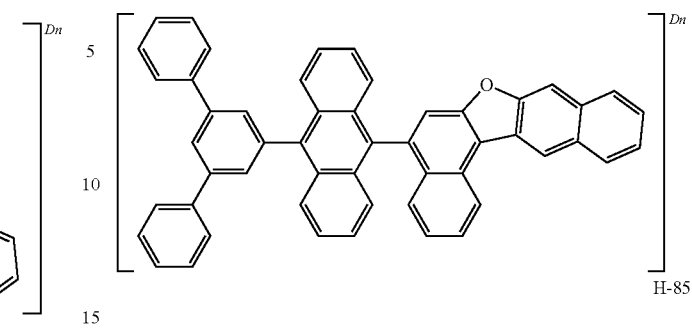
H-80
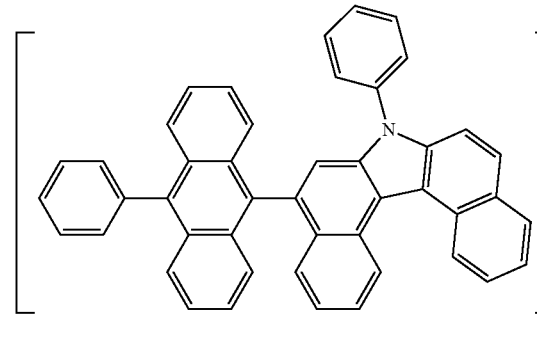
H-85
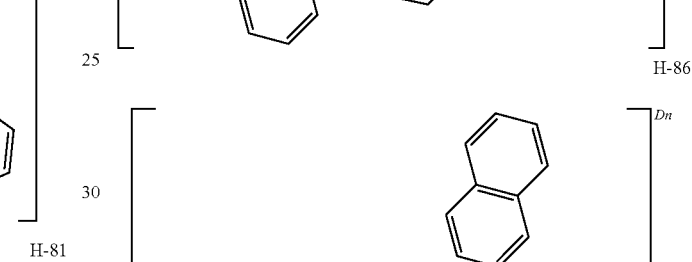
H-81
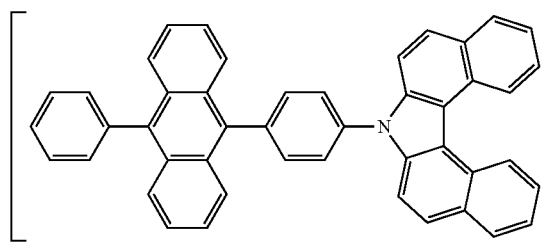
H-86
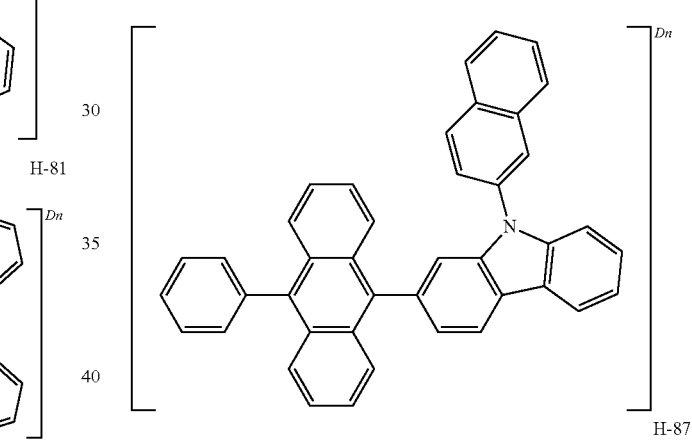
H-82
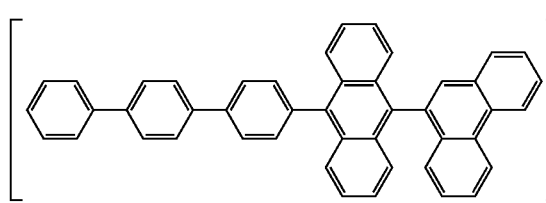
H-87
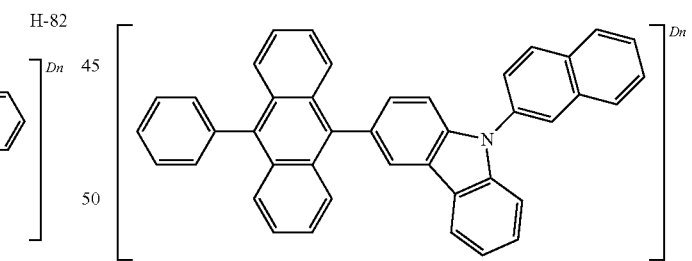
H-83
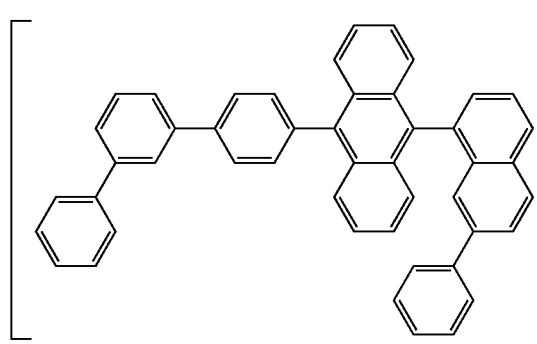
H-88
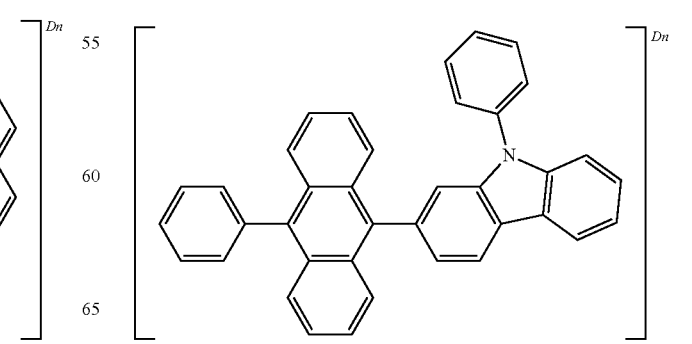

-continued
H-89
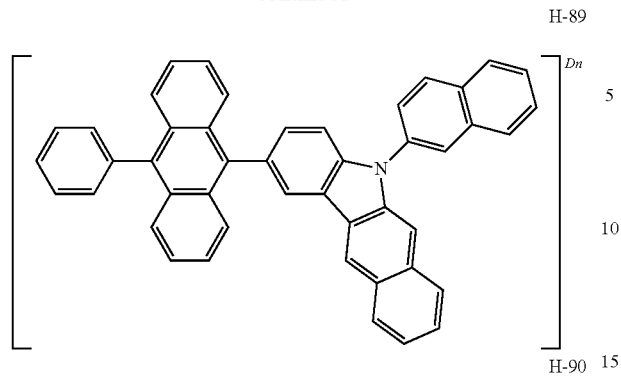
H-90
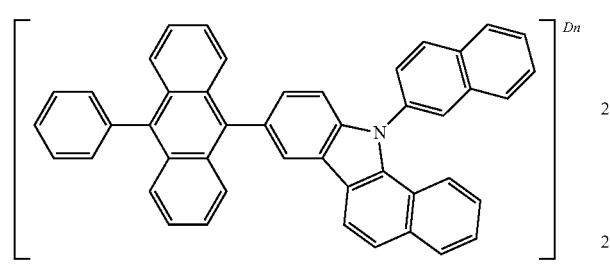
H-91
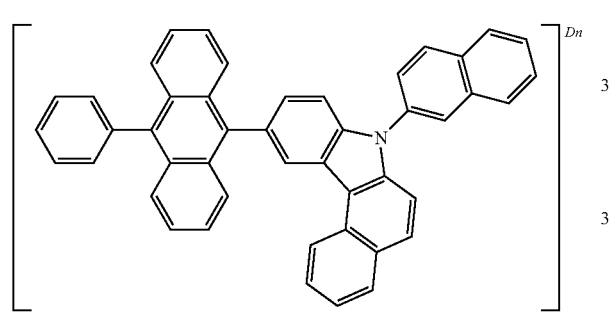
H-92
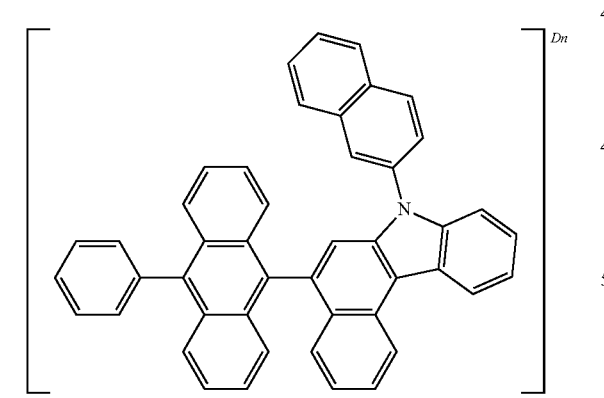
H-93
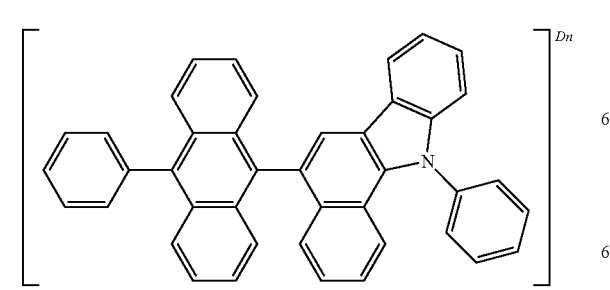
-continued
H-94
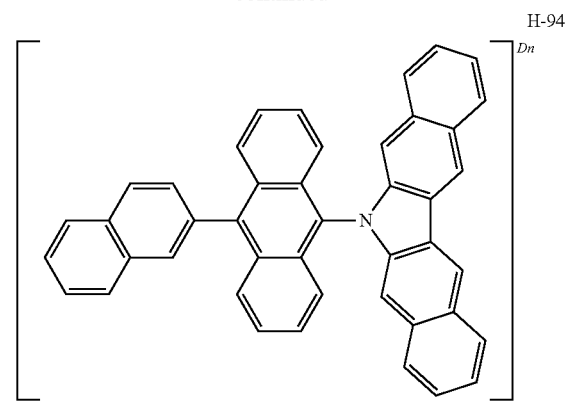
H-95
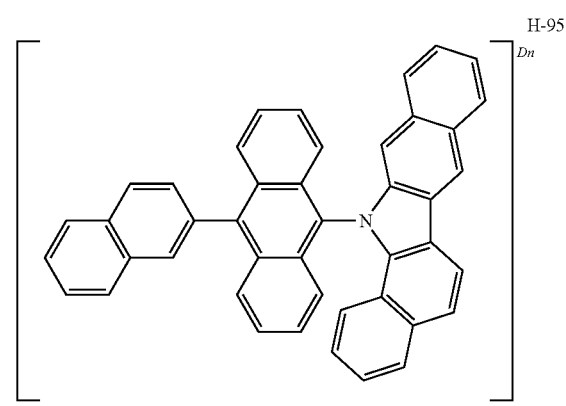
H-96
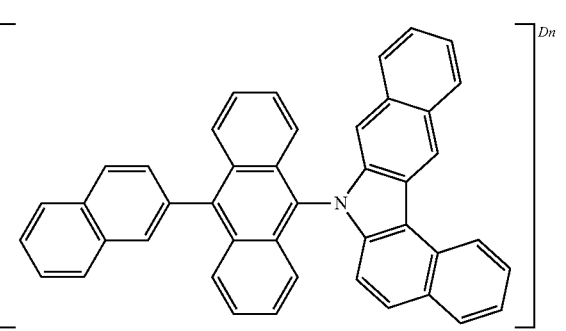
H-97
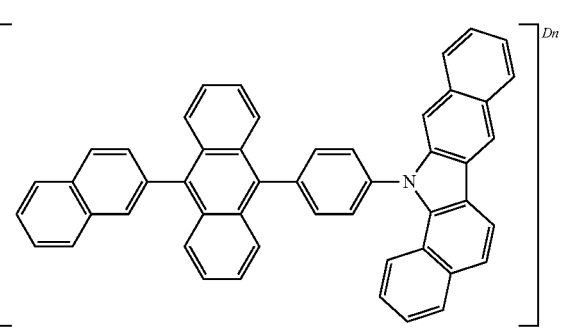

-continued
H-98
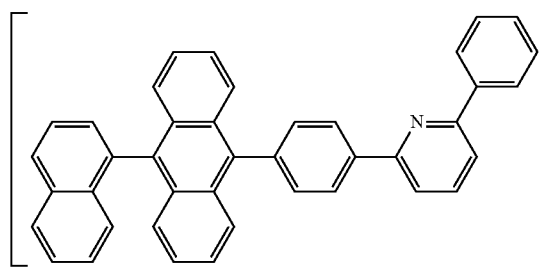
H-99
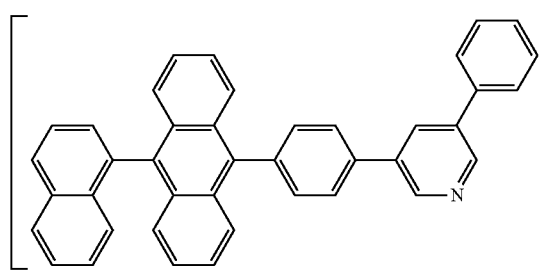
H-100
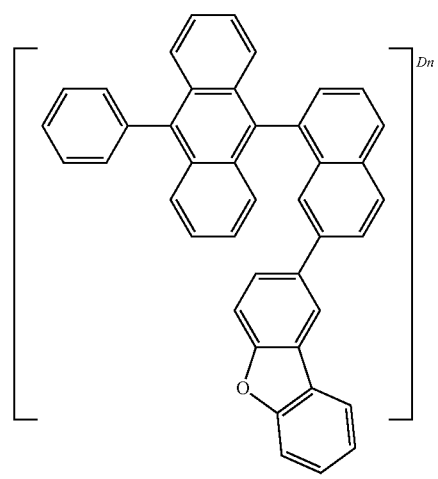
H-101
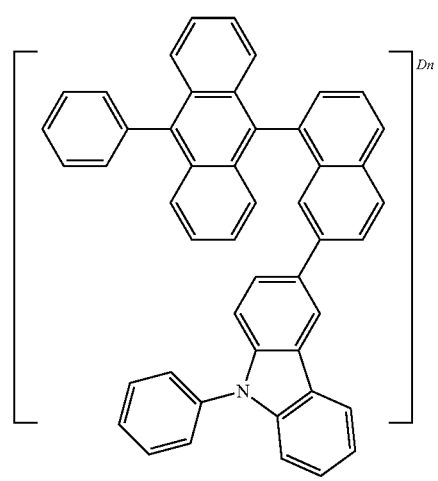
H-102
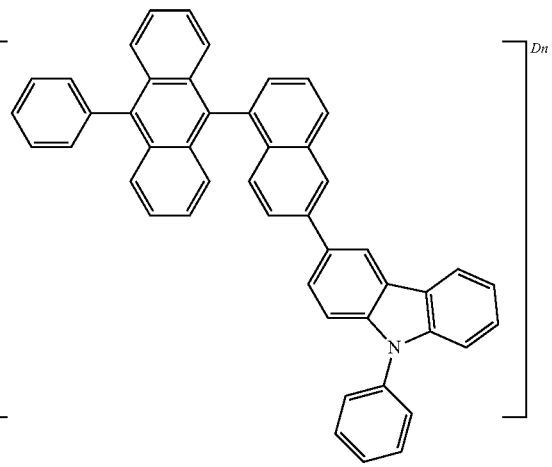
H-103
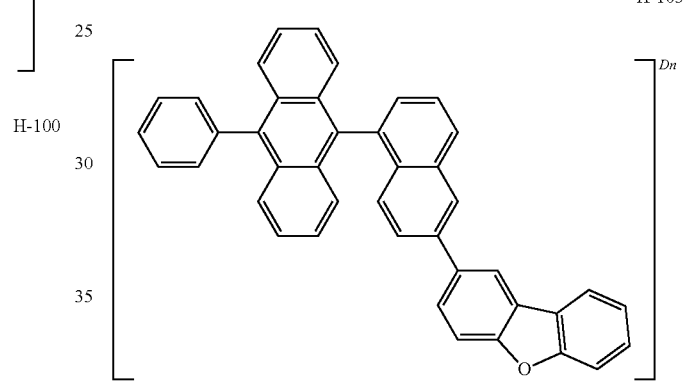
H-104
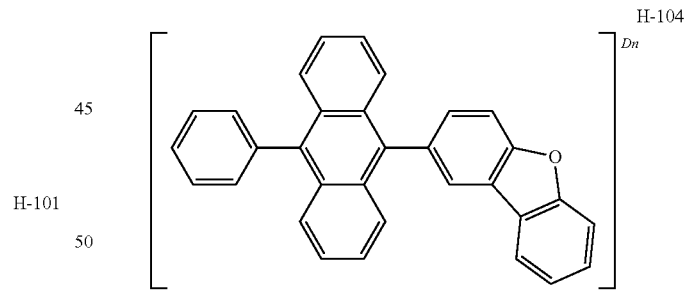
H-105
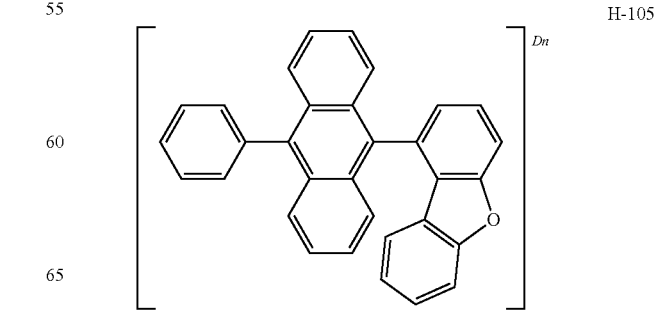

-continued
H-106
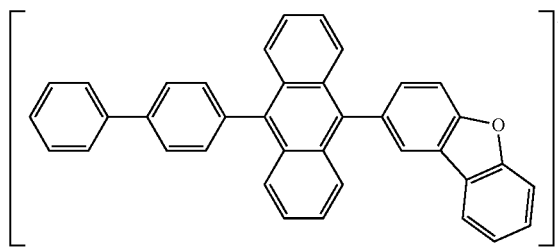
H-107
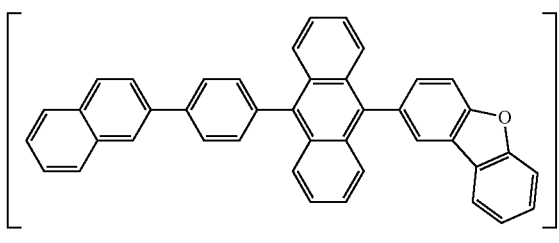
H-108
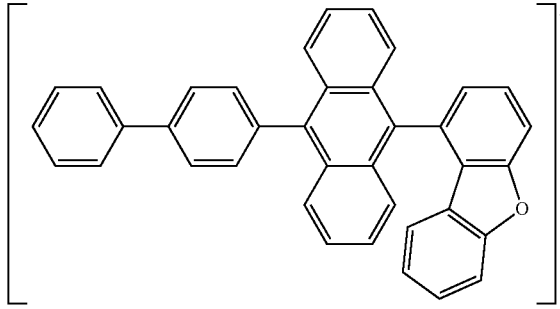
H-109
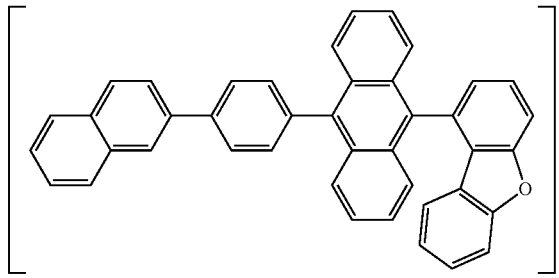
H-110
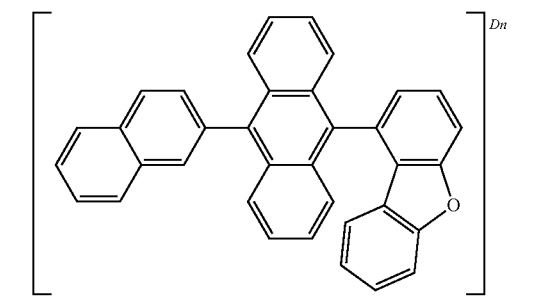
-continued
H-111
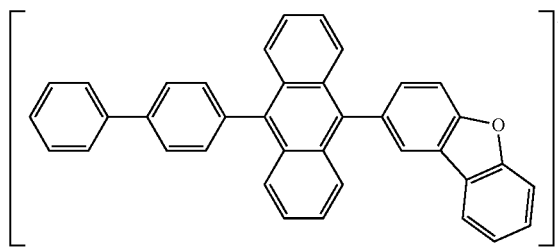
H-112
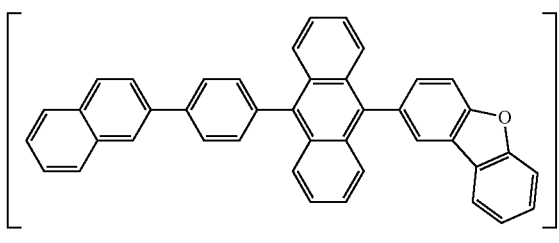
H-113
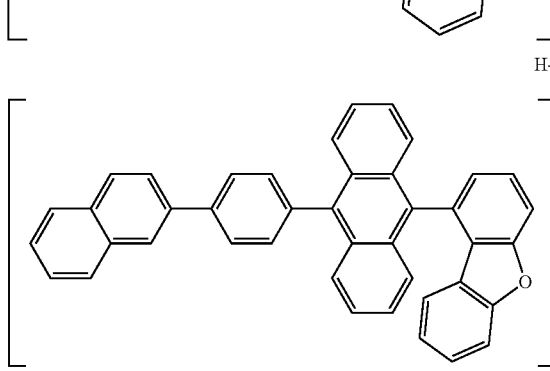
H-114
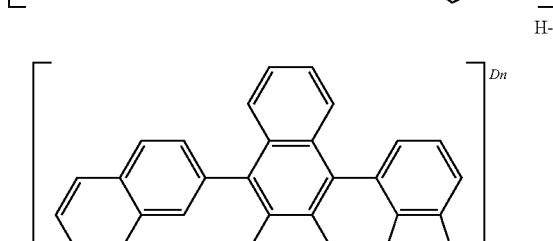

-continued
H-115
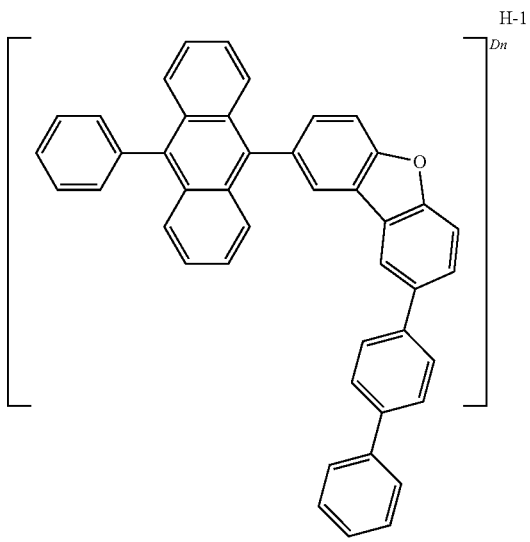
H-116
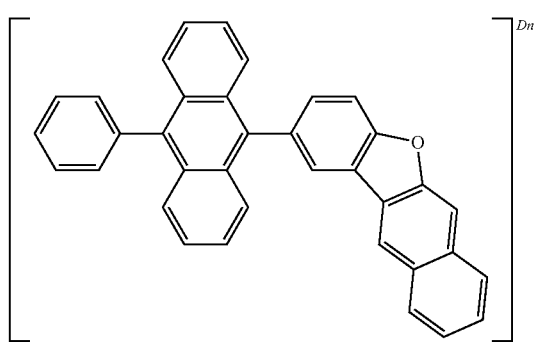
H-117
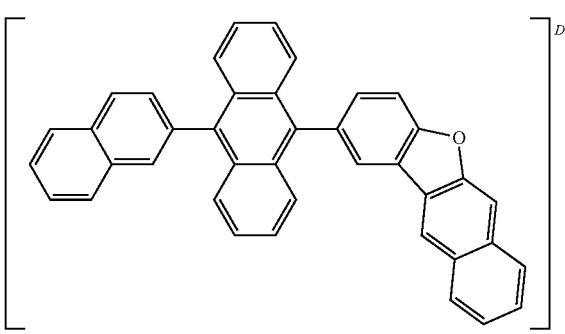
H-118
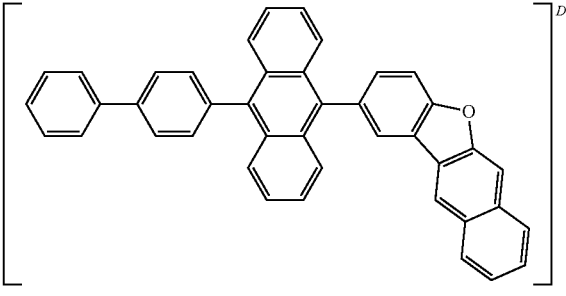
H-119
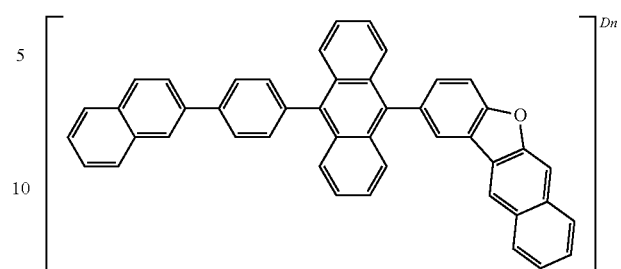
H-120
H-121
H-122
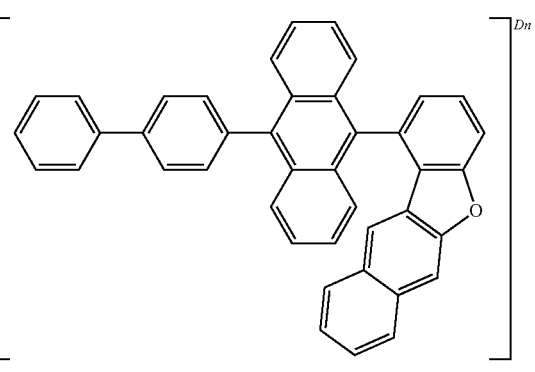

H-123
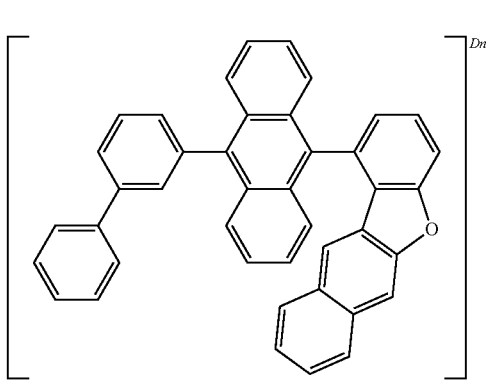
H-127
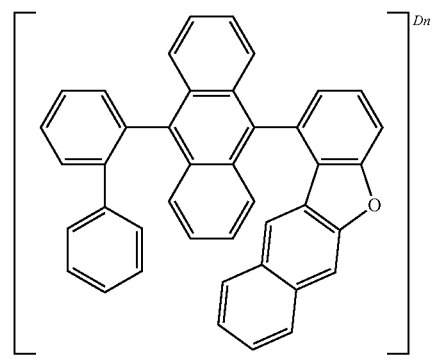
H-124
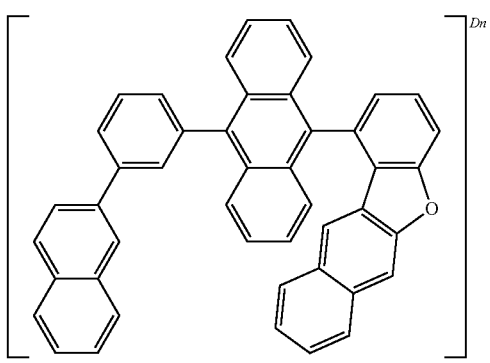
H-128
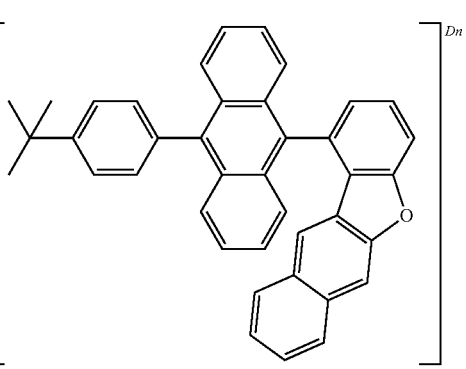
H-125
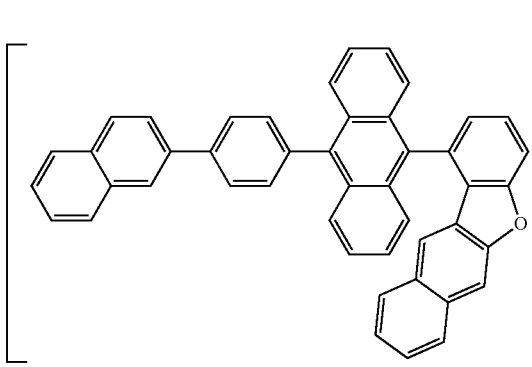
H-129
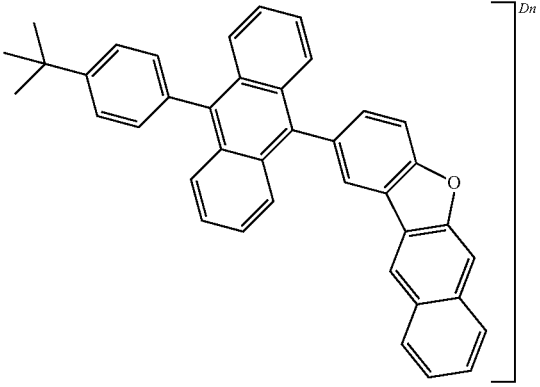
H-126
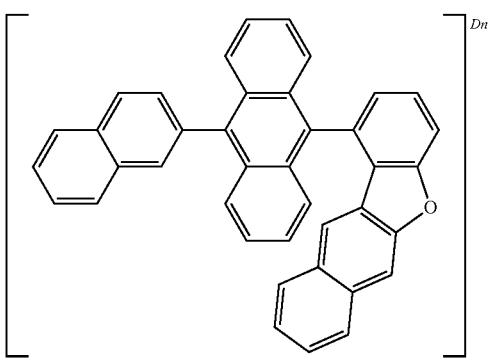
H-130
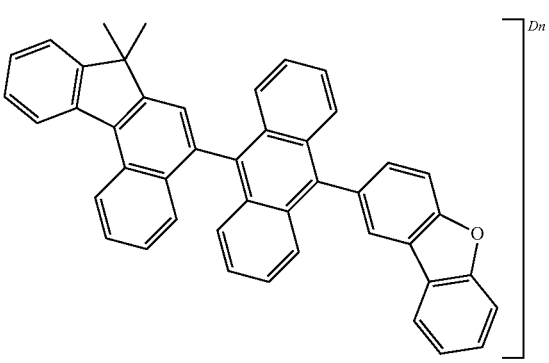

H-131
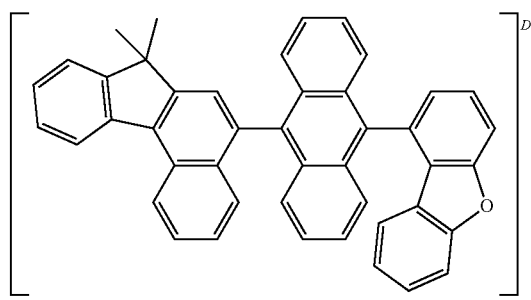
H-135
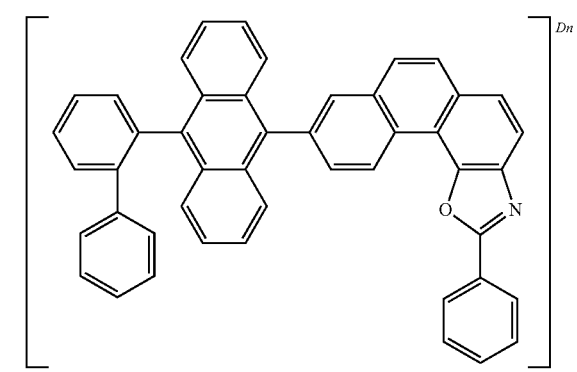
H-132
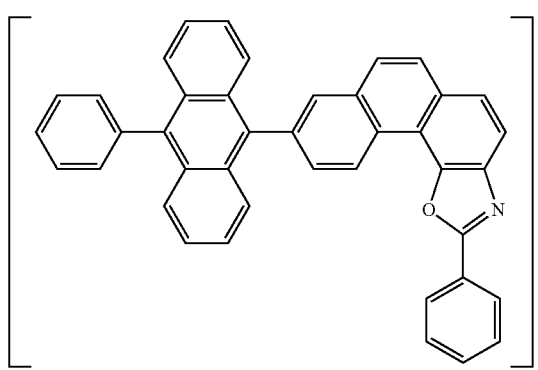
H-136
H-133
H-137
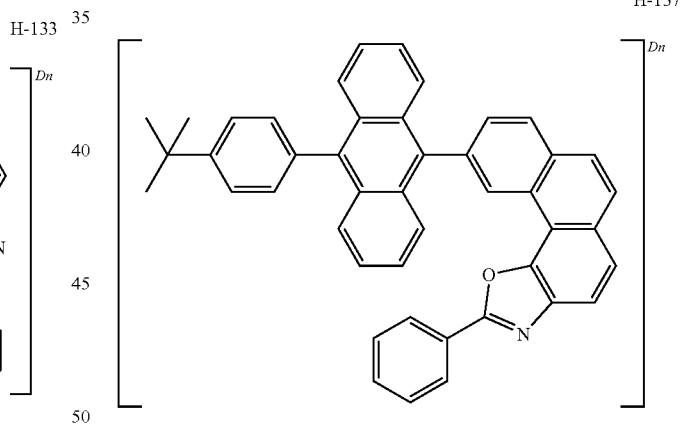
H-134
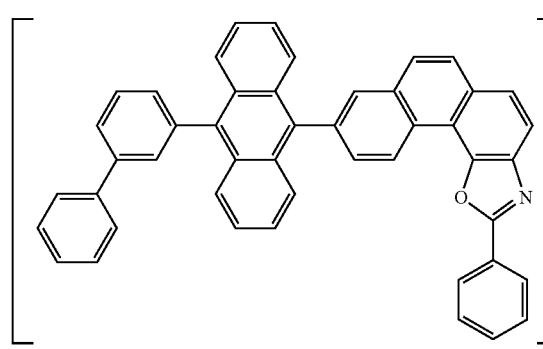
H-138
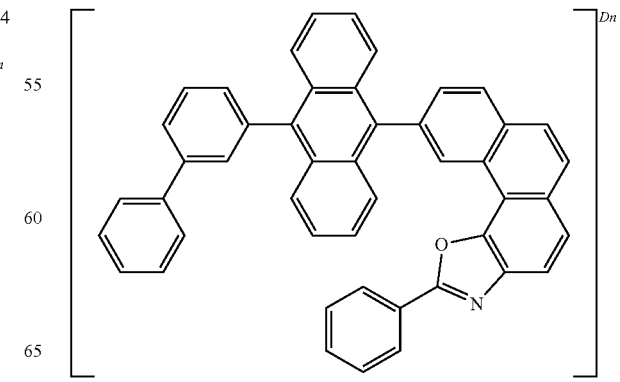

H-139
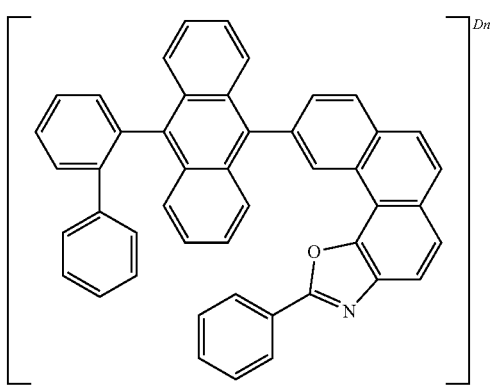
H-142
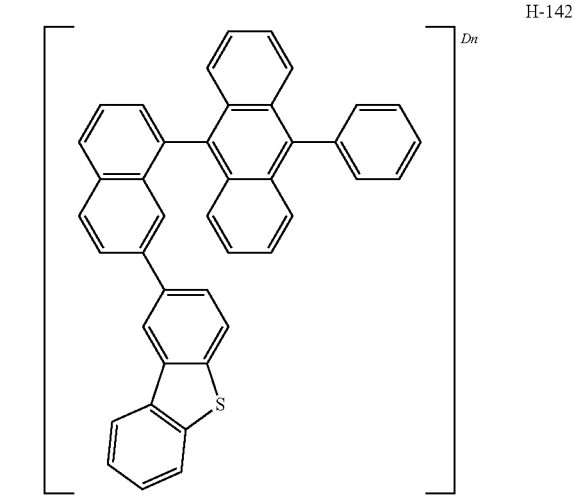
H-140
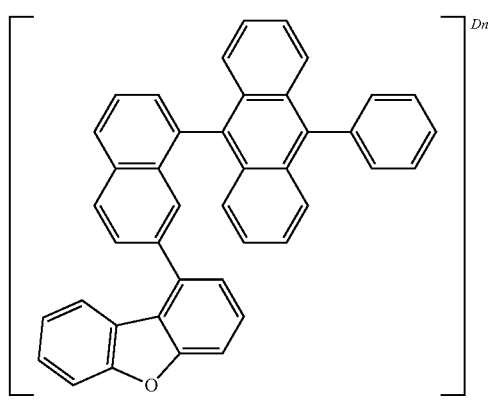
H-143
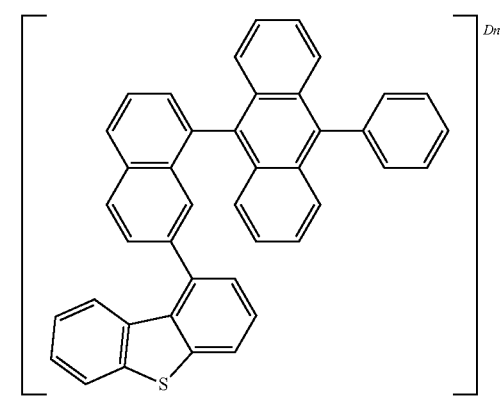
H-141
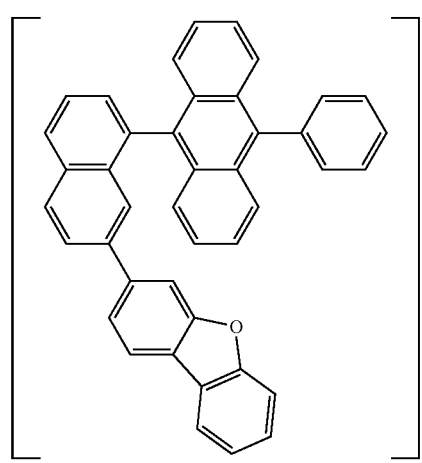
H-144
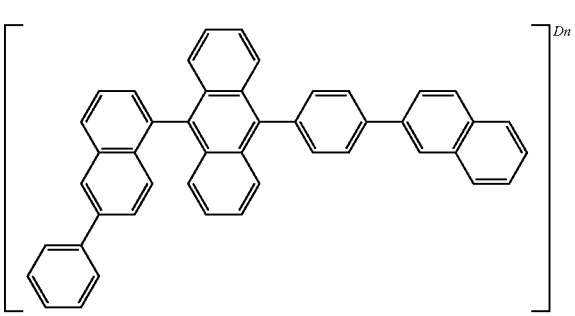
H-145
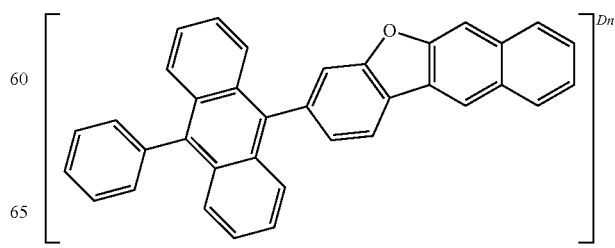

H-146
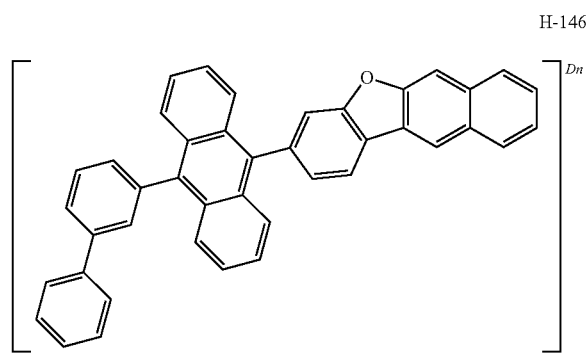
H-147
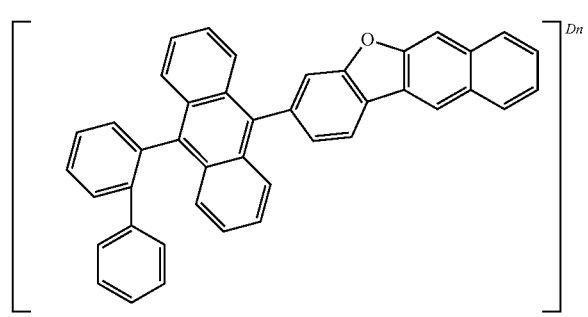
H-148
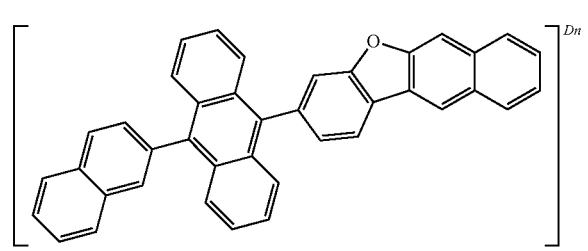
H-149
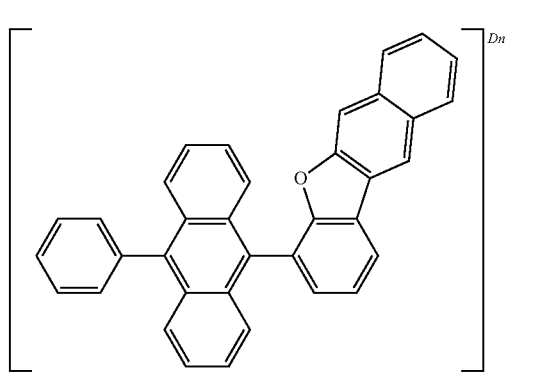
H-150
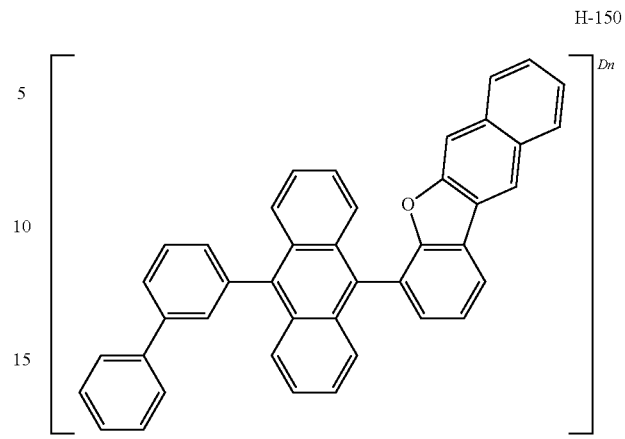
H-151
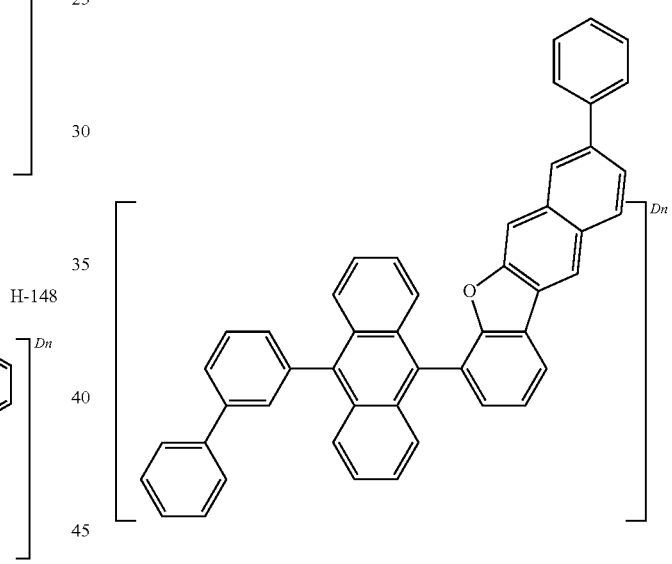
H-152
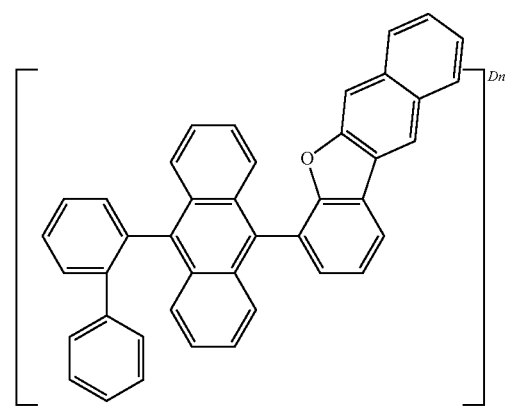

H-153
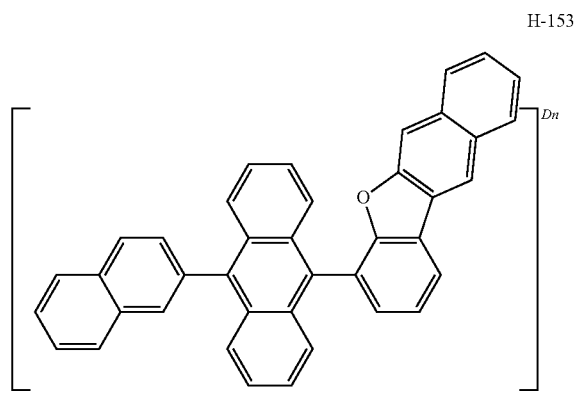
H-157
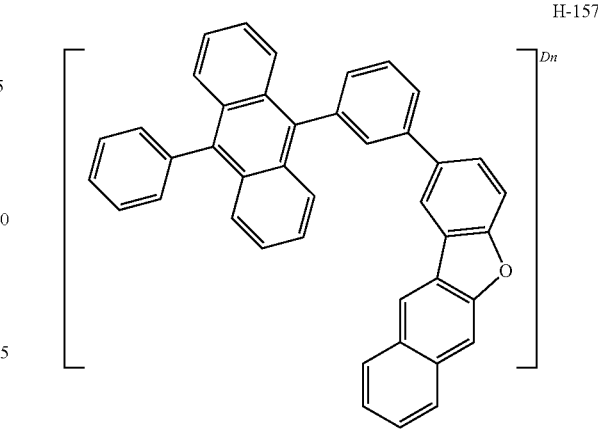
H-154
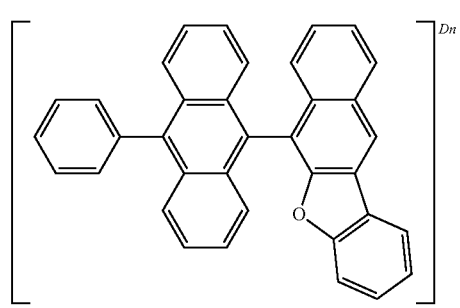
H-158
H-155
H-159
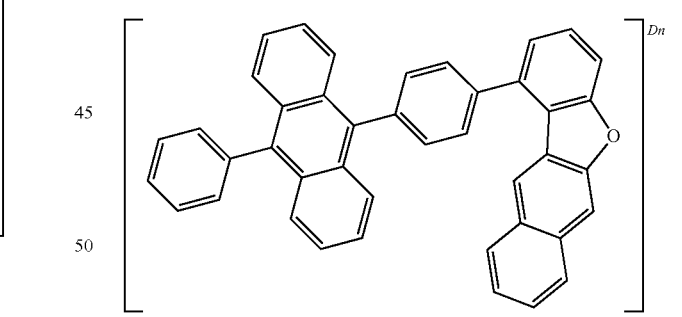
H-156
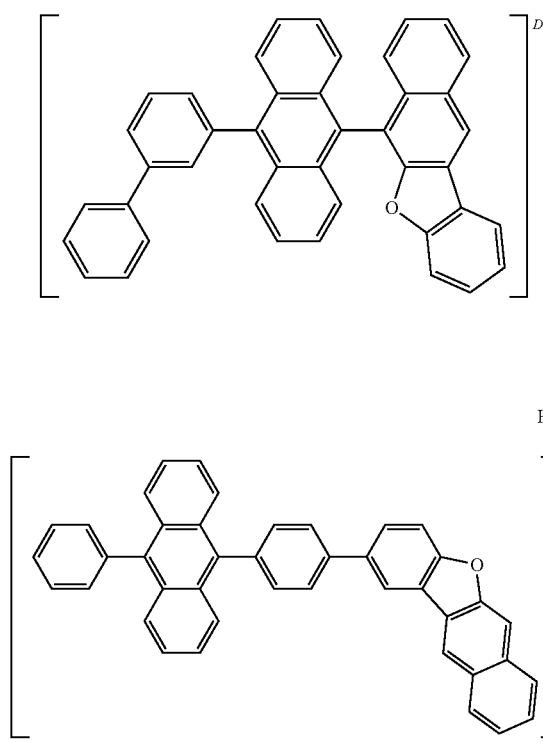
H-160

H-161
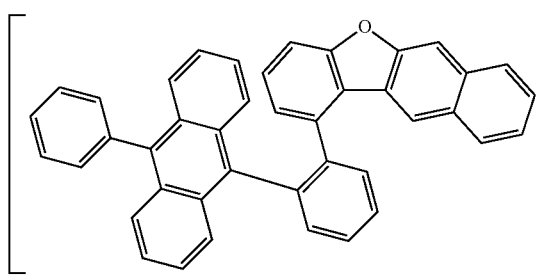
H-165
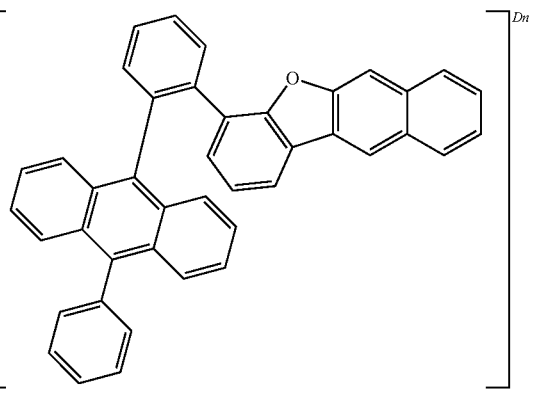
H-162
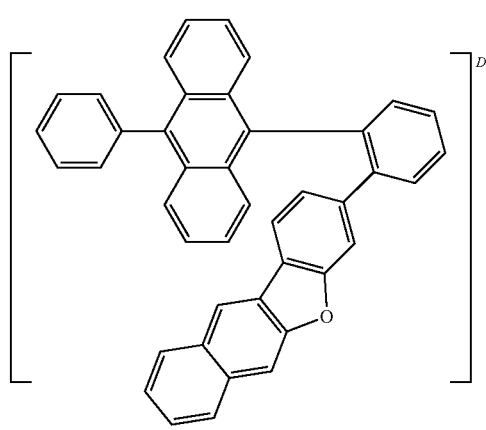
H-166
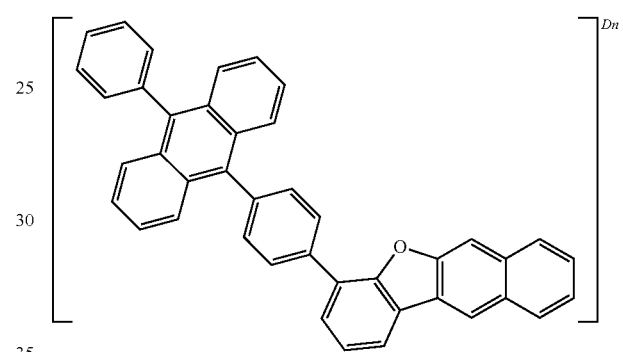
H-163
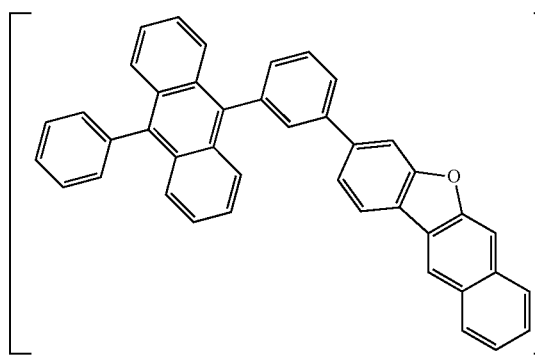
H-167
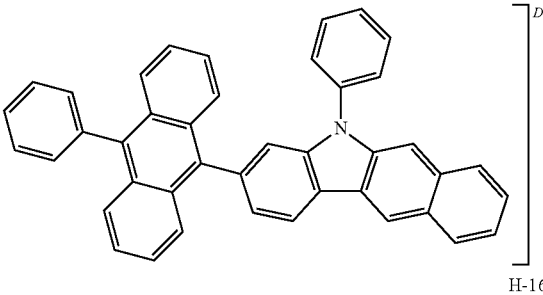
H-164
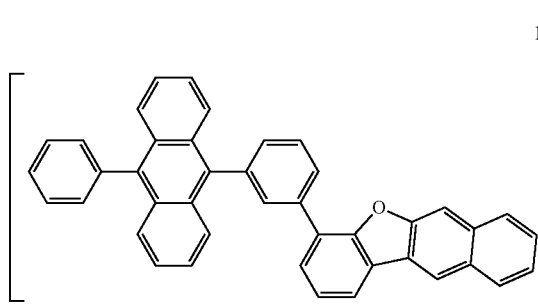
H-168
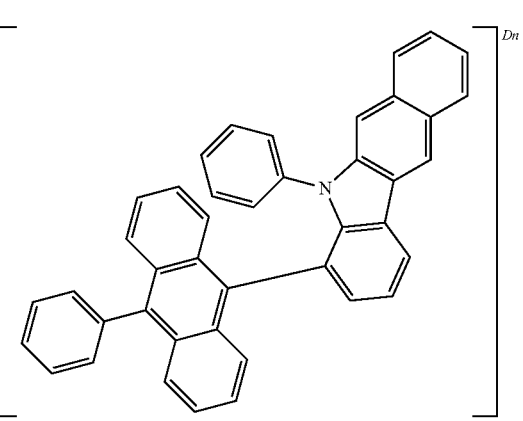

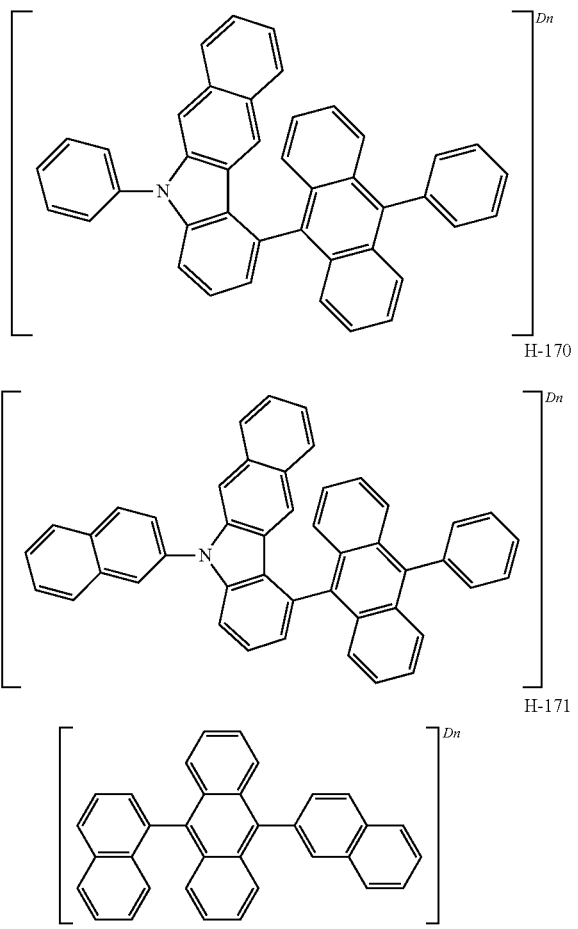

The compound represented by formula 5 may be at least one selected from the group consisting of compounds H-2, H-3, H-38, H-39, H-41 to H-44, H-46, H-47, H-68, H-69, H-71, H-73 to H-81, H-84 to H-97, H-100 to H-131, H-140 to H-143, and H-145 to H-170, but is not limited thereto.

According to one embodiment of the present disclosure, the present disclosure may provide a compound represented by any one of formulas 1 to 5. Specifically, the present disclosure may provide at least one compound selected from the group consisting of compounds C-1 to C-88, compounds B-1 to B-9 and B-11 to B-84, compounds A-1 to A-10, and compounds H-1 to H-171.

According to one embodiment of the present disclosure, the present disclosure may provide a combination of at least one of the compound represented by formula 1, the compound represented by formula 2, and the compound represented by formula 3; and at least one of the compound represented by formula 4 and the compound represented by formula 5. Specifically, the present disclosure may provide a combination of at least one of compounds C-1 to C-88, compounds B-1 to B-9 and B-11 to B-84, and compounds A-1 to A-10; and at least one of compounds H-1 to H-171. This may be a combination of the second hole transport layer material and the host material of the light-emitting layer.

According to another embodiment of the present disclosure, the present disclosure may provide a combination of at least one compound represented by formula 1, 2 or 3, and at least one compound represented by formula 4. The compound represented by formula 4 may be used in combination with the compound represented by formula 5.

According to another embodiment of the present disclosure, the present disclosure may provide a combination of the compound represented by formula 4 and the compound represented by formula 5. This can be used as a plurality of host materials of the light-emitting layer.

Non-deuterated analogs of the compound represented by any one of formulas 1 to 5 of the present disclosure can be prepared by known coupling and substitution reactions. The compound represented by any one of formulas 1 to 5 of the present disclosure may be prepared in a similar manner by using deuterated precursor materials, or more generally may be prepared by treating the non-deuterated compound with a deuterated solvent or D6-benzene in the presence of an H/D exchange catalyst such as a Lewis acid, e.g., aluminum trichloride or ethyl aluminum chloride, a trifluoromethanesulfonic acid, or a trifluoromethanesulfonic acid-D. In addition, the degree of deuteration can be controlled by changing the reaction conditions such as the reaction temperature. For example, the number of deuterium in formulas 1 to 5 can be controlled by adjusting the reaction temperature, time, the equivalent of the acid, etc.

The compounds represented by formulas 1 to 5 of the present disclosure may be prepared by a synthetic method known to one skilled in the art. For example, the compound represented by formula 1 can be prepared by referring to U.S. Patent Application Publication No. 2017/0025609 (published on Jan. 26, 2017), Korean Patent Application Laid-Open Nos. 2015-0004264 (published on Jan. 12, 2015), and 2012-0101029 (published on Sep. 12, 2012), etc., but is not limited thereto. The compound represented by formula 2 can be prepared by referring to Korean Patent Application Laid-Open No. 2010-0079458 (published on Jul. 8, 2010), JP Patent No. 3139321 (published on Feb. 26, 2001), and Korean Patent Application Laid-Open No. 2012-101029 (published on Sep. 12, 2012), etc., but is not limited thereto. The compound represented by formula 3 can be prepared by referring to Korean Patent Nos. 0955993 (published on May 4, 2010), 1144358 (published on May 11, 2012), 1146929 (published on May 23, 2012), 1146930 (published on May 23, 2012), 1497124 (published on Mar. 6, 2015), and 1498278 (published on Mar. 6, 2015), Korean Patent Application Laid-Open No. 2012-0101029 (published on Sep. 12, 2012), etc., but is not limited thereto. The compound represented by formula 4 or 5 can be prepared by referring to Korean Patent Nos. 1427457 (published on Aug. 8, 2014) and 1194506 (published on Oct. 24, 2012), and Korean Patent Application Laid-Open No. 2012-0101029 (published on Sep. 12, 2012), etc., but is not limited thereto.

The light-emitting layer of the present disclosure may further comprise a dopant(s). The dopant may comprise at least one selected from the group consisting of a boron derivative, a pyrene derivative, a chrysene derivative, and a benzofluorene derivative. In addition, the light-emitting layer may be a blue light-emitting layer.

The light-emitting layer of the present disclosure may comprise a deuterated compound, which may be included as a single host, or a combination of two or more compounds may be included as a plurality of hosts. The weight ratio of the first host compound to the second host compound of the plurality of host materials is in the range of about 1:99 to about 99:1, preferably about 10:90 to about 90:10, more preferably about 30:70 to about 70:30, even more preferably about 40:60 to about 60:40, and still more preferably about 50:50.

The light-emitting layer is a layer from which light is emitted, and can be a single layer or a multi-layer in which two or more layers are stacked. In the plurality of host materials according to the present disclosure, the first and second host materials may both be comprised in one layer, or may be respectively comprised in different light-emitting layers. When two or more materials are included in one layer, they may be mixture-evaporated to form a layer, or may be separately co-evaporated at the same time to form a layer. According to one embodiment of the present disclosure, the doping concentration of the dopant compound with respect to the host compound in the light-emitting layer is less than about 20 wt %.

In the present disclosure, any one of the first electrode and the second electrode may be an anode, and the other may be a cathode. The second electrode may be a transflective electrode or a reflective electrode, and may be a top emission type, a bottom emission type, or a both-sides emission type, depending on the materials. The hole injection layer may be further doped with a p-dopant, and the electron injection layer may be further doped with an n-dopant.

The organic layer comprises a light-emitting layer, and may further comprise at least one layer selected from a hole injection layer, a hole transport layer, a hole auxiliary layer, a light-emitting auxiliary layer, an electron transport layer, an electron buffer layer, an electron injection layer, an interlayer, a hole blocking layer, and an electron blocking layer. According to one embodiment of the present disclosure, the organic electroluminescent device may further comprise amine-based compounds in addition to the deuterated compound of the present disclosure as at least one of a hole injection material, a hole transport material, a hole auxiliary material, a light-emitting material, a light-emitting auxiliary material, and an electron blocking material. Also, according to one embodiment of the present disclosure, the organic electroluminescent device of the present disclosure may further comprise azine-based compounds in addition to the deuterated compound of the present disclosure as at least one of an electron transport material, an electron injection material, an electron buffer material, and a hole blocking material.

In order to form each layer of the organic electroluminescent device of the present disclosure, dry film-forming methods such as vacuum evaporation, sputtering, plasma, ion plating methods, etc., or wet film-forming methods such as ink jet printing, nozzle printing, slot coating, spin coating, dip coating, flow coating methods, etc., can be used.

When using a wet film-forming method, a thin film can be formed by dissolving or diffusing materials forming each layer into any suitable solvent such as ethanol, chloroform, tetrahydrofuran, dioxane, etc. The solvent can be any solvent where the materials forming each layer can be dissolved or diffused, and where there are no problems in film-formation capability.

The compounds represented by formulas 1 to 5 of the present disclosure may be film-formed by the above-listed methods, commonly by a co-evaporation process or a mixture-evaporation process. The co-evaporation is a mixed deposition method in which two or more materials are placed in a respective individual crucible source and a current is applied to both cells at the same time to evaporate the materials. The mixture-evaporation is a mixed deposition method in which two or more materials are mixed in one crucible source before evaporating them, and a current is applied to the cell to evaporate the materials.

In addition, the organic electroluminescent material comprising the deuterated compound according to present disclosure may be used as light-emitting materials for a white organic light-emitting device. Various structures have been proposed for the white organic electroluminescent device, for example, a side-by-side structure or a stacking structure depending on the arrangement of R (red), G (green) or YG (yellow green), and B (blue) light emitting parts, or a color conversion material (CCM) method, etc. The present disclosure may also be applied to such white organic light-emitting device. The organic electroluminescent materials according to the present disclosure may also be applied to the organic electroluminescent device comprising a QD (quantum dot).

The present disclosure may provide a display system comprising the deuterated compound according to the present disclosure. In addition, it is possible to manufacture a display system or a lighting system by using the organic electroluminescent device of the present disclosure. Specifically, it is possible to produce a display system, e.g., a display system for smart phones, tablets, notebooks, PCs, TVs, or cars; or a lighting system, e.g., an outdoor or indoor lighting system, by using the organic electroluminescent device of the present disclosure.

Hereinafter, the luminous efficiency and lifetime properties of the organic electroluminescent device (OLED) according to the present disclosure will be explained. However, the following examples merely illustrate the properties of the OLED according to the present disclosure in detail, but the present disclosure is not limited to the following examples.

Device Example 1: Producing an OLED According to the Present Disclosure

An OLED according to the present disclosure was produced. A transparent electrode indium tin oxide (ITO) thin film (10 Ω/sq) on a glass substrate for an OLED (GEOMATEC CO., LTD., Japan) was subjected to an ultrasonic washing with acetone, ethanol and distilled water, sequentially, and then was stored in isopropanol. After evacuating until the degree of vacuum in the chamber reached $10^{-6}$ torr, the ITO substrate was mounted on a substrate holder of a vacuum vapor deposition apparatus. Compound HT-1 was introduced into a cell of the vacuum vapor deposition apparatus, and compound HI was introduced into another cell of the vacuum vapor deposition apparatus. The two materials were evaporated, and compound HI was deposited in a doping amount of 3 wt % based on the total amount of compound HI and compound HT-1 to form a hole injection layer having a thickness of 10 nm on the ITO substrate. Next, compound HT-1 was evaporated to form a first hole transport layer having a thickness of 75 nm on the hole injection layer. Compound C-2 was then introduced into another cell of the vacuum vapor deposition apparatus and was evaporated by applying an electric current to the cell, thereby forming a second hole transport layer having a thickness of 5 nm on the first hole transport layer. After forming the hole injection layer and the hole transport layers, a light-emitting layer was formed thereon as follows: Compound NH-104 was introduced into a cell of the vacuum vapor deposition apparatus as a host of the light-emitting layer, and compound BD was introduced into another cell as a dopant. The two materials were evaporated, and the dopant was deposited in a doping amount of 2 wt % based on the total amount of the host and dopant to form a light-emitting layer having a thickness of 20 nm on the second hole transport layer. Next, compound ET-1 was deposited to form a hole blocking layer having a thickness of 5 nm on the light-emitting layer. Compound ET-2 and compound EI-1 were evaporated at a rate of 1:1 in two other cells to form an electron transport layer having a thickness of 30 nm on the hole blocking layer. After depositing compound EI-1 as an electron injection layer having a thickness of 2 nm on the electron transport layer, an Al cathode having a thickness of 80 nm was deposited on the electron injection layer by another vacuum vapor deposition apparatus. Thus, an OLED was produced.

Device Example 2: Producing an OLED According to the Present Disclosure

An OLED was produced in the same manner as in Device Example 1, except that compound H-104 was used as a host of the light-emitting layer.

Comparative Example 1: Producing an OLED Using a Conventional Compound

An OLED was produced in the same manner as in Device Example 1, except that compound NC-2 was used in the second hole transport layer.

The driving voltage, luminous efficiency [cd/A], and a CIE color coordinate at a luminance of 1,000 nit, and the time taken for luminance to decrease from 100% to 95% (lifetime; T95) at a luminance of 1,400 nit of the OLEDs produced in Device Examples 1 and 2, and Comparative Example 1 are provided in Table 1 below.

TABLE 1

|  | Second Hole Transport Layer | Host | Driving Voltage [V] | Luminous Efficiency [cd/A] | CIE Color Coordinate (x, y) | Lifetime (T95) [hr] |
| --- | --- | --- | --- | --- | --- | --- |
| Device Example 1 | C-2 | NH-104 | 3.9 | 5.1 | (0.139, 0.060) | 59 |
| Device Example 2 | C-2 | H-104 | 3.9 | 5.1 | (0.139, 0.060) | 60 |
| Comparative Example 1 | NC-2 | NH-104 | 3.9 | 5.1 | (0.139, 0.061) | 44 |

From Table 1, it can be confirmed that an organic electroluminescent device comprising a compound substituted with deuterium in at least one of the second hole transport layer and the host of the light-emitting layer has improved lifetime properties compared to an organic electroluminescent device using a conventional compound that does not contain deuterium. Without wishing to be bound by theory, it is understood that the compound substituted with deuterium lowers the zero point vibration energy compared to the compound not substituted with deuterium, thereby improving the stability of the material, and thus the lifetime properties of OLEDs can be improved.

Device Example 3: Producing an OLED Comprising a Compound According to the Present Disclosure as a Plurality of Hosts An OLED was produced in the same manner as in Device Example 1, except that compound HT-2 was used for the second hole transport layer, compound H-171 was used as a first host of the light-emitting layer, compound NH-121 was used as a second host of the light-emitting layer, and a first host and a second host were co-deposited at a ratio of 5:5, and the dopant was deposited in a doping amount of 2 wt % based on the total amount of the hosts and the dopant to form a light-emitting layer having a thickness of 20 nm on the second hole transport layer.

Device Example 4: Producing an OLED Comprising a Compound According to the Present Disclosure as a Plurality of Hosts An OLED was produced in the same manner as in Device Example 3, except that compound H-171 was used as the first host of the light-emitting layer and compound H-121 was used as the second host of the light-emitting layer.

Device Example 5: Producing an OLED Comprising a Compound According to the Present Disclosure as a Single Host An OLED was produced in the same manner as in Device Example 1, except that compound HT-2 was used for the second hole transport layer, and compound H-171 was used as a single host of the light-emitting layer.

Comparative Example 2: Producing an OLED Using a Conventional Compound as Co-Host An OLED was produced in the same manner as in Device Example 3, except that compound NH-171 was used as the first host of the light-emitting layer and compound NH-121 was used as the second host of the light-emitting layer.

Comparative Example 3: Producing an OLED Using a Conventional Compound

An OLED was produced in the same manner as in Device Example 5, except that compound NH-121 was used as a single host of the light-emitting layer.

The driving voltage, luminous efficiency [cd/A], and a CIE color coordinate at a luminance of 1,000 nit, and the time taken for luminance to decrease from 100% to 95% (lifetime; T95) at a luminance of 1,400 nit of the OLEDs produced in Device Examples 3 to 5, and Comparative Examples 2 and 3 are provided in Table 2 below.

TABLE 2

|  | First Host | Second Host | Driving Voltage [V] | Luminous Efficiency [cd/A] | CIE Color Coordinate (x, y) | Lifetime (T95) [hr] |
|---|---|---|---|---|---|---|
| Device Example 3 | H-171 | NH-121 | 4.0 | 5.1 | (0.140, 0.058) | 95 |
| Device Example 4 | H-171 | H-121 | 3.9 | 5.3 | (0.139, 0.059) | 148 |
| Device Example 5 | H-171 | — | 4.2 | 5.3 | (0.139, 0.060) | 139 |
| Comparative Example 2 | NH-171 | NH-121 | 3.8 | 5.4 | (0.139, 0.060) | 55 |
| Comparative Example 3 | — | NH-121 | 3.5 | 5.2 | (0.139, 0.061) | 42 |

From Table 2, it can be confirmed that by including two or more different host materials in the light-emitting layer, and by using a compound substituted with deuterium as at least one of the hosts, the lifetime properties can be improved compared to an organic electroluminescent device using a conventional compound not substituted with deuterium as a host. In addition, from Device Examples 3 to 5, it can be seen that the driving voltage of the organic electroluminescent device can be lowered by appropriately combining the two host materials of the light-emitting layer. Furthermore, from Device Examples 3 to 5, and Comparative Examples 2 and 3, it can be confirmed that the present disclosure can provide an organic electroluminescent device having improved lifetime properties without deteriorating driving voltage and/or luminous efficiency properties through an appropriate combination of two or more compounds substituted with deuterium. In other words, from Table 2 above, it can be seen that it is not only possible to improve the lifetime through the stability of the material by using a compound substituted with deuterium, but it is also possible to achieve a balanced driving voltage, luminous efficiency, and operating lifetime through an appropriate combination of two or more materials. This can be balanced with other colors (red, green), which is thought to contribute to the improvement of the performance of the display.

The compounds used in the Device Examples and the Comparative Examples are shown below.

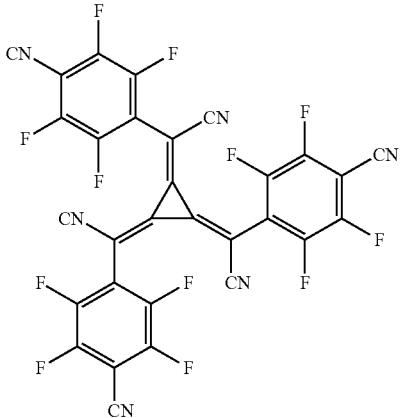

HI

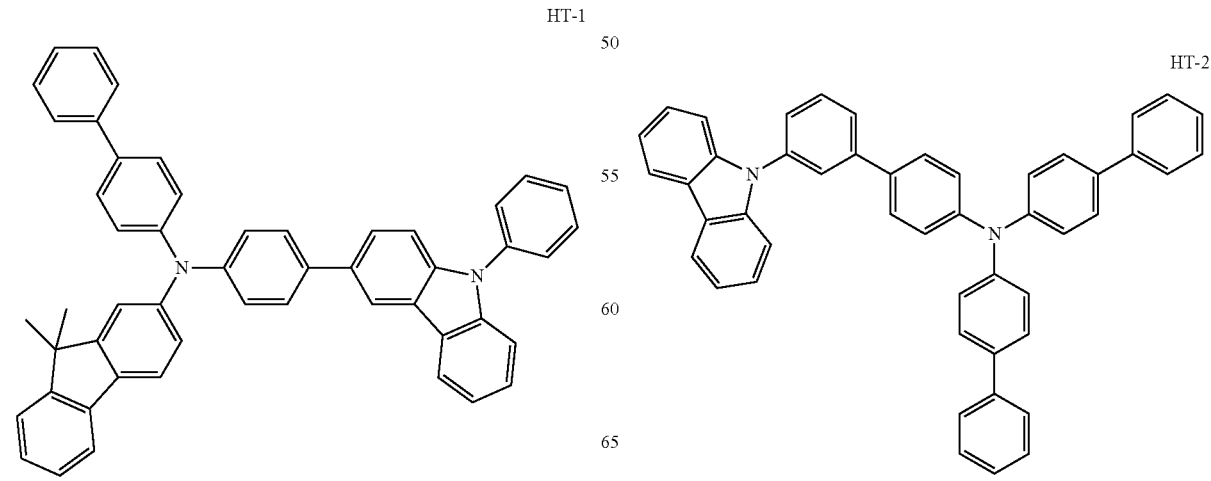

HT-1

HT-2

127
-continued
BD
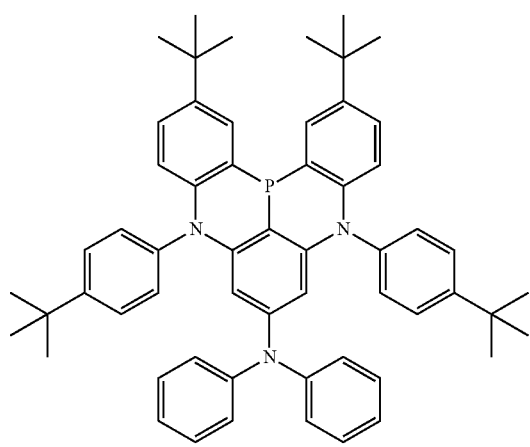
ET-1
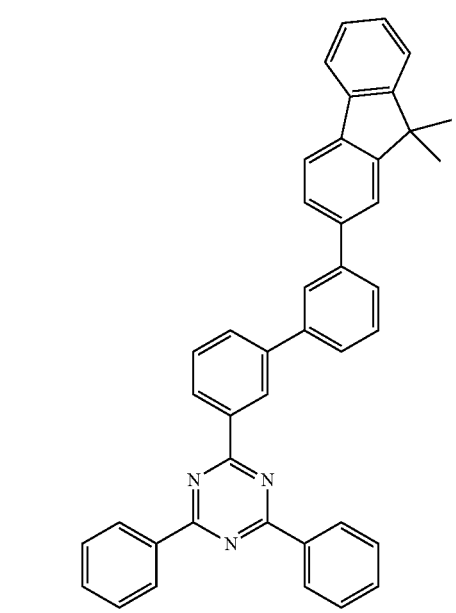
ET-2
EI-1
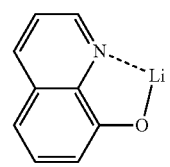
128
-continued
NC-2
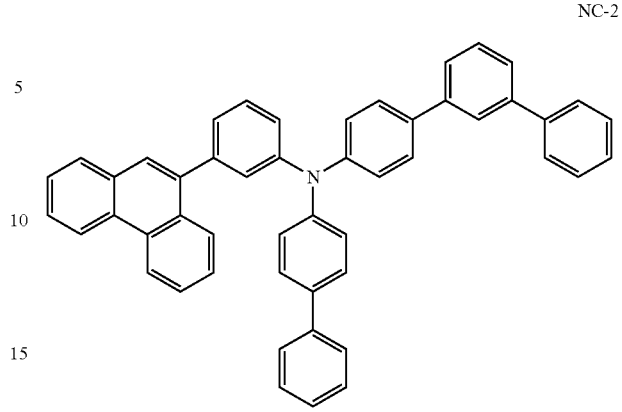
C-2
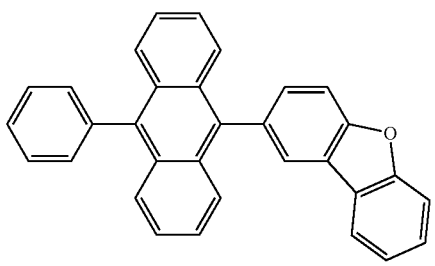
NH-104
H-104
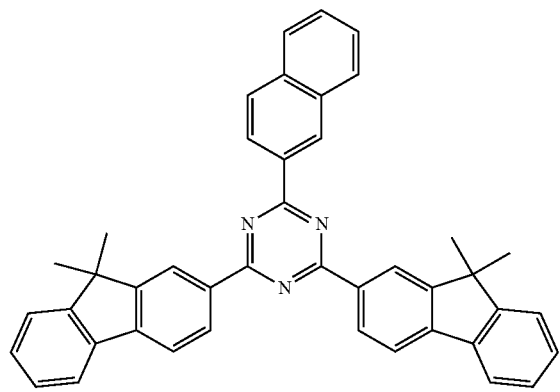
NH-171
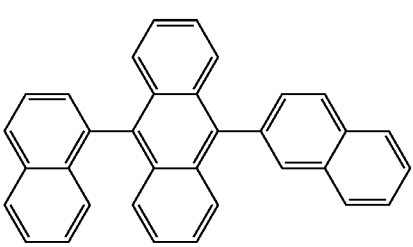

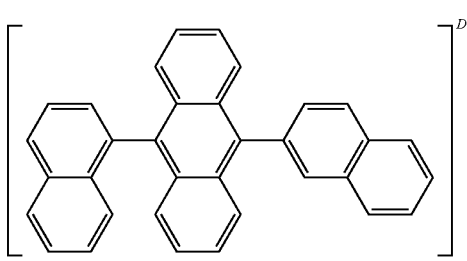

H-171

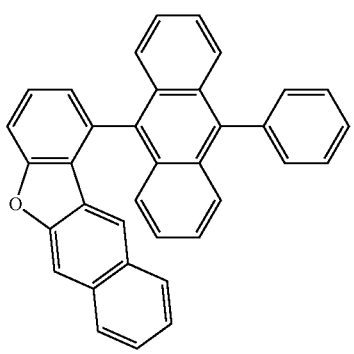

NH-121

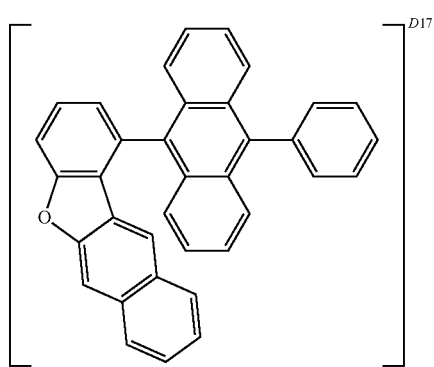

H-121

The invention claimed is:

1. An organic electroluminescent device comprising a first electrode, a second electrode, and at least one organic layer interposed between the first electrode and the second electrode, wherein the organic layer comprises a light-emitting layer and a hole transport zone, and the hole transport zone comprises a deuterated compound; wherein the light-emitting layer comprises a dopant, the dopant comprises at least one selected from the group consisting of a boron derivative, a pyrene derivative, and a benzofluorene derivative.

2. The organic electroluminescent device according to claim 1, wherein the hole transport zone comprises at least one of a hole auxiliary layer and a light-emitting auxiliary layer.

3. The organic electroluminescent device according to claim 1, wherein the hole transport zone comprises a compound represented by the following formula 1:

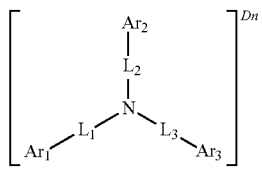

wherein,
Ar$_1$ to Ar$_3$, each independently, represent hydrogen, deuterium, a halogen, a cyano, a substituted or unsubstituted (C1-C30)alkyl, a substituted or unsubstituted (C3-C30)cycloalkyl, a substituted or unsubstituted silyl, a substituted or unsubstituted (C6-C30)aryl, or a substituted or unsubstituted (3- to 30-membered)heteroaryl; with a proviso that at least one of Ar$_1$ to Ar$_3$ represents a substituted or unsubstituted (C6-C30)aryl, or a substituted or unsubstituted (3- to 30-membered) heteroaryl;
L$_1$ to L$_3$, each independently, represent a single bond, a substituted or unsubstituted (C6-C30)arylene, or a substituted or unsubstituted (3- to 30-membered)heteroarylene;
Dn represents that n hydrogens are replaced with deuterium; and n represents an integer of 0 to 50.

4. The organic electroluminescent device according to claim 3, wherein at least one of Ar$_1$ to Ar$_3$ represents a substituted or unsubstituted phenanthrenyl, a substituted or unsubstituted carbazolyl, a substituted or unsubstituted fluorenyl, a substituted or unsubstituted benzofluorenyl, a substituted or unsubstituted triphenylenyl, a substituted or unsubstituted dibenzofuranyl, or a substituted or unsubstituted dibenzothiophenyl.

5. The organic electroluminescent device according to claim 1, wherein the hole transport zone comprises a compound represented by the following formula 2:

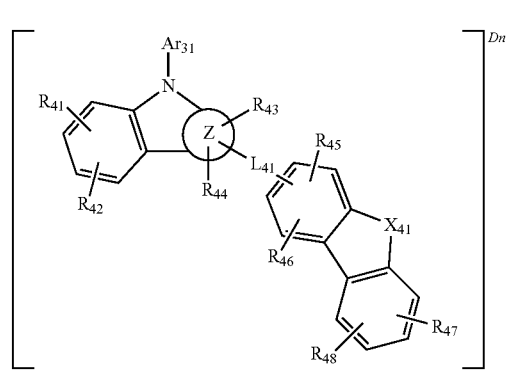

wherein,
ring Z represents a benzene ring or a naphthalene ring;
X$_{41}$ represents —O—, —S—, —C(R$_{51}$)(R$_{52}$)—, or —N(R$_{53}$)—;
R$_{51}$ and R$_{52}$, each independently, represent hydrogen, deuterium, a halogen, a cyano, a substituted or unsubstituted (C1-C30)alkyl, a substituted or unsubstituted (C6-C30)aryl, a substituted or unsubstituted (3- to 30-membered)heteroaryl, a substituted or unsubstituted (C3-C30)cycloalkyl, a substituted or unsubstituted (C1-C30)alkoxy, a substituted or unsubstituted tri(C1-

C30)alkylsilyl, a substituted or unsubstituted di(C1-C30)alkyl(C6-C30)arylsilyl, a substituted or unsubstituted (C1-C30)alkyldi(C6-C30)arylsilyl, a substituted or unsubstituted tri(C6-C30)arylsilyl, a substituted or unsubstituted mono- or di-(C1-C30)alkylamino, a substituted or unsubstituted mono- or di-(C2-C30)alkenylamino, a substituted or unsubstituted mono- or di-(C6-C30)arylamino, a substituted or unsubstituted mono- or di-(3- to 30-membered)heteroarylamino, a substituted or unsubstituted (C1-C30)alkyl(C2-C30)alkenylamino, a substituted or unsubstituted (C1-C30)alkyl(C6-C30)arylamino, a substituted or unsubstituted (C1-C30)alkyl(3- to 30-membered)heteroarylamino, a substituted or unsubstituted (C2-C30)alkenyl(C6-C30)arylamino, a substituted or unsubstituted (C2-C30)alkenyl(3- to 30-membered)heteroarylamino, or a substituted or unsubstituted (C6-C30)aryl(3- to 30-membered)heteroarylamino; or $R_{51}$ and $R_{52}$ may be linked to each other to form a ring(s);

$R_{53}$ represents hydrogen, deuterium, a halogen, a cyano, a substituted or unsubstituted (C1-C30)alkyl, a substituted or unsubstituted (C6-C30)aryl, a substituted or unsubstituted (3- to 30-membered)heteroaryl, a substituted or unsubstituted (C3-C30)cycloalkyl, a substituted or unsubstituted (C1-C30)alkoxy, a substituted or unsubstituted tri(C1-C30)alkylsilyl, a substituted or unsubstituted di(C1-C30)alkyl(C6-C30)arylsilyl, a substituted or unsubstituted (C1-C30)alkyldi(C6-C30)arylsilyl, a substituted or unsubstituted tri(C6-C30)arylsilyl, a substituted or unsubstituted mono- or di-(C1-C30)alkylamino, a substituted or unsubstituted mono- or di-(C2-C30)alkenylamino, a substituted or unsubstituted mono- or di-(C6-C30)arylamino, a substituted or unsubstituted mono- or di-(3- to 30-membered)heteroarylamino, a substituted or unsubstituted (C1-C30)alkyl(C2-C30)alkenylamino, a substituted or unsubstituted (C1-C30)alkyl(C6-C30)arylamino, a substituted or unsubstituted (C1-C30)alkyl(3- to 30-membered)heteroarylamino, a substituted or unsubstituted (C2-C30)alkenyl(C6-C30)arylamino, a substituted or unsubstituted (C2-C30)alkenyl(3- to 30-membered)heteroarylamino, or a substituted or unsubstituted (C6-C30)aryl(3- to 30-membered)heteroarylamino;

$L_{41}$ represents a single bond, a substituted or unsubstituted (C6-C30)arylene, or a substituted or unsubstituted (3- to 30-membered)heteroarylene;

$Ar_{31}$ represents a substituted or unsubstituted (C6-C30)aryl;

$R_{41}$ to $R_{48}$, each independently, represent hydrogen, deuterium, a substituted or unsubstituted (C1-C30)alkyl, a substituted or unsubstituted (C6-C30)aryl, a substituted or unsubstituted (3- to 30-membered)heteroaryl, a substituted or unsubstituted (C3-C30)cycloalkyl, a substituted or unsubstituted tri(C1-C30)alkylsilyl, a substituted or unsubstituted di(C1-C30)alkyl(C6-C30)arylsilyl, a substituted or unsubstituted (C1-C30)alkyldi(C6-C30)arylsilyl, a substituted or unsubstituted tri(C6-C30)arylsilyl, a substituted or unsubstituted mono- or di-(C1-C30)alkylamino, a substituted or unsubstituted mono- or di-(C2-C30)alkenylamino, a substituted or unsubstituted mono- or di-(C6-C30)arylamino, a substituted or unsubstituted mono- or di-(3- to 30-membered)heteroarylamino, a substituted or unsubstituted (C1-C30)alkyl(C2-C30)alkenylamino, a substituted or unsubstituted (C1-C30)alkyl(C6-C30)arylamino, a substituted or unsubstituted (C1-C30)alkyl(3- to 30-membered)heteroarylamino, a substituted or unsubstituted (C2-C30)alkenyl(C6-C30)arylamino, a substituted or unsubstituted (C2-C30)alkenyl(3- to 30-membered)heteroarylamino, or a substituted or unsubstituted (C6-C30)aryl(3- to 30-membered)heteroarylamino; or two or more adjacent ones of $R_{41}$ to $R_{48}$ may be linked to each other to form a ring(s);

Dn represents that n hydrogens are replaced with deuterium; and n represents an integer of 0 to 50.

6. The organic electroluminescent device according to claim 1, wherein the hole transport zone comprises a compound represented by the following formula 3:

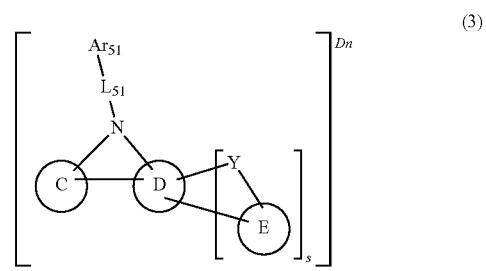

wherein, ring C, ring D, and ring E, each independently, represent a substituted or unsubstituted benzene ring, or a substituted or unsubstituted naphthalene ring;

Y represents —O—, —S—, or —N(Ra)—;

Ra represents -$L_{52}$-$Ar_{52}$;

$Ar_{51}$ and $Ar_{52}$, each independently, represent a substituted or unsubstituted (C6-C30)aryl, a substituted or unsubstituted (3- to 30-membered)heteroaryl containing at least one of nitrogen, oxygen and sulfur, a substituted or unsubstituted di(C6-C30)arylamino, a substituted or unsubstituted mono- or di-(3- to 30-membered)heteroarylamino, or a substituted or unsubstituted (C6-C30)aryl(3- to 30-membered)heteroarylamino;

$L_{51}$ and $L_{52}$, each independently, represent a single bond, a substituted or unsubstituted (C6-C30)arylene, or a substituted or unsubstituted (3- to 30-membered)heteroarylene;

s represents an integer of 0 or 1;

Dn represents that n hydrogens are replaced with deuterium; and n represents an integer of 0 to 50.

7. The organic electroluminescent device according to claim 1, wherein the light-emitting layer is a blue light-emitting layer.

8. The organic electroluminescent device according to claim 3, wherein the compound represented by formula 1 is at least one selected from the following compounds:

C1
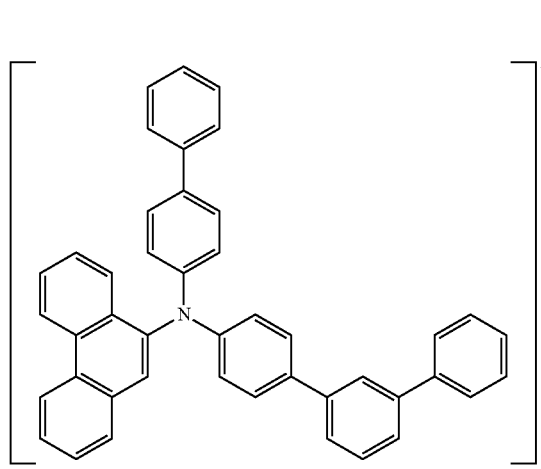
C2
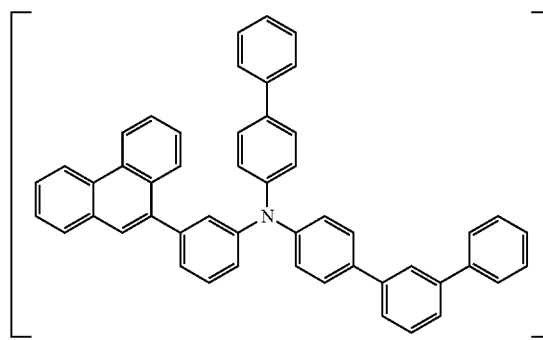
C3
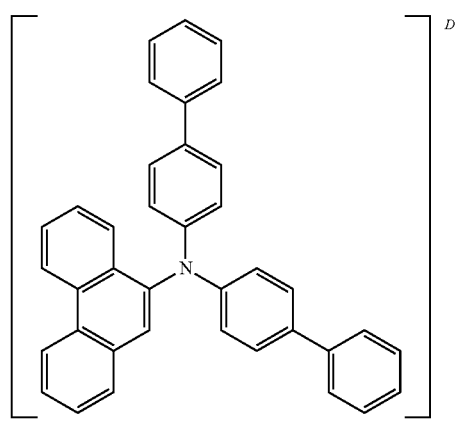
C4
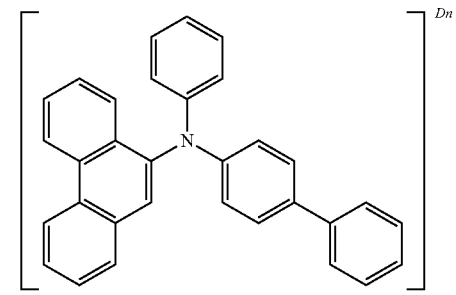
-continued
C-5
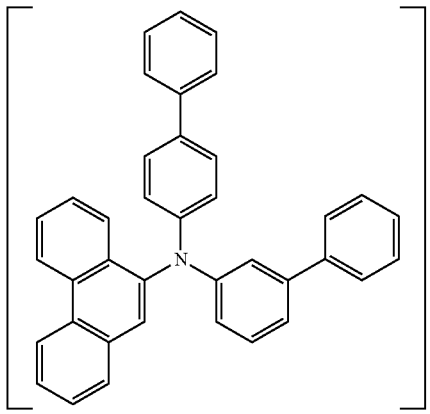
C-6
C-7
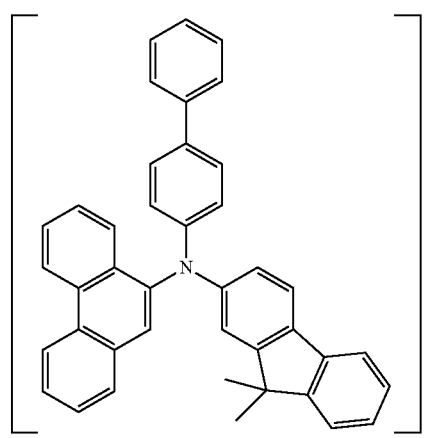

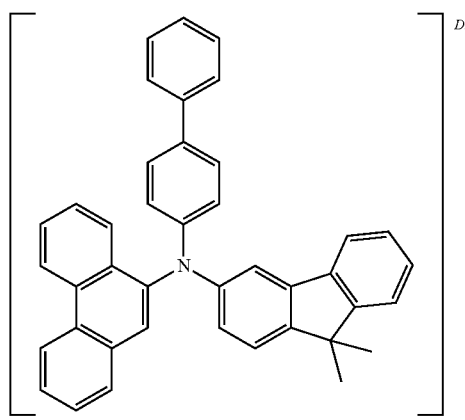 C-8
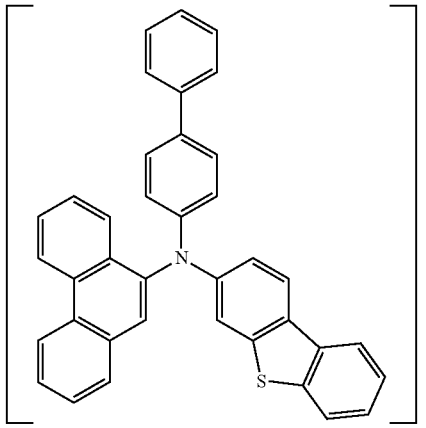 C-11
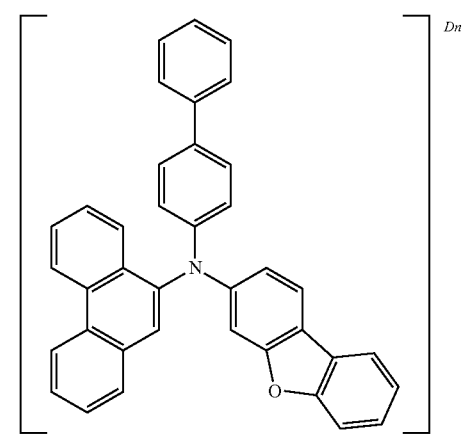 C-9
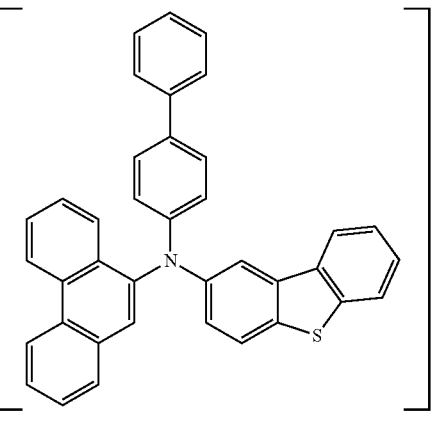 C-12
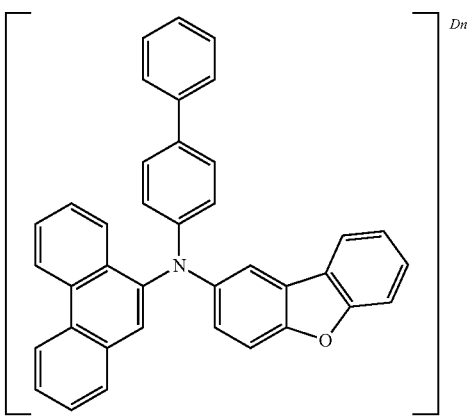 C-10
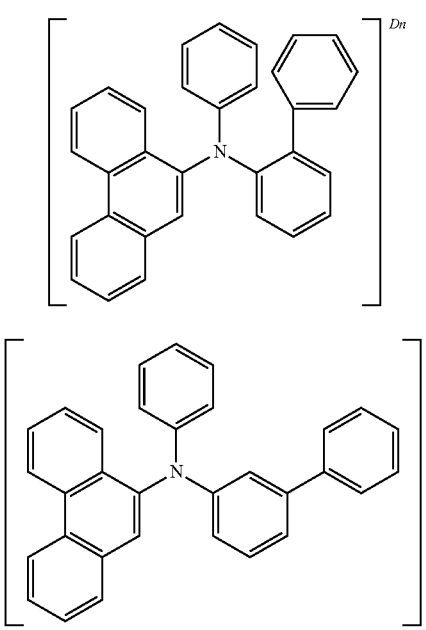
C-13
C-14

-continued
C-15
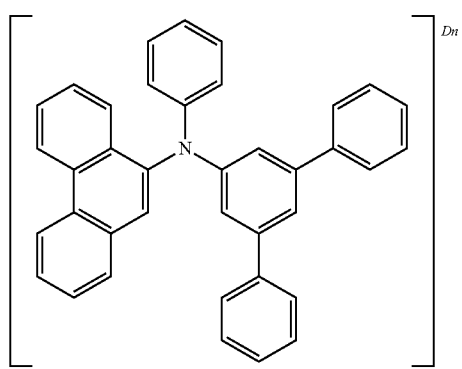
C-16
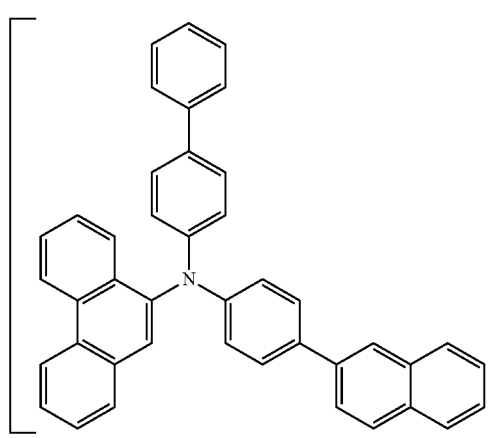
C-17
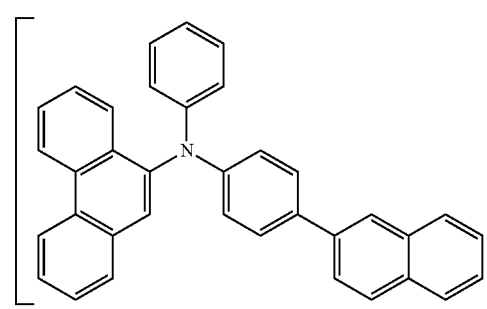
C-18
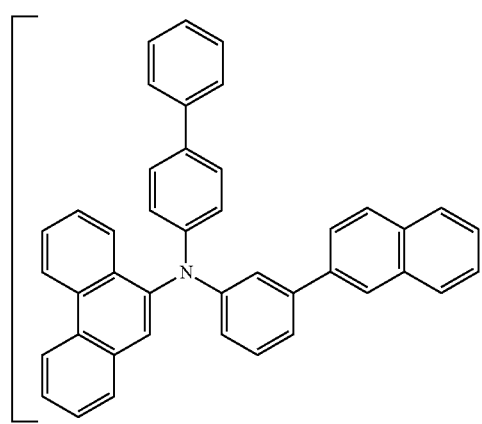
-continued
C-19
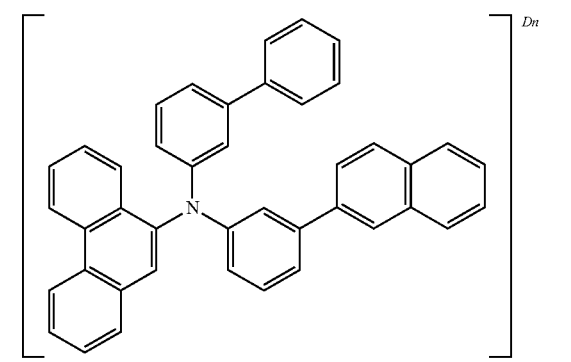
C-20
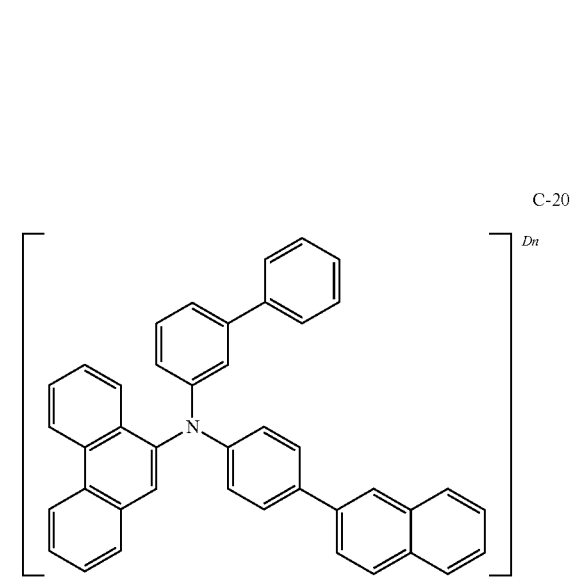
C-21
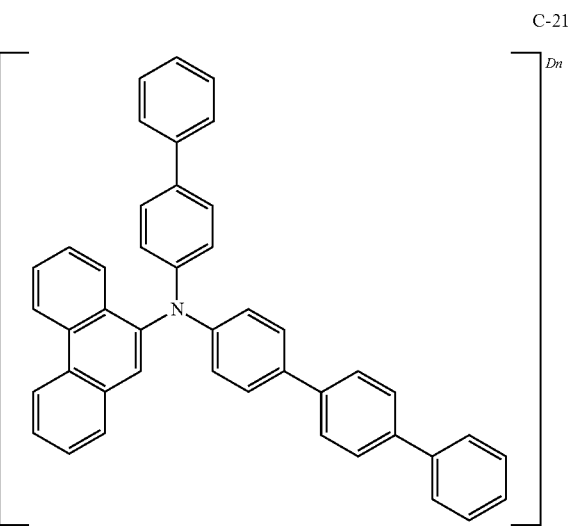

C-22
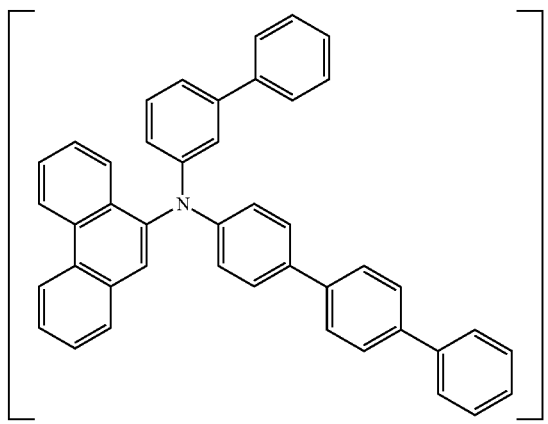
C-23
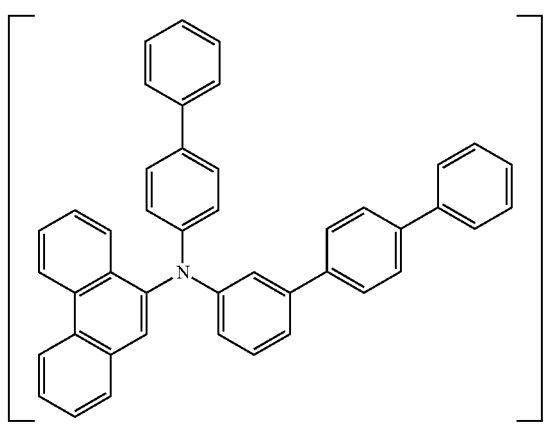
C-24
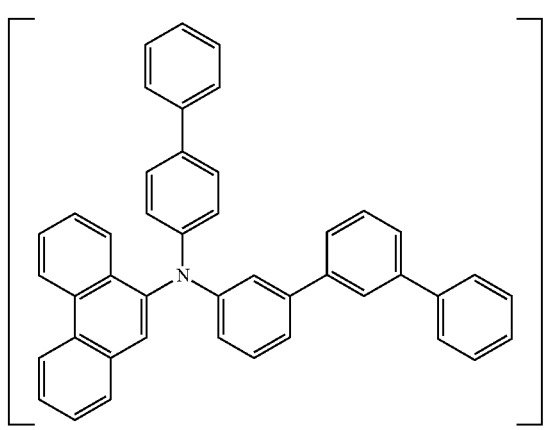
C-25
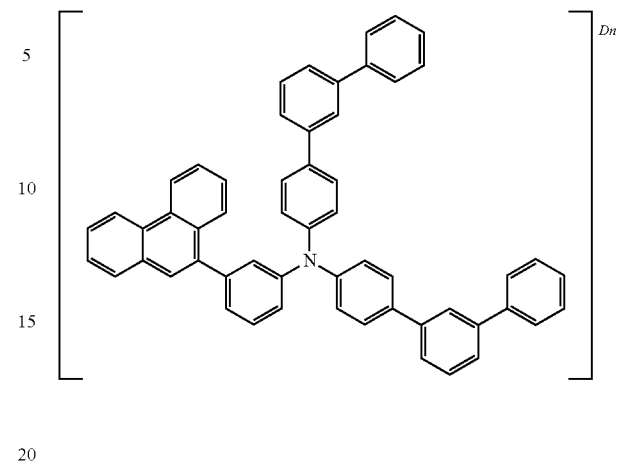
C-26
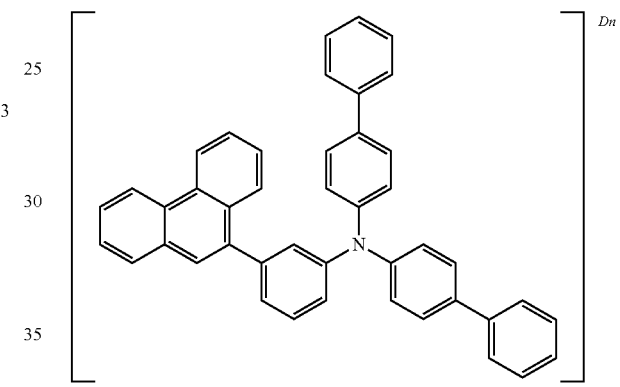
C-27
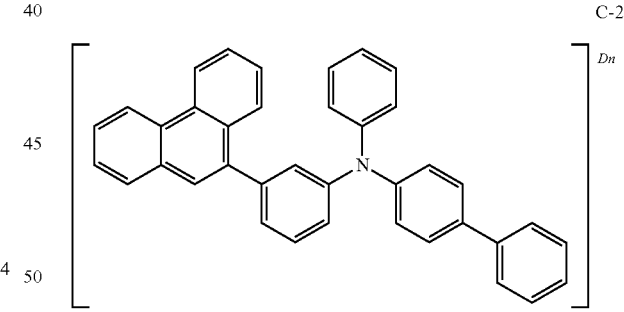
C-28
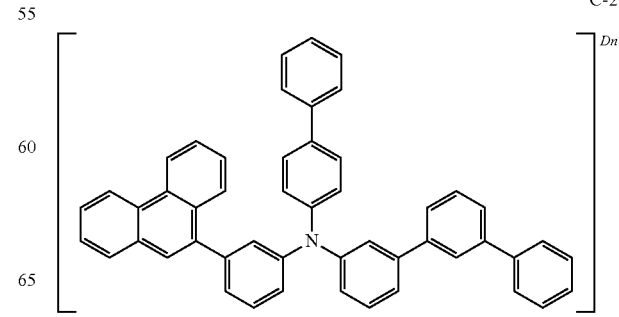

-continued
C-29
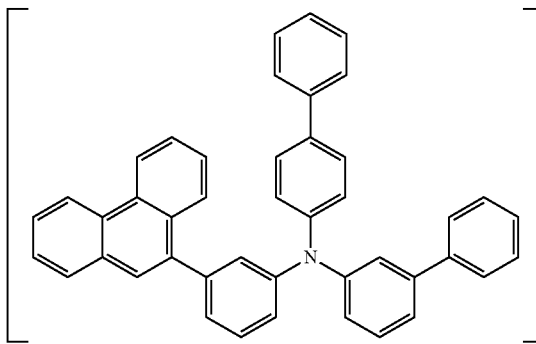
C-30
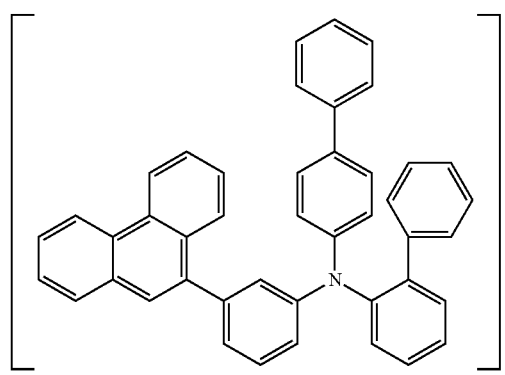
C-31
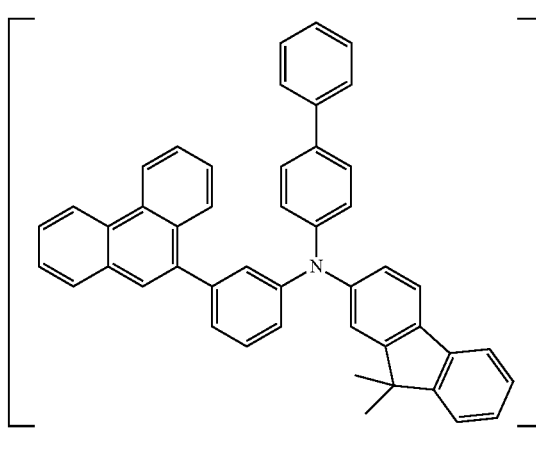
C-32
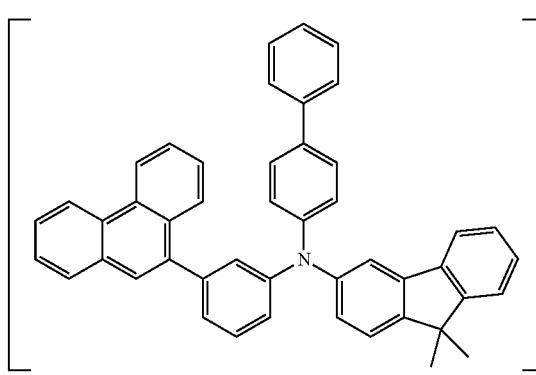
-continued
C-33
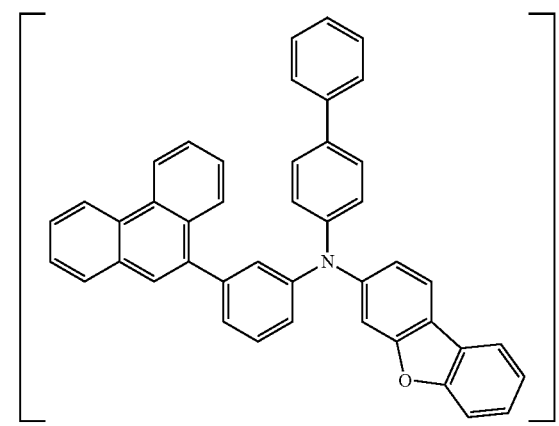
C-34
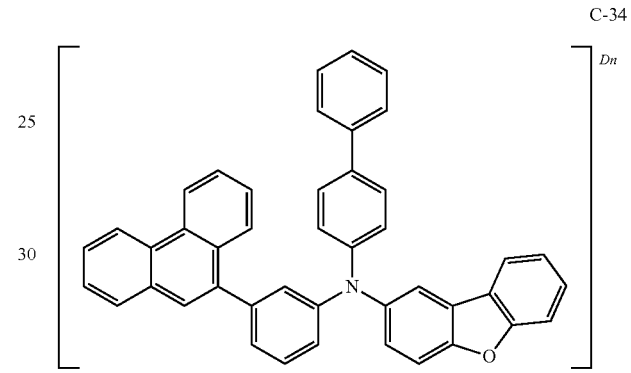
C-35
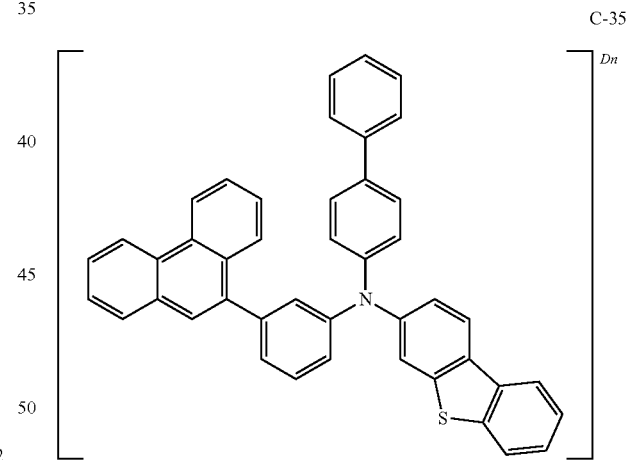
C-36
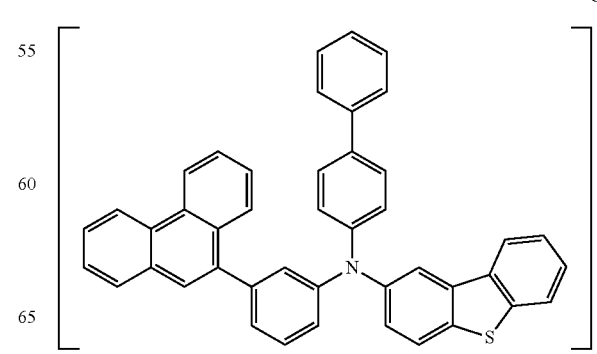

C-37
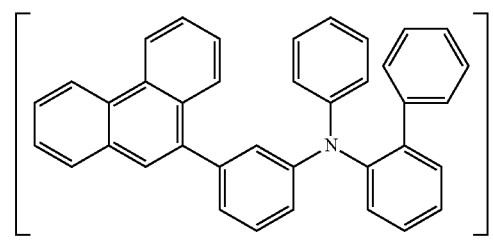
C-38
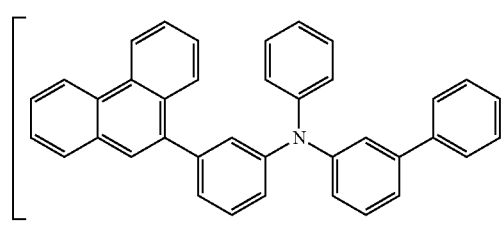
C-39
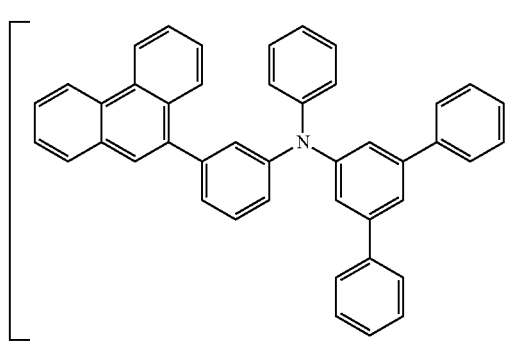
C-40
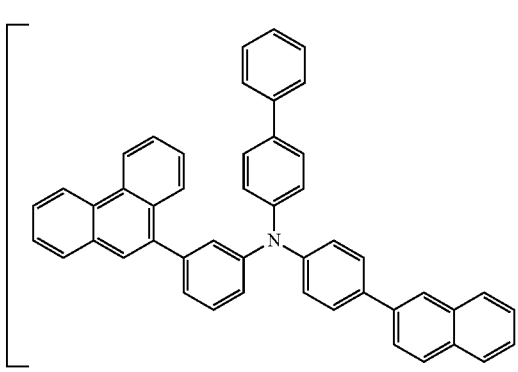
C-41
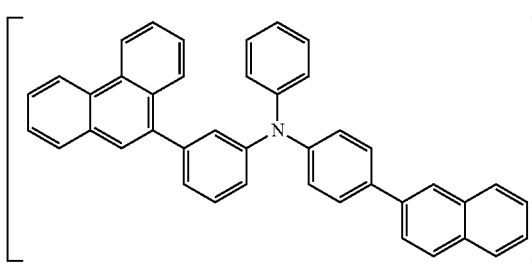
C-42
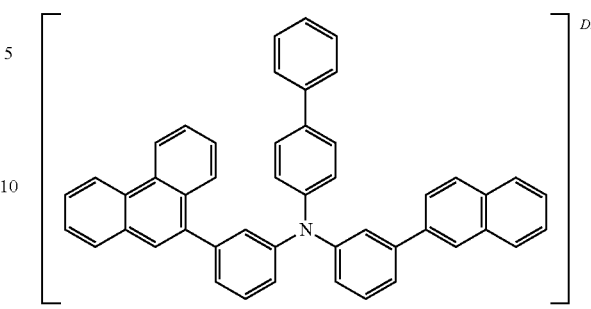
C-43
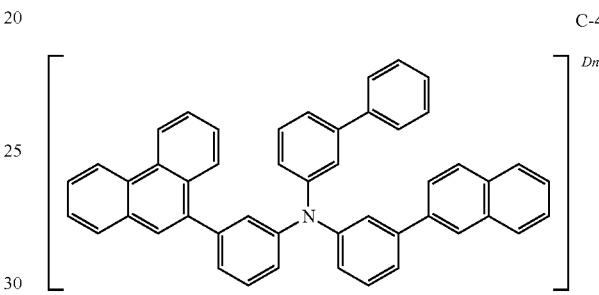
C-44
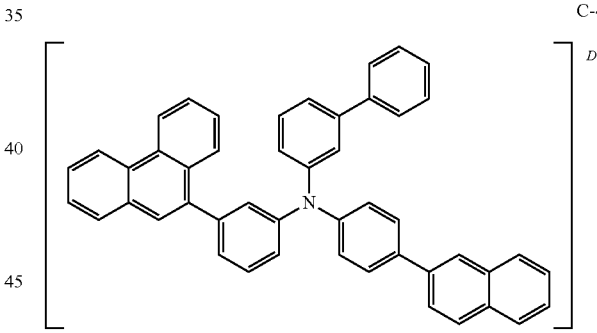
C-45
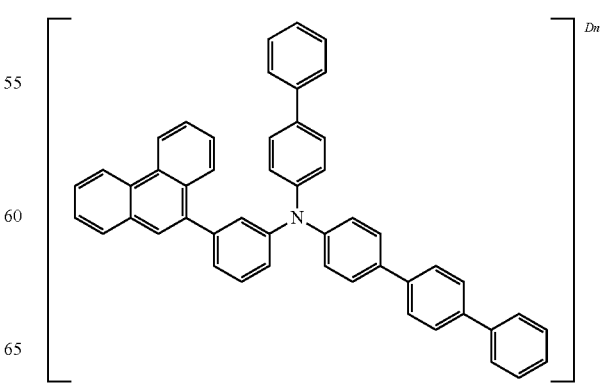

C-46
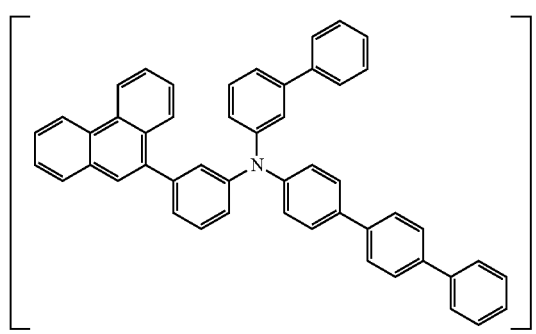
C-50
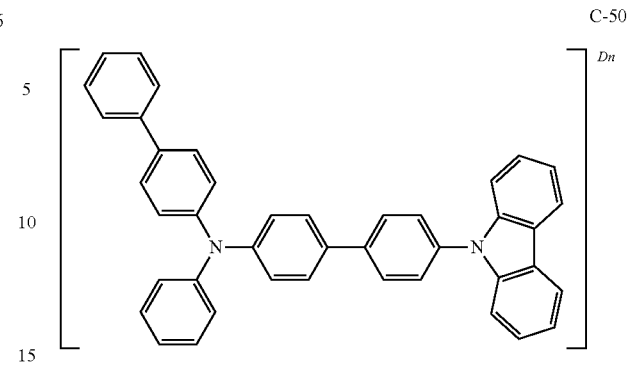
C-47
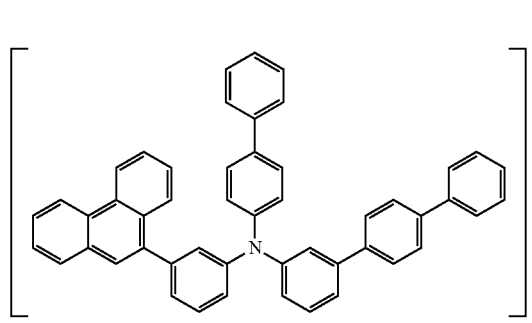
C-51
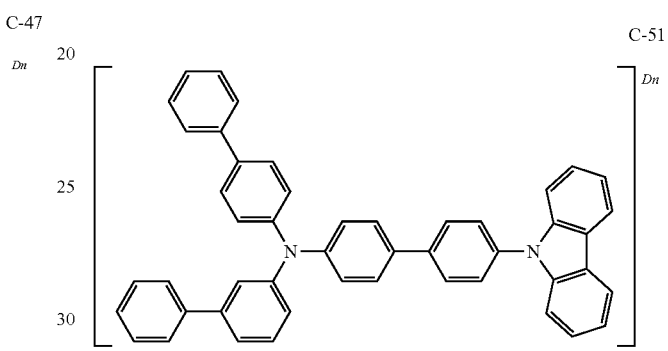
C-48
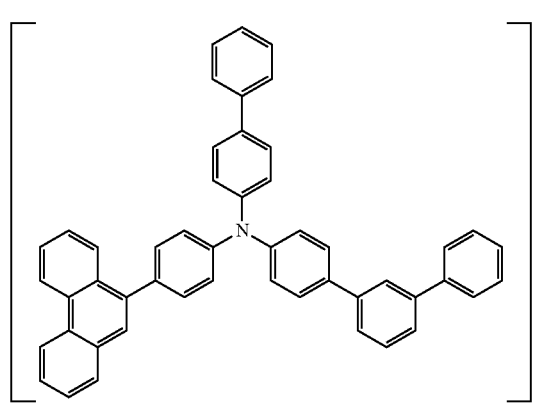
C-52
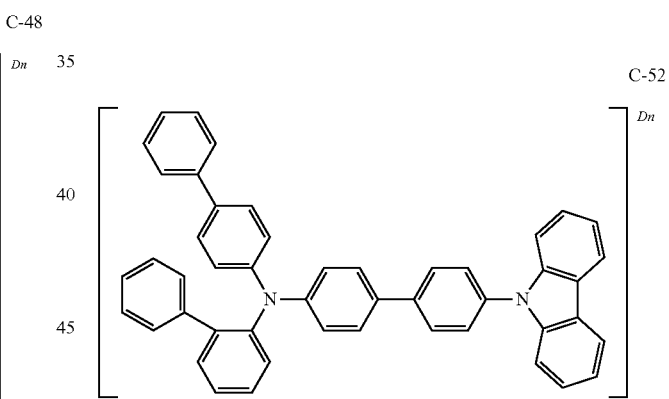
C-49
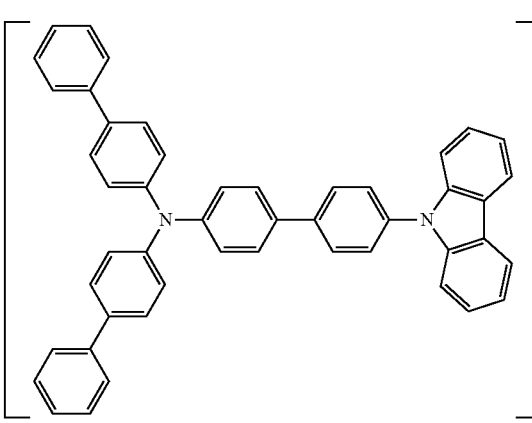
C-53
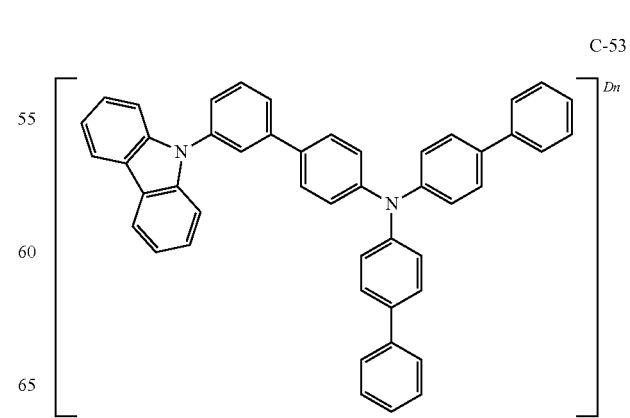

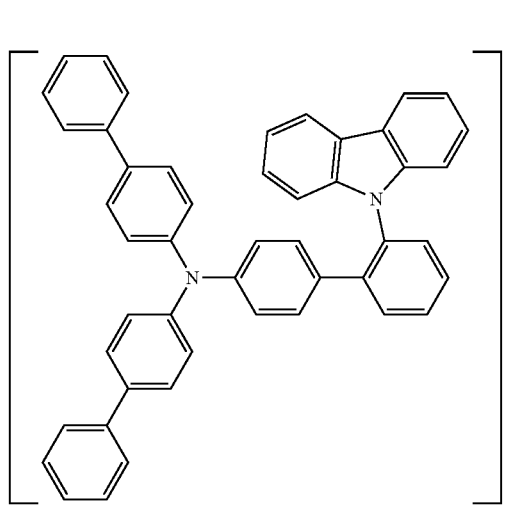
C-54
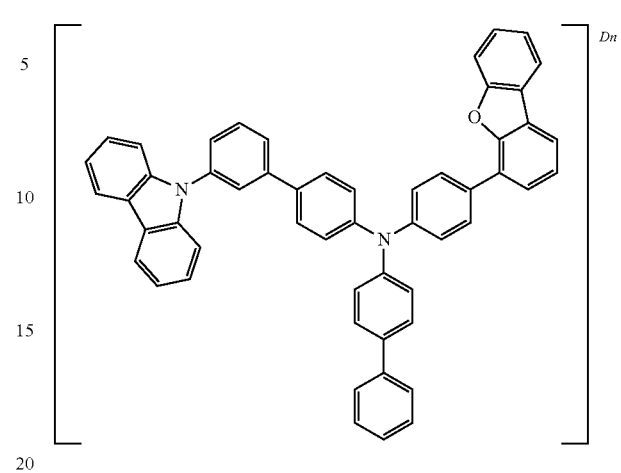
C-57
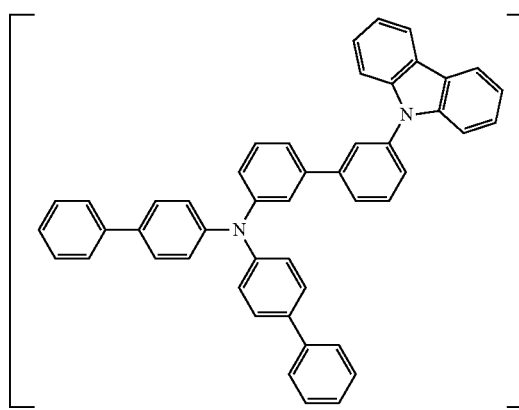
C-55
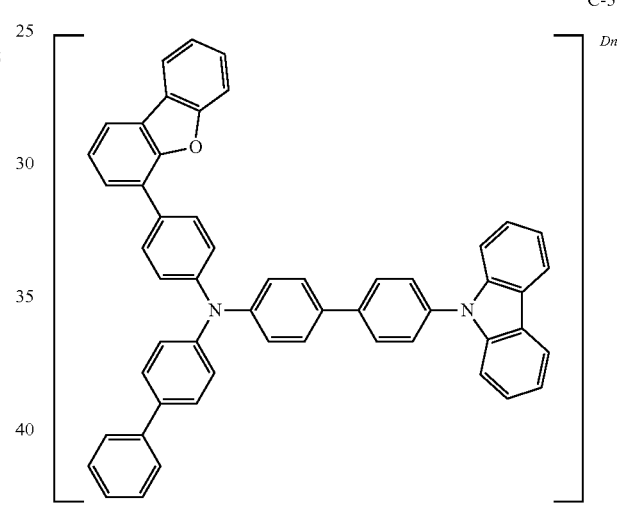
C-58
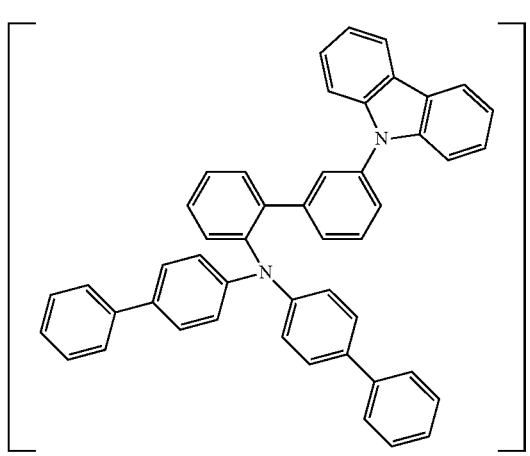
C-56
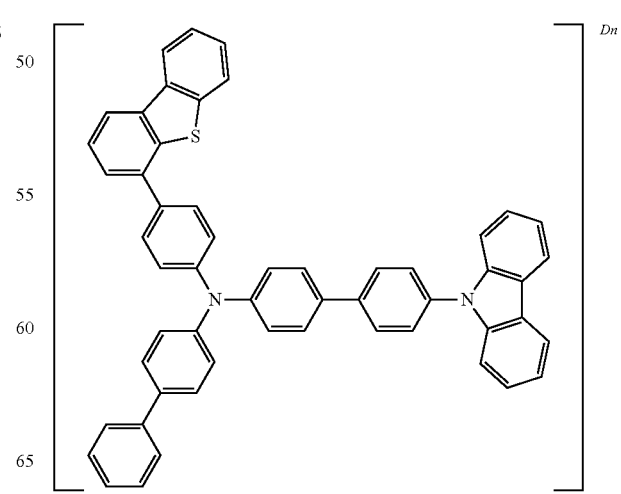
C-58

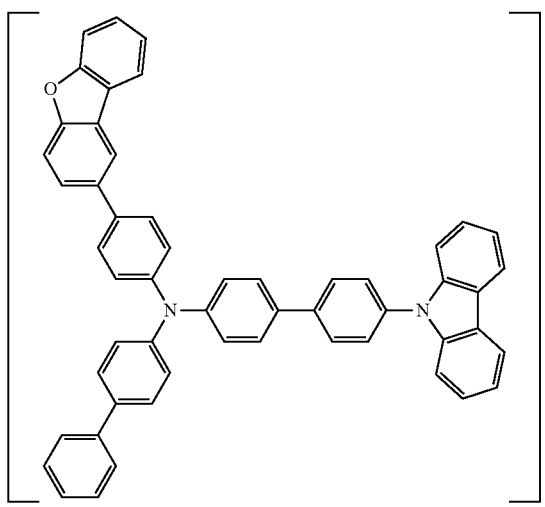
C-60
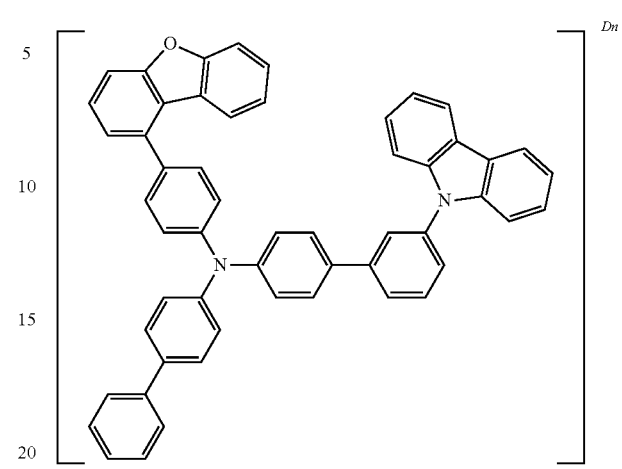
C-63
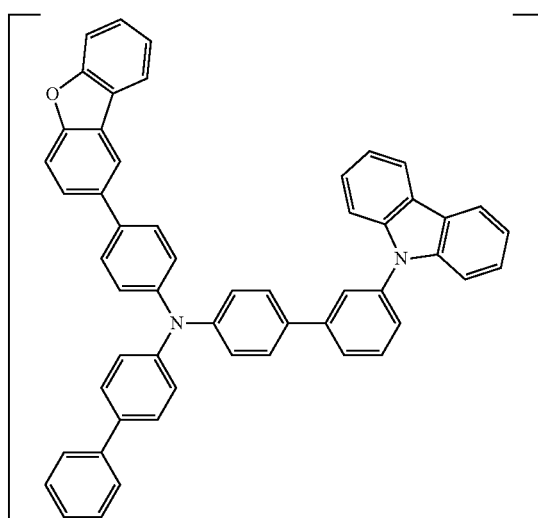
C-61
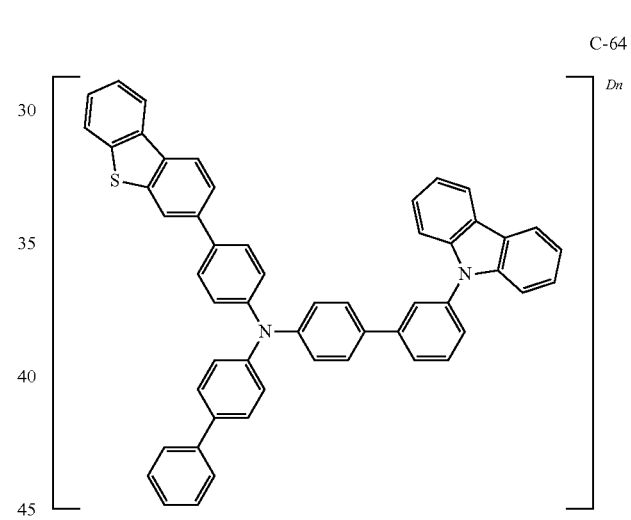
C-64
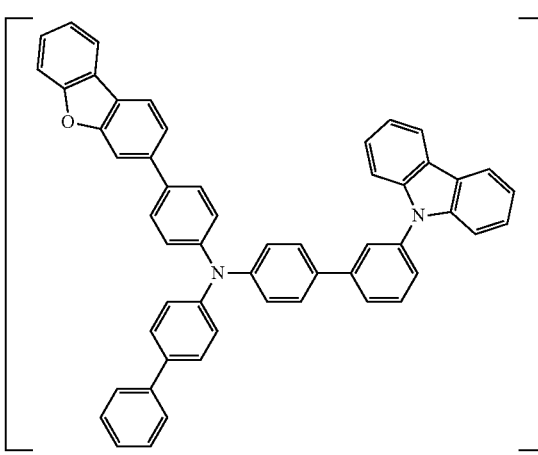
C-62
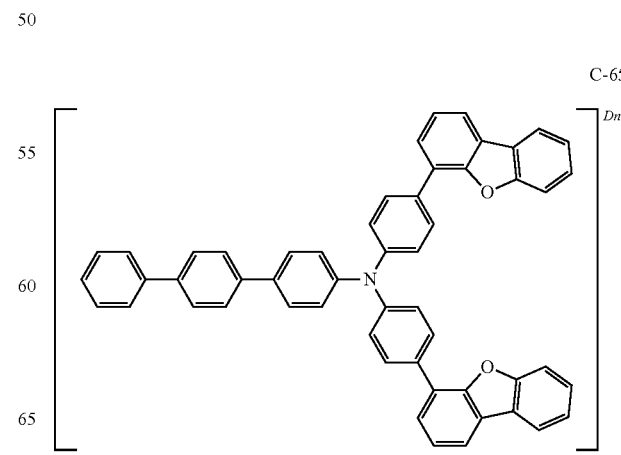
C-65

C-66
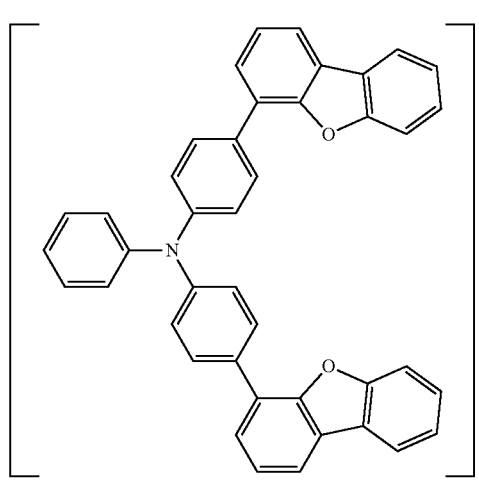
C-67
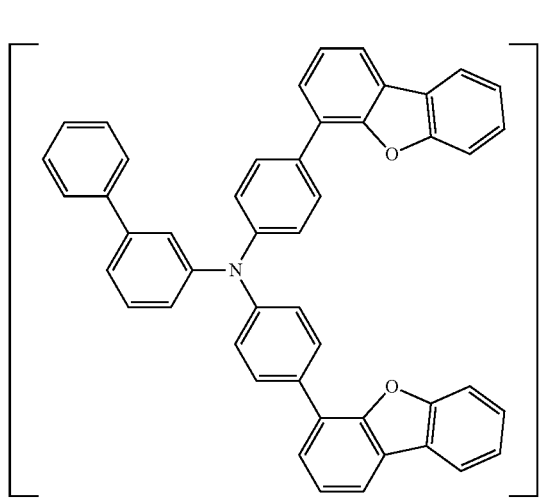
C-68
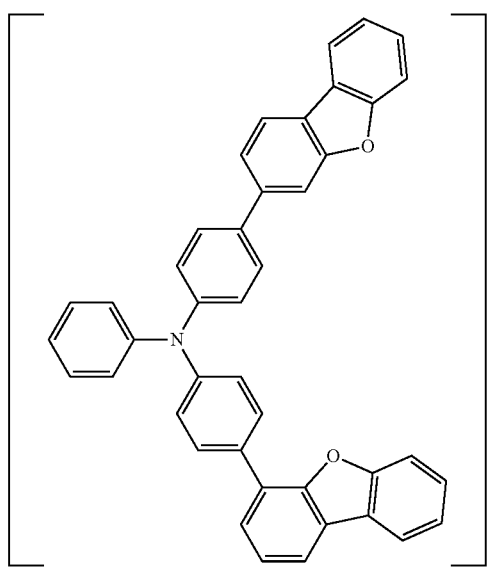
C-69
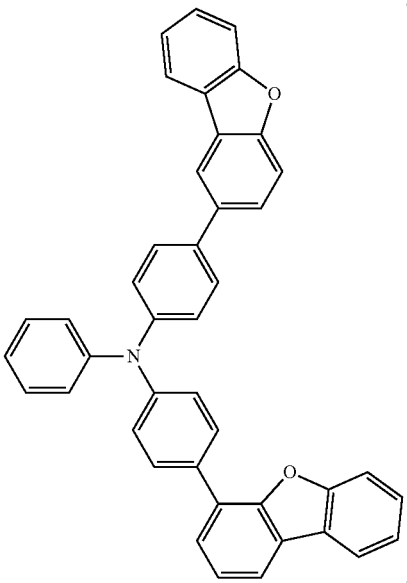
C-70
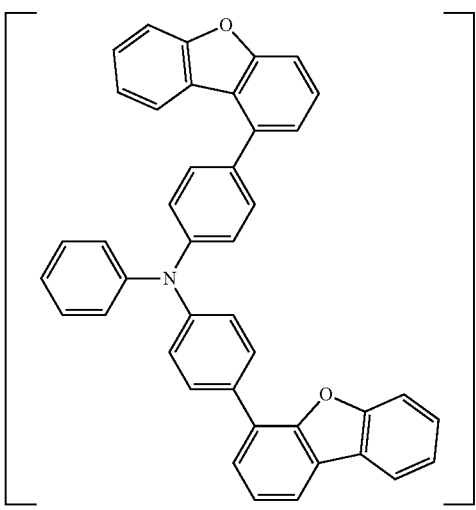

C-71
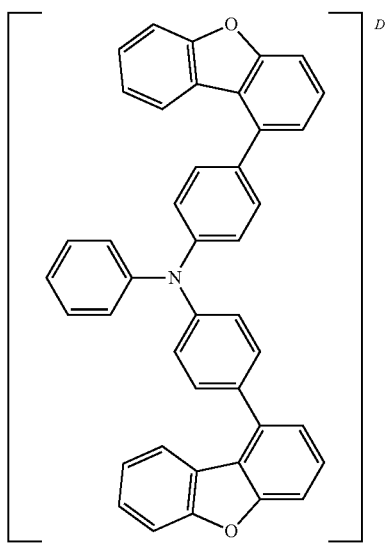
C-72
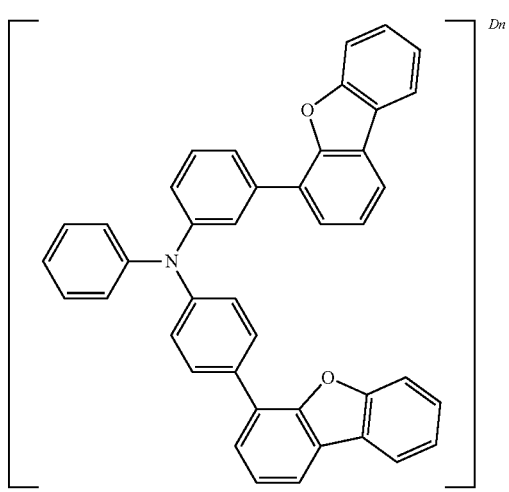
C-73
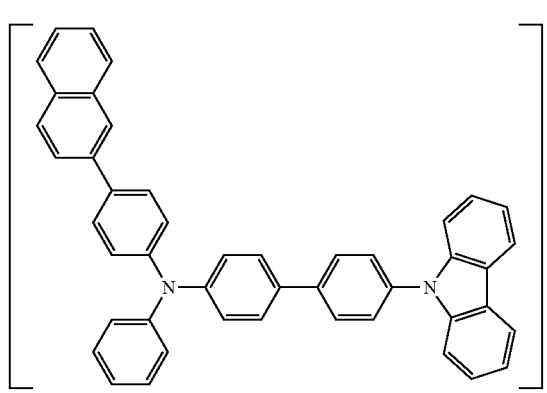
C-74
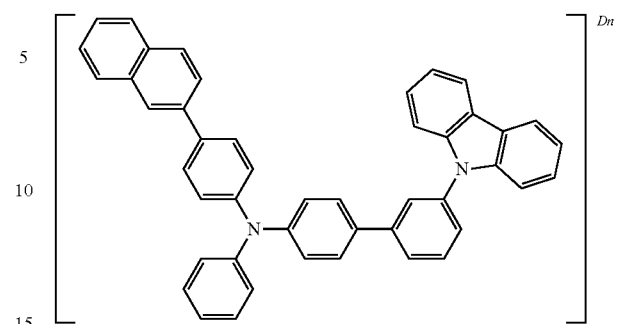
C-75
C-76
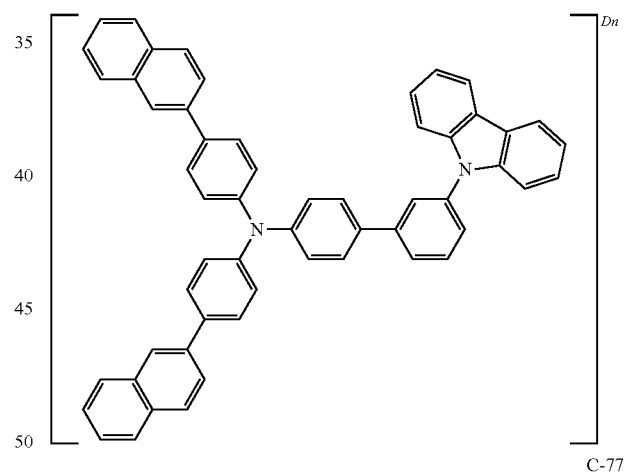
C-77
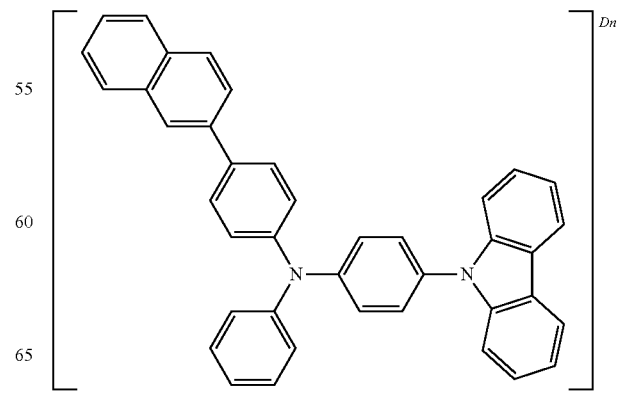

C-78
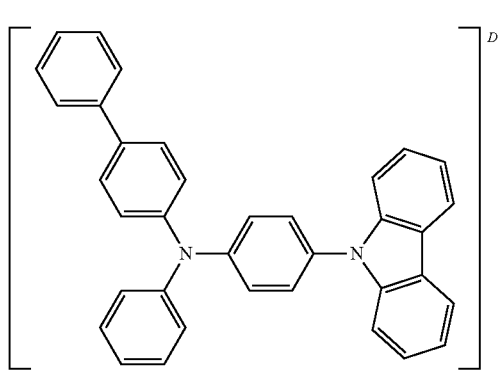
C-79
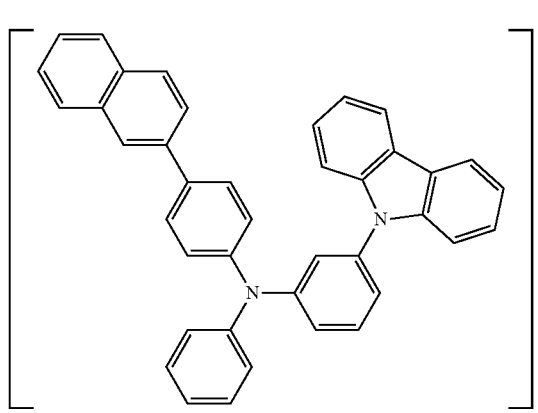
C-80
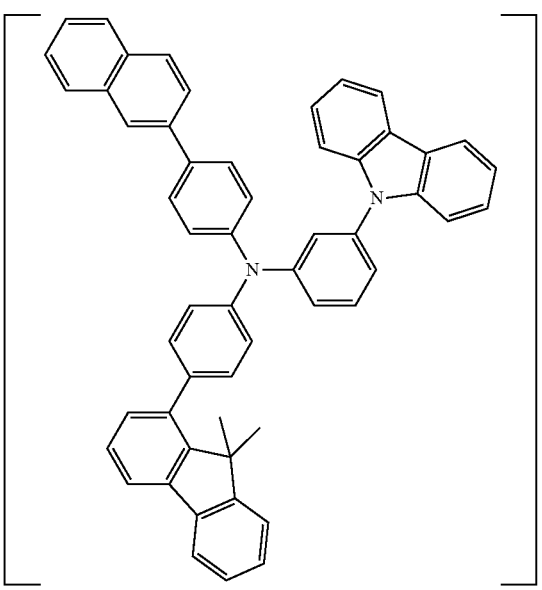
C-81
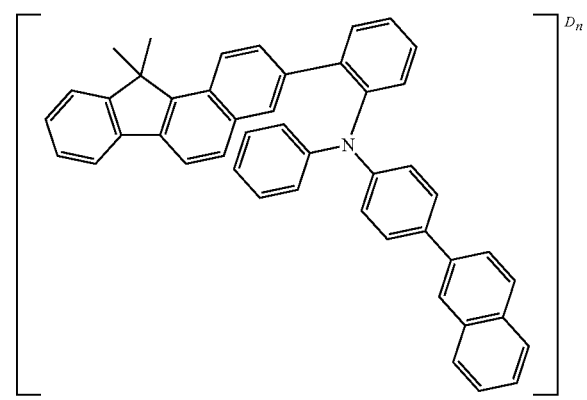
C-82
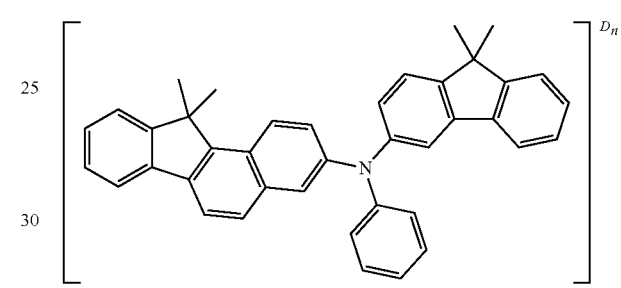
C-83
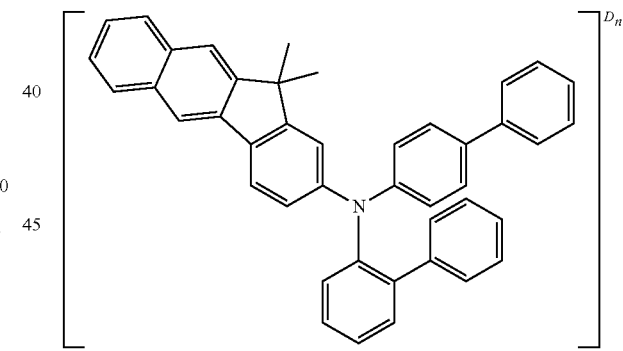
C-84
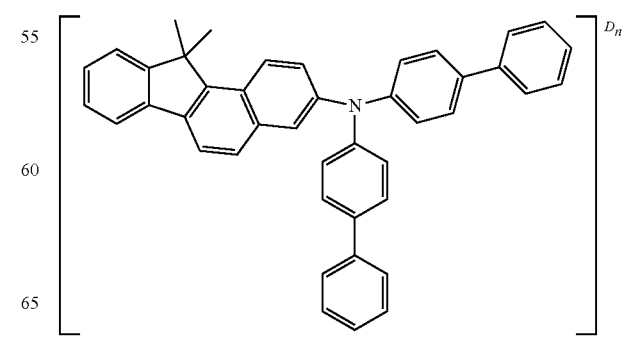

C-85 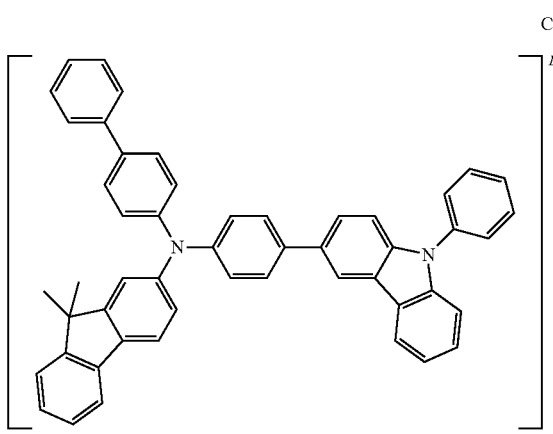
C-86 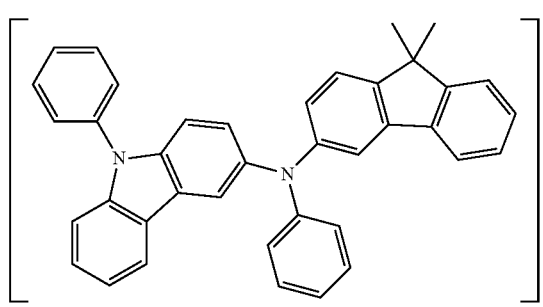
C-87 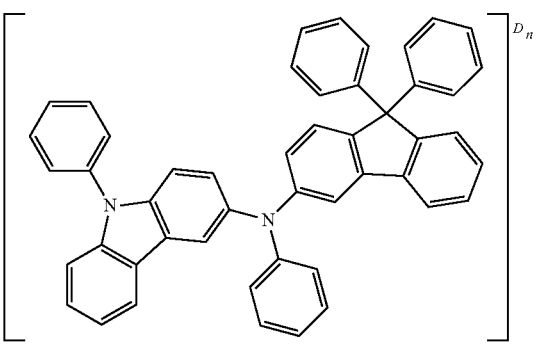 and
C-88 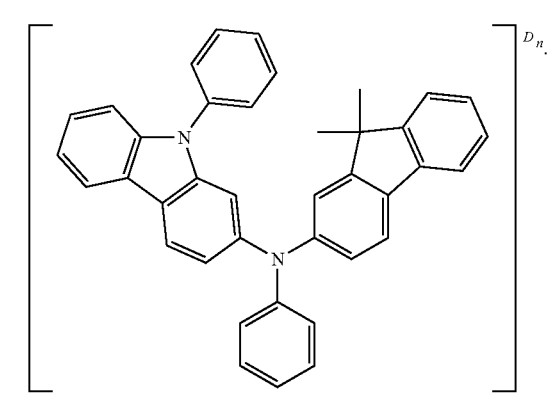
B-1 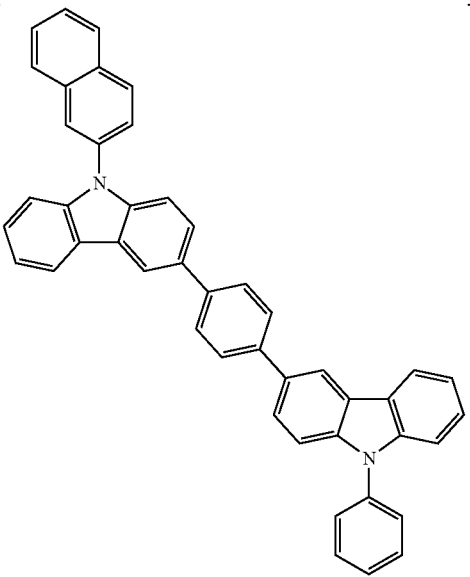
B-2 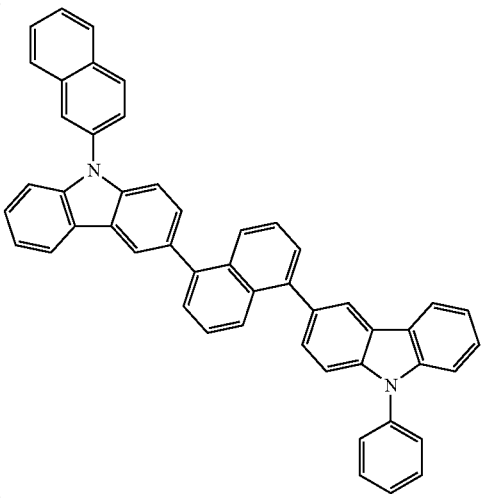
9. The organic electroluminescent device according to claim 5, wherein the compound represented by formula 2 is at least one selected from the following compounds:

B-3
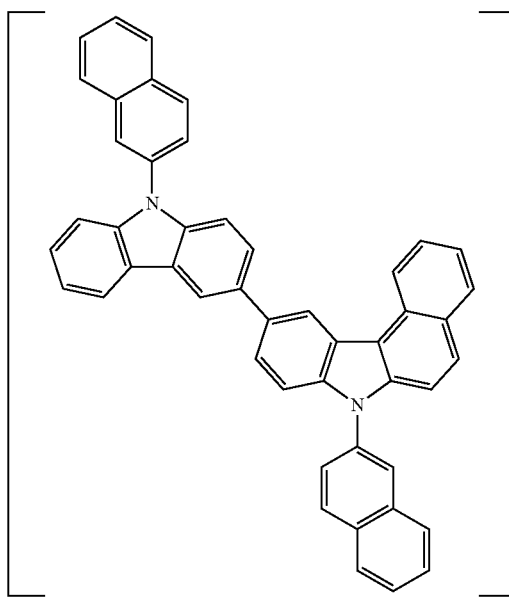
B-5
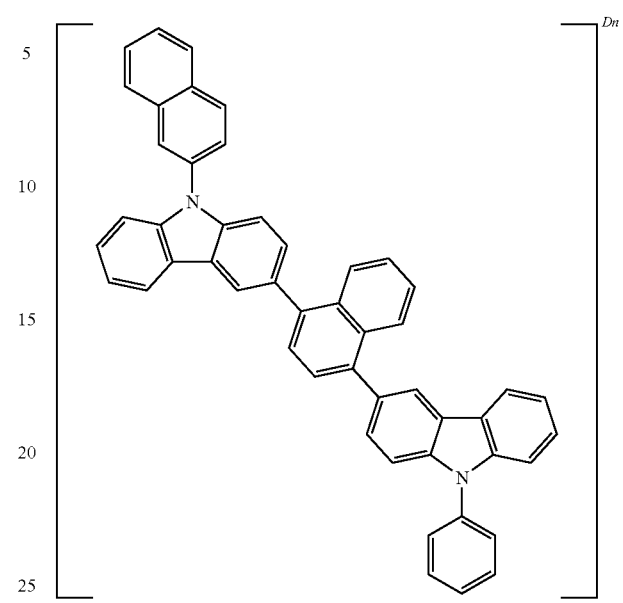
B-4
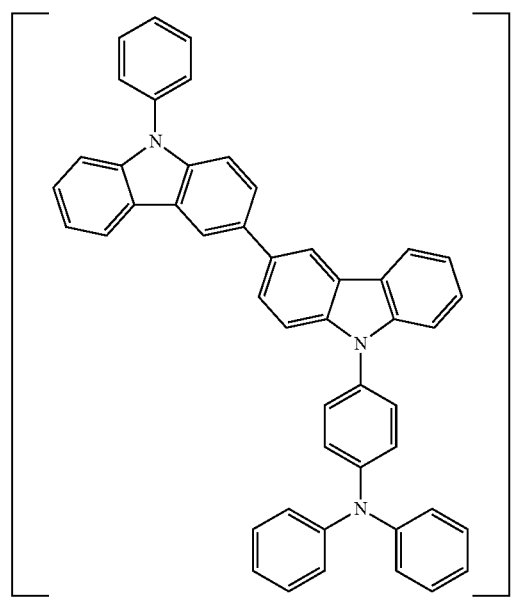
B-6
B-7
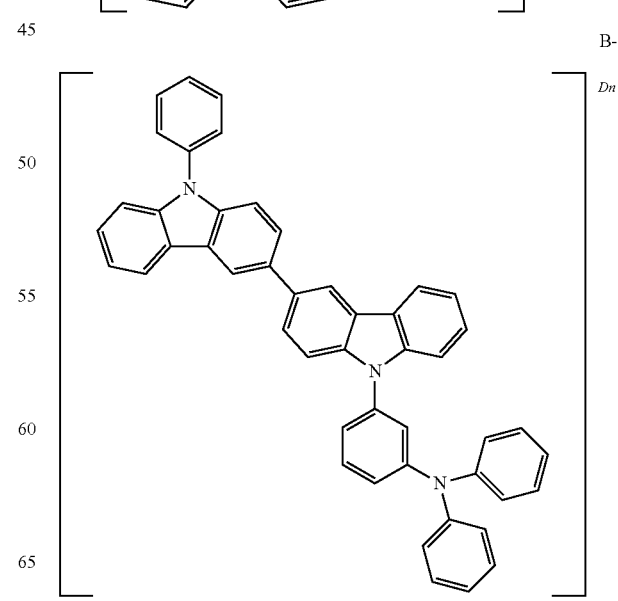

-continued
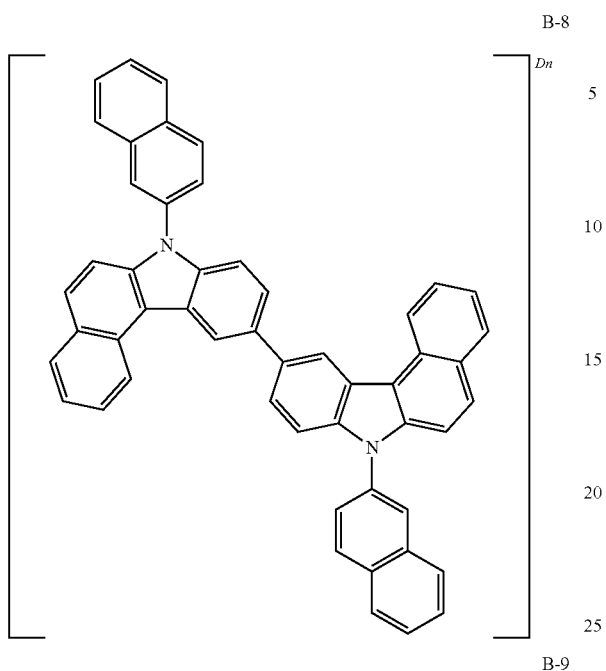
B-8
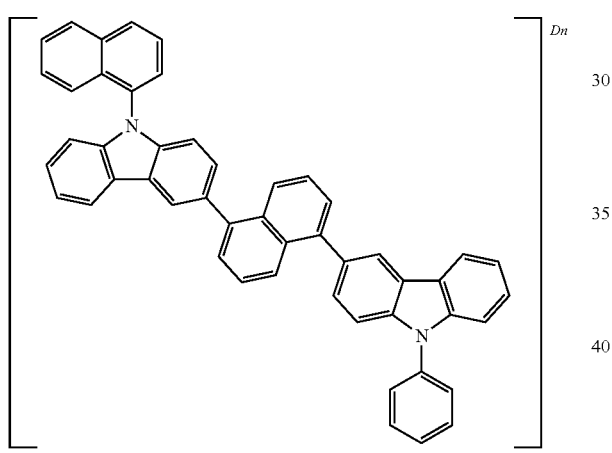
B-9
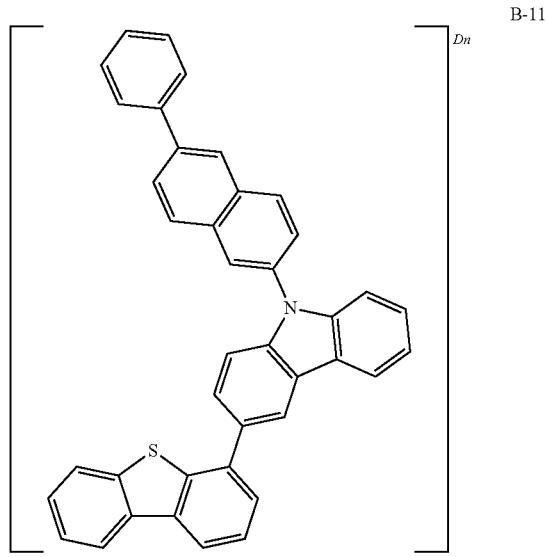
B-11
-continued
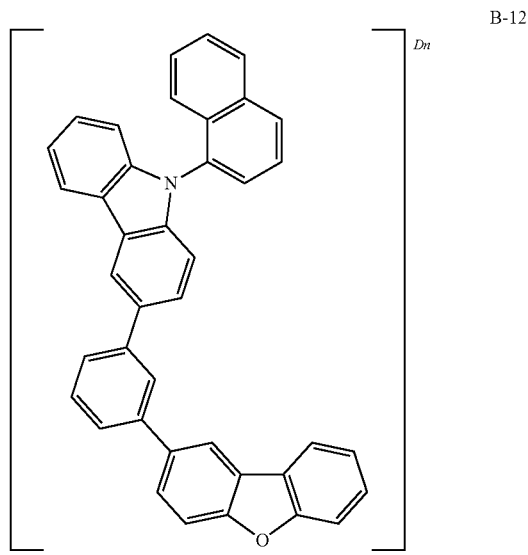
B-12
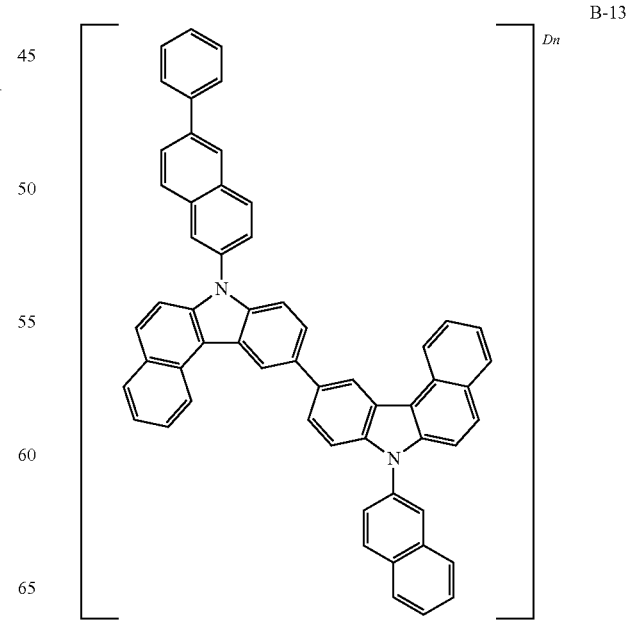
B-13

B-14
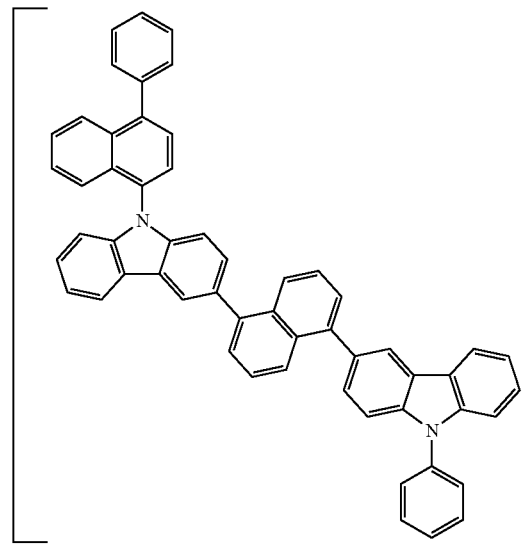
B-17
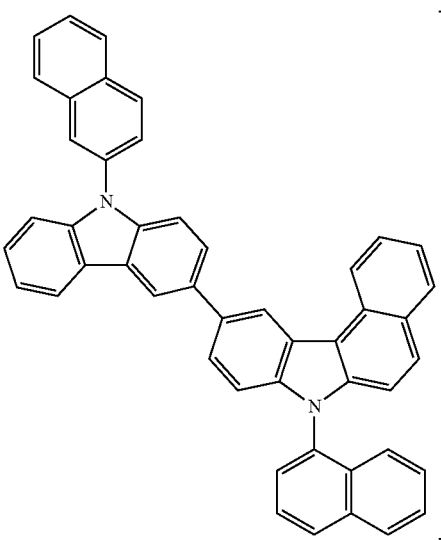
B-15
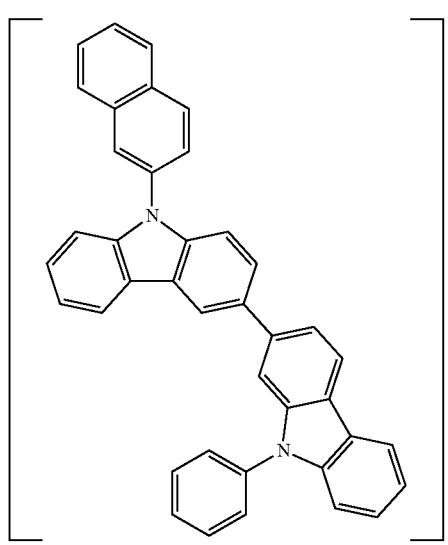
B-18
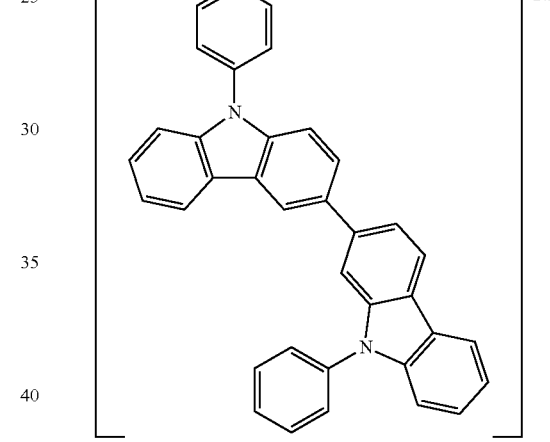
B-16
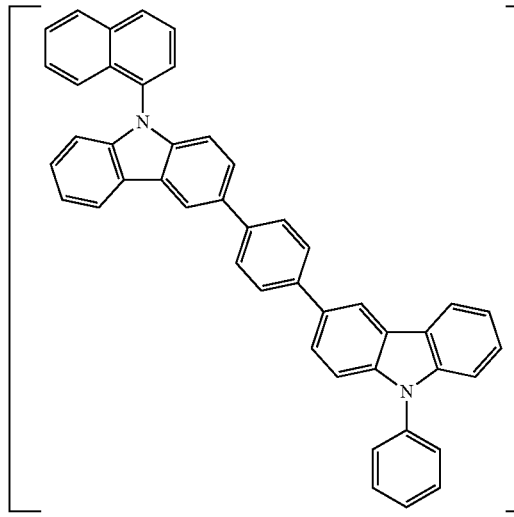
B-19
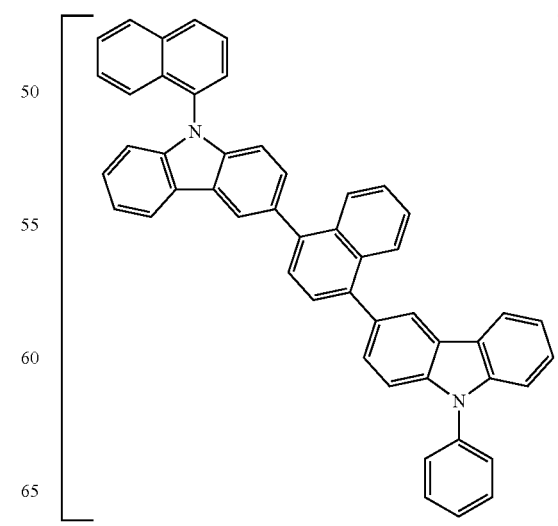

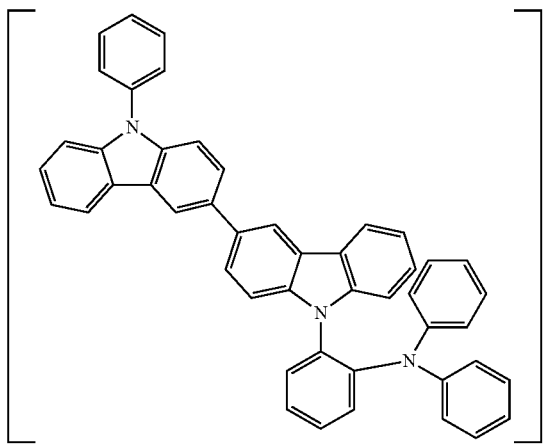
B-20
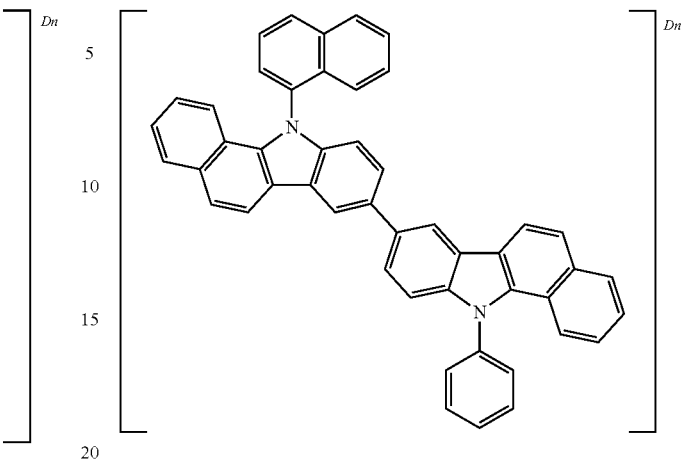
B-23
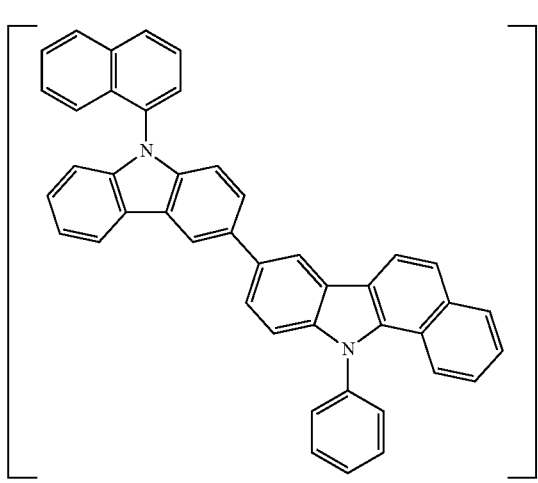
B-21
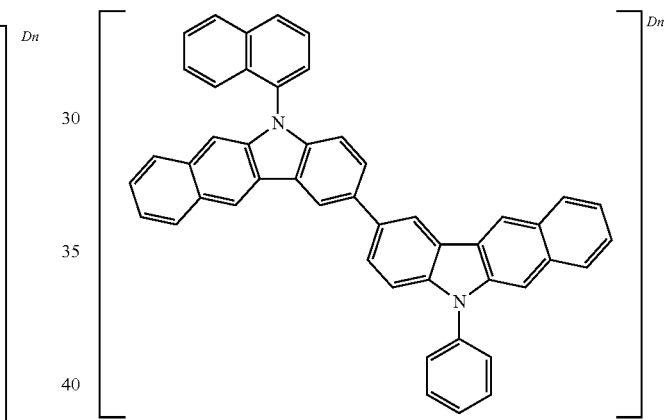
B-24
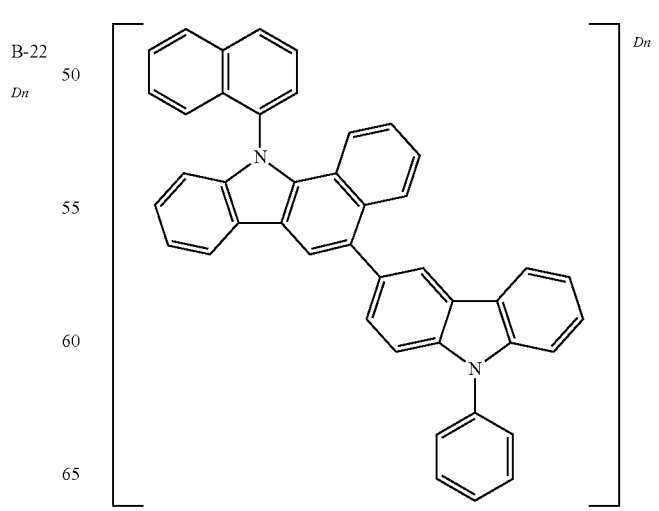
B-25

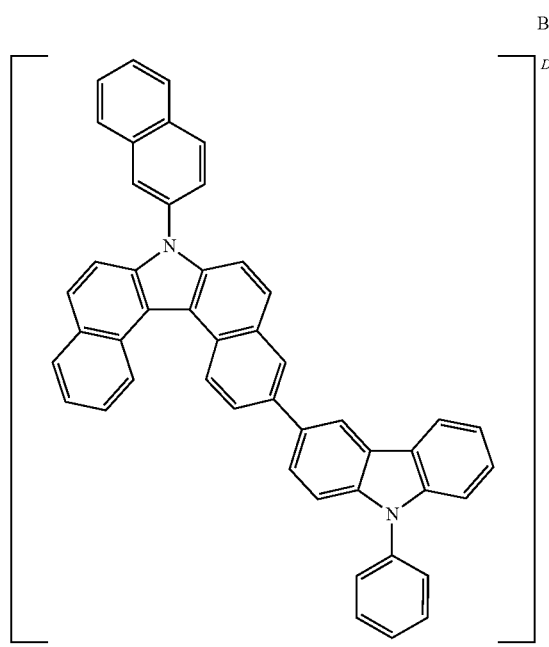
B-26
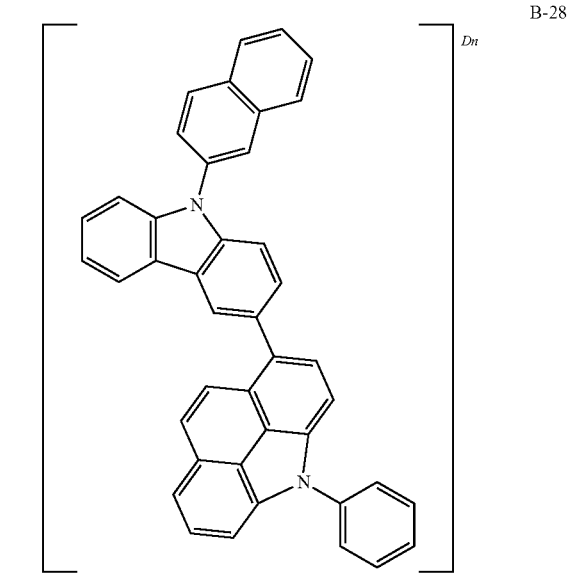
B-28
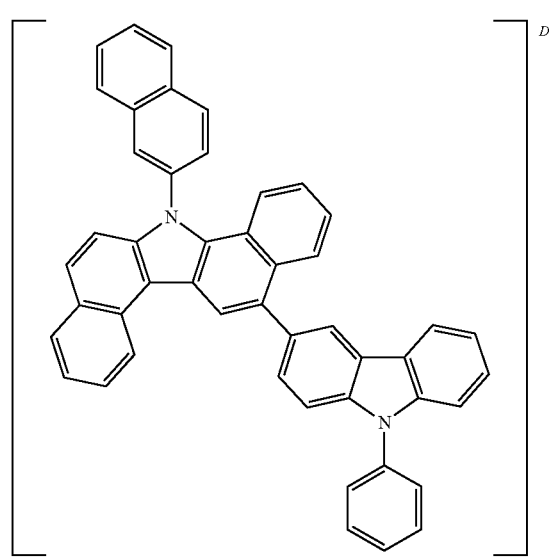
B-27
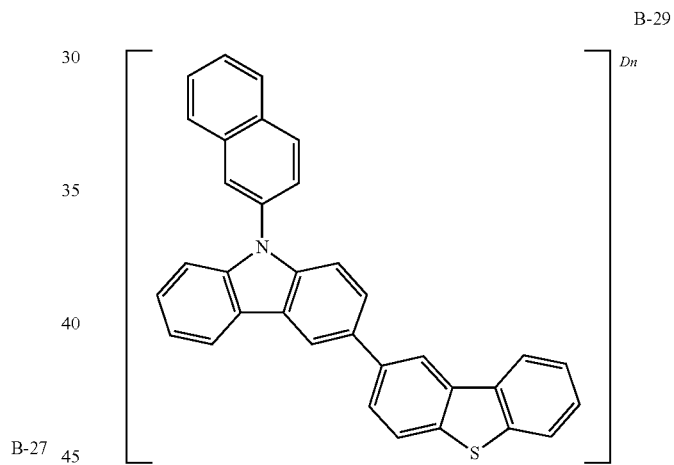
B-29
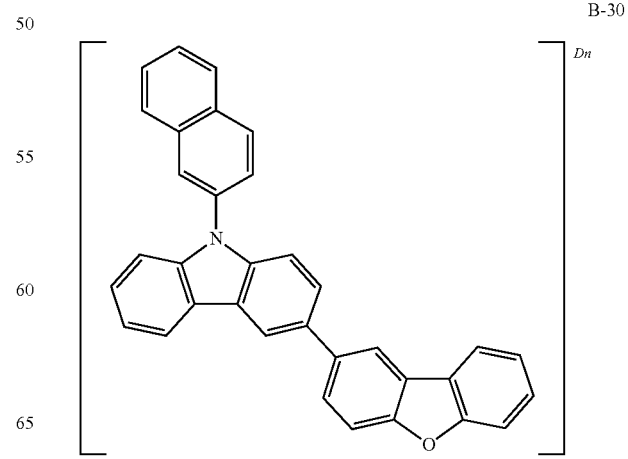
B-30

B-31
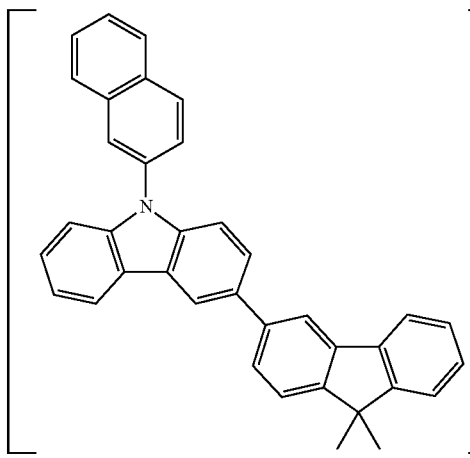
B-34
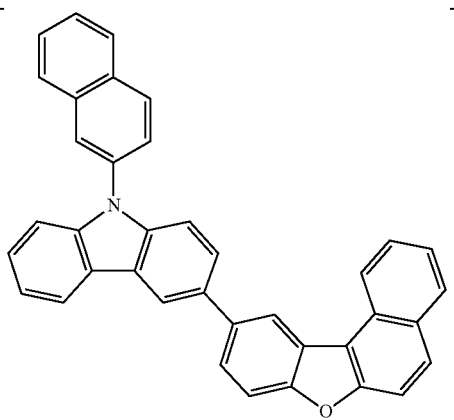
B-32
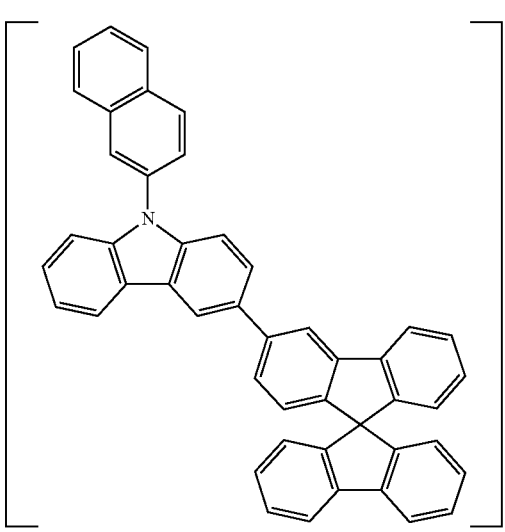
B-35
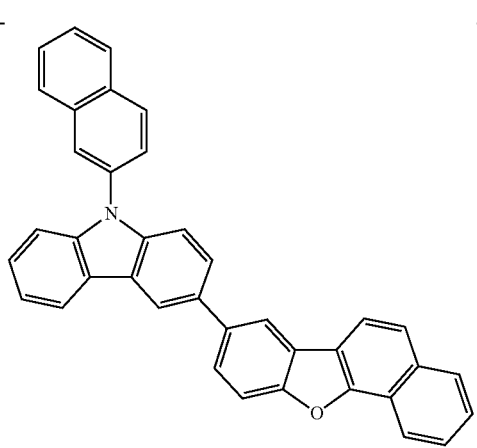
B-33
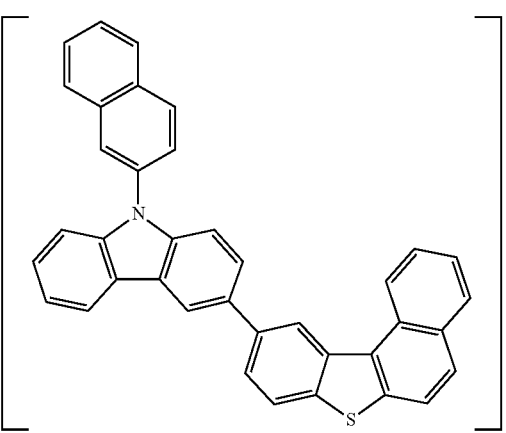
B-36
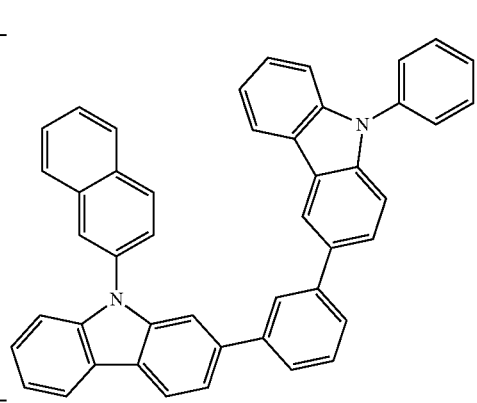

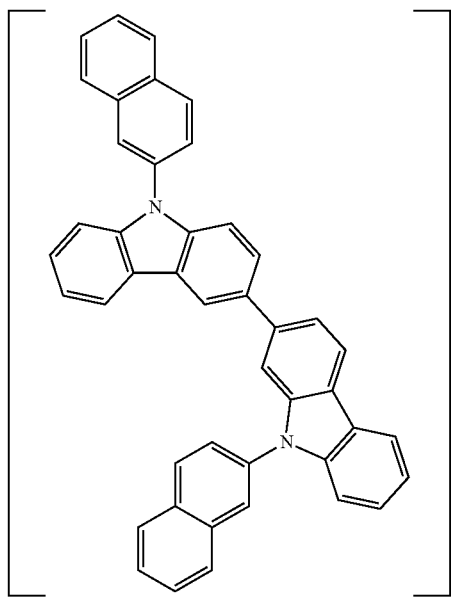
B-37
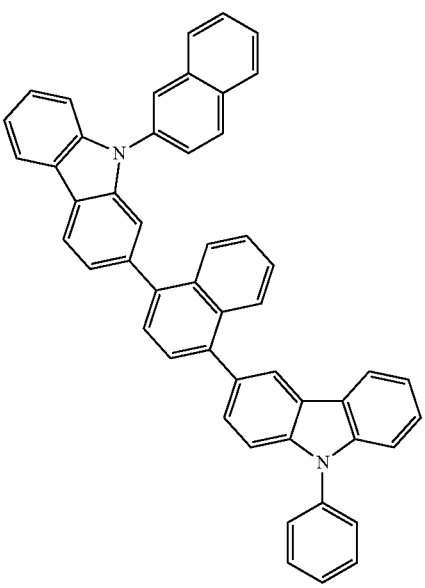
B-40
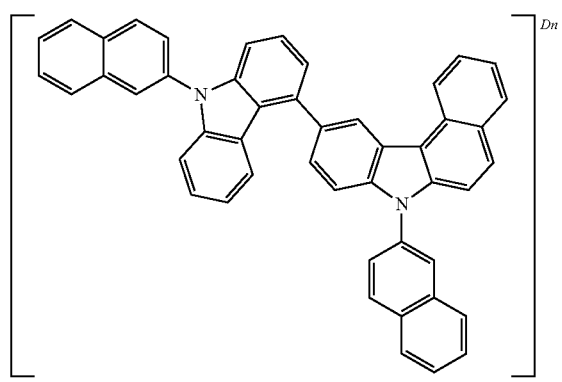
B-38
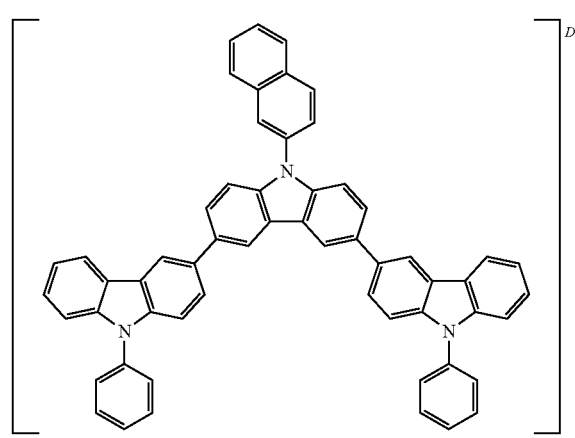
B-39
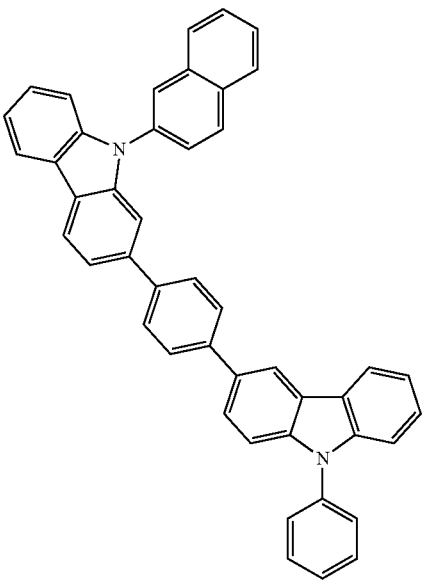
B-41

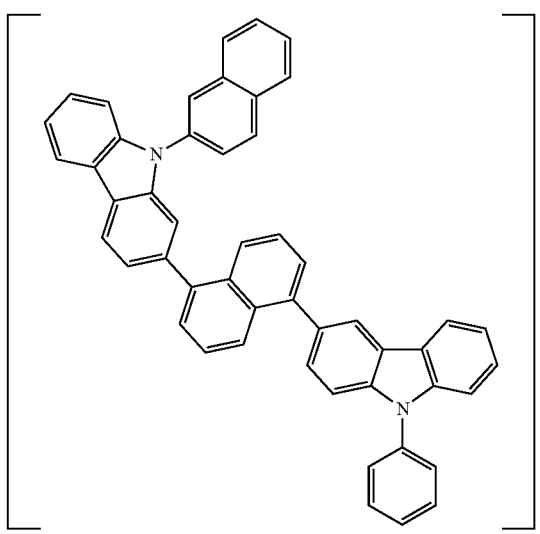
B-42
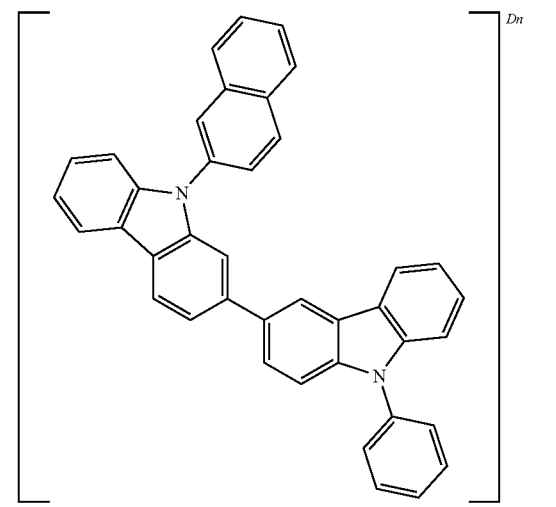
B-44
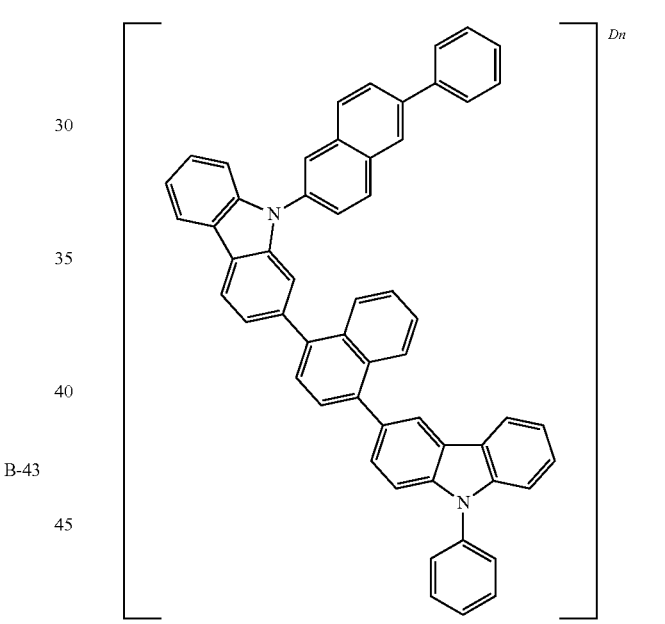
B-45
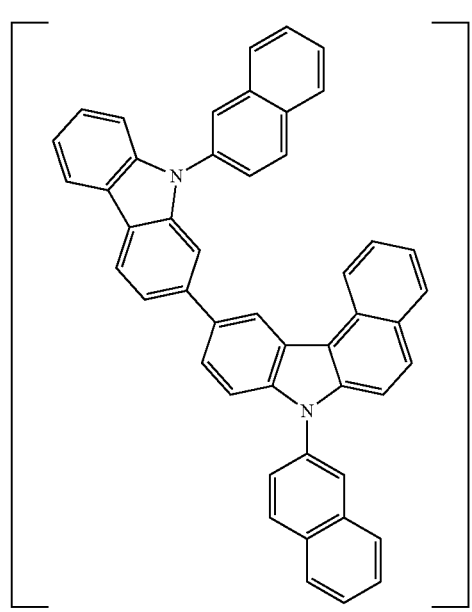
B-43
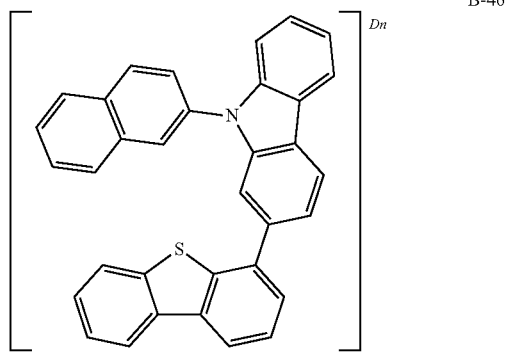
B-46

B-47
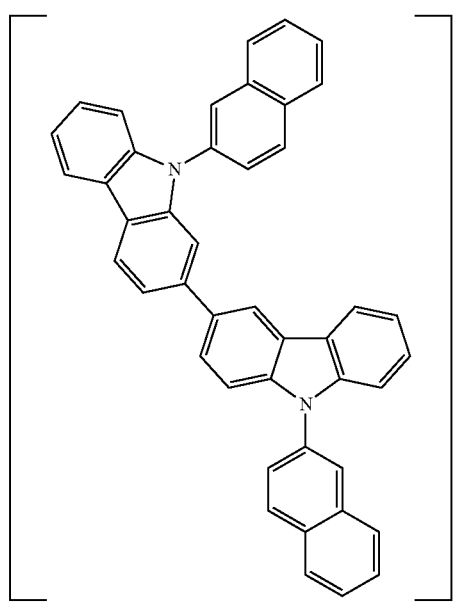
B-49
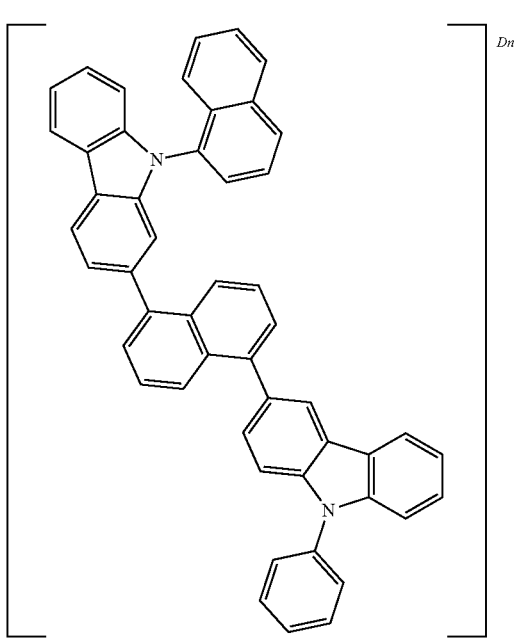
B-48
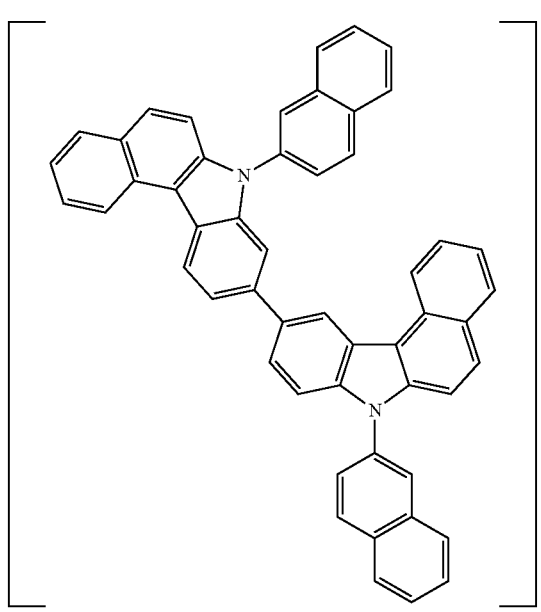
B-50
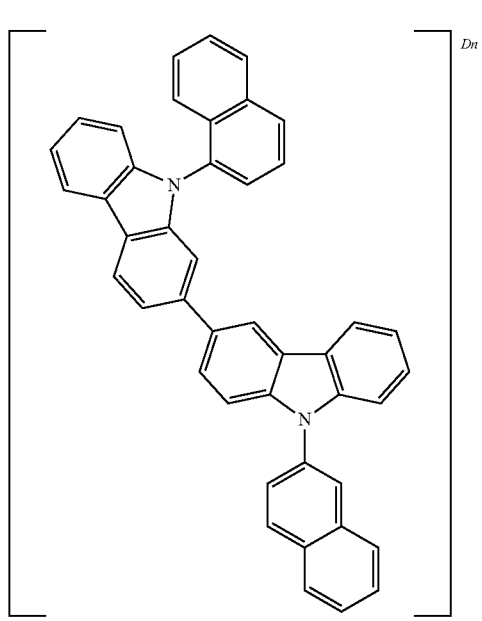

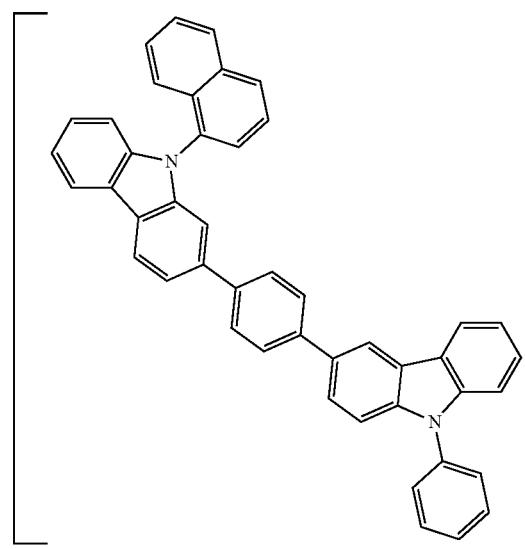
B-51
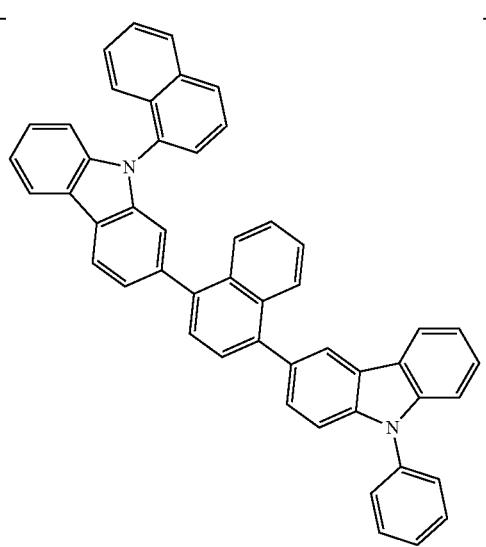
B-54
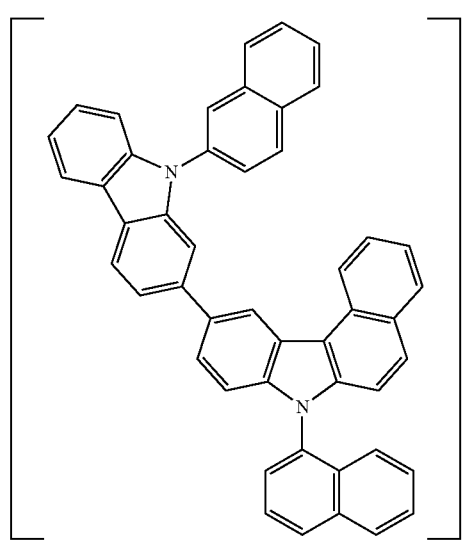
B-52
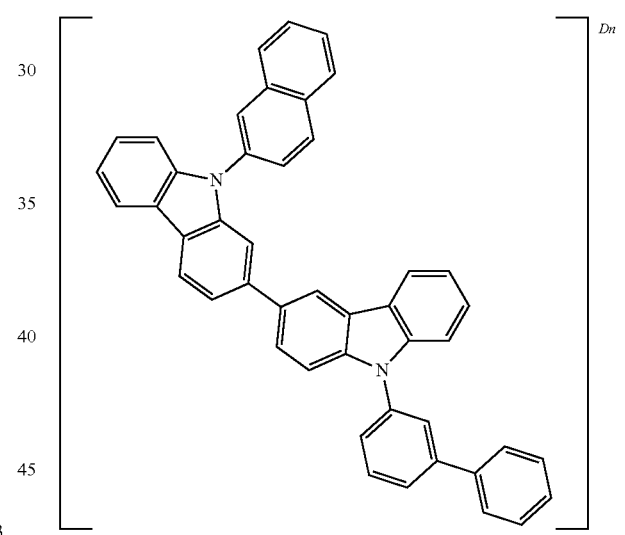
B-55
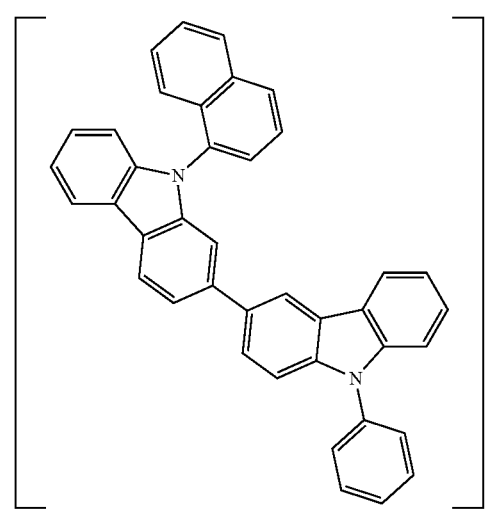
B-53
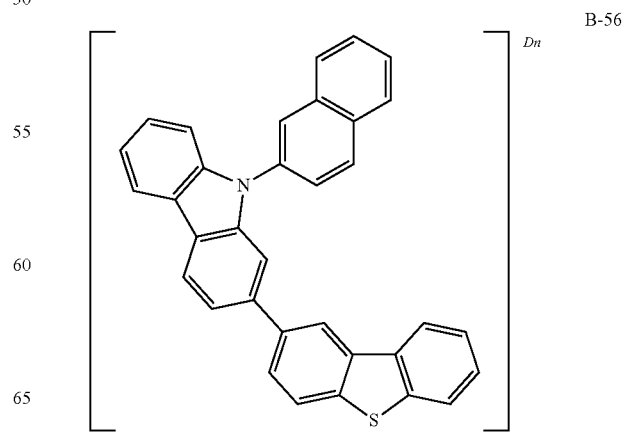
B-56

B-57
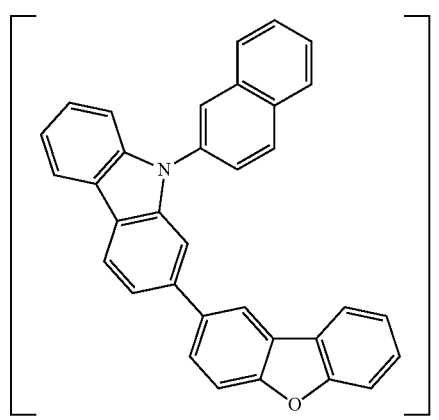
B-58
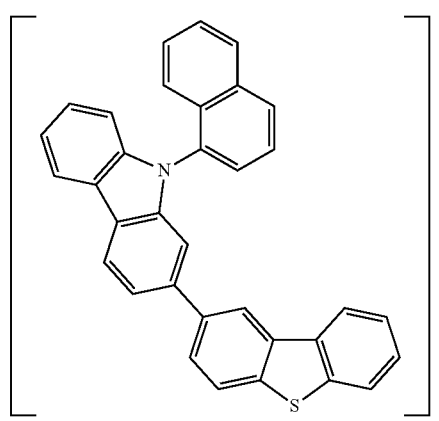
B-59
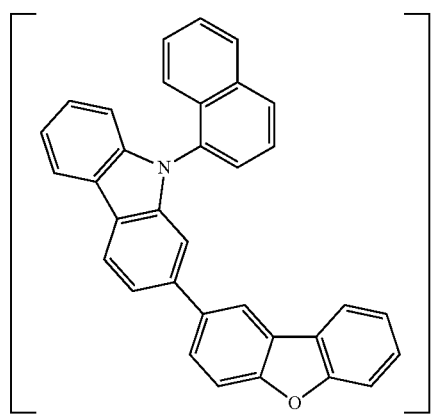
B-60
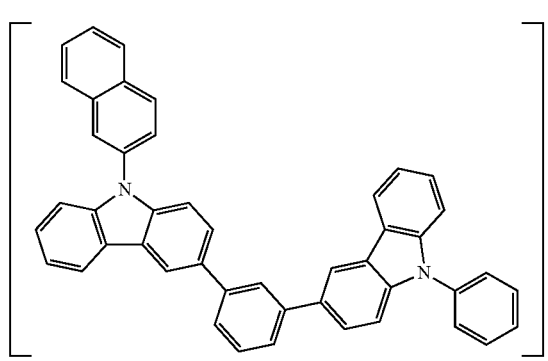
B-61
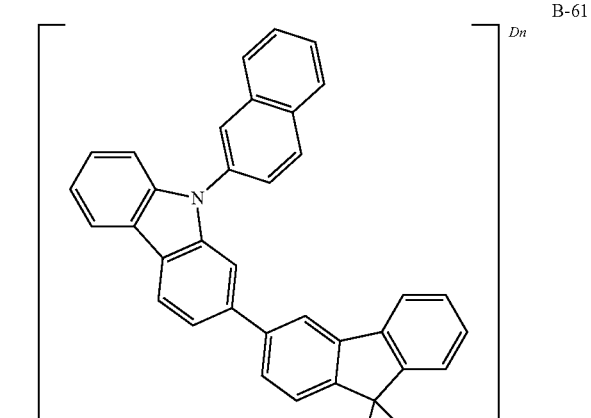
B-62
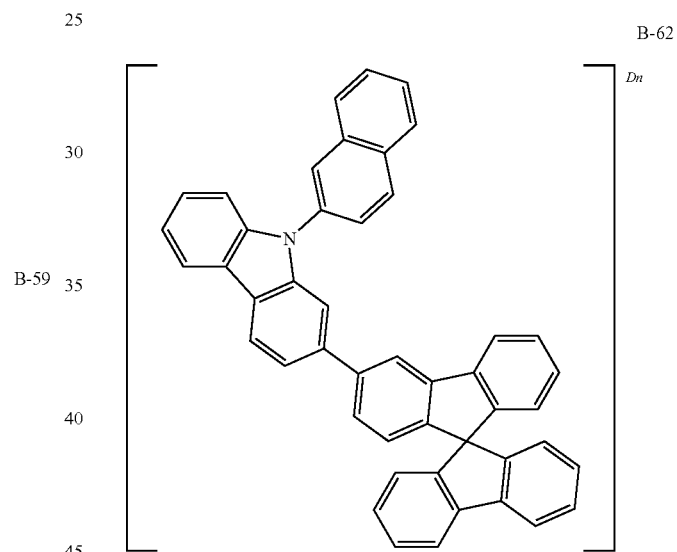
B-63
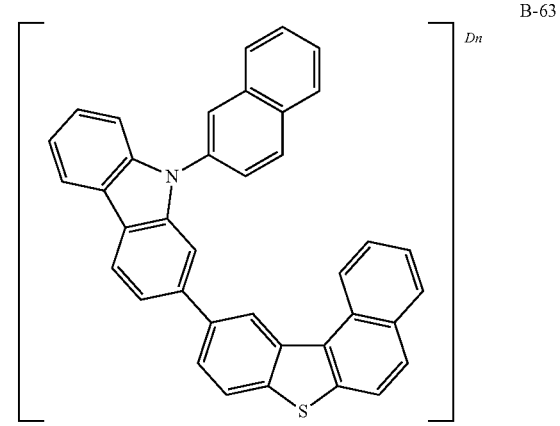

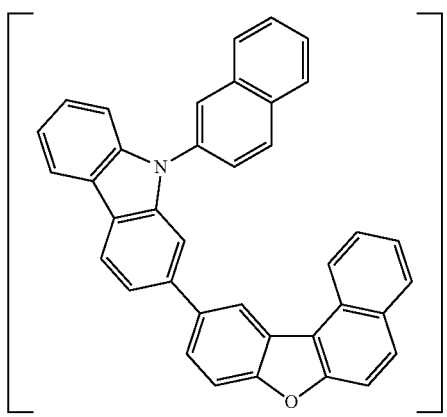
B-64
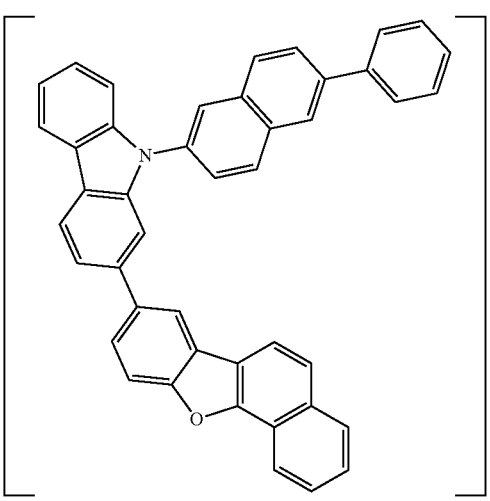
B-65
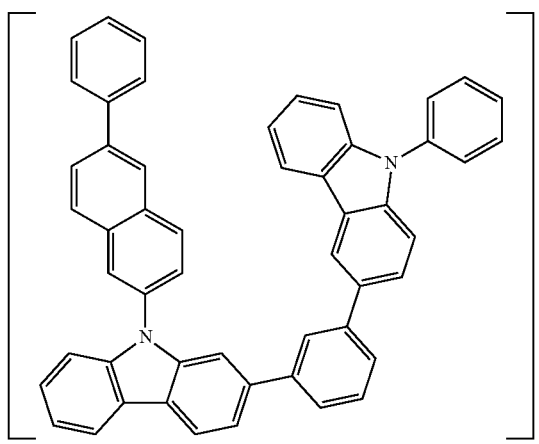
B-66
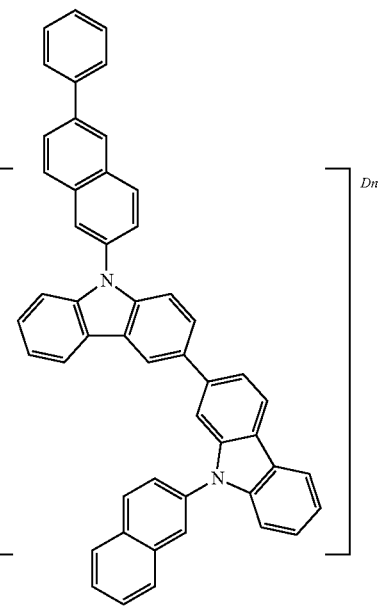
B-67
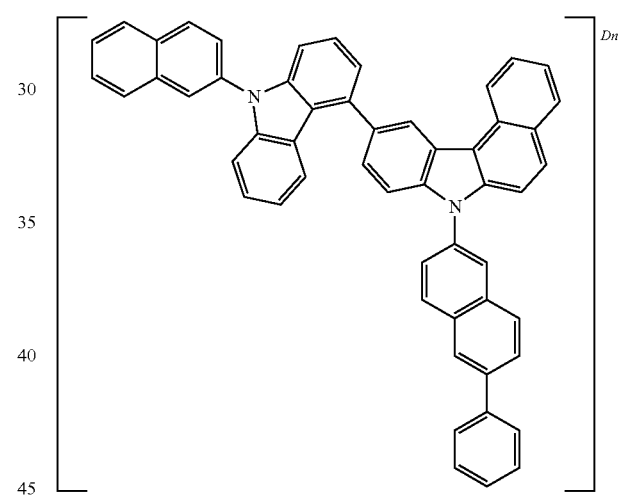
B-68
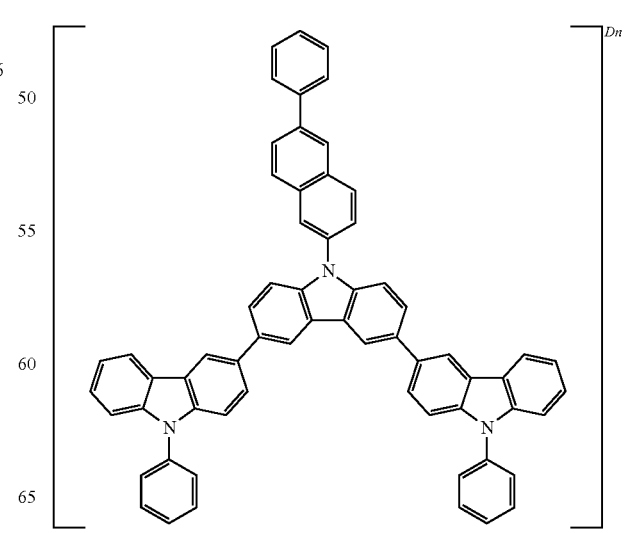
B-69

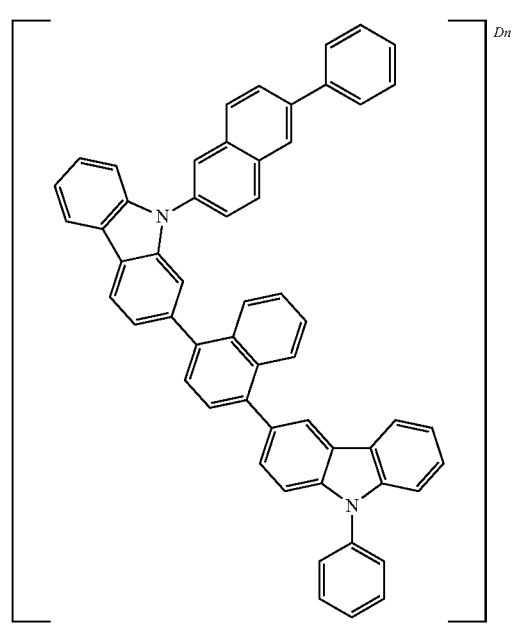
B-70
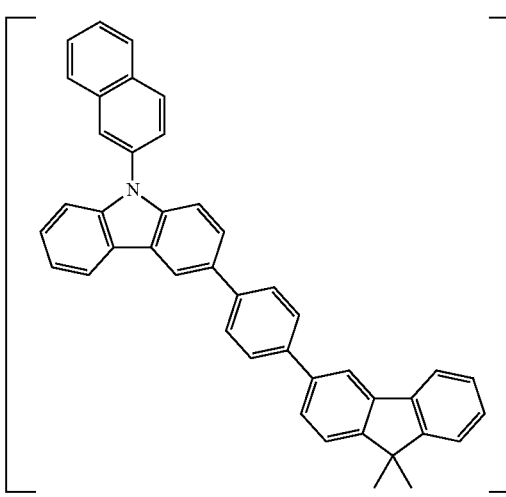
B-71
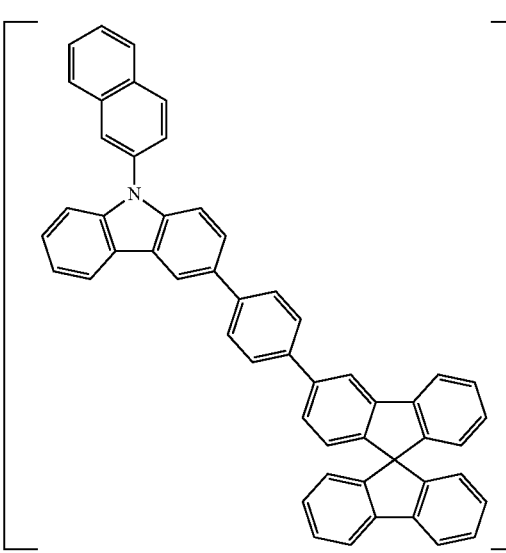
B-72
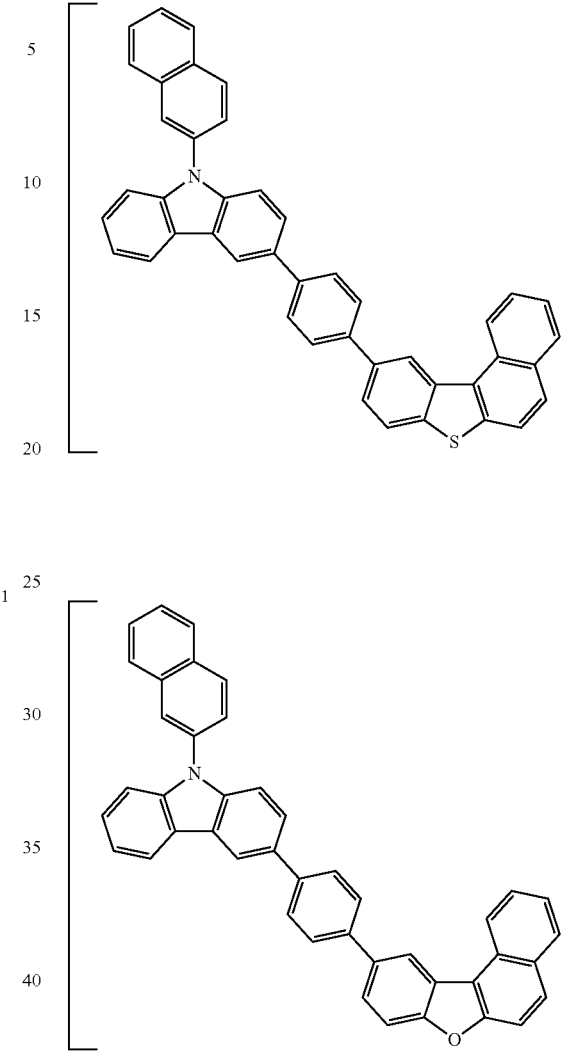
B-73
B-74
B-75

B-76
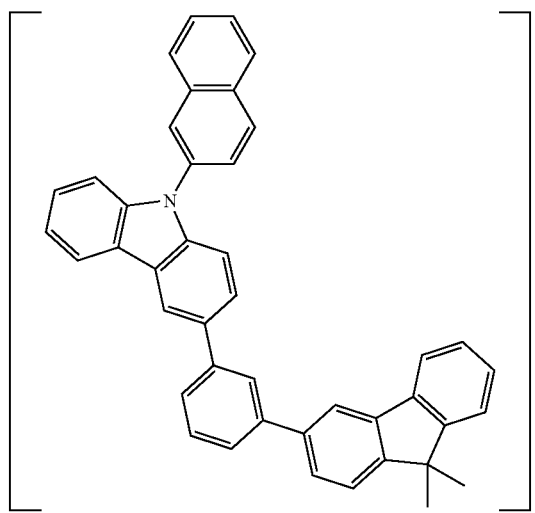
B-79
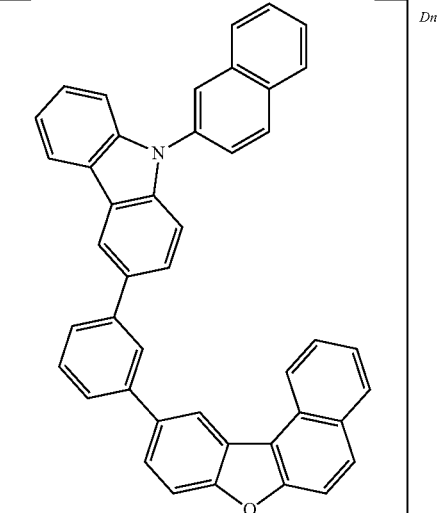
B-77
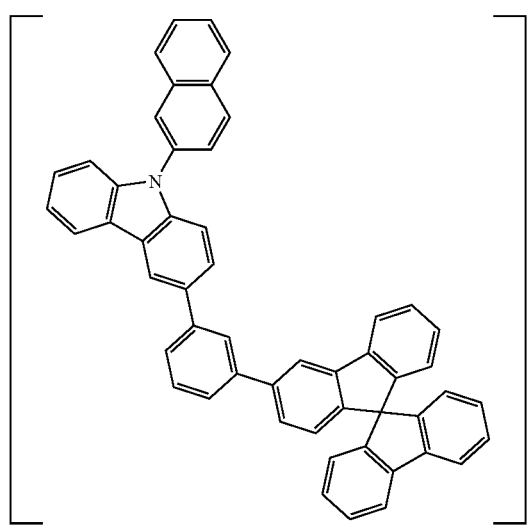
B-80
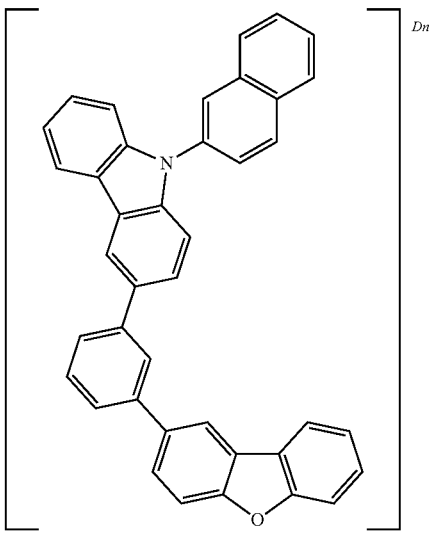
B-78
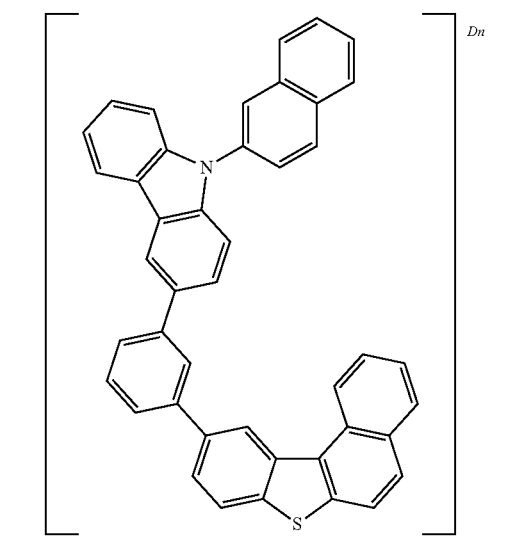
B-81
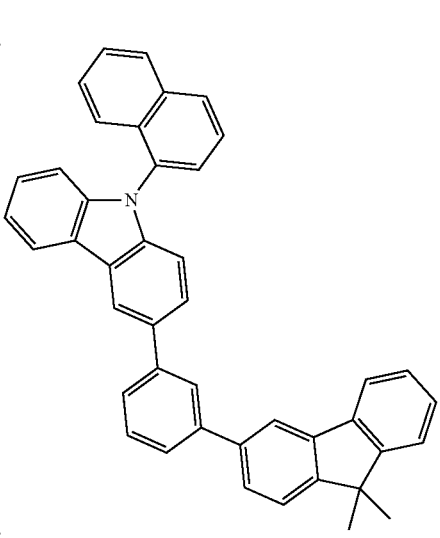

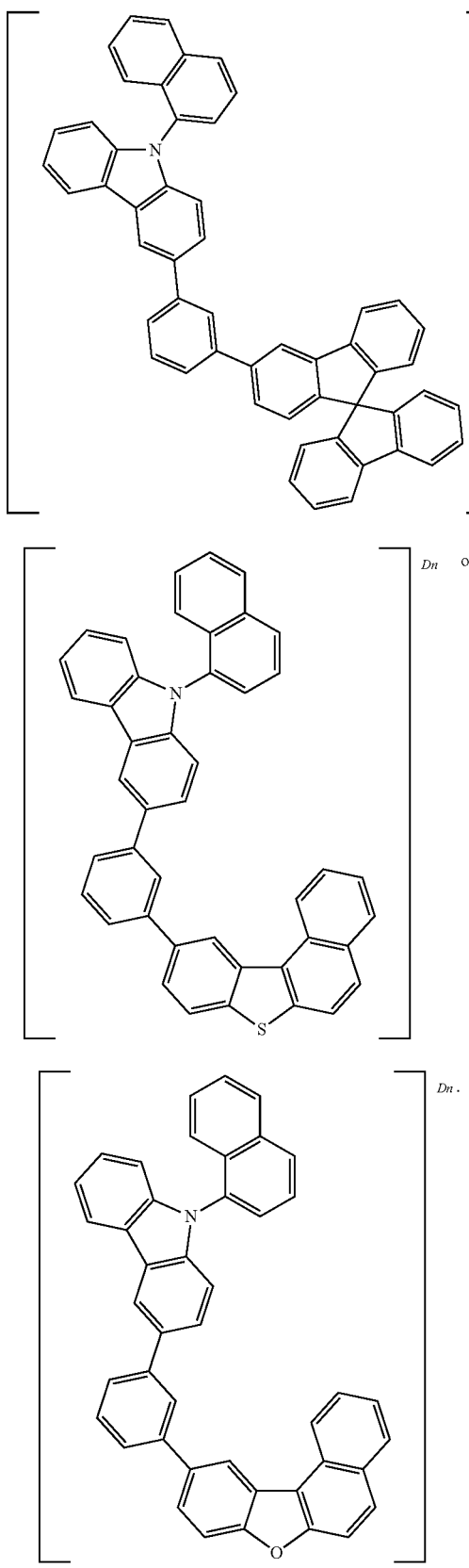
10. The organic electroluminescent device according to claim 6, wherein the compound represented by formula 3 is at least one selected from the following compounds:
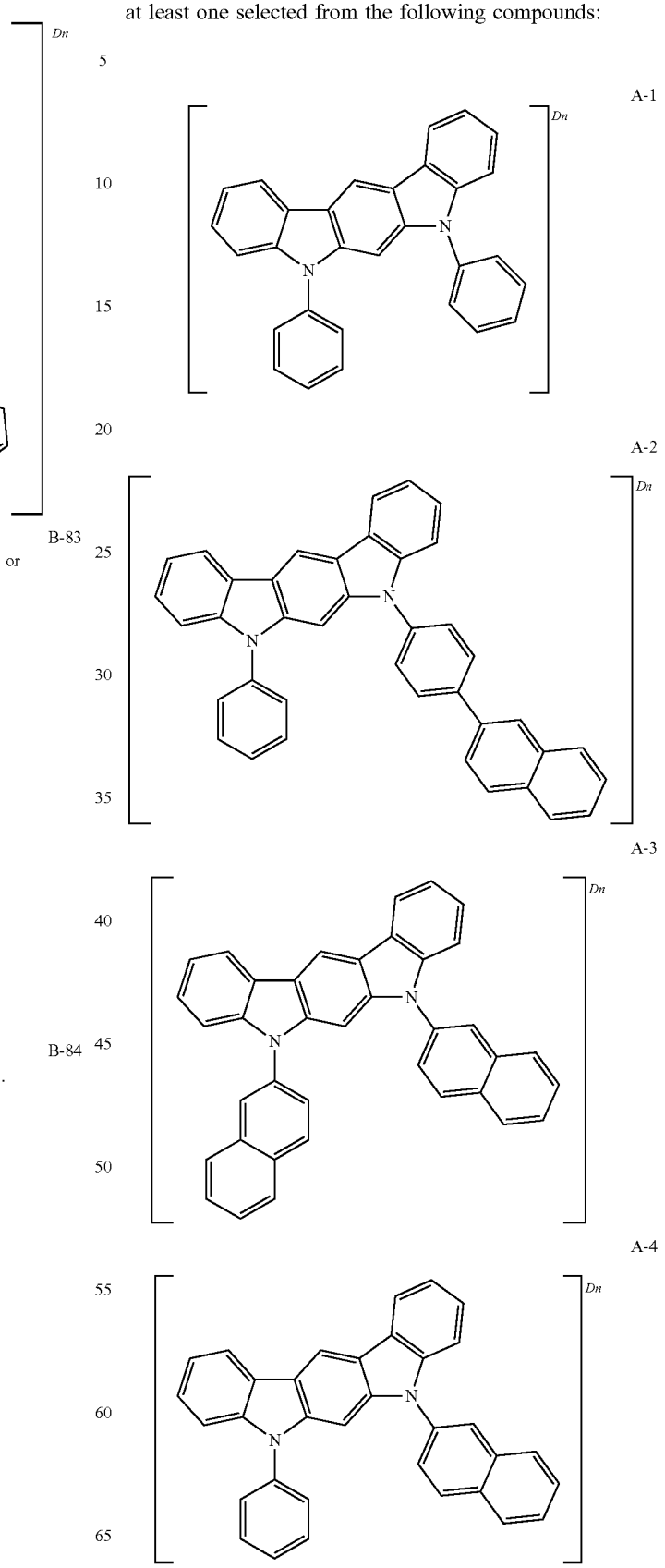

-continued
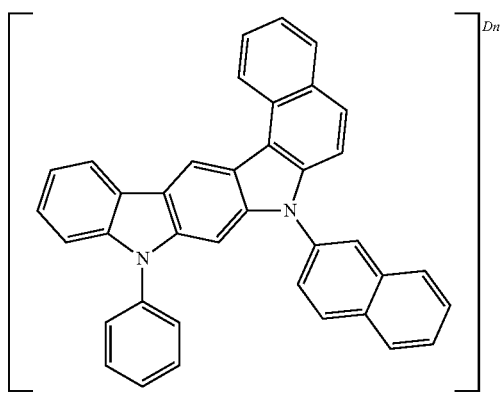
A-5
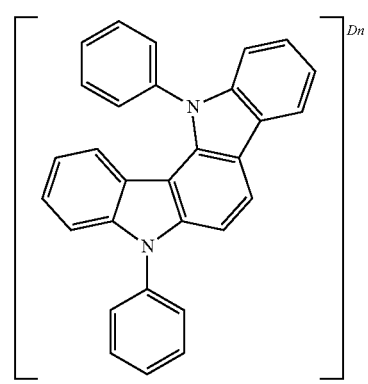
A-6
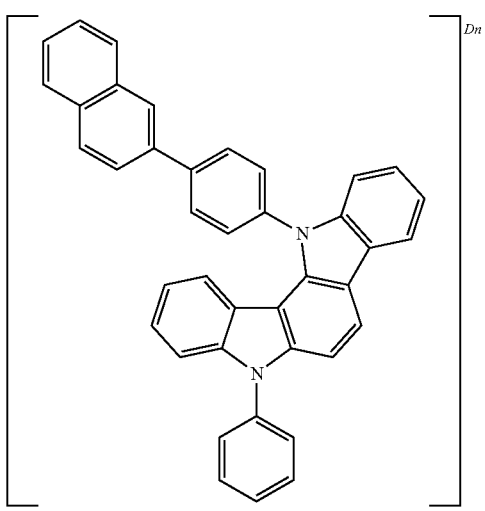
A-7
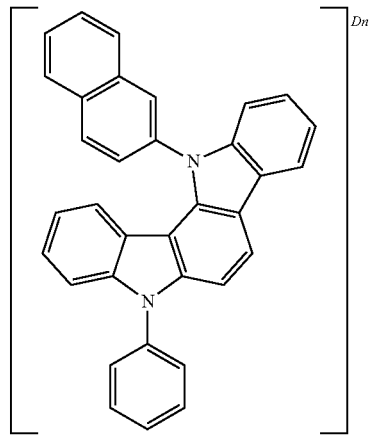
A-8
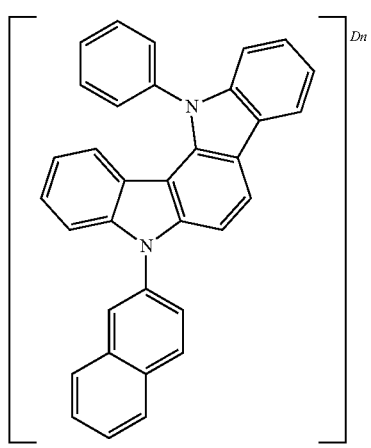
A-9
and
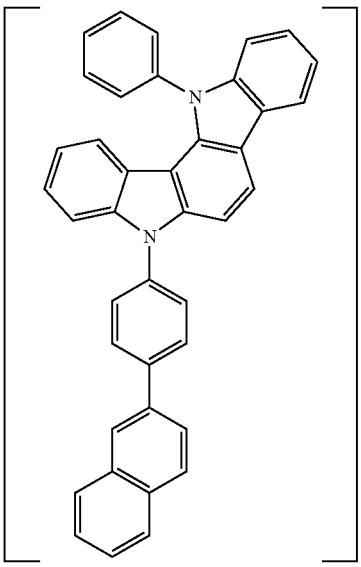
A-10
* * * * *